(12) United States Patent
Toda et al.

(10) Patent No.: US 8,488,030 B2
(45) Date of Patent: Jul. 16, 2013

(54) INFORMATION ACQUIRING METHOD, INFORMATION ACQUIRING APPARATUS, SEMICONDUCTOR DEVICE COMPRISING ARRAY OF PLURALITY OF UNIT COMPONENTS FOR DETECTING PHYSICAL QUANTITY DISTRIBUTION, AND SEMICONDUCTOR MANUFACTURING METHOD

(75) Inventors: Atsushi Toda, Kanagawa (JP); Hirofumi Sumi, Kanagawa (JP)

(73) Assignee: Sony Corporation (JP)

( * ) Notice: Subject to any disclaimer, the term of this patent is extended or adjusted under 35 U.S.C. 154(b) by 1584 days.

(21) Appl. No.: 11/211,821

(22) Filed: Aug. 25, 2005

(65) Prior Publication Data

US 2006/0044429 A1  Mar. 2, 2006

(30) Foreign Application Priority Data

Aug. 30, 2004  (JP) ................ P2004-250049

(51) Int. Cl.
*H04N 3/14* (2006.01)
*H04N 5/335* (2011.01)
*H04N 9/04* (2006.01)

(52) U.S. Cl.
USPC .......... 348/272; 359/558; 359/566; 359/563; 250/208.1

(58) Field of Classification Search
USPC .................. 348/272; 385/37; 398/16
See application file for complete search history.

(56) References Cited

U.S. PATENT DOCUMENTS

| | | | |
|---|---|---|---|
| 5,600,486 A * | 2/1997 | Gal et al. ............ | 359/569 |
| 2002/0191394 A1* | 12/2002 | Coleman et al. ........ | 362/231 |
| 2003/0112433 A1* | 6/2003 | Youn et al. ............. | 356/328 |
| 2004/0156589 A1* | 8/2004 | Gunn et al. ............. | 385/37 |
| 2005/0180748 A1* | 8/2005 | Kawahata ............... | 398/16 |

FOREIGN PATENT DOCUMENTS

| | | |
|---|---|---|
| JP | 09246511 | 9/1997 |
| JP | 2001-133615 | 5/2001 |

OTHER PUBLICATIONS

Japanese Office Action dated Jun. 3, 2008 for Application No. 2004-250049.

* cited by examiner

*Primary Examiner* — Antoinette Spinks
(74) *Attorney, Agent, or Firm* — Sheridan Ross P.C.

(57) ABSTRACT

To enable an imaging apparatus to achieve high resolution and sufficient color reproducibility.
A diffraction grating 1 is provided on the incident light side of a spectral image sensor 10, the diffraction grating 1 including scatterers such as scatterers 3, slits 5, and scatterers 7 which are disposed in that order. An electromagnetic wave is scattered by the scatterers to produce diffracted waves, and by using the fact that interference patterns between the diffracted waves change with wavelengths, signals are detected for respective wavelengths by photoelectric conversion elements 12B, 12G, and 12R in each photodiode group 12.

14 Claims, 113 Drawing Sheets

OUTLINE OF LIGHT INTENSITY

LIGHT INTENSITY →

OUTLINE OF DIFFRACTION GRATING

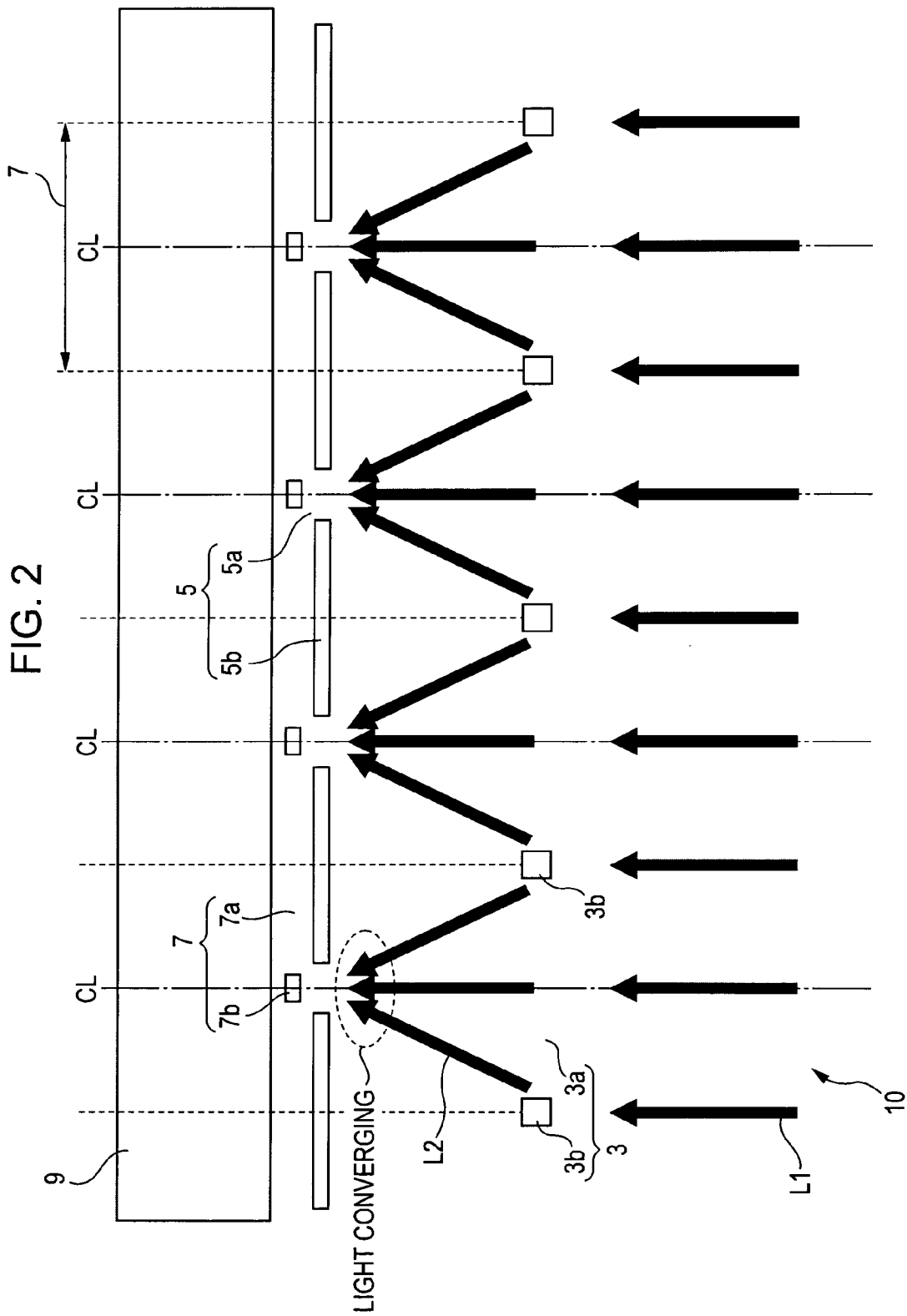

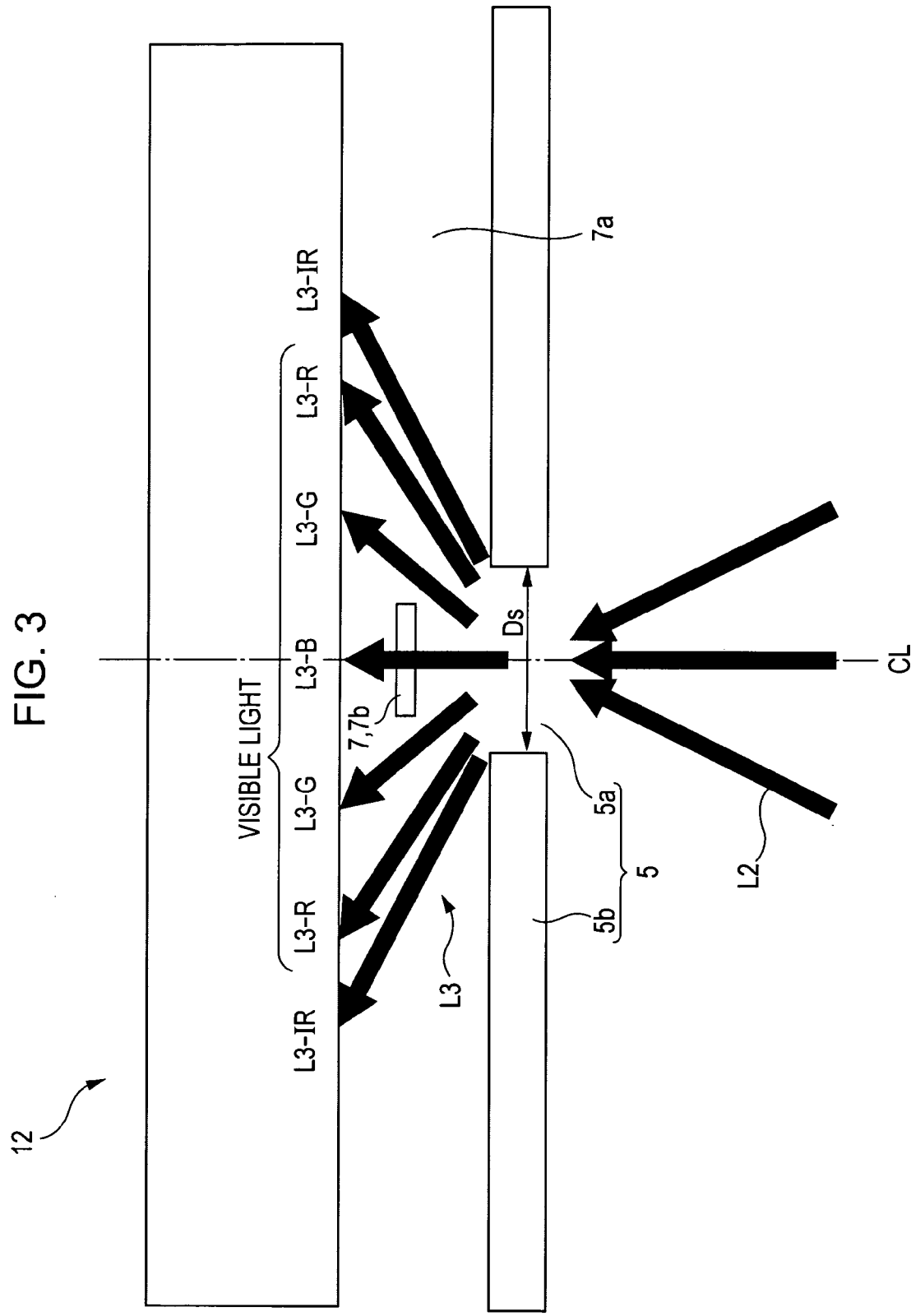

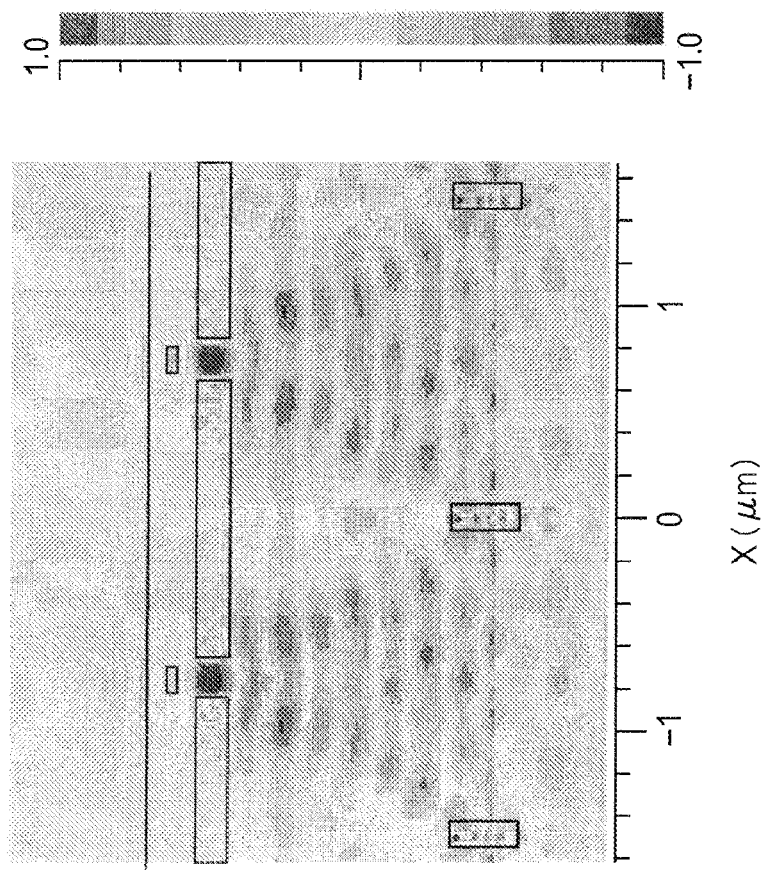
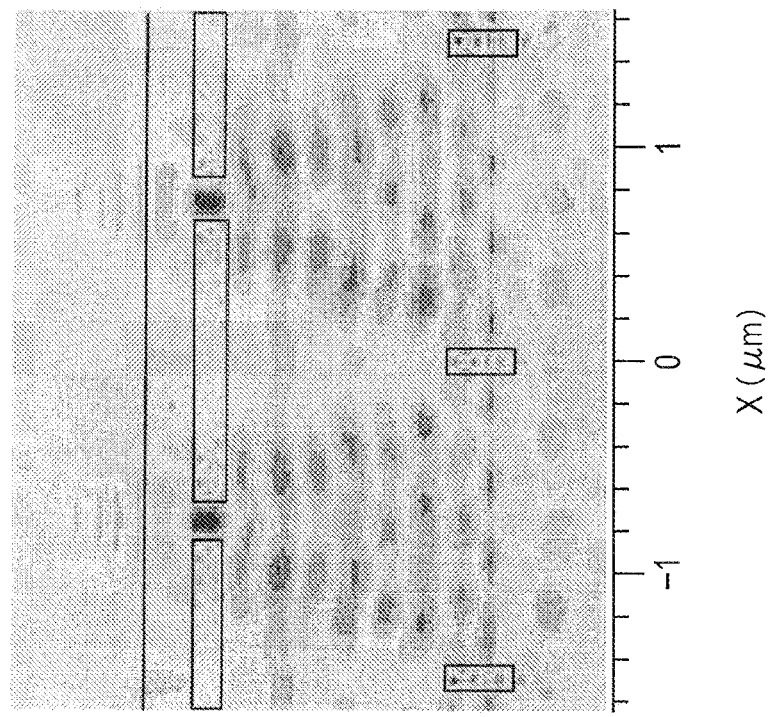

FIG. 7

| WAVELENGTH | REFRACTIVE INDEX | EXTINCTION COEFFICIENT |
|---|---|---|
| 460nm (BLUE) | 4.6 | 0.1 |
| 540nm (GREEN) | 4.1 | 0.05 |
| 640nm (RED) | 3.8 | 0.02 |

FIG. 14

| WAVELENGTH | REFRACTIVE INDEX | EXTINCTION COEFFICIENT |
|---|---|---|
| 460nm (BLUE) | 4.74 | 0.333 |
| 540nm (GREEN) | 4.24 | 0.124 |
| 640nm (RED) | 3.96 | 0.054 |

FIG. 64

| WAVELENGTH | REFRACTIVE INDEX | EXTINCTION COEFFICIENT |
|---|---|---|
| 460nm (BLUE) | 4.74 | 0.333 |
| 540nm (GREEN) | 4.24 | 0.124 |
| 640nm (RED) | 3.96 | 0.054 |
| 780nm (INFRARED) | 3.76 | 0.019 |
| 880nm (INFRARED) | 3.70 | 0.019 |

CONTOUR MAP OF Ey
SIMULATION OF BLUE COLOR LIGHT (460nm)
cT=10

CONTOUR MAP OF Ey
SIMULATION OF RED COLOR LIGHT (640nm)
cT=20

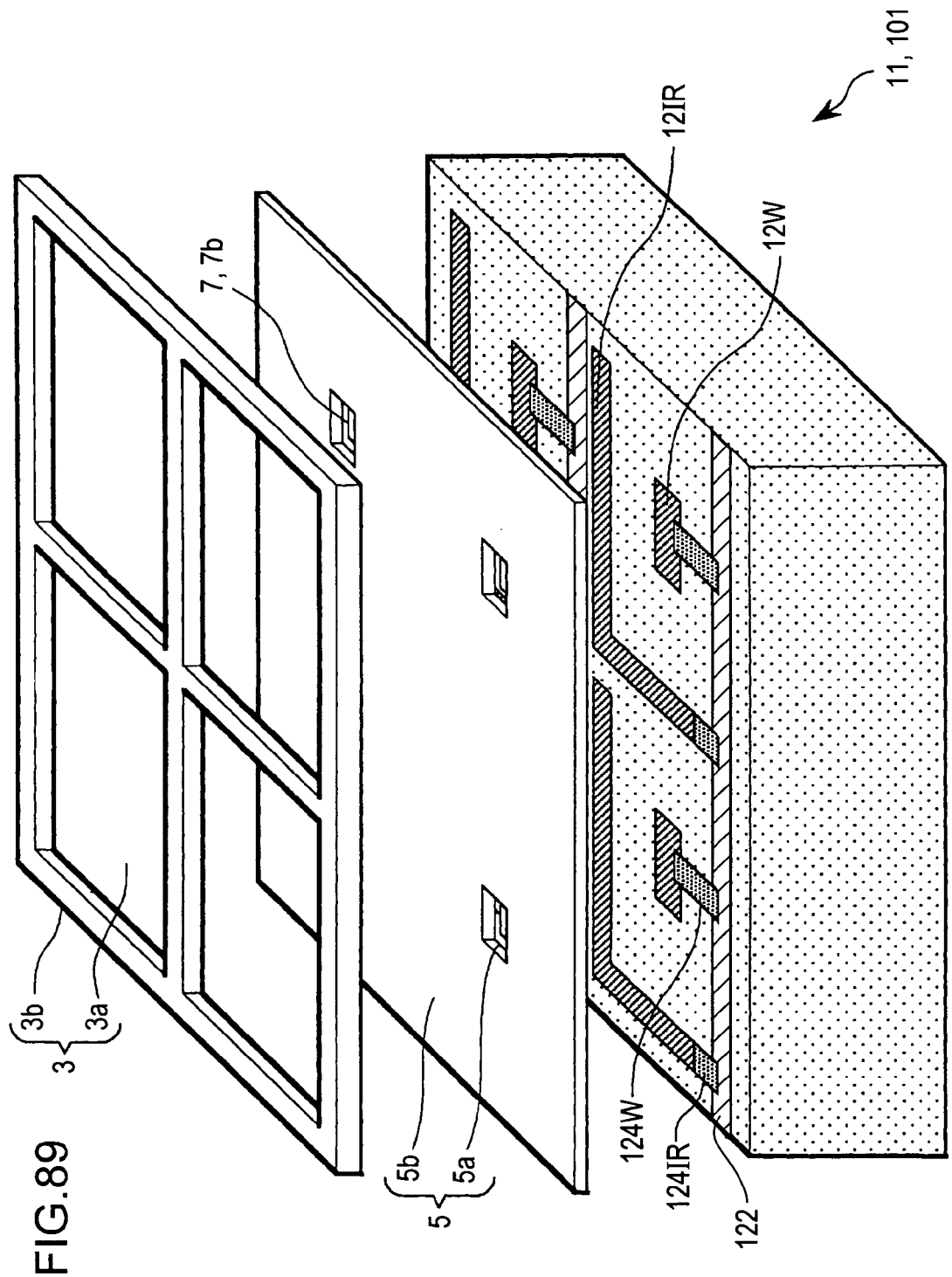

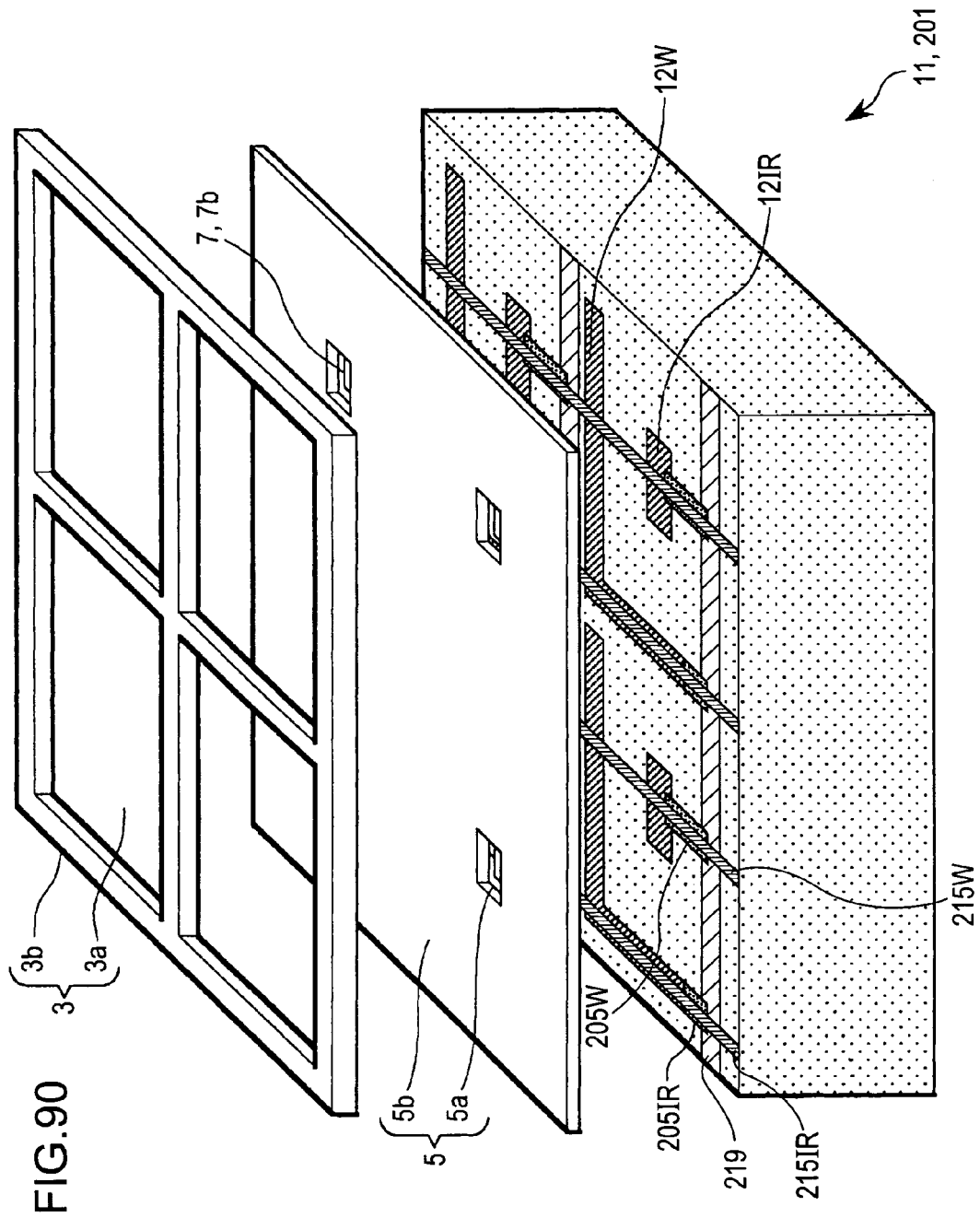

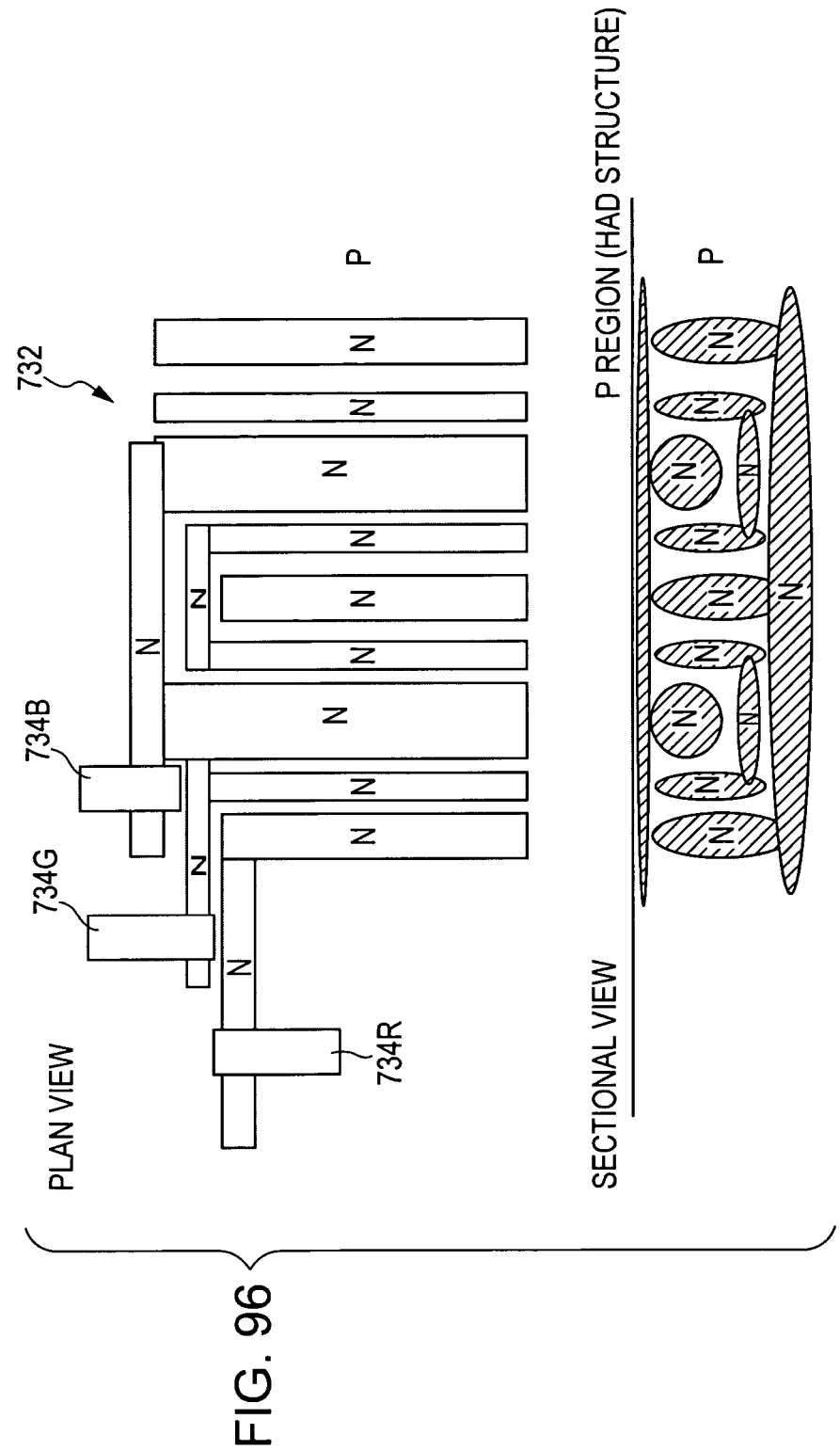

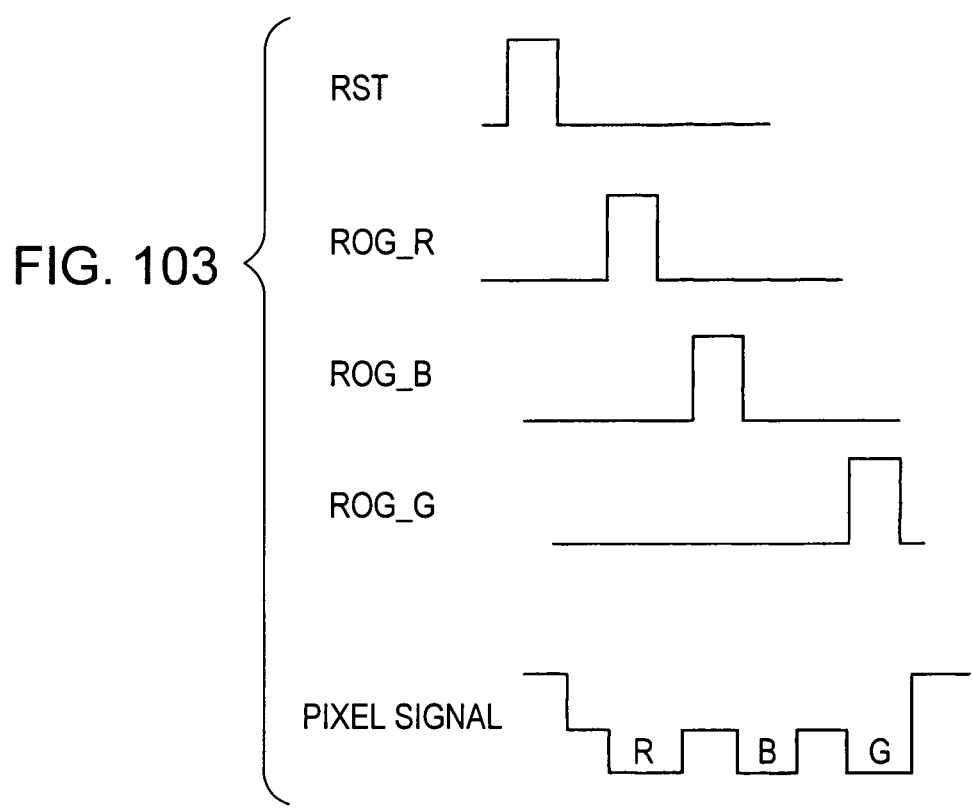

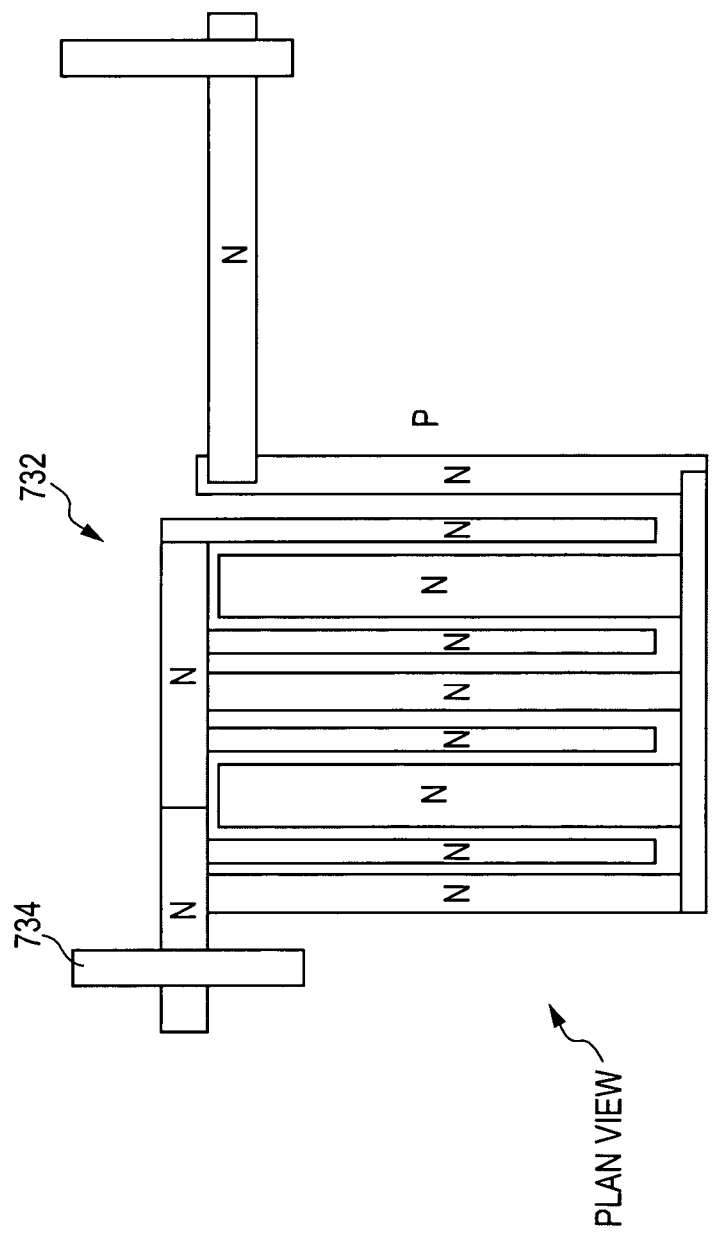

IR=(W+IR)−W (CALCULATION FOR OBTAINING PIXEL SIGNAL OF IR COMPONENT)

LIGHT ABSORPTION SPECTRUM
OF SEMICONDUCTOR

LIGHT ABSORPTION
OF SEMICONDUCTOR
(DEPTH DIRECTION)

INFORMATION ACQUIRING METHOD, INFORMATION ACQUIRING APPARATUS, SEMICONDUCTOR DEVICE COMPRISING ARRAY OF PLURALITY OF UNIT COMPONENTS FOR DETECTING PHYSICAL QUANTITY DISTRIBUTION, AND SEMICONDUCTOR MANUFACTURING METHOD

CROSS PREFERENCE TO RELATED APPLICATIONS

The present invention claims the benefit of Japanese Patent Application JP 2004-250049 filed in the Japanese Patent Office on Aug. 30, 2004, the entire contents of which are incorporated herein by reference.

FIELD OF THE INVENTION

The present invention relates to a physical information acquiring method, a physical information acquiring apparatus, a semiconductor device comprising an array of a plurality of unit components for detecting a physical quantity distribution, and a semiconductor manufacturing method. For example, the present invention relates to an imaging method and imaging apparatus using a semiconductor device for detecting a physical quantity distribution, a drive controlling device for an imaging device, and a method for manufacturing an imaging device. The device includes a CMOS image sensor and a CCD sensor. The apparatus includes a camera and a camera module.

More specifically, the present invention relates to a signal acquiring technique suitable for application to a solid-state image sensing device using a semiconductor device for detecting a physical quantity distribution, the semiconductor device comprising an array of a plurality of unit components sensitive to electromagnetic waves such as light, radiation, or the like, which is input from the outside, so that a physical quantity distribution can be converted to an electric signal by the unit components and can be read as the electric signal.

BACKGROUND OF THE INVENTION

A semiconductor device for detecting a physical quantity distribution has been used in various fields, the semiconductor device comprising a line or matrix array of a plurality of unit components (for example, pixels) sensitive to changes in physical quantities of electromagnetic waves such as light, radiation, or the like, which is input from the outside.

For example, in the field of picture devices, CCD (Charge Coupled Device), MOS (Metal Oxide Semiconductor), CMOS (Complementary Metal Oxide Semiconductor) solid-state image sensing devices are used for detecting changes in light (an example of electromagnetic waves) as an example of physical quantities. In these devices, a physical quantity distribution is converted to an electric signal by unit components (in a solid-state image sensing device, pixels) and is read as the electric signal.

For example, in a solid-state image sensing device, a photodiode serving as a photoelectric conversion element (light-receiving element: photosensor) and provided in an image sensing portion (pixel potion) of a device portion detects an electromagnetic wave such as light, radiation, or the like, which is input from the outside, to generate signal electric charge and store it, so that the stored signal electric charge (photoelectron) is read as image information.

In order to acquire a signal having color information by a single image sensing device, a conventional single-plate solid-state image sensing device for color images mainly comprises a color filter (color separating filter) provided on the light-receiving surface side of an imaging portion, for discriminating (separating) among colors.

In this case, an individual color component must be aligned to a photoelectric conversion element constituting each pixel, and the unit of color separation corresponds to the repetition period of the color separating filter.

Examples of color filter combination include a primary color system using the three colors including red (R), green (G), and blue (B), and a complementary color system using the four colors including yellow (Y), cyan (C), magenta (M), and green (G). The primary color system has higher color reproducibility than that of the complementary color system, but the complementary color system is advantageous in that a color filter has high transmittance to cause high sensitivity. In reproducing an image, color signals (for example, primary color signals of R, G, and B) obtained using the primary color-system or complementary color-system color filter are processed to synthesize a luminance signal and color-difference signal.

Any one of combinations of primary color- or complementary color-system color filters includes a subtractive color filter in which only a specified wavelength region component is transmitted and led to a photoelectric conversion element, and other wavelength region components are cut off for performing color selection.

For example, when a light-detecting semiconductor layer is provided as a photoelectric conversion element below each of subtractive color filters of the three primary colors, i.e., red, green, and blue, which are used for discriminating among colors, light of each of the primary colors transmitted through the respective subtractive color filters can be individually detected.

However, a subtractive color filter system has low efficiency of light utilization because a large quantity of light is cut off. In particular, when filters of the primary colors, i.e., red, green, and blue, are used for discriminating among the colors, the quantity of light is decreased to ⅓ or less.

Also, a photoelectric conversion element is required for each color, and thus at least tree photoelectric conversion elements are required for one unit of color separation, thereby causing difficulty in realizing a high-density pixel sensor. Furthermore, a color separating filter is required to increase cost.

In order to solvent the problems of such a subtractive color filter, a sensor has been recently proposed, in which colors are discriminated using changes in absorption coefficient of a semiconductor with light wavelengths.

FIG. 113 is a drawing illustrating the mechanism of the sensor. FIG. 113(A) is a drawing showing the light absorption spectral characteristics of a semiconductor layer, and FIG. 113(B) is a schematic drawing showing the sectional structure of a device.

In the mechanism, the absorption coefficient of a Si (silicon) semiconductor for the primary color lights decreases in the order of blue, green, and red, as shown by 113(A). Namely, for blue color light, green color light, and red color light contained in incident light L1, the position dependence in the depth direction according to wavelengths is utilized, and layers for detecting the blue, green, and red color lights are provided in that order from the surface of the Si semiconductor in the depth direction, as shown in FIG. 113(B).

However, in the mechanism which utilizes changes in absorption coefficient with wavelengths, the quantity of light which can be theoretically detected is not decreased, but red color light and blue color light are absorbed by the blue color light detecting layer to some extent when being passed therethrough, and are thus detected as blue color light. Therefore, even when there is originally no blue signal, a blue signal is generated by absorption of green light and red light to produce alias, thereby failing to achieve sufficient color reproducibility.

In order to avoid this problem, correction by computation signal processing must be required for all signals of the primary colors, and thus a circuit must be separately required for computation, thereby complicating and scaling-up the circuit configuration and increasing the cost. Furthermore, for example, when one of the primary colors is saturated, the original value of light of the saturated color cannot be determined to cause error in computation. As a result, a signal of the color is processed differently from the original color.

Also, as shown in FIG. 113(A), most of semiconductors have absorption sensitivity to infrared light. Therefore, for example, in a solid-state image sensing device (image sensor) using a Si semiconductor, an infrared cut filter must be provided as an example of subtractive filter in front of the sensor.

On the other hand, there have recently been demands for a single a solid-state image sensing device to simultaneously take a visible light image and an infrared light image. For example, an infrared luminous point is previously prepared so that an infrared luminous point in the visible image can be detected by tracing the previously prepared infrared luminous point. For example, in the night without visible light, a clear image can be obtained by imaging with infrared irradiation.

In order to receive infrared light as a signal to take an image, it is necessary to remove an infrared cut filter or decrease the ratio of the infrared light cut.

However, in this case, infrared light is mixed in visible light and incident on a photoelectric conversion element, thereby causing a difference between the color of a visible light image and the original color.

Apart from the above-described problem, visible light is cut to some extent by the infrared cut filter used in an ordinary solid-state image sensing device, and thus sensitivity is decreased. Also, the use of the infrared cut filter increases the cost.

The present invention has been achieved in consideration of the above situation, and an object of the invention is to provide a new semiconductor device capable of increasing (typically improving the conversion efficiency of light quantity) the quantity of electromagnetic waves (typically, quantity of light) incident per unit area (substantially a unit component such as a photoelectric conversion element) without using a subtractive color filter, a drive controlling technique and manufacturing method therefor, and a mechanism using the semiconductor device for acquiring physical information.

In an example, the invention provides a mechanism for an imaging technique capable of achieving high resolution and sufficient color reproducibility.

In another example, the invention provides a mechanism capable of simultaneously taking a visible light image with a correct color and an infrared or ultraviolet light image using a single semiconductor device.

SUMMARY OF THE INVENTION

A method for acquiring physical information according to the present invention uses a semiconductor device including a unit component comprising a diffraction grating in which scatterers are arrayed so that physical information is acquired by using the phenomenon that the interference patterns between diffracted waves produced by scattering of an electromagnetic wave by the scatterers change with wavelengths.

An apparatus to the present invention comprises a wavelength dispersion portion provided for separating an electromagnetic wave into a plurality of wavelength components by using a diffraction effect caused when the electromagnetic wave passes through openings and entering the wavelength components into adjacent different positions in the incidence surface, the openings being provided between respective cut-off portions for cutting off electromagnetic waves in parallel to the incidence surface side of the semiconductor device on which the electromagnetic wave is incident; respective wavelength detectors for detecting unit signals of the respective wavelength components separated by the wavelength dispersion portion; and a physical information acquiring portion for acquiring physical information for the predetermined purpose on the basis the unit signal of each of the wavelength components detected by the respective wavelength detection portions.

A semiconductor device of the present invention comprises at least a wavelength dispersion portion and respective wavelength detecting portions for detecting electromagnetic waves for respective wavelength components separated by the wavelength dispersion portion, the wavelength dispersion portion and the respective wavelength detecting portions being provided in a unit component.

A method for manufacturing a semiconductor device of the present invention comprises alternately laminating p-type and n-type semiconductor layers in a curved form to form respective wavelength detecting portions or successively repeating diffusions of n-type and p-type impurities through the same mask to form the respective wavelength detecting portions.

BRIEF DESCRIPTION OF THE DRAWINGS

FIG. 2 is a drawing illustrating the basic structure of a spectral image sensor using a diffraction grating.

FIG. 3 is an enlarged drawing showing one photodiode group of the spectral image sensor shown in FIG. 2.

FIG. 5 is a diagram of computation simulation (2) illustrating a method for dispersing visible light into a plurality of wavelength components on the basis of the concept shown in FIG. 2.

FIG. 7 is a table showing a relation of wavelength dispersion to the refractive index and extinction coefficient of Si used in a spectral image sensor.

Figure 6:
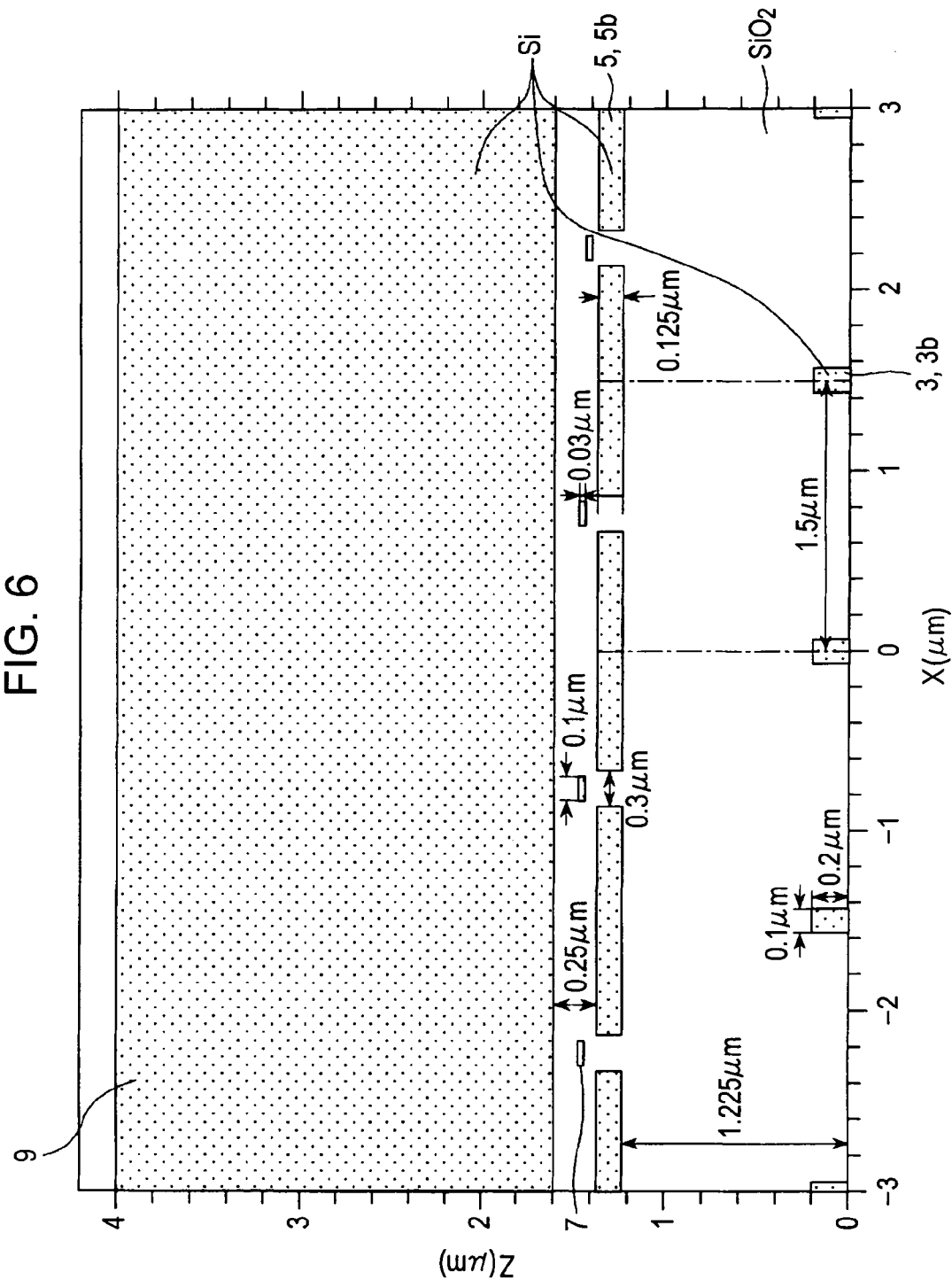
FIG. 6 is a diagram illustrating a spectral image sensor comprising a diffraction grating provided on the incidence surface side of a Si substrate according to an embodiment of the present invention.

incident on the light-receiving surface of a spectral image sensor having the characteristics shown in FIG. 7 and the structure shown in FIG. 6.

Figure 10:
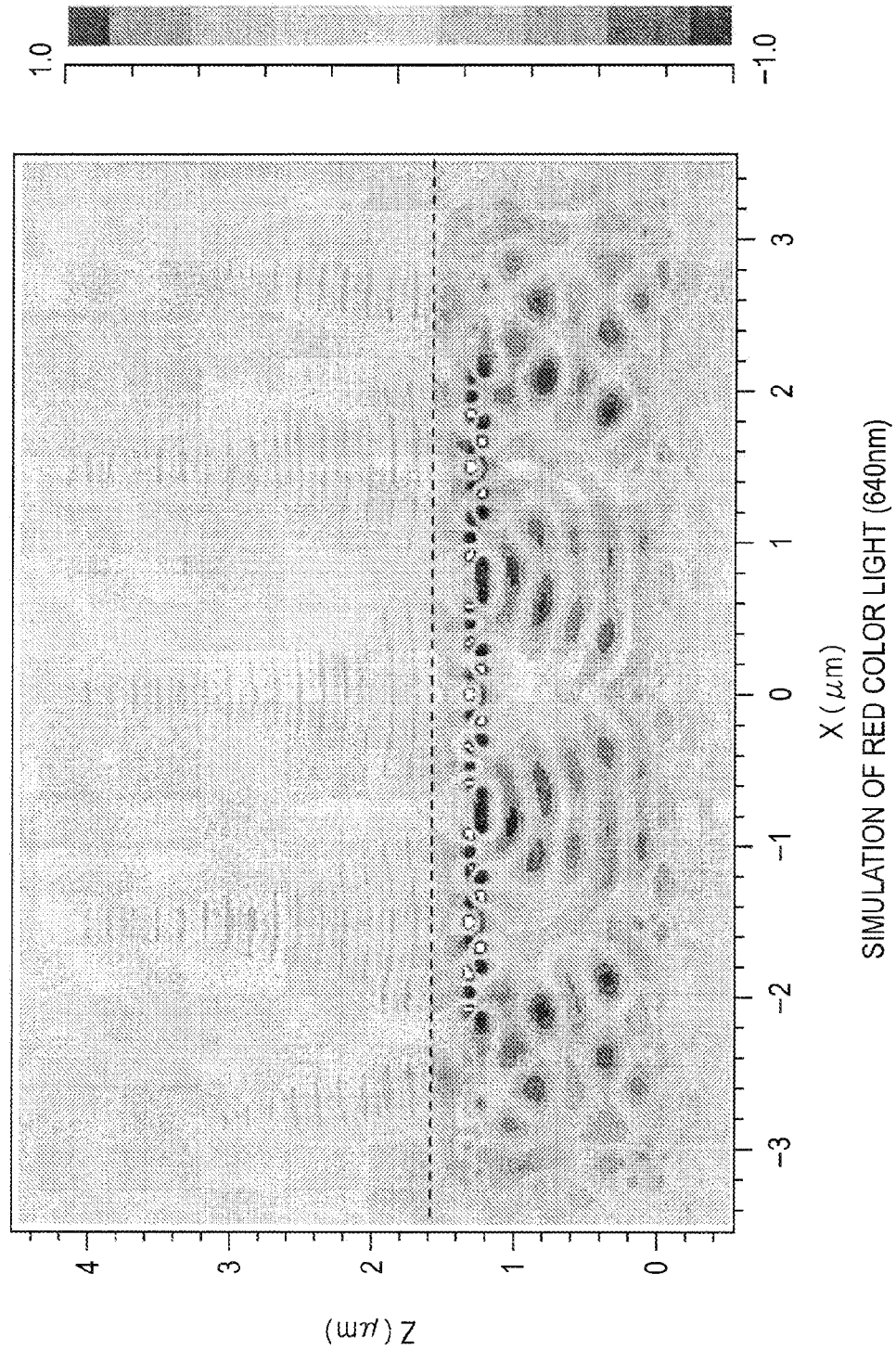

FIG. 10 is a diagram of computation simulation illustrating a spectral method using red light (wavelength 540 nm) incident on the light-receiving surface of a spectral image sensor having the characteristics shown in FIG. 7 and the structure shown in FIG. 6.

Figure 11:
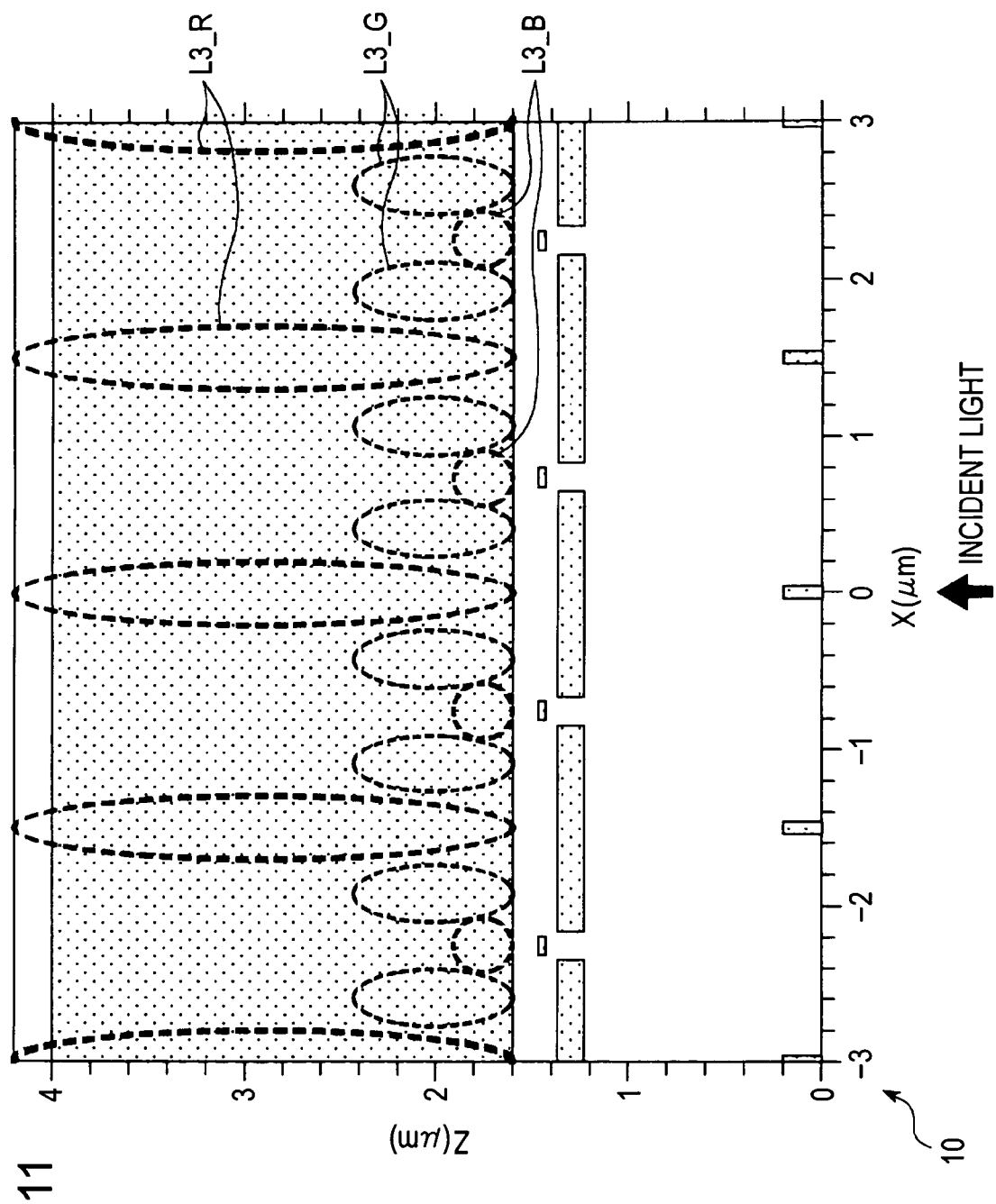

FIG. 11 is a diagram illustrating a proper example (first example) of detection positions for dispersion of a visible light band on the basis of simulation results.

Figure 12:
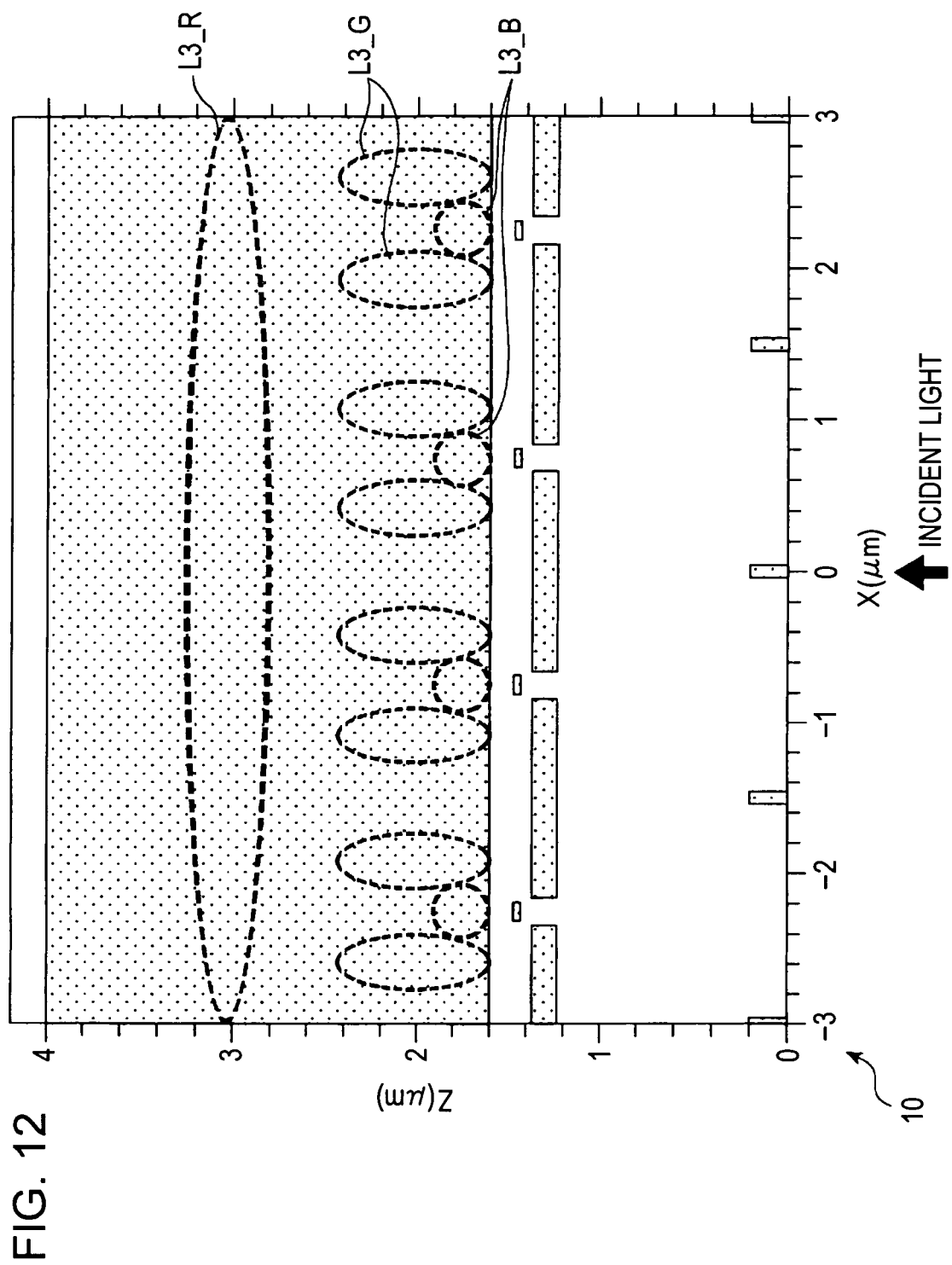

FIG. 12 is a diagram illustrating a proper example (second example) of detection positions for dispersion of a visible light band on the basis of simulation results.

Figure 13:
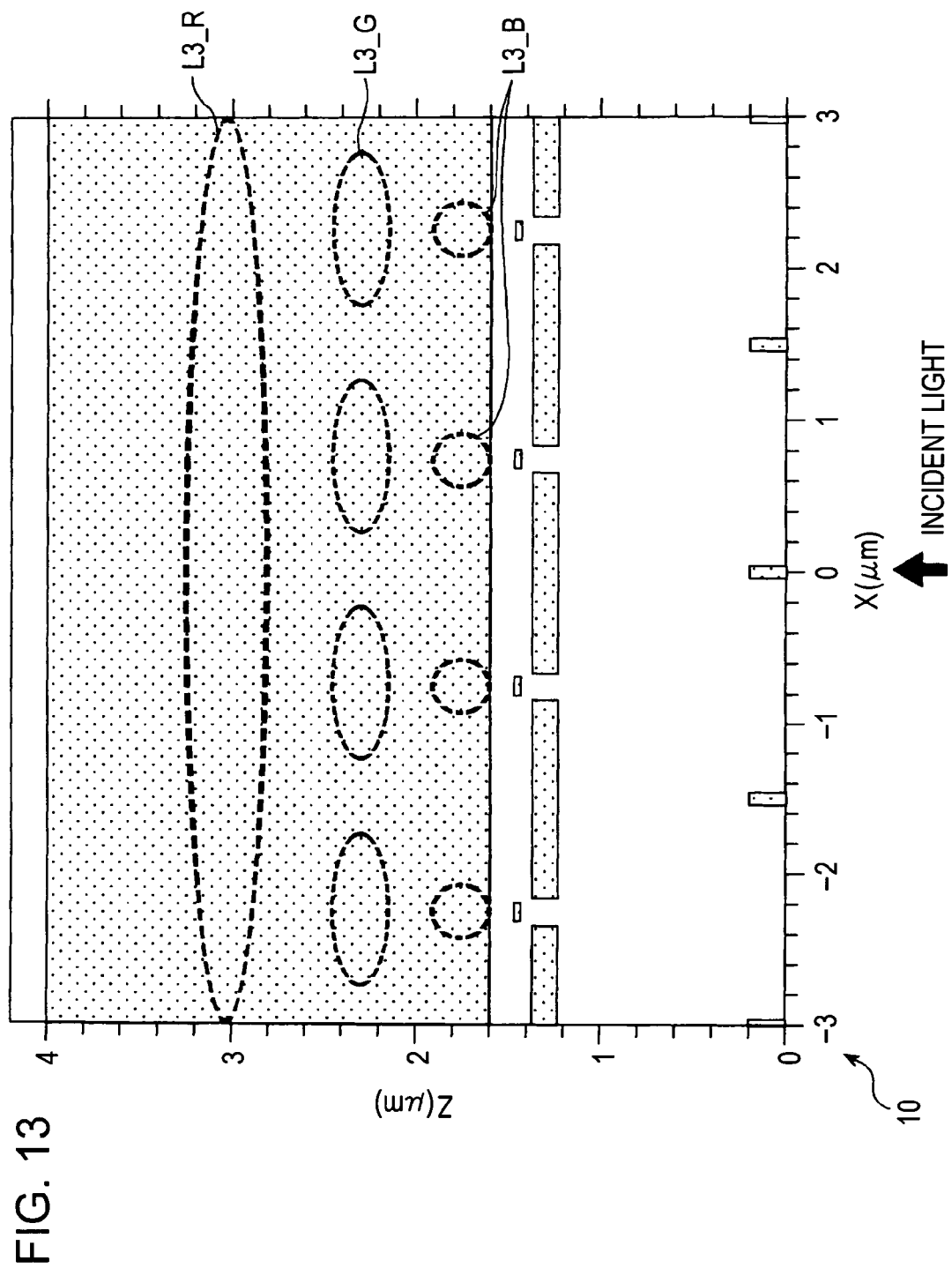

FIG. 13 is a diagram illustrating a proper example (third example) of detection positions for dispersion of a visible light band on the basis of simulation results.

FIG. 14 is a table showing another relation of wavelength dispersion to the refractive index and extinction coefficient of Si used in a spectral image sensor.

Figure 15:
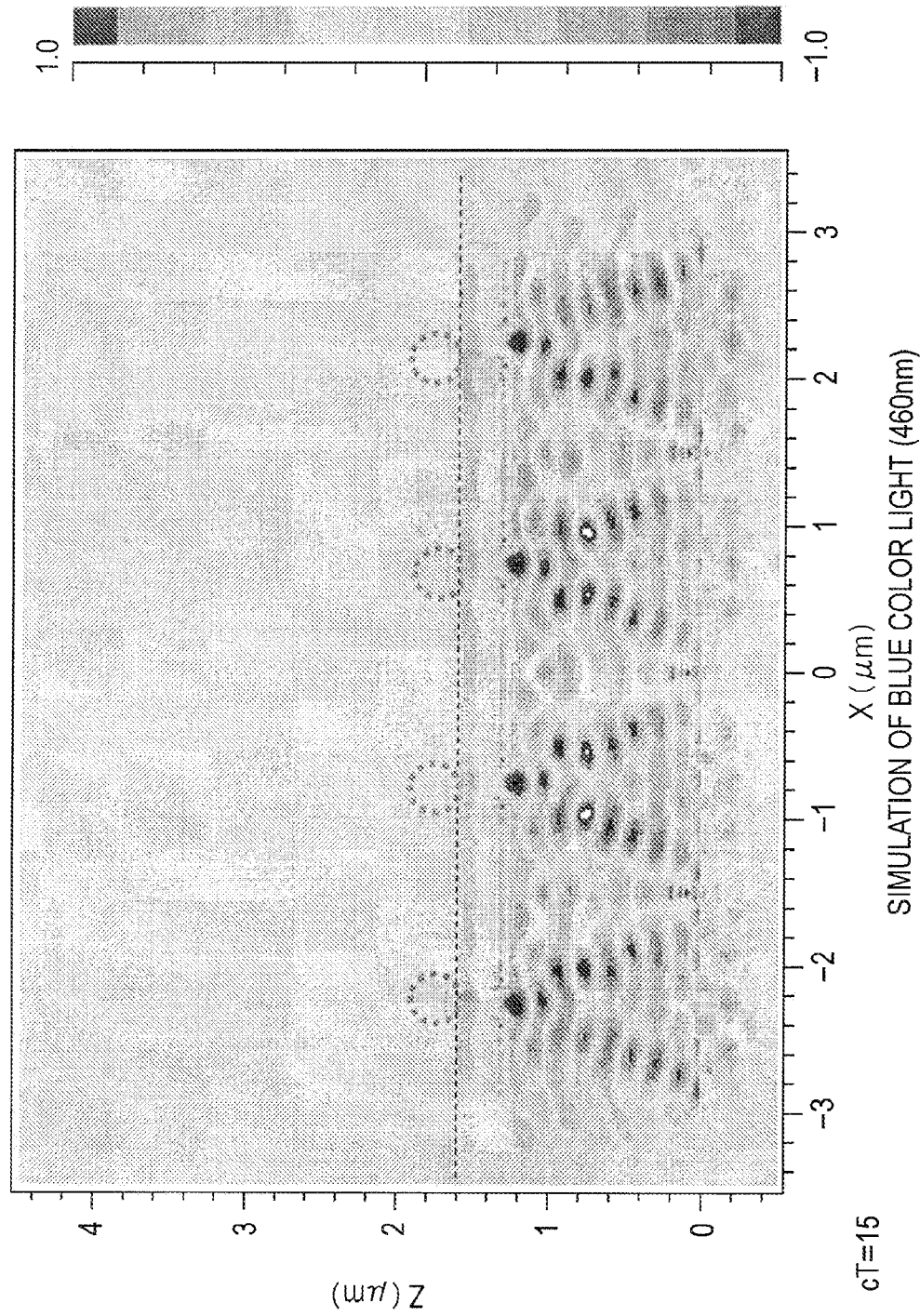

FIG. 15 is a diagram of computation simulation illustrating a spectral method using blue light (wavelength 460 nm) incident on the light-receiving surface of a spectral image sensor having the characteristics shown in FIG. 14 and the structure shown in FIG. 6.

Figure 16:
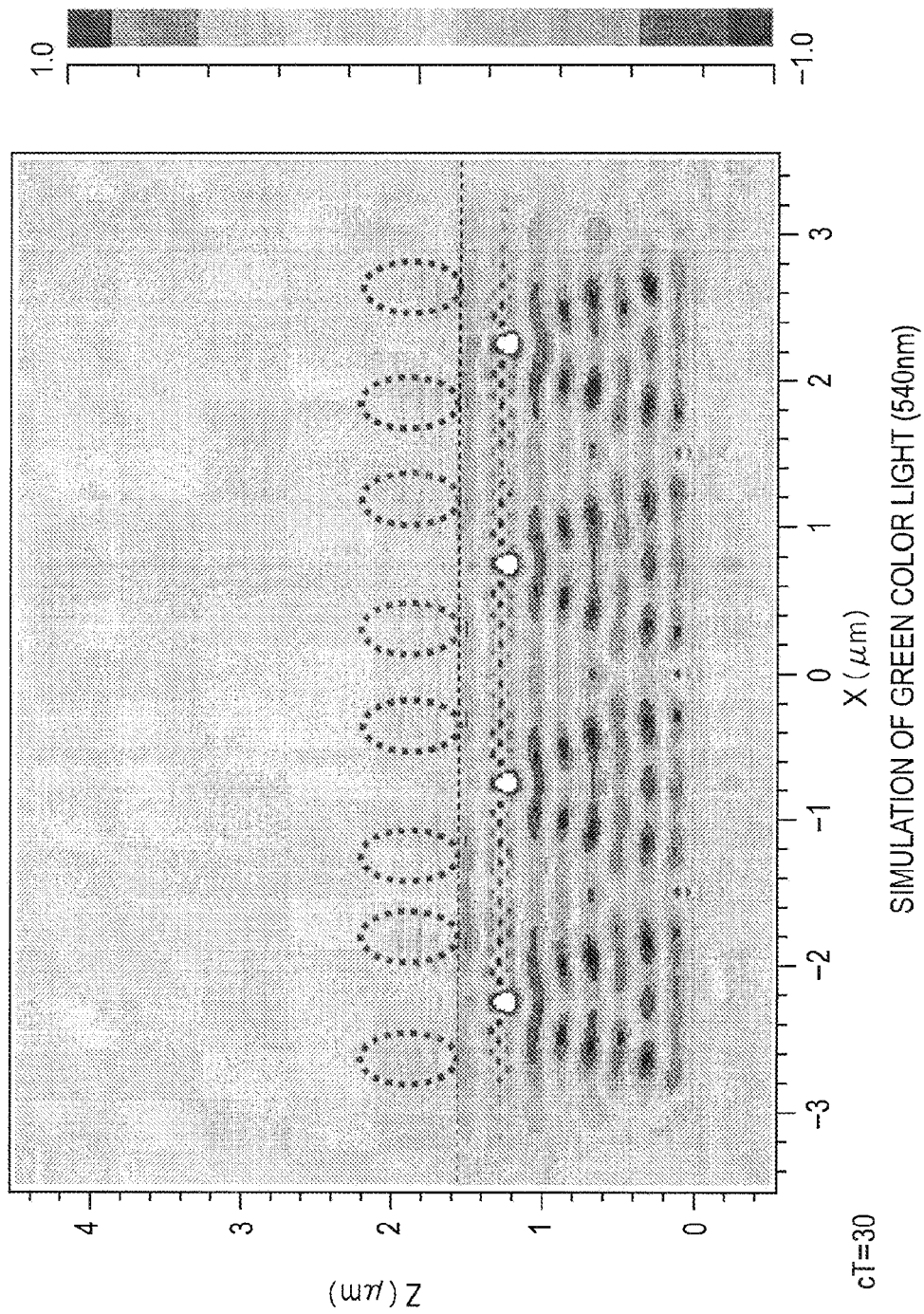

FIG. 16 is a diagram of computation simulation illustrating a spectral method using green light (wavelength 540 nm) incident on the light-receiving surface of a spectral image sensor having the characteristics shown in FIG. 14 and the structure shown in FIG. 6.

Figure 17:
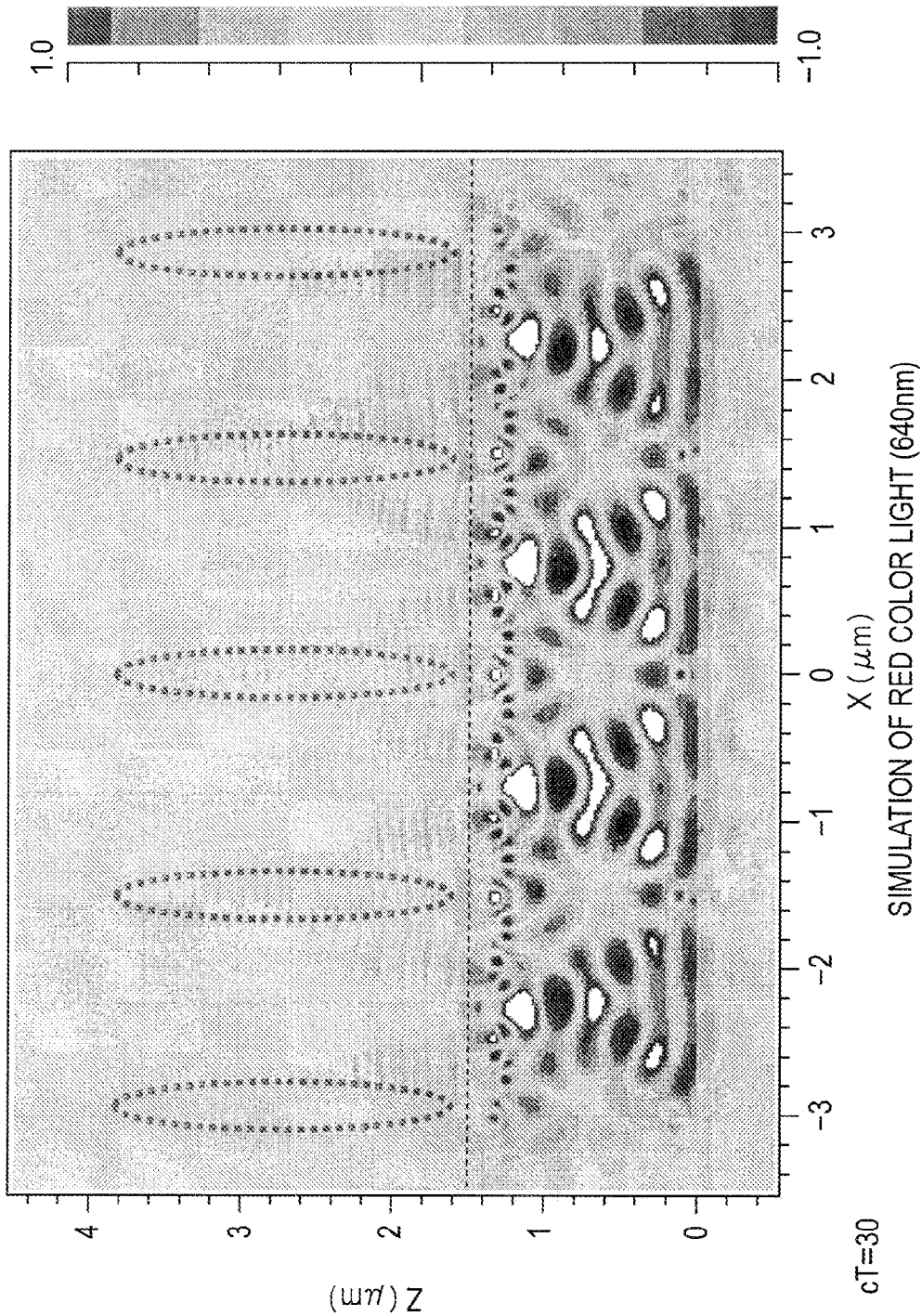

FIG. 17 is a diagram of computation simulation illustrating a spectral method using red light (wavelength 640 nm) incident on the light-receiving surface of a spectral image sensor having the characteristics shown in FIG. 14 and the structure shown in FIG. 6.

Figure 18:
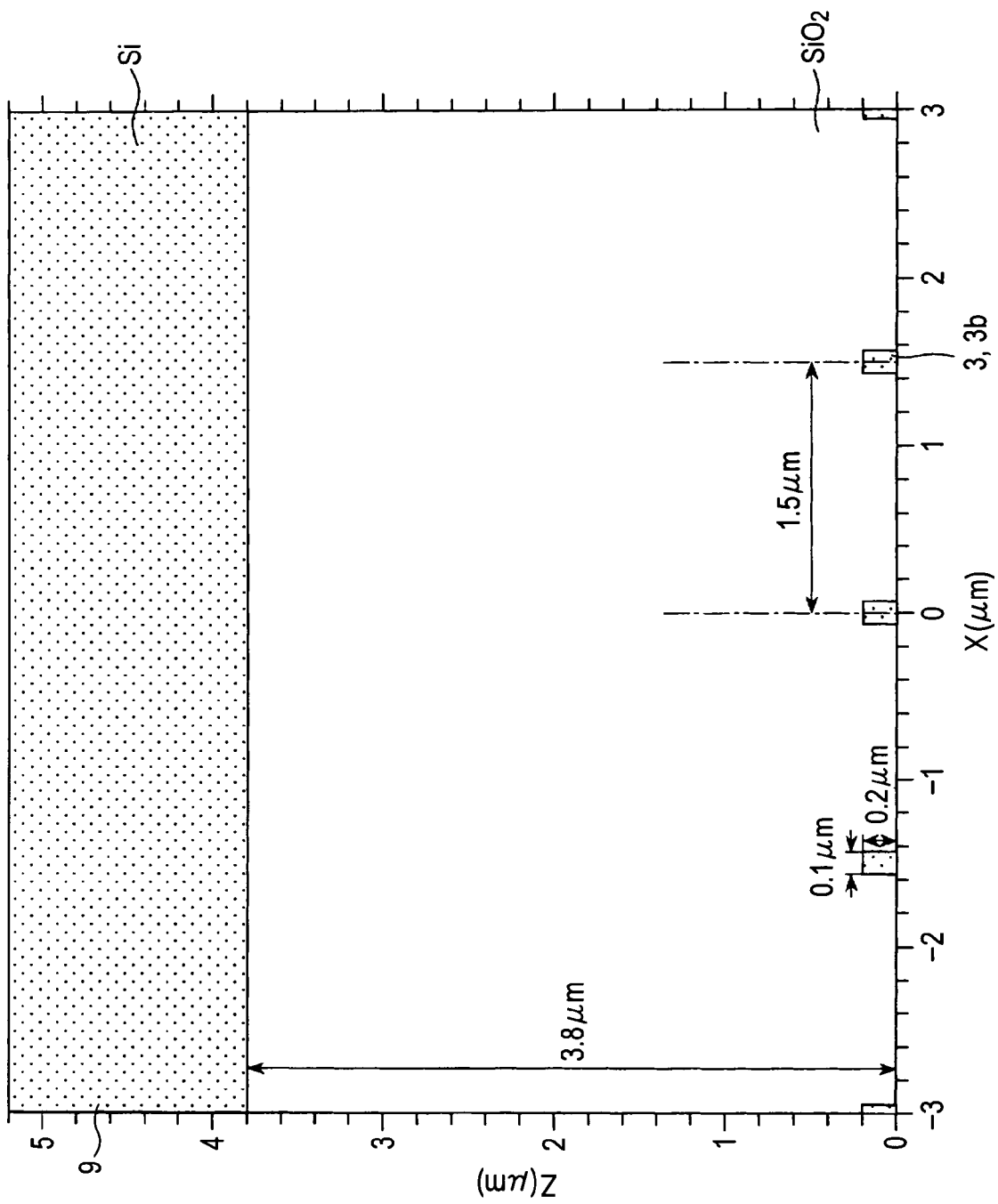

FIG. 18 is a drawing showing the sectional structure of a modified example of a wavelength dispersion portion.

Figure 19:
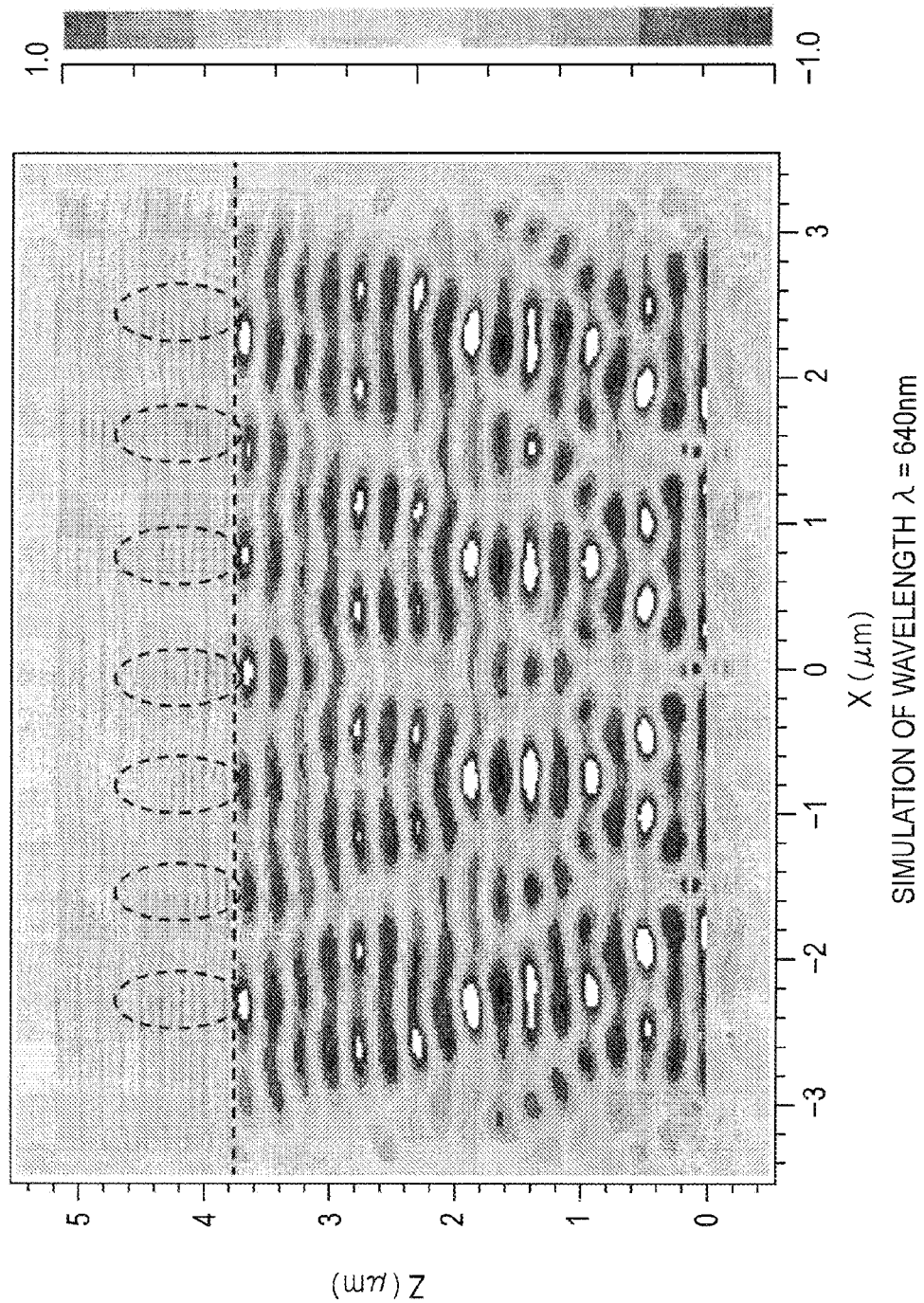

FIG. 19 is a diagram of computation simulation illustrating a spectral method using light at a wavelength of 640 nm incident on the light-receiving surface of a spectral image sensor having the characteristics shown in FIG. 7 and the structure shown in FIG. 18.

Figure 20:
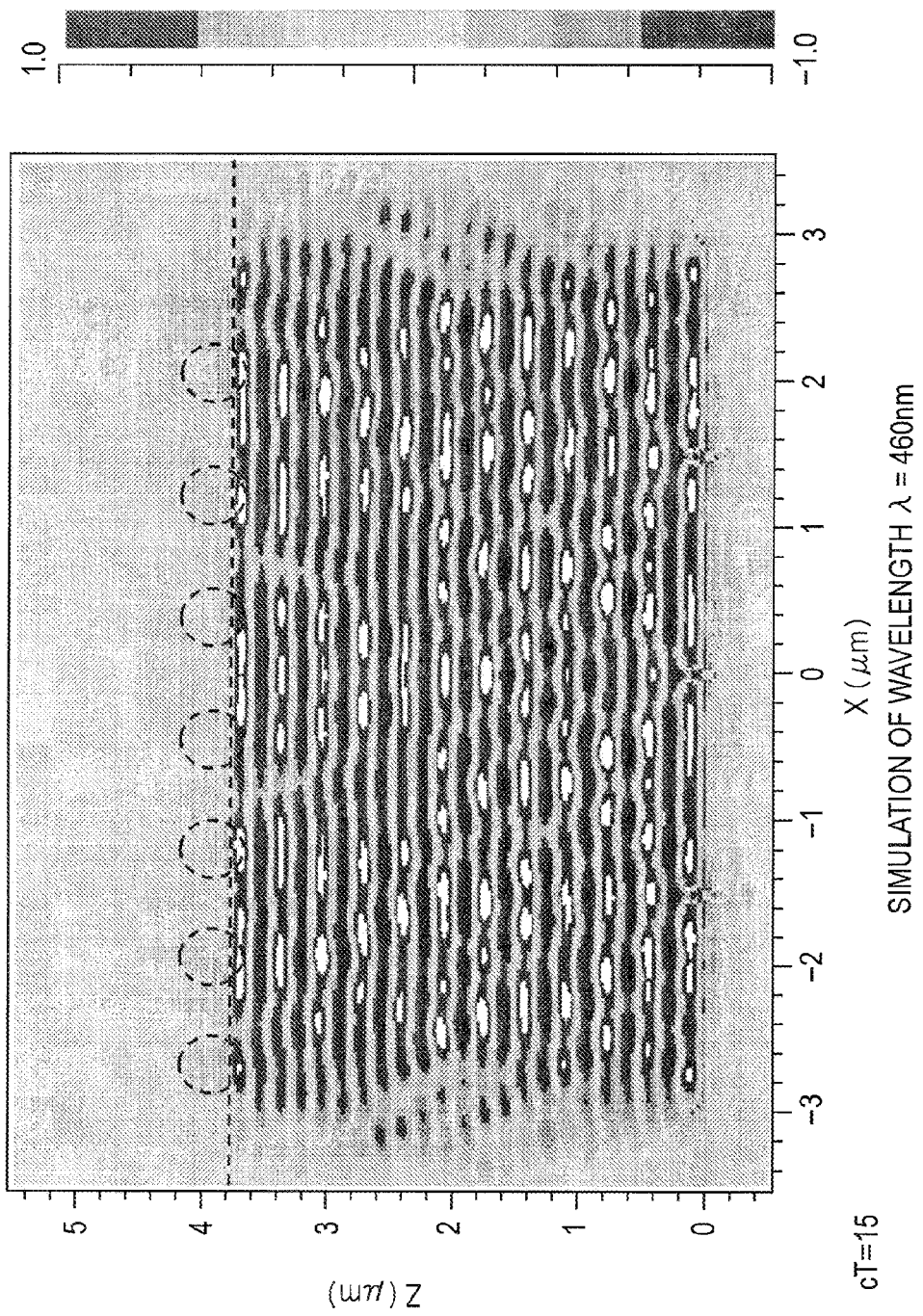

FIG. 20 is a diagram of computation simulation illustrating a spectral method using light at a wavelength of 460 nm incident on the light-receiving surface of a spectral image sensor having the characteristics shown in FIG. 7 and the structure shown in FIG. 18.

Figure 21:
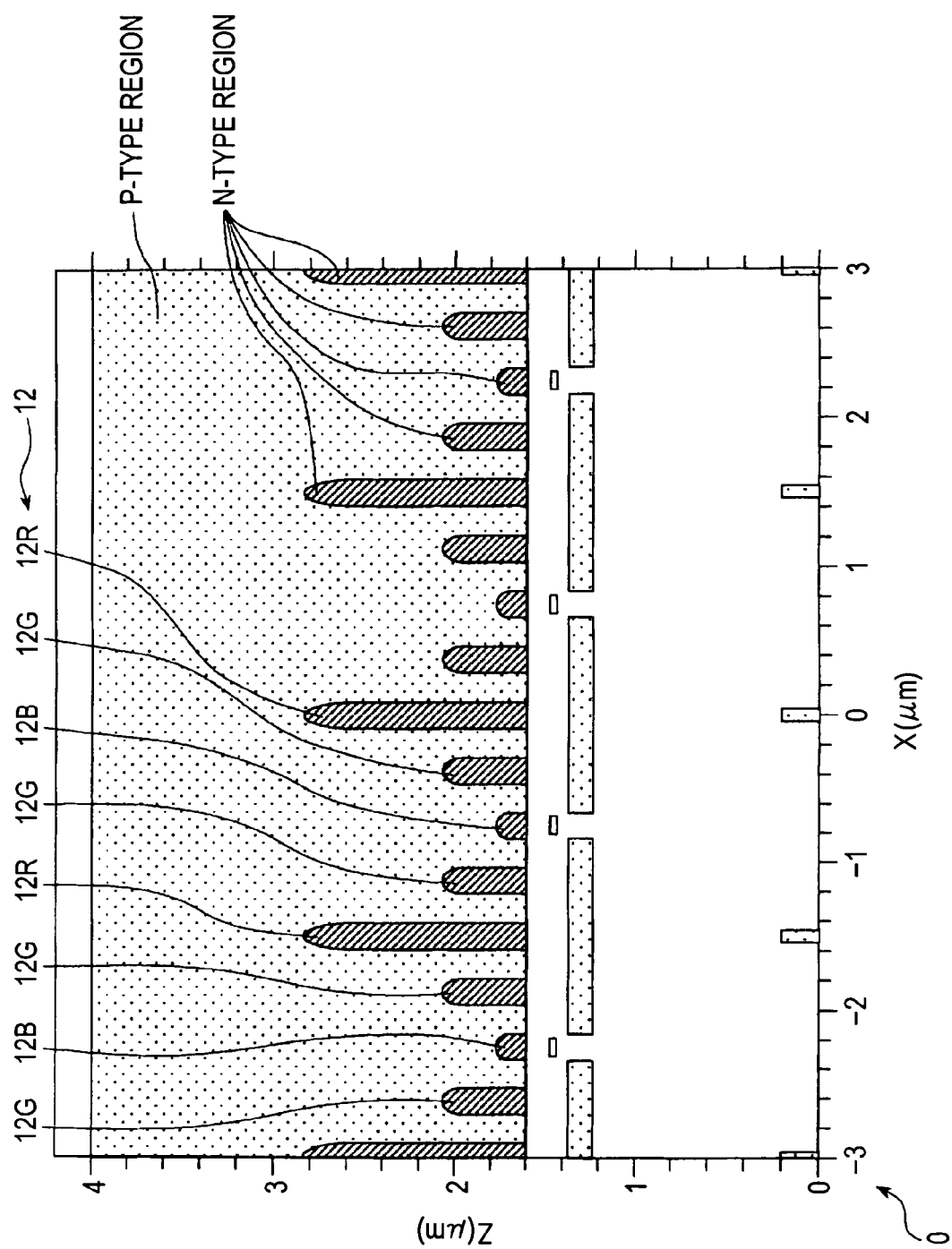

FIG. 21 is a sectional view showing a configuration example of a sensor structure of a first example corresponding to the detection positions shown in FIG. 11.

Figure 22:
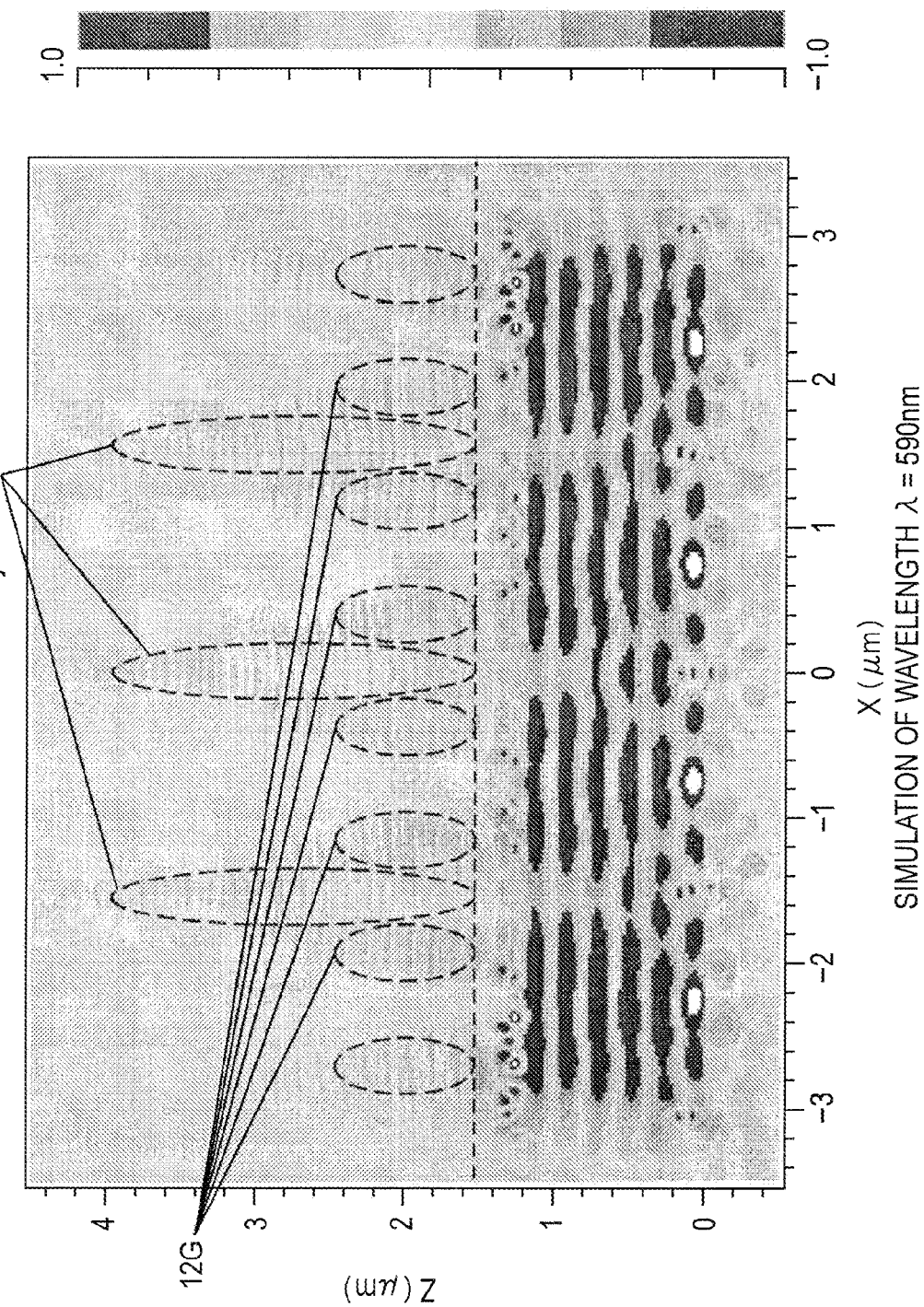

FIG. 22 is a diagram of computation simulation illustrating a spectral method using yellow light (wavelength $\lambda$=590 nm) incident on the device shown in FIG. 6.

Figure 23:
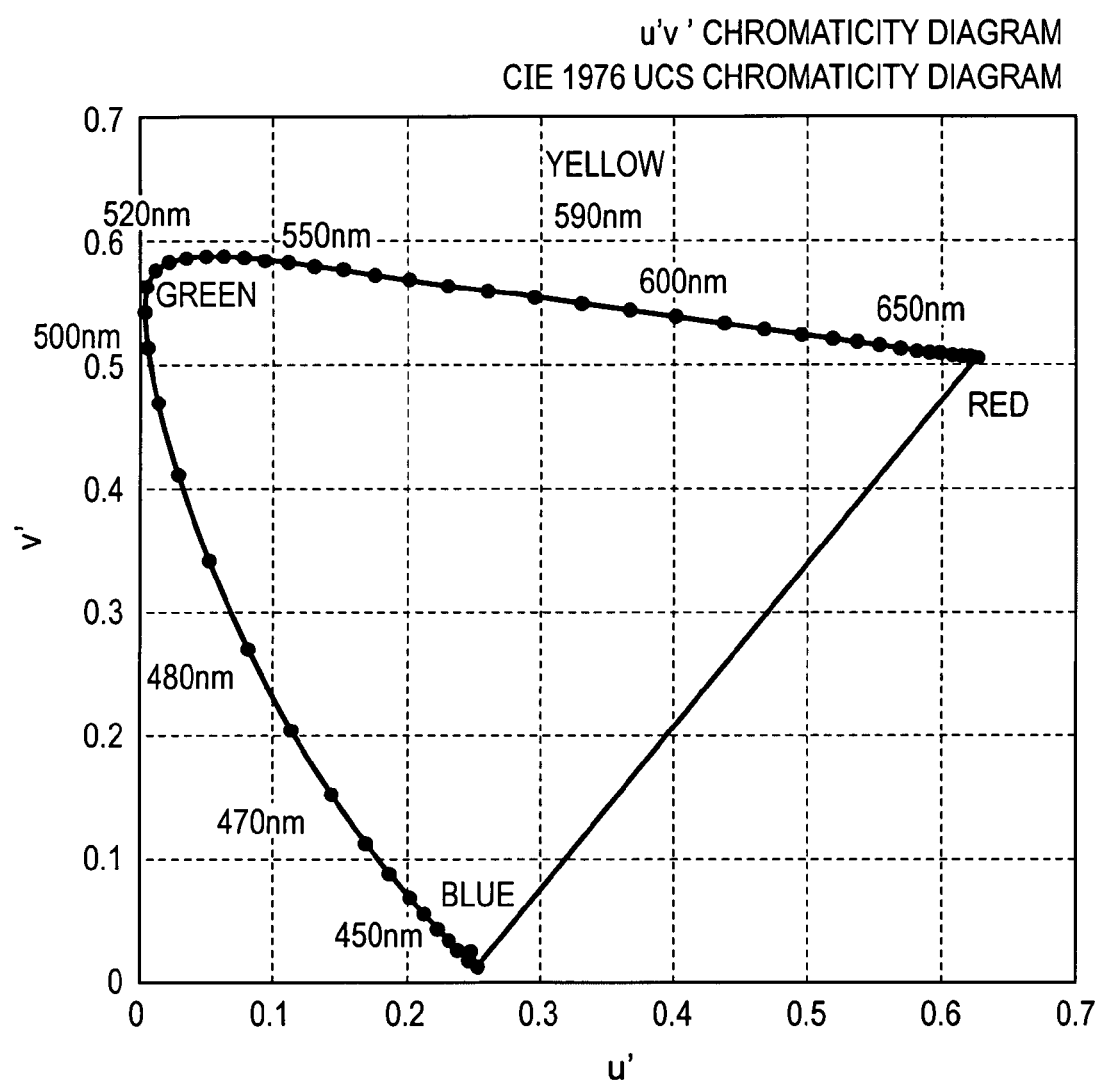

FIG. 23 is a CIE 1976 UCS/u'v' chromaticity diagram.

Figure 24:
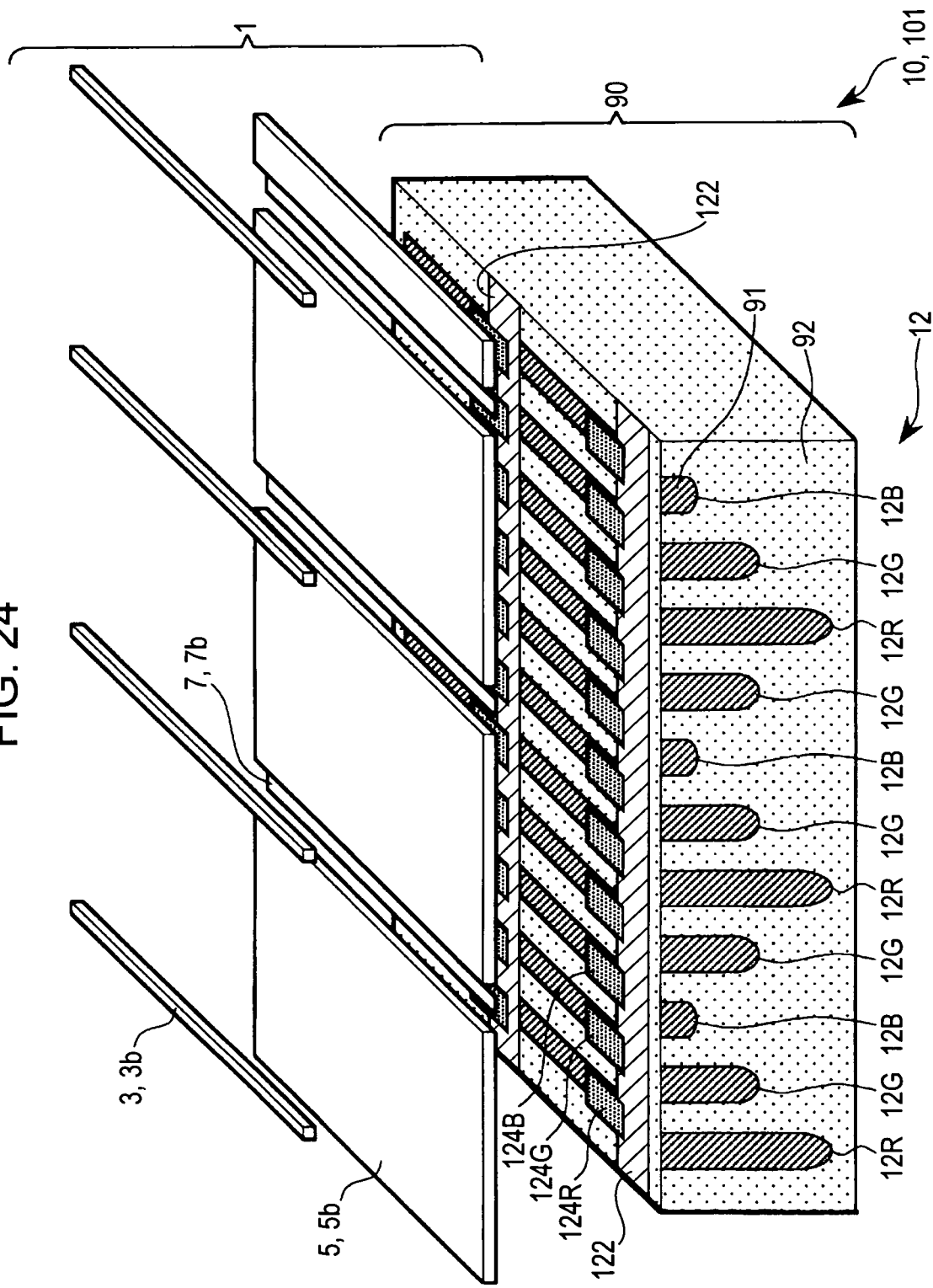

FIG. 24 is a sketch drawing showing an example of a structure when the sensor structure of the first example shown in FIG. 21 is applied to an IT_CCD image sensor.

Figure 25:
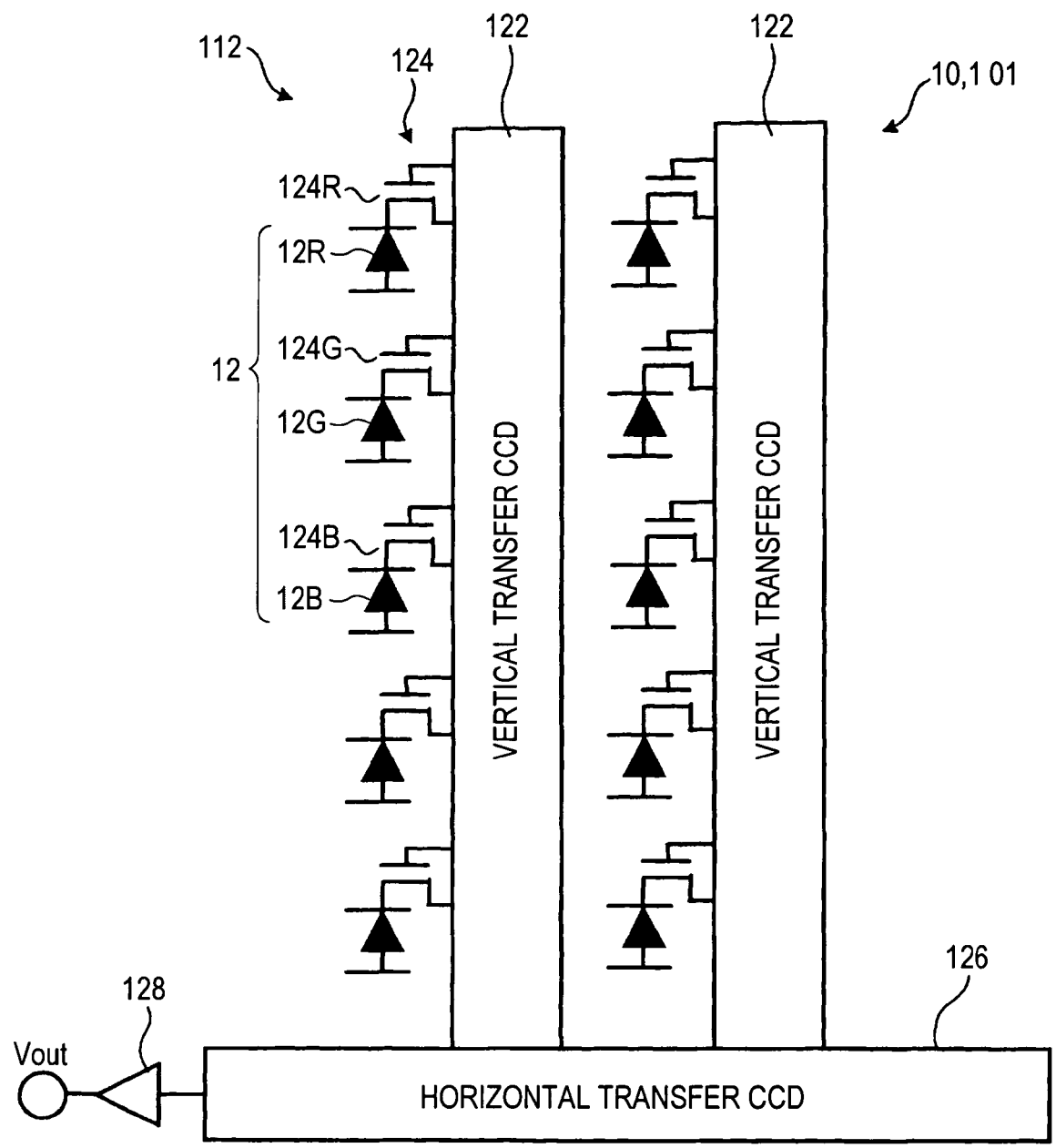

FIG. 25 is a drawing showing a circuit for application to an IT_CCD image sensor.

Figure 26:
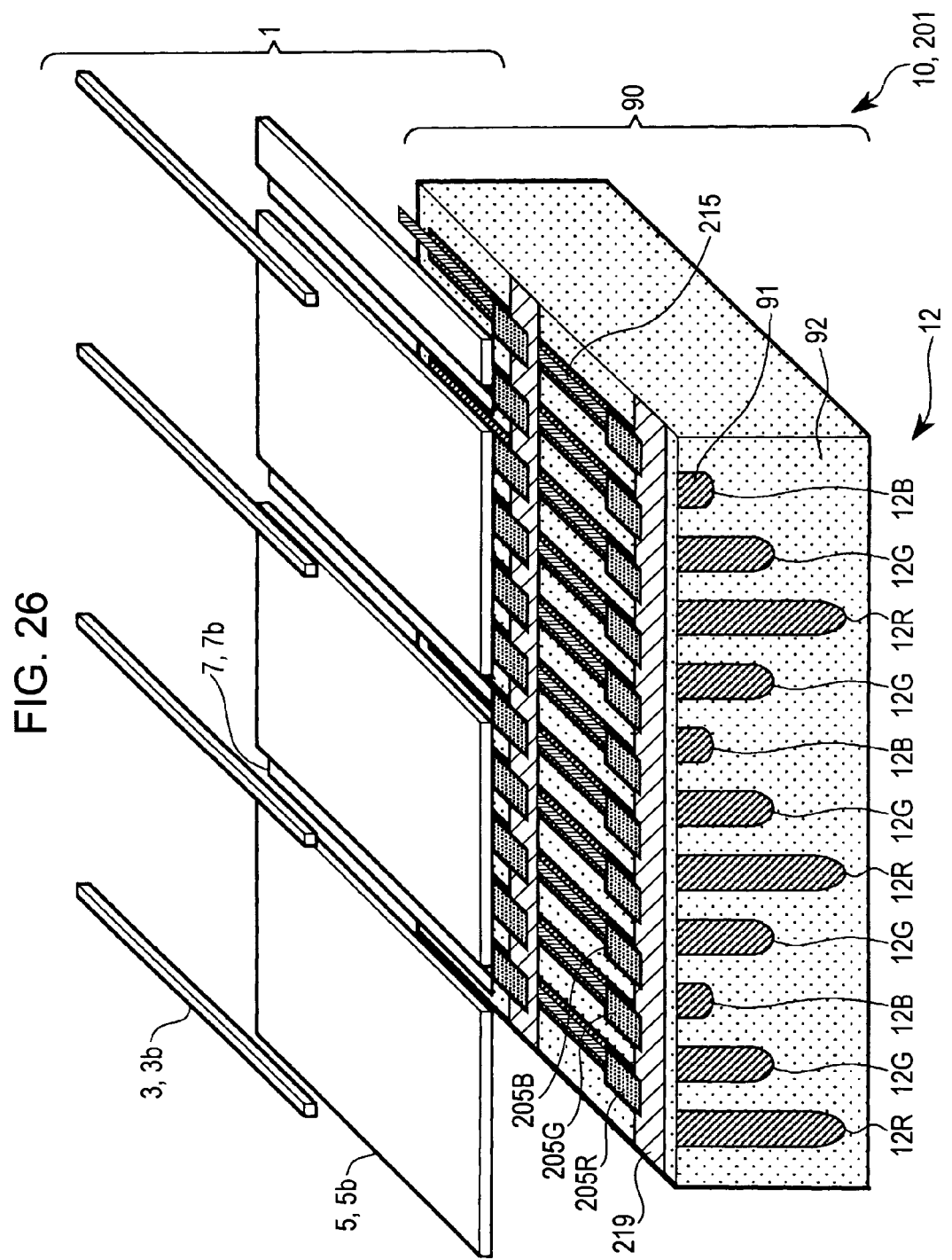

FIG. 26 is a sketch drawing showing an example of a structure when the sensor structure of the first example shown in FIG. 21 is applied to a CMOS image sensor.

Figure 27:
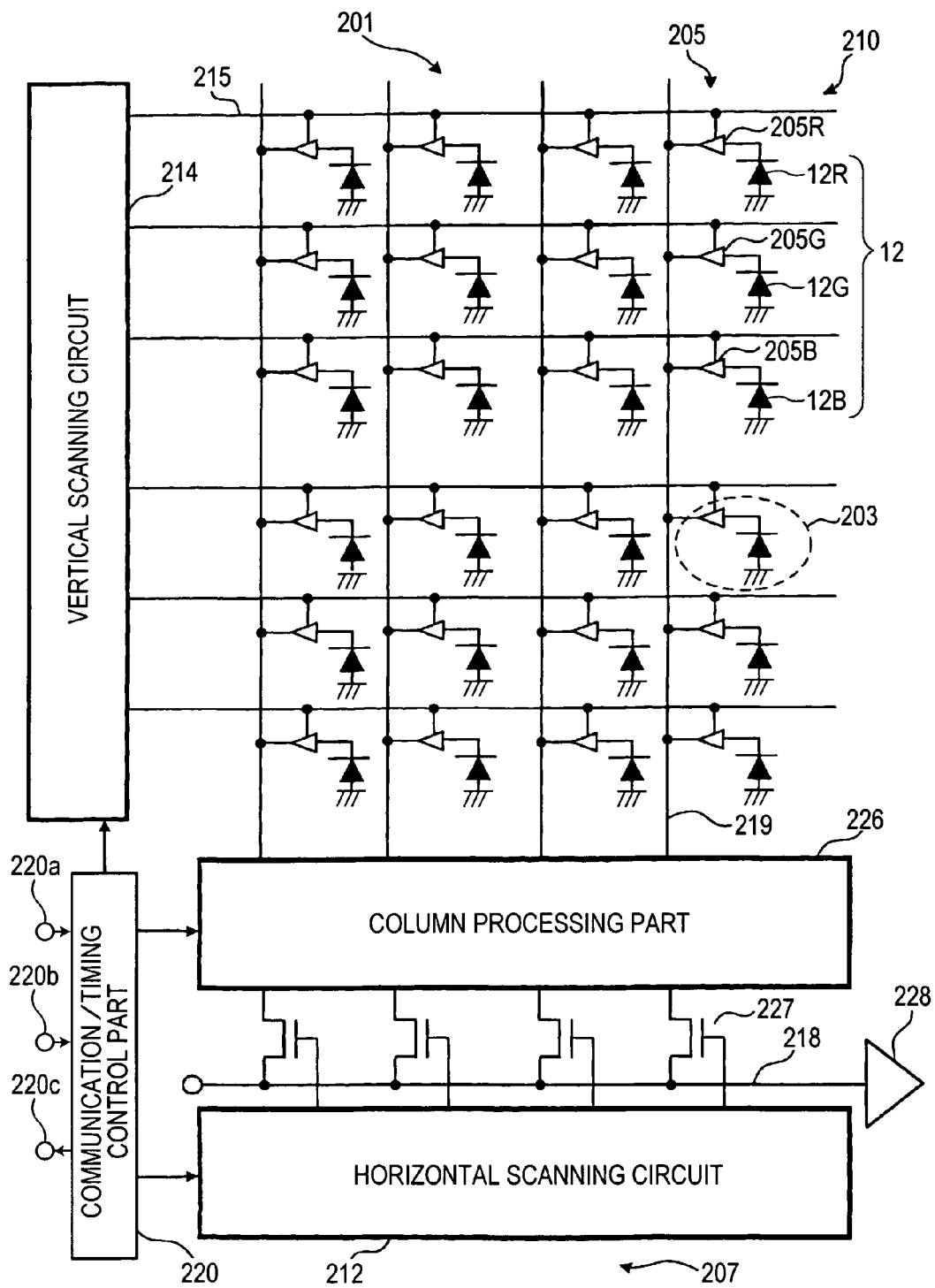

FIG. 27 is a drawing showing a circuit for application to a CMOS image sensor.

Figure 28:
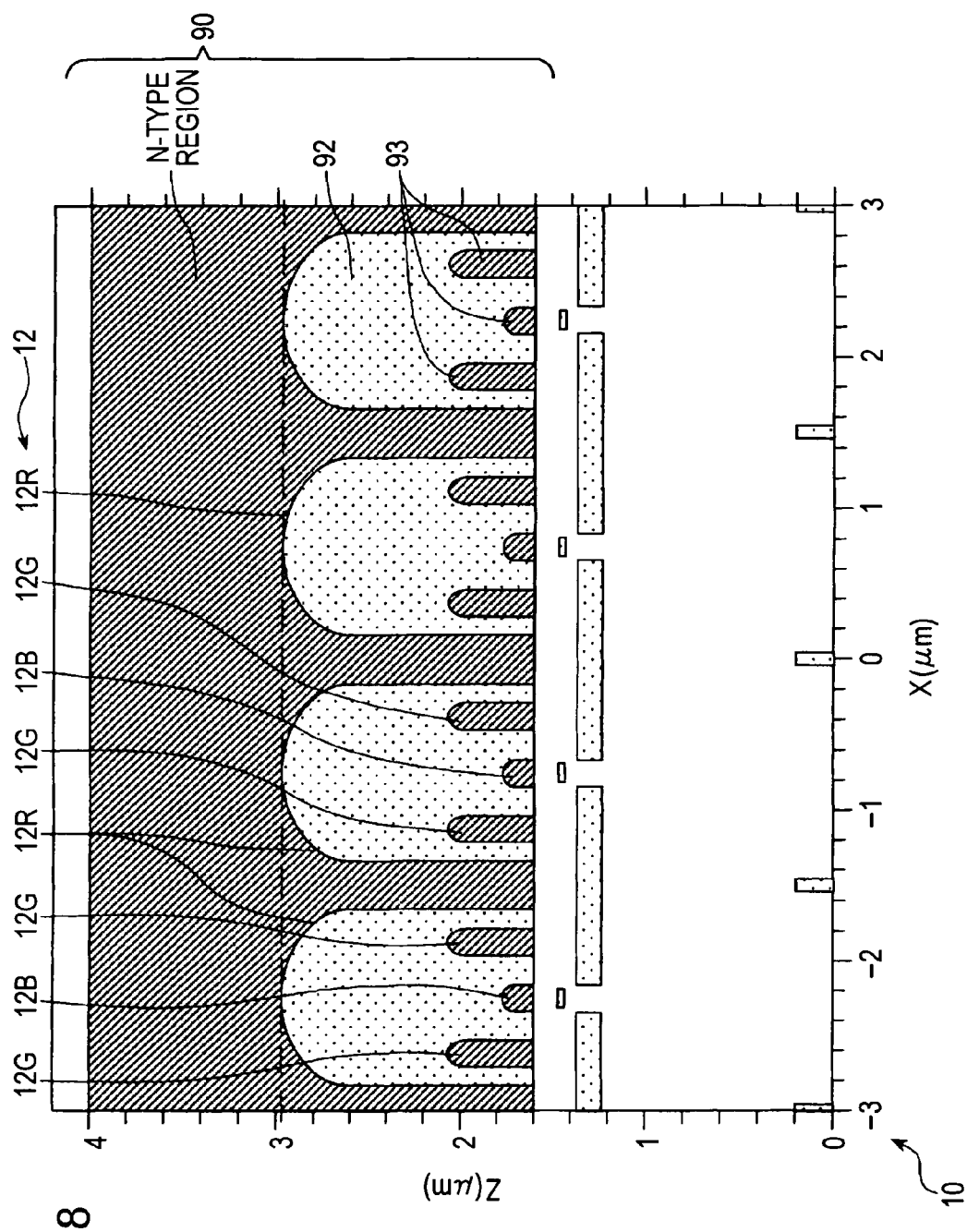

FIG. 28 is a sectional view showing a configuration example of a sensor structure of a second example corresponding to the detection positions shown in FIG. 12.

Figure 29:
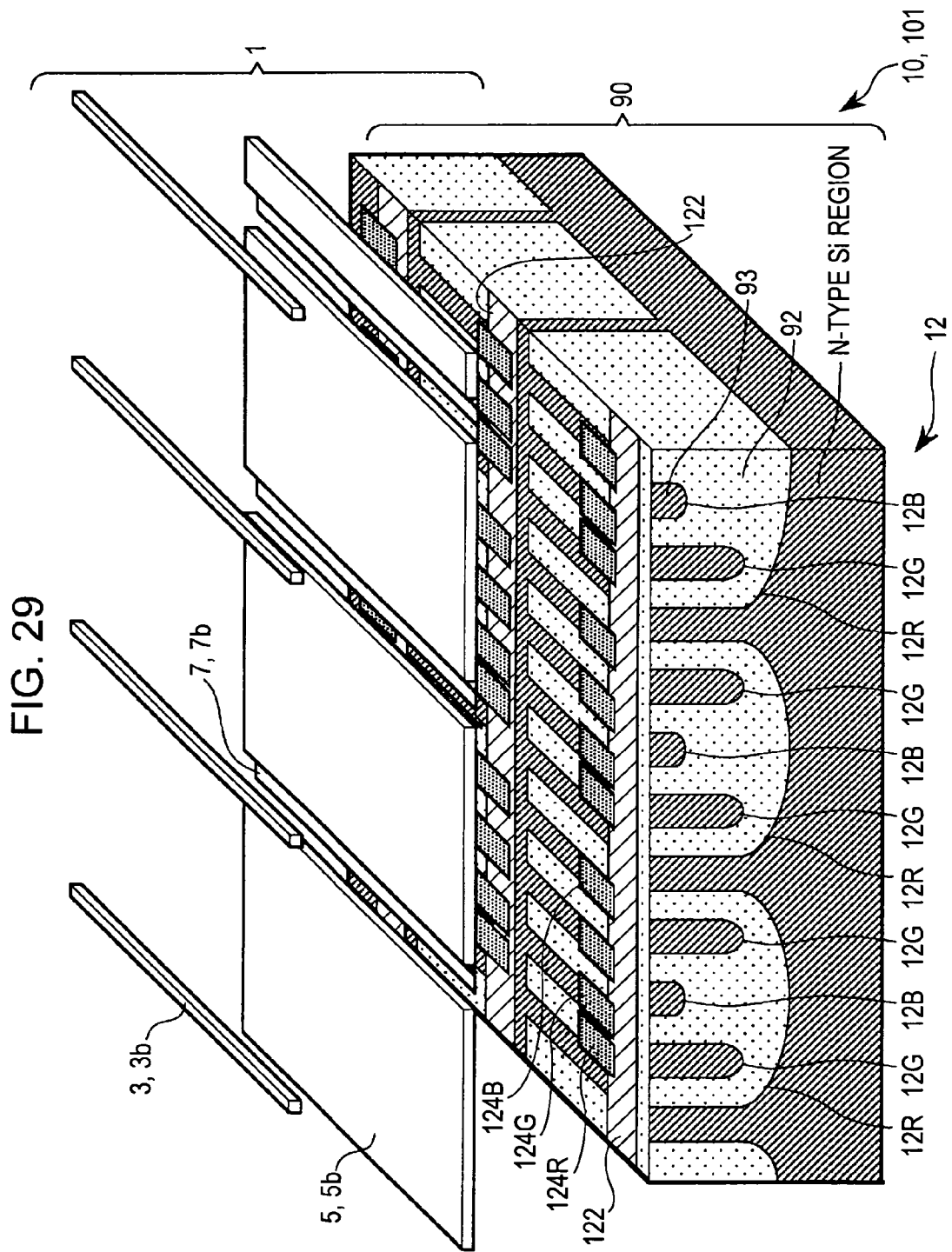

FIG. 29 is a sketch drawing showing an example of a structure when the sensor structure of the second example shown in FIG. 28 is applied to an IT_CCD image sensor.

Figure 30:
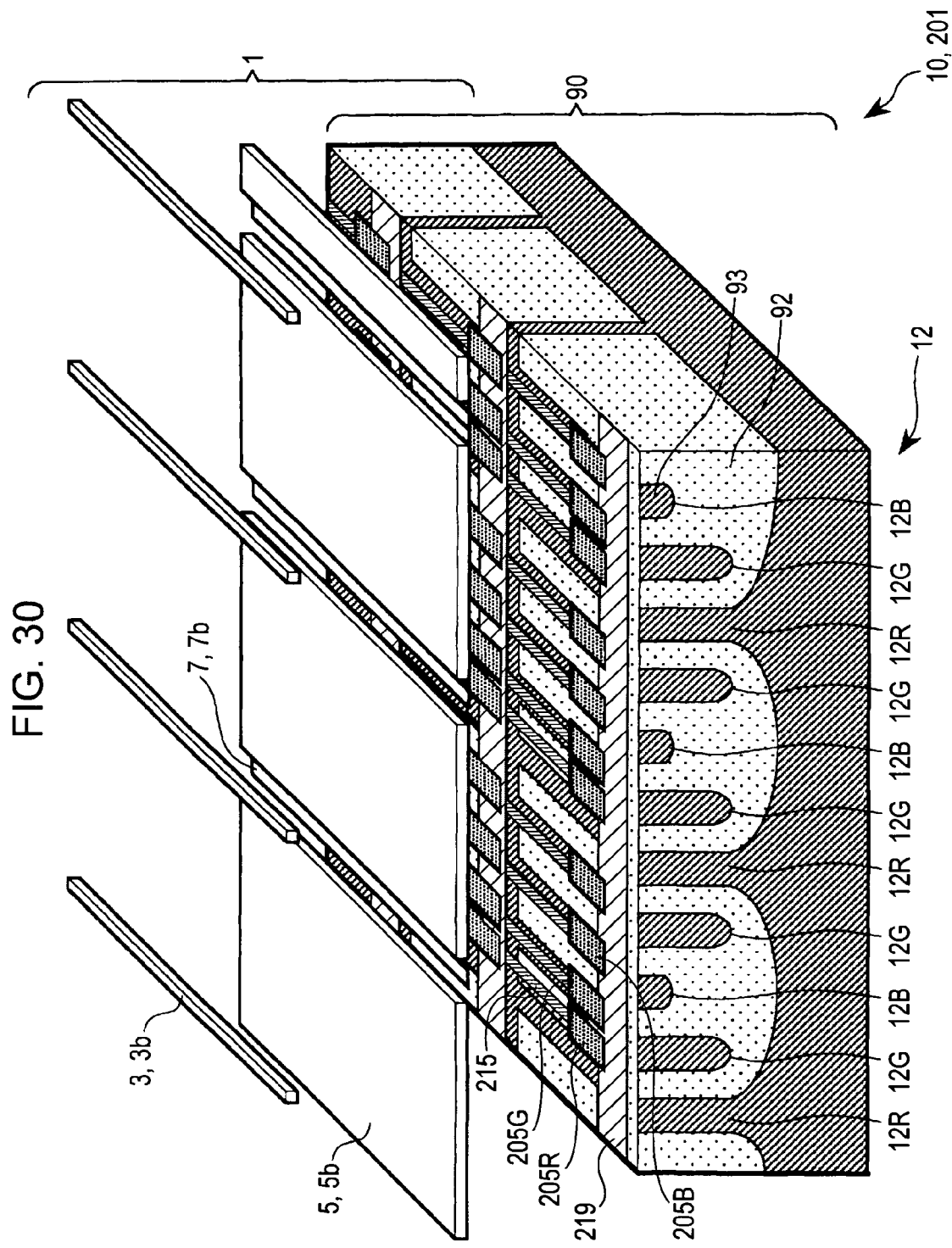

FIG. 30 is a sketch drawing showing an example of a structure when the sensor structure of the second example shown in FIG. 28 is applied to a CMOS image sensor.

Figure 31:
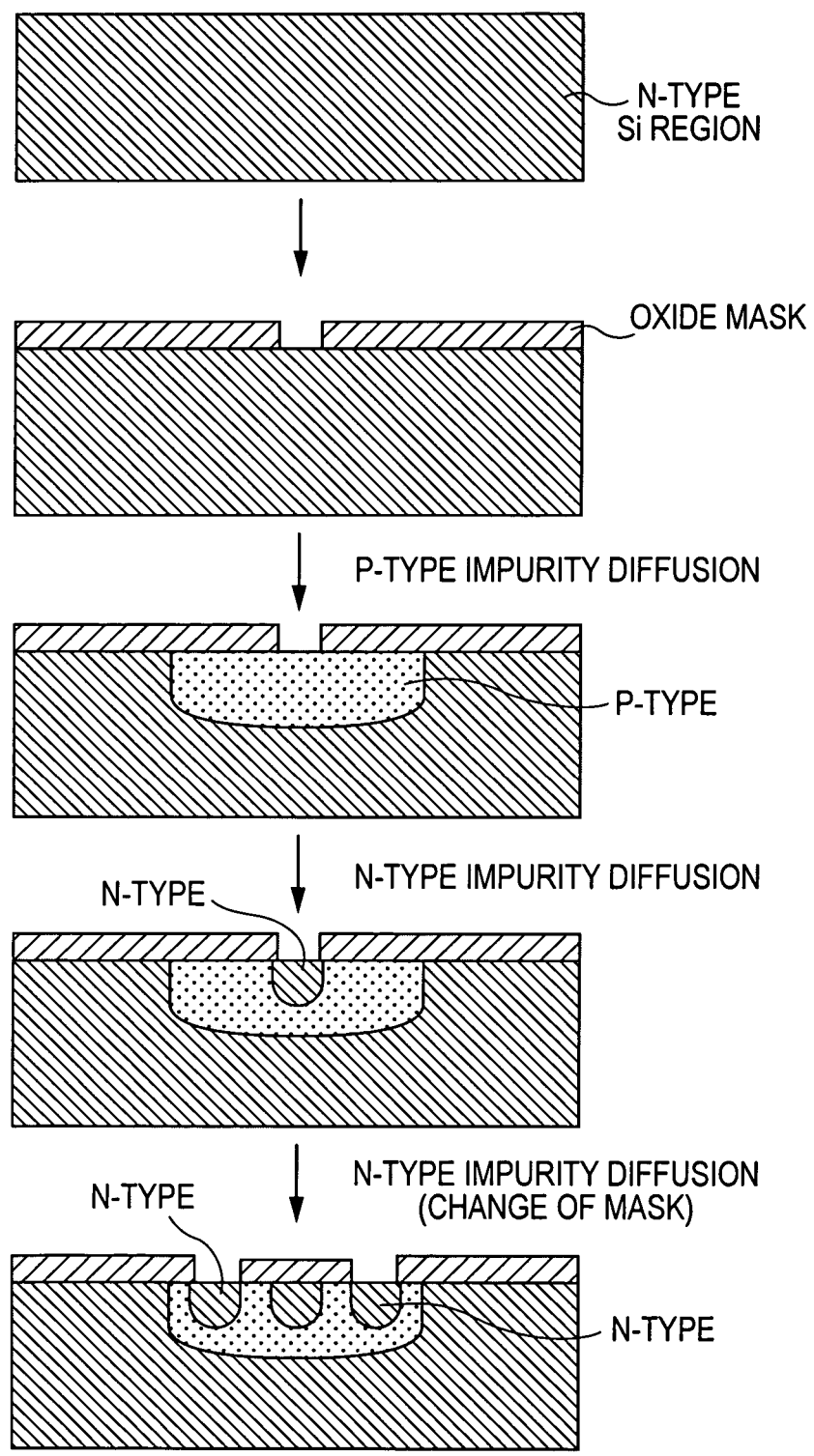

FIG. 31 is a drawing showing the outline of a process for manufacturing a spectral image sensor having the structure of the second example.

Figure 32:
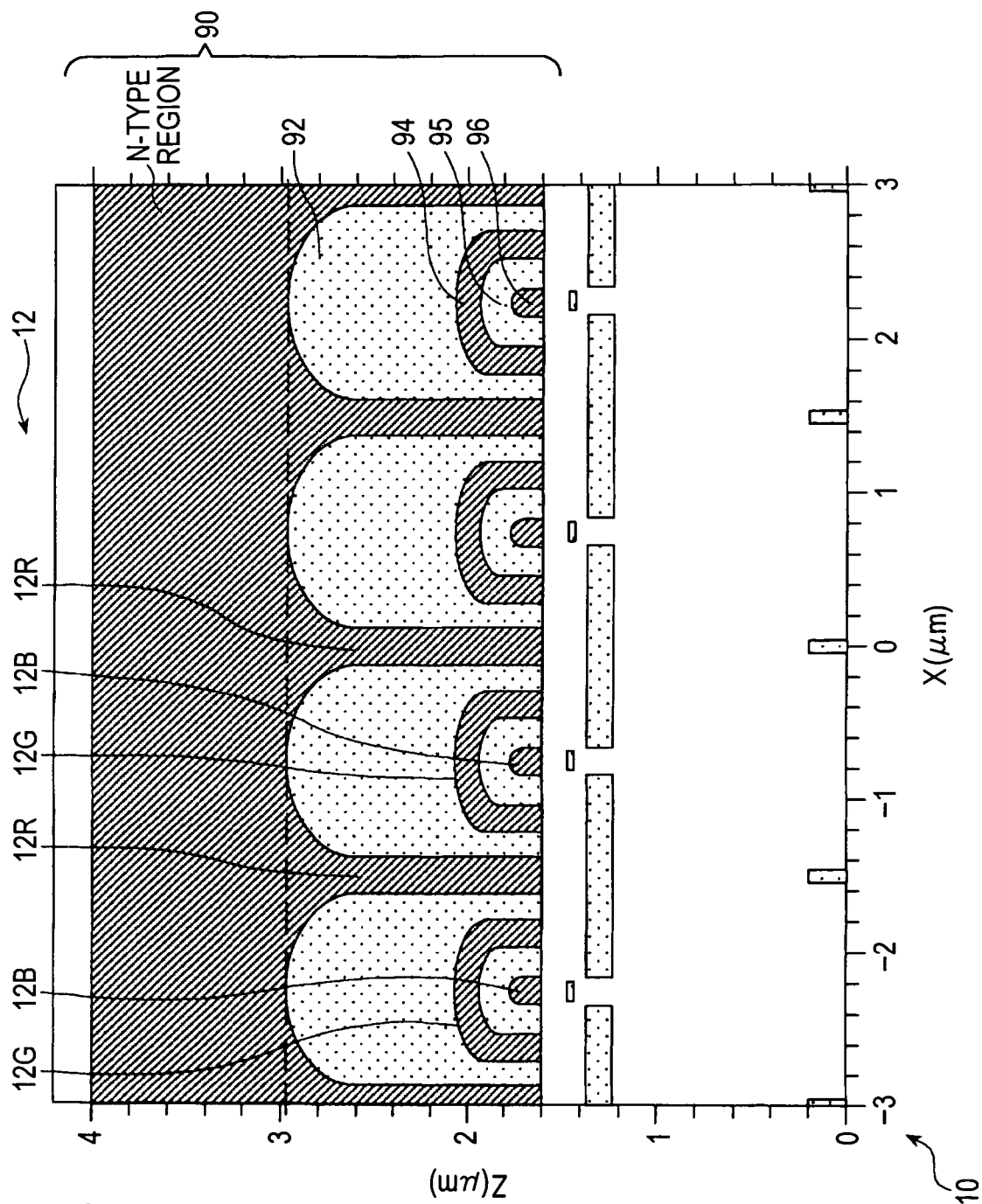

FIG. 32 is a sectional view showing a configuration example of a sensor structure of a third example corresponding to the detection positions shown in FIG. 13.

Figure 33:
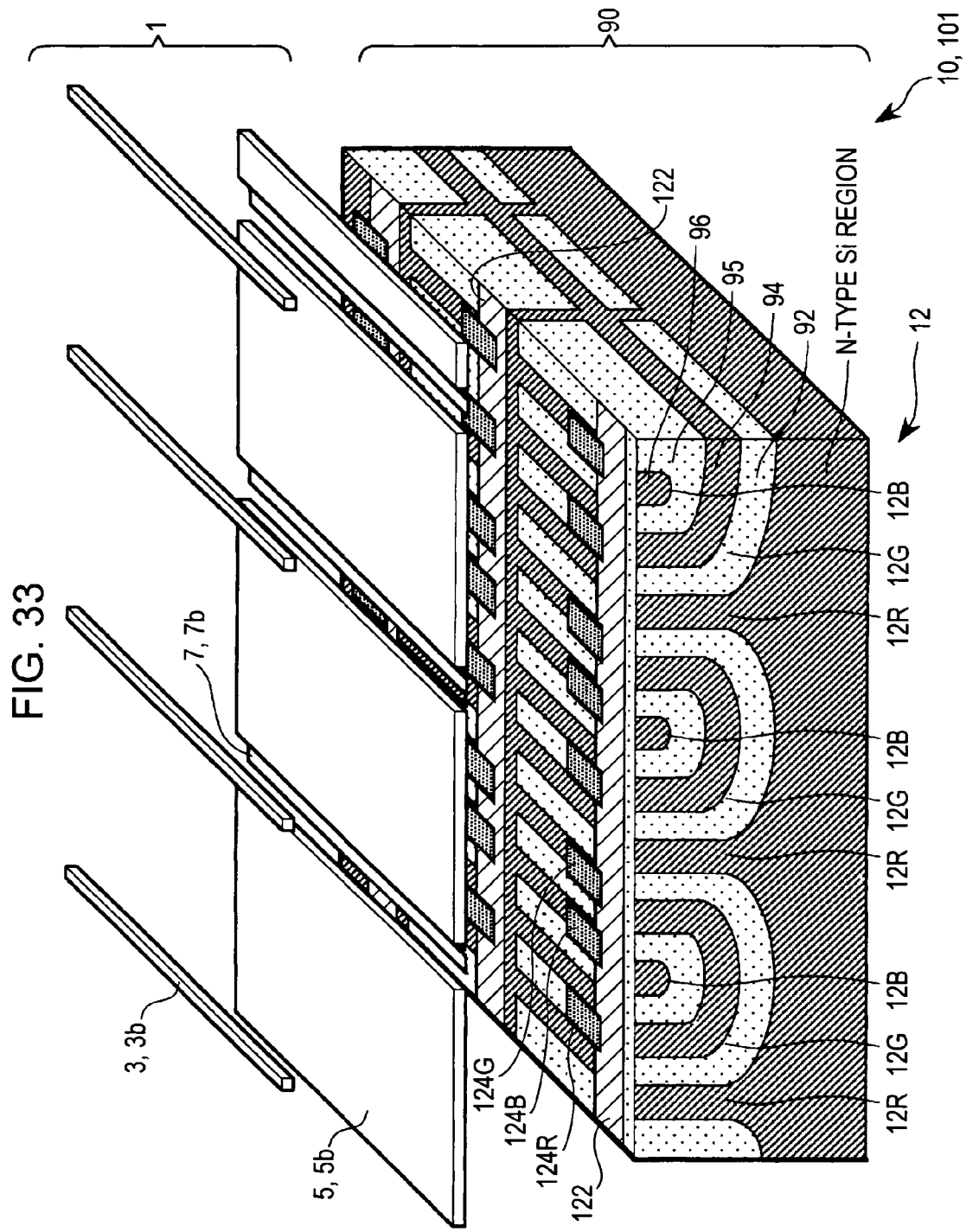

FIG. 33 is a sketch drawing showing an example of a structure when the sensor structure of the third example shown in FIG. 32 is applied to an IT_CCD image sensor.

Figure 34:
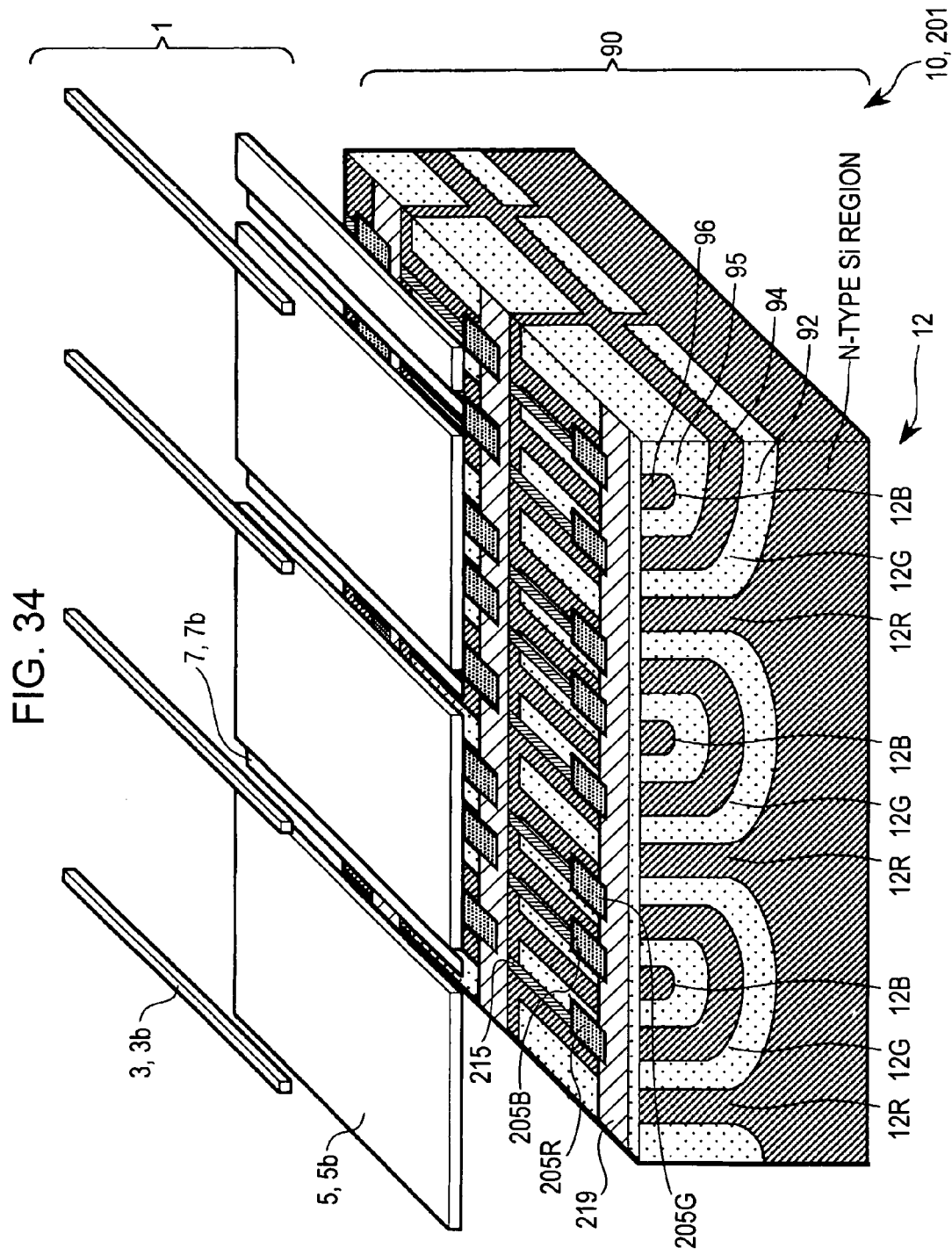

FIG. 34 is a sketch drawing showing an example of a structure when the sensor structure of the third example shown in FIG. 32 is applied to a CMOS image sensor.

Figure 35:
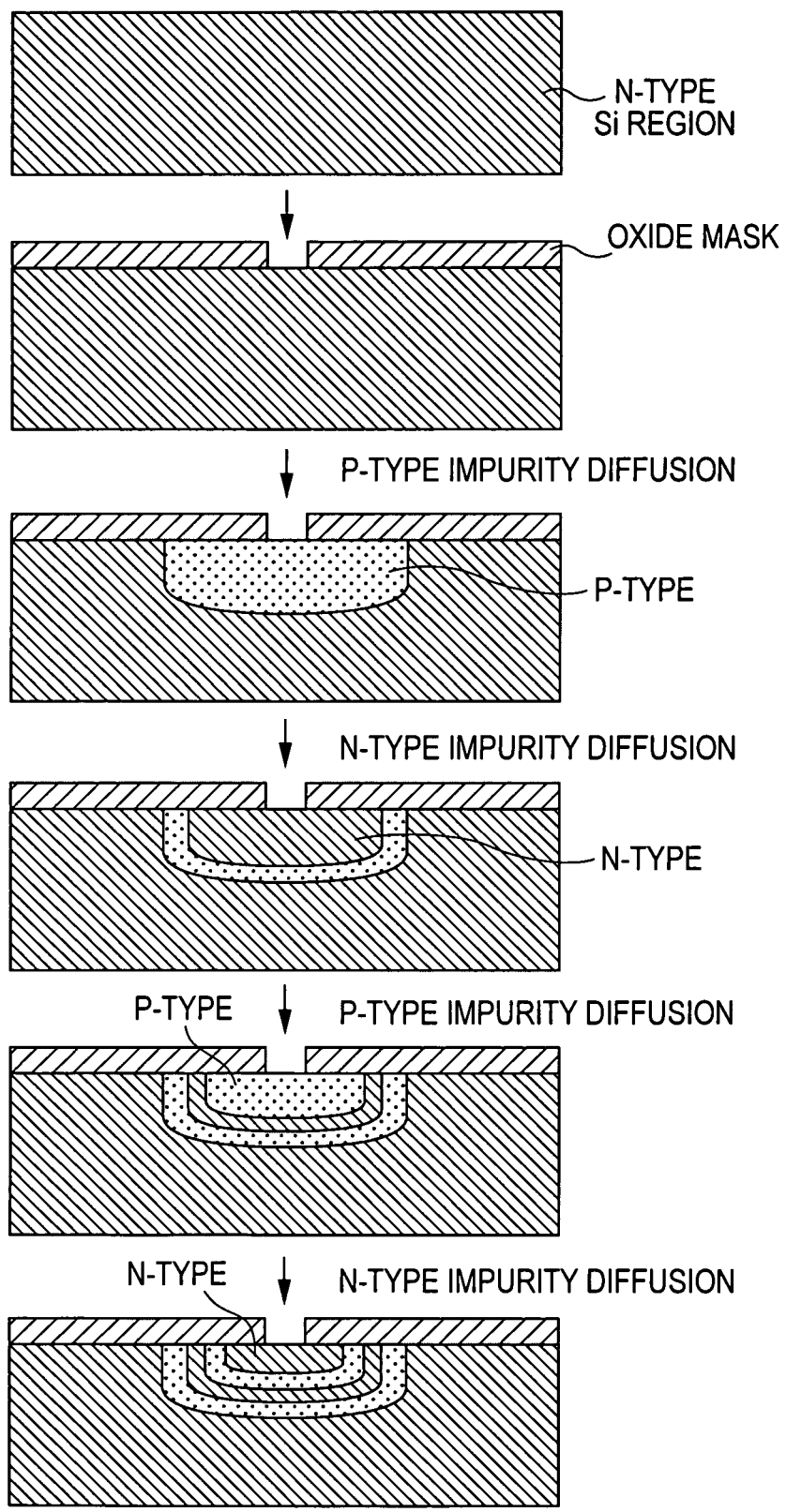

FIG. 35 is a drawing showing the outline of a process for manufacturing a spectral image sensor having the structure of the third example.

Figure 36:
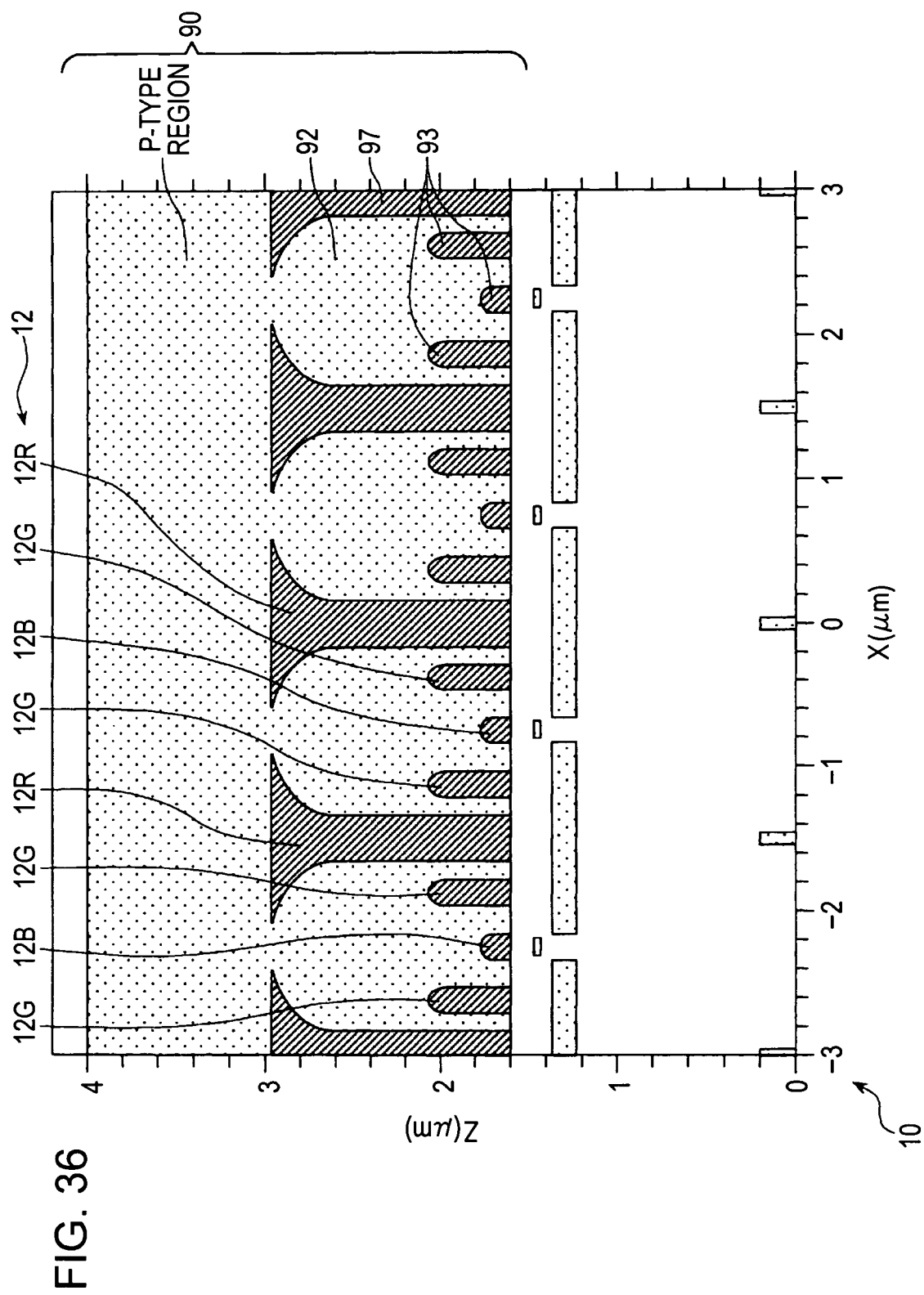

FIG. 36 is a sectional view showing a modified example of the sensor structure of the second example corresponding to the detection positions shown in FIG. 12.

Figure 37:
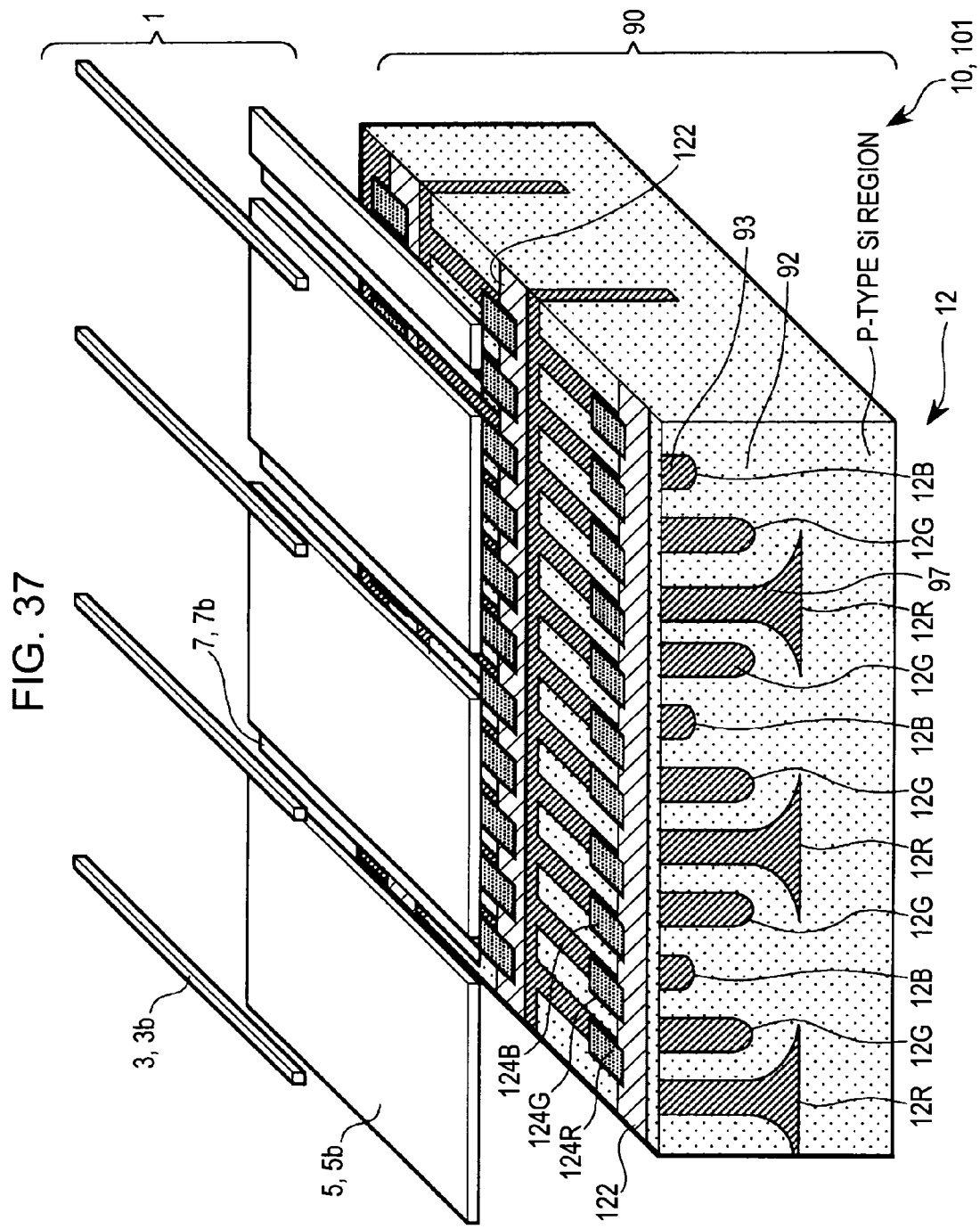

FIG. 37 is a sketch drawing showing an example of a structure when the sensor structure of the modified example shown in FIG. 36 corresponding to the second example is applied to an IT_CCD image sensor.

Figure 38:
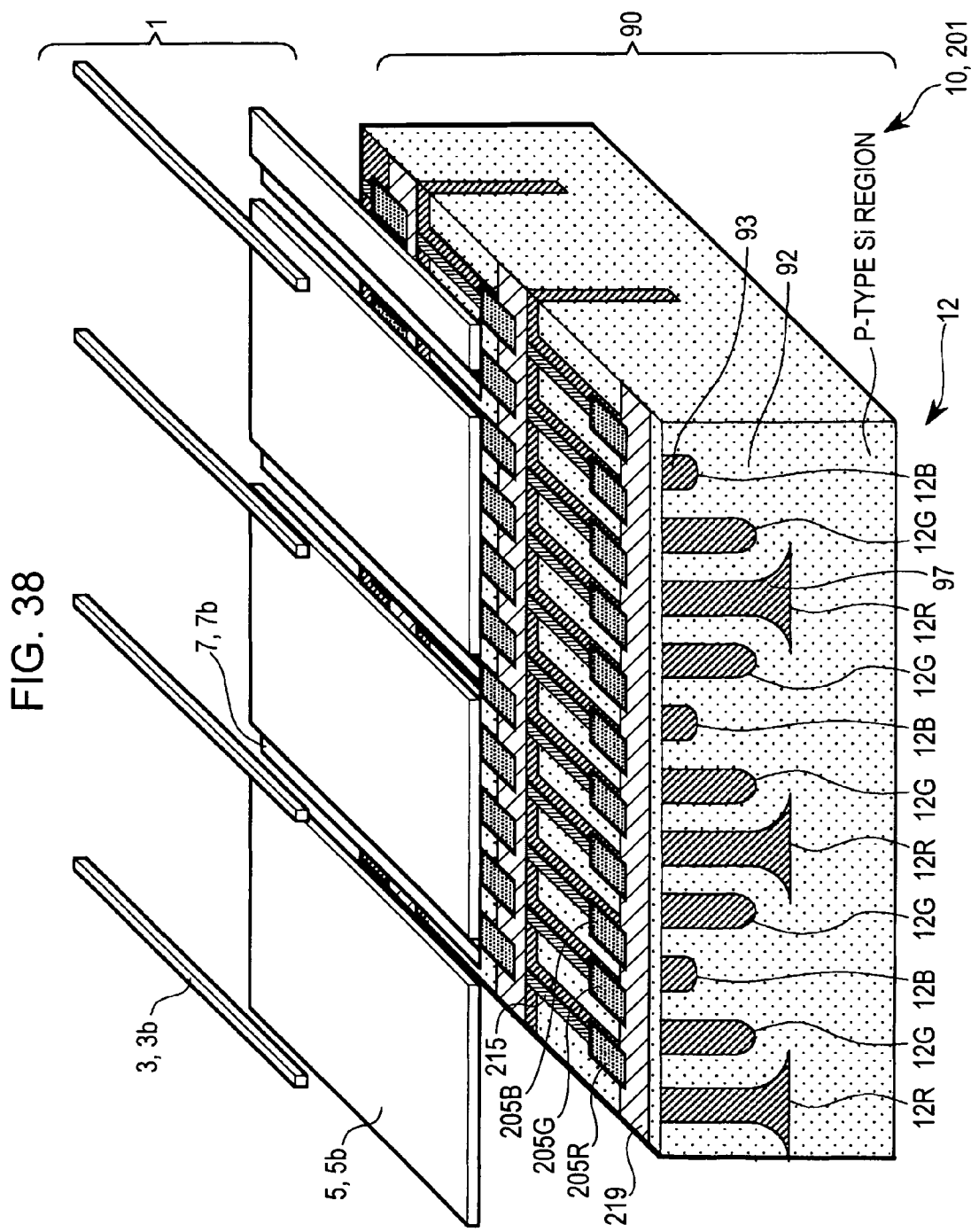

FIG. 38 is a sketch drawing showing an example of a structure when the sensor structure of the modified example shown in FIG. 36 corresponding to the second example is applied to a CMOS image sensor.

Figure 39:
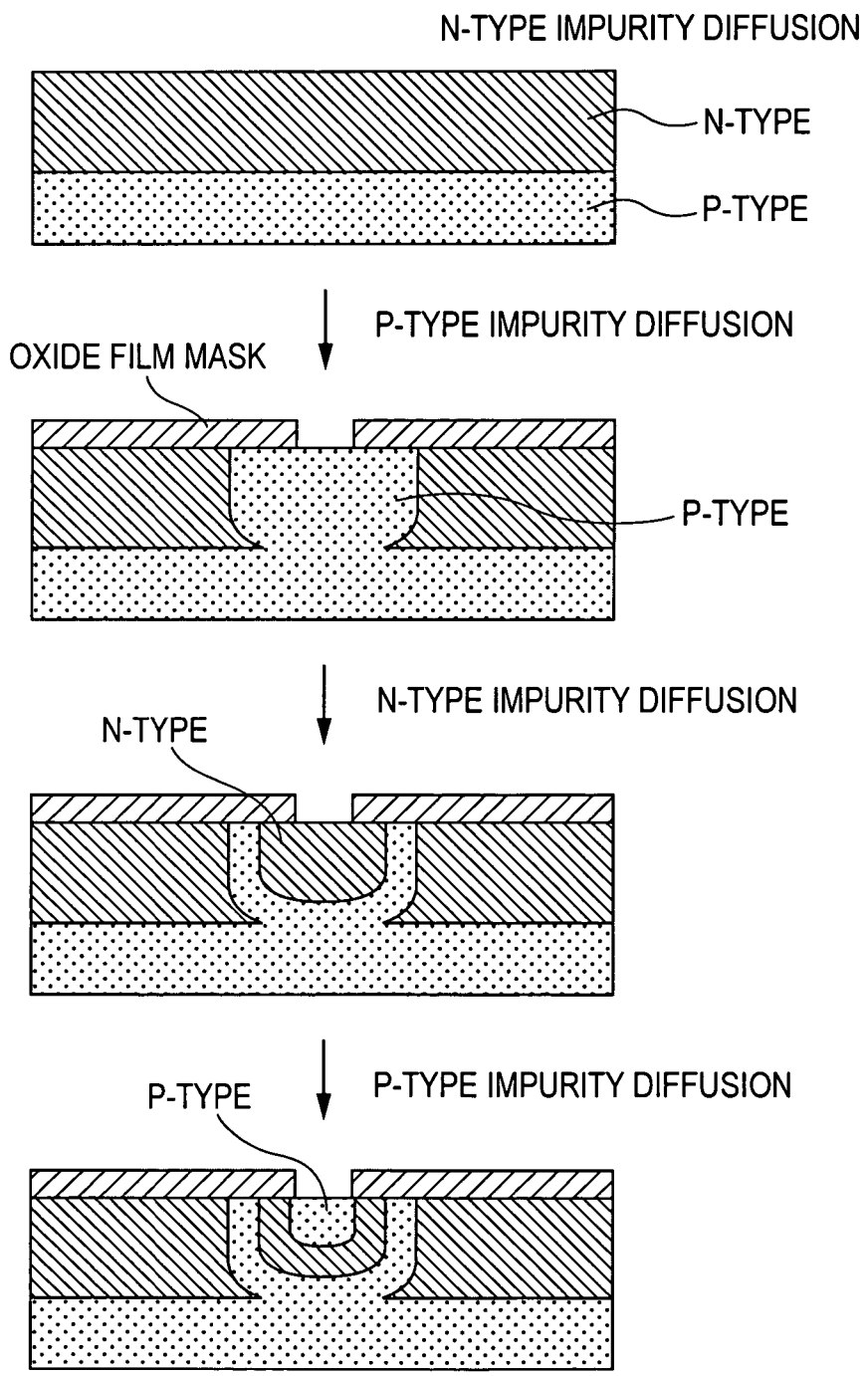

FIG. 39 is a drawing showing the outline of a process for manufacturing a spectral image sensor 10 having the structure of the modified example of the second example.

Figure 40:
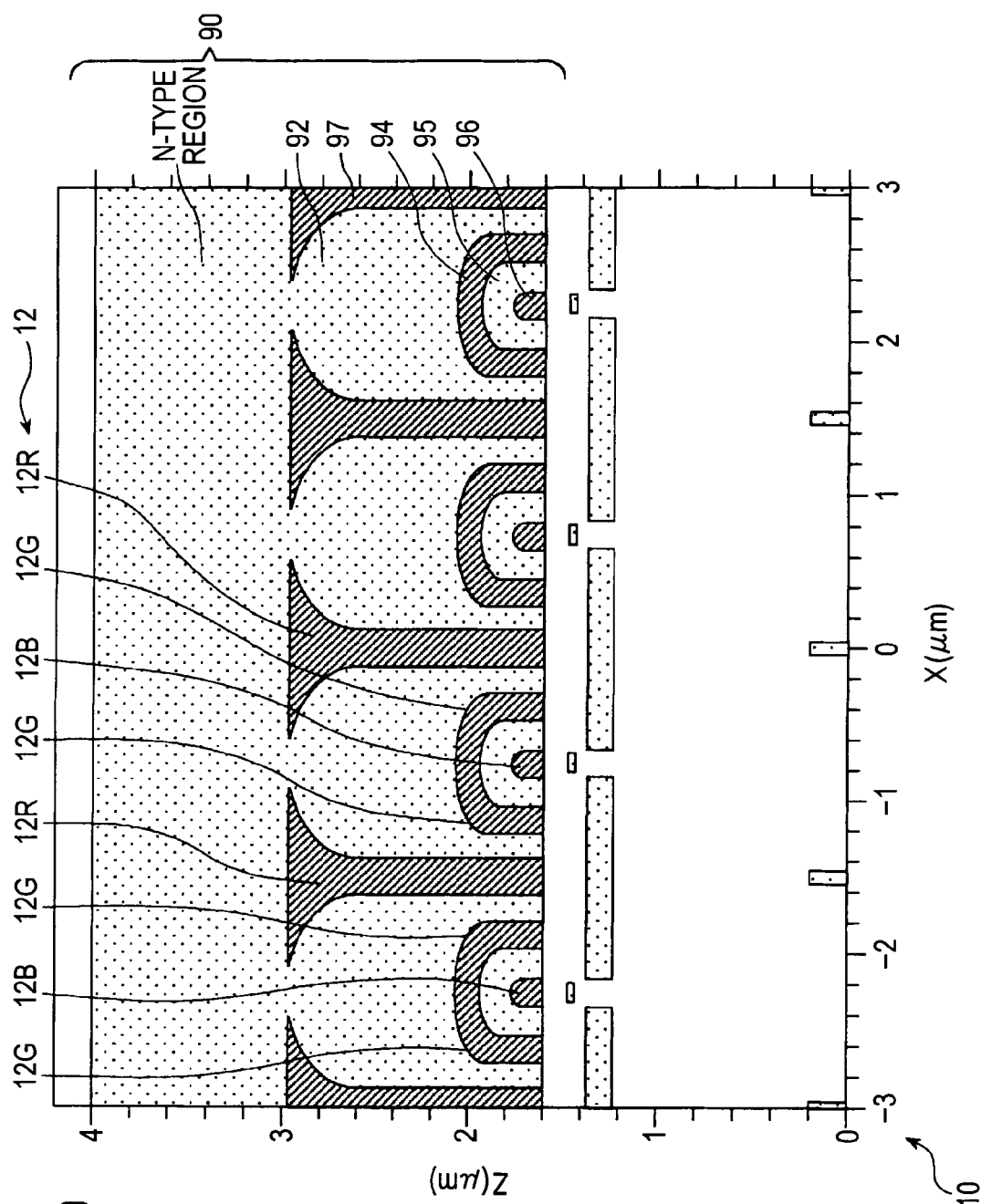

FIG. 40 is a sectional view showing a modified example of the sensor structure of the third example corresponding to the detection positions shown in FIG. 13.

Figure 41:
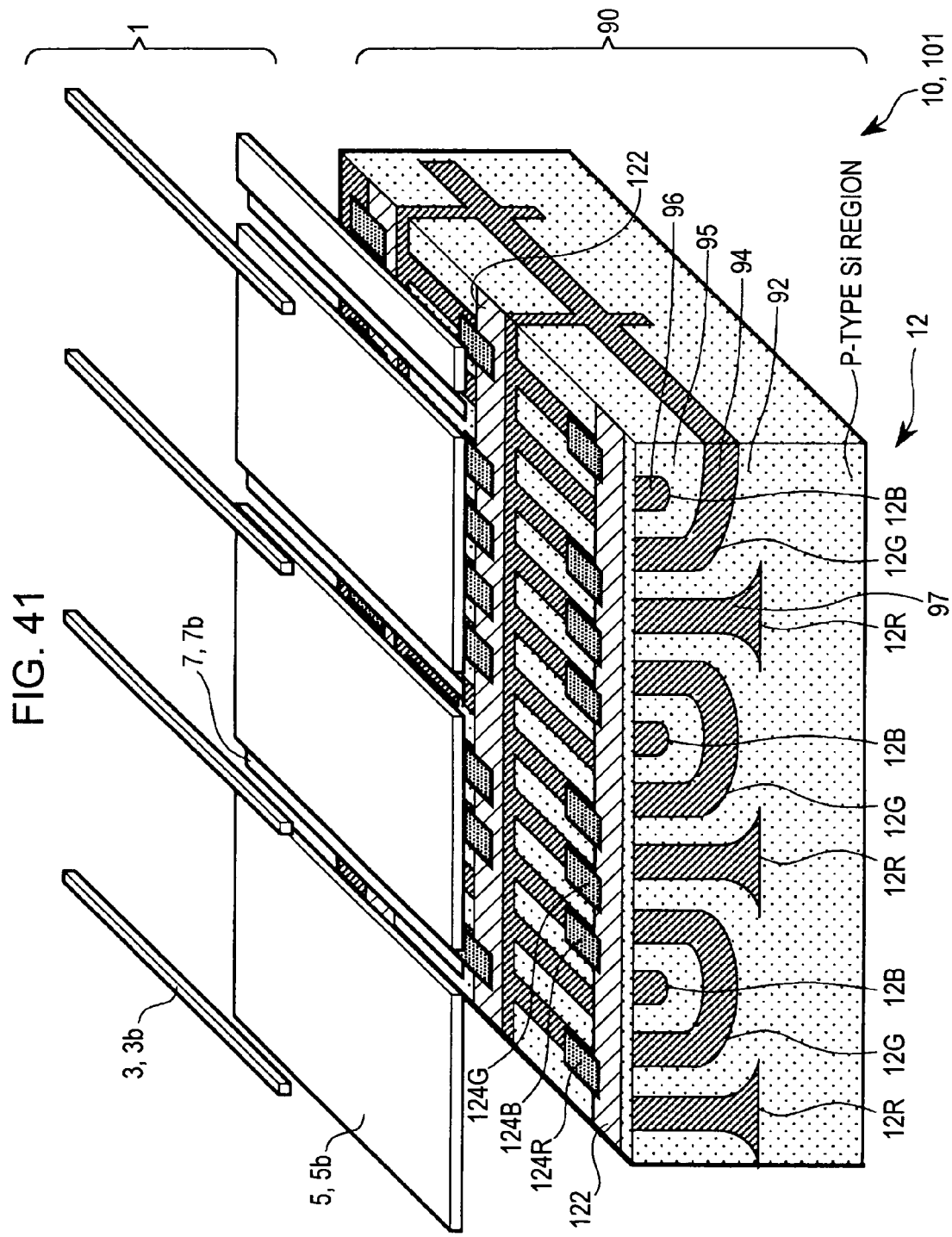

FIG. 41 is a sketch drawing showing an example of a structure when the sensor structure of the modified example shown in FIG. 40 corresponding to the third example is applied to an IT_CCD image sensor.

Figure 42:
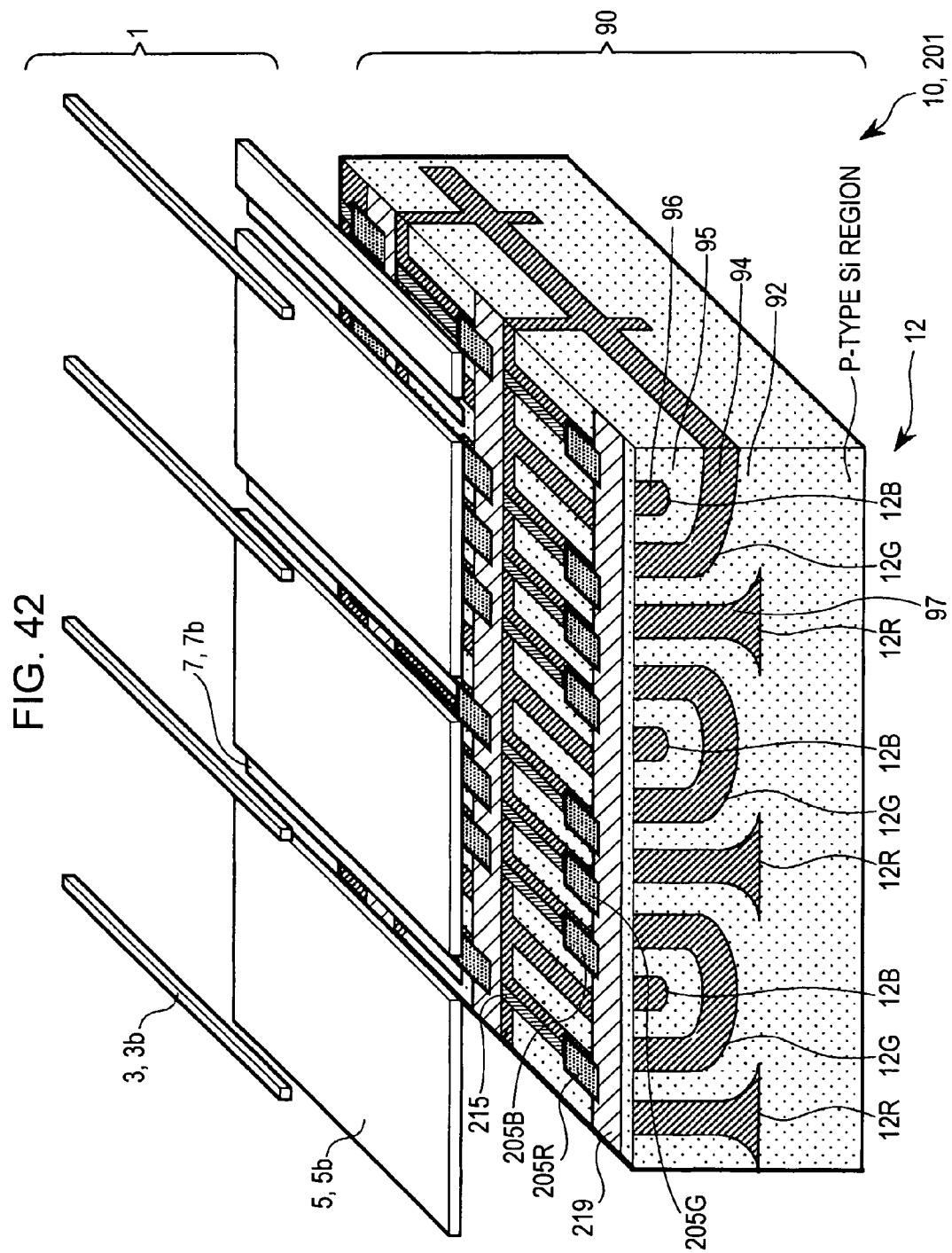

FIG. 42 is a sketch drawing showing an example of a structure when the sensor structure of the modified example shown in FIG. 40 corresponding to the third example is applied to a CMOS image sensor.

Figure 43:
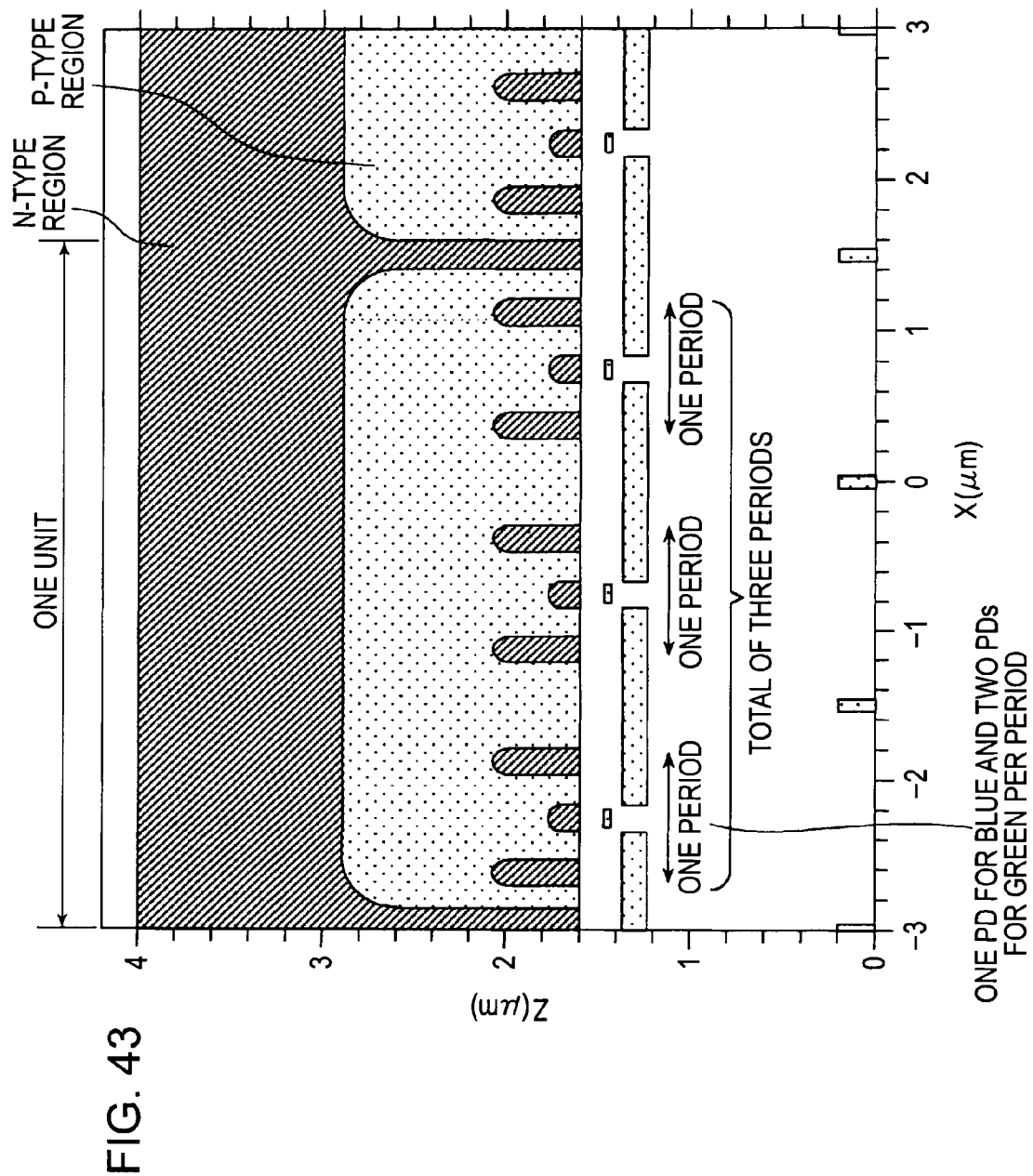

FIG. 43 is a sectional view showing another modified example of the sensor structures of the first to third examples.

Figure 44:
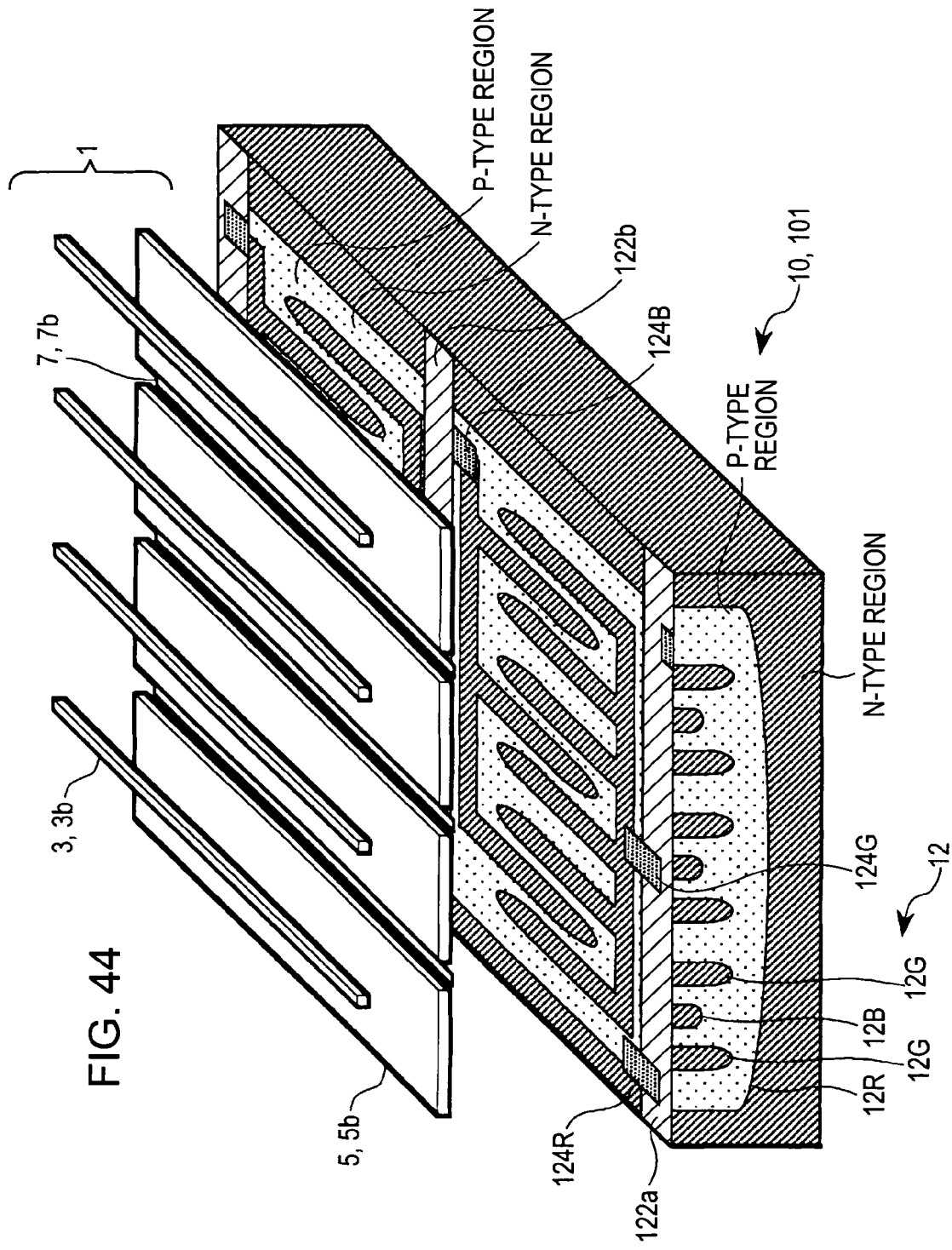

FIG. 44 is a sketch drawing showing an example of a structure when the sensor structure of the other modified example shown in FIG. 43 corresponding to the second example is applied to an IT_CCD image sensor.

Figure 45:
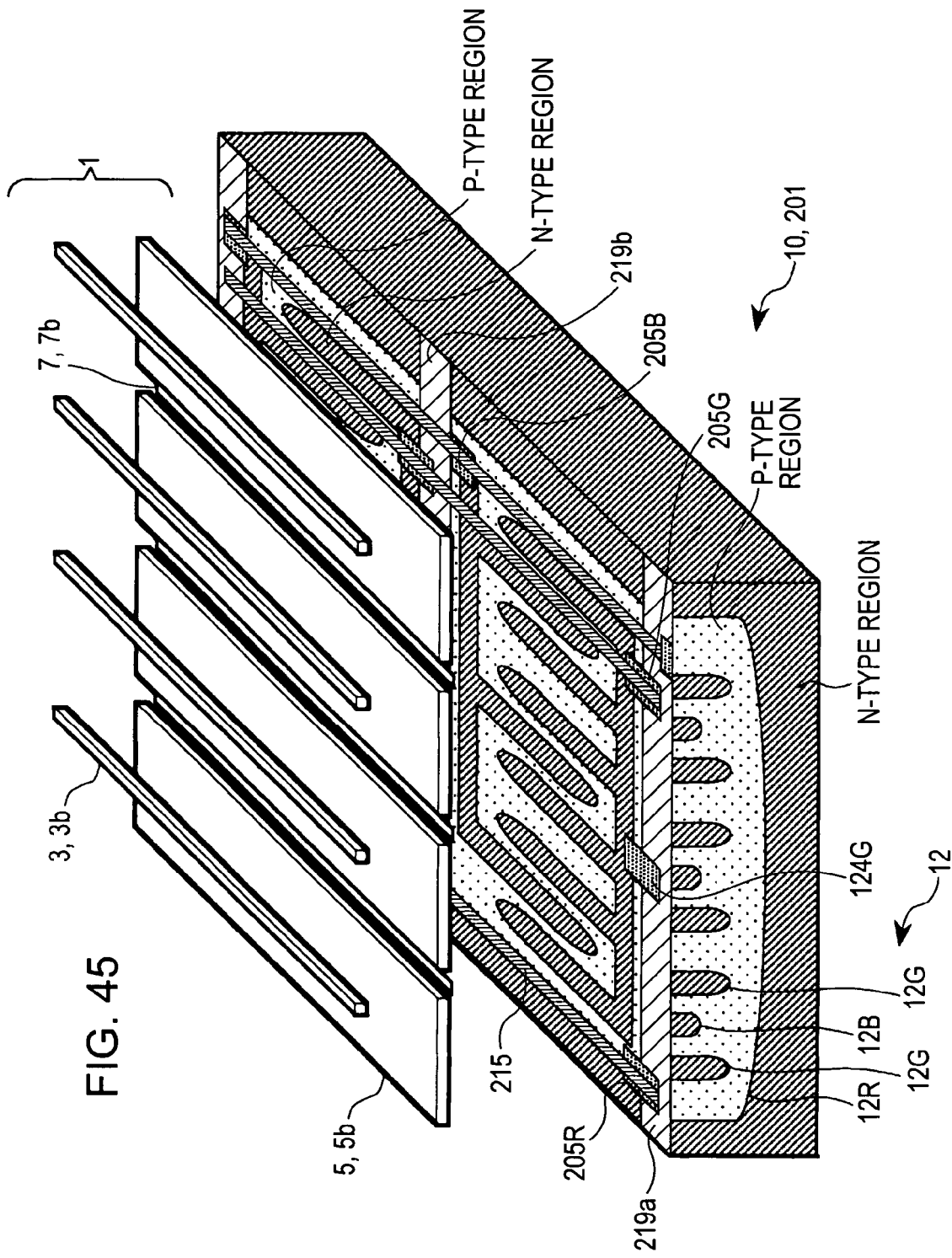

FIG. 45 is a sketch drawing showing an example of a structure when the sensor structure of the other modified example shown in FIG. 43 corresponding to the second example is applied to a CMOS image sensor.

Figure 46:
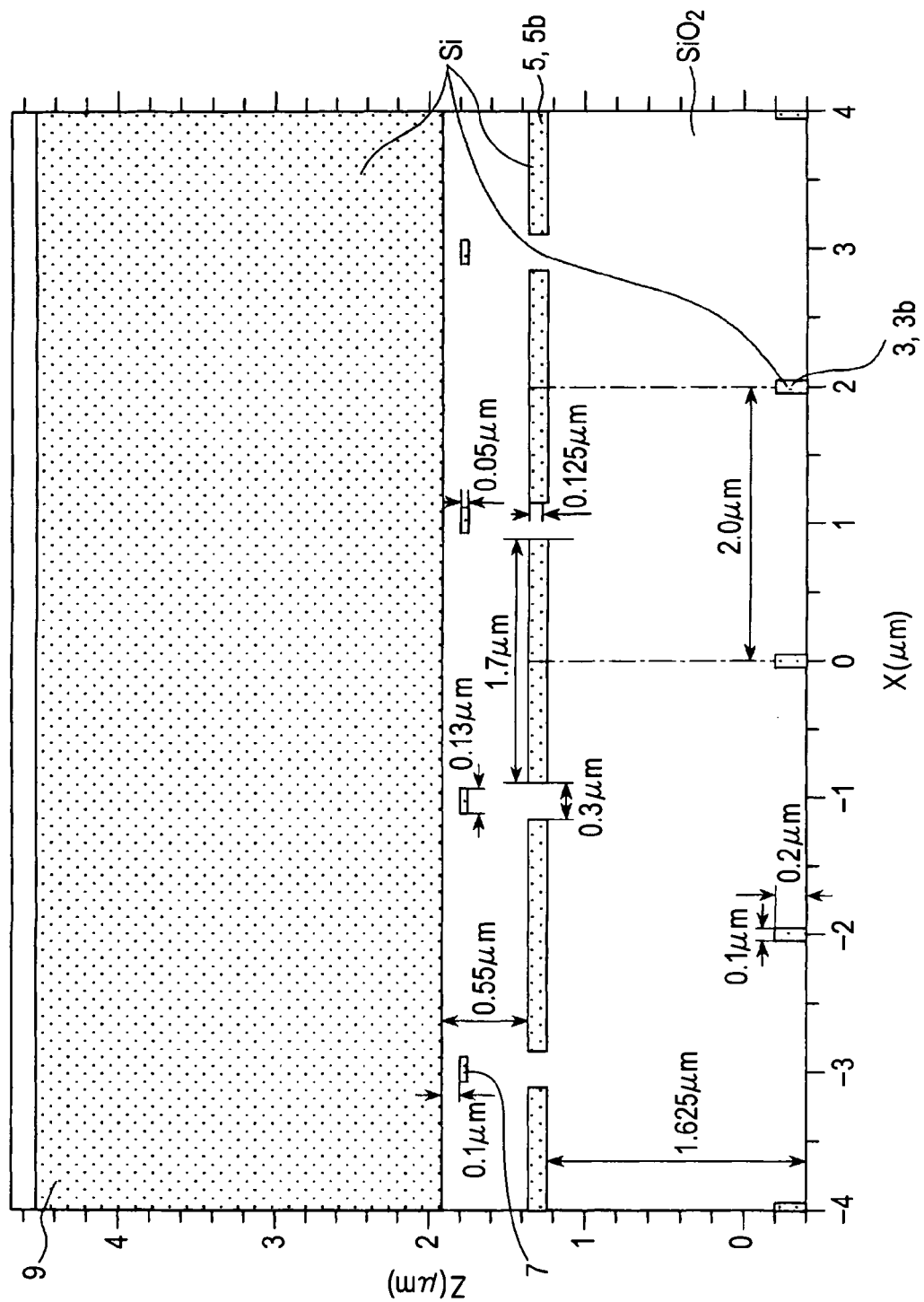

FIG. 46 is a drawing showing an example of a sensor structure in which the period of scatterers is 2.0 µm.

Figure 47:
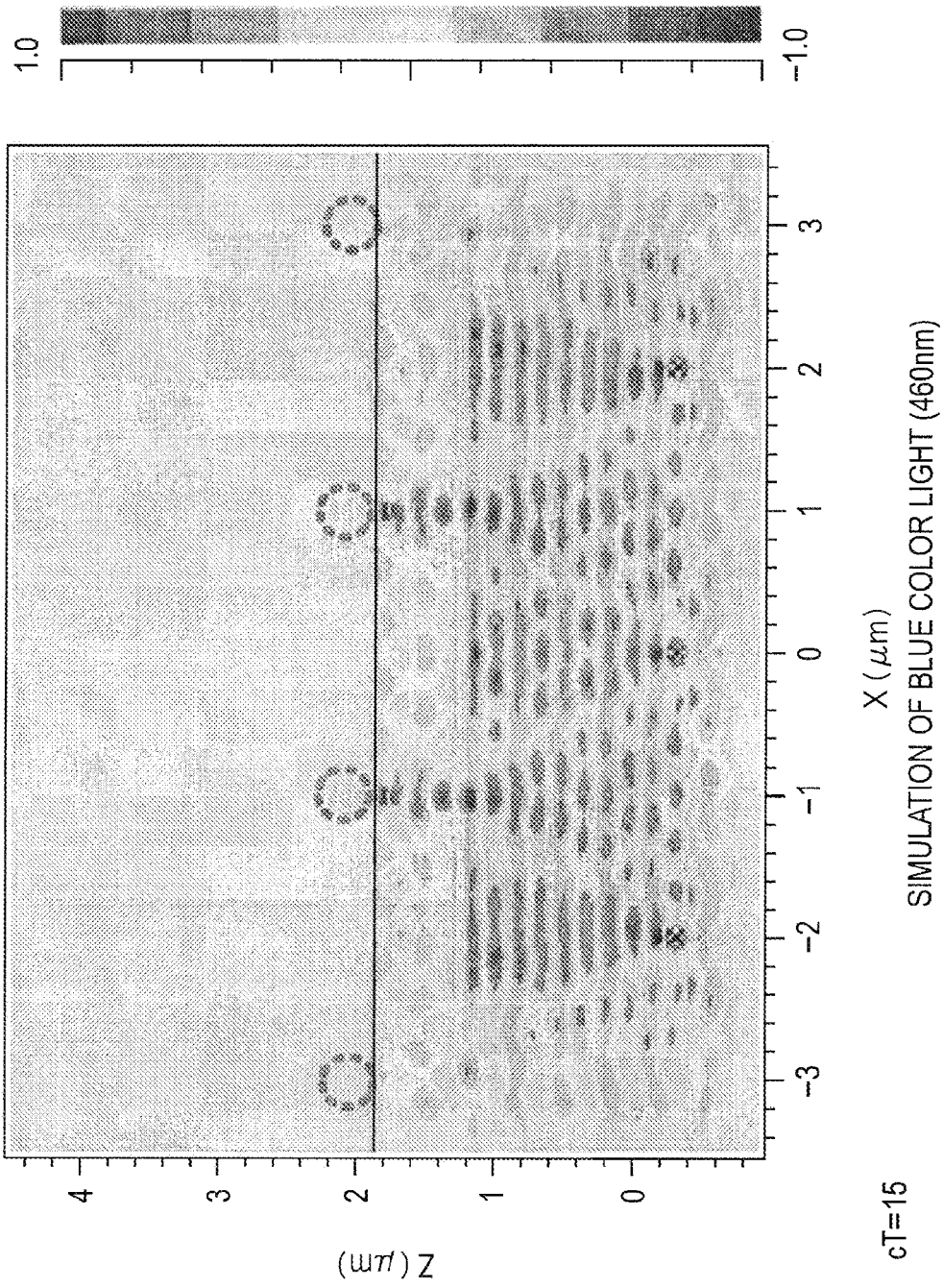

FIG. 47 is a diagram of computation simulation illustrating a spectral method for a visible light band using blue light (wavelength 460 nm) incident on the light-receiving surface of a spectral image sensor having the structure shown in FIG. 46.

Figure 48:
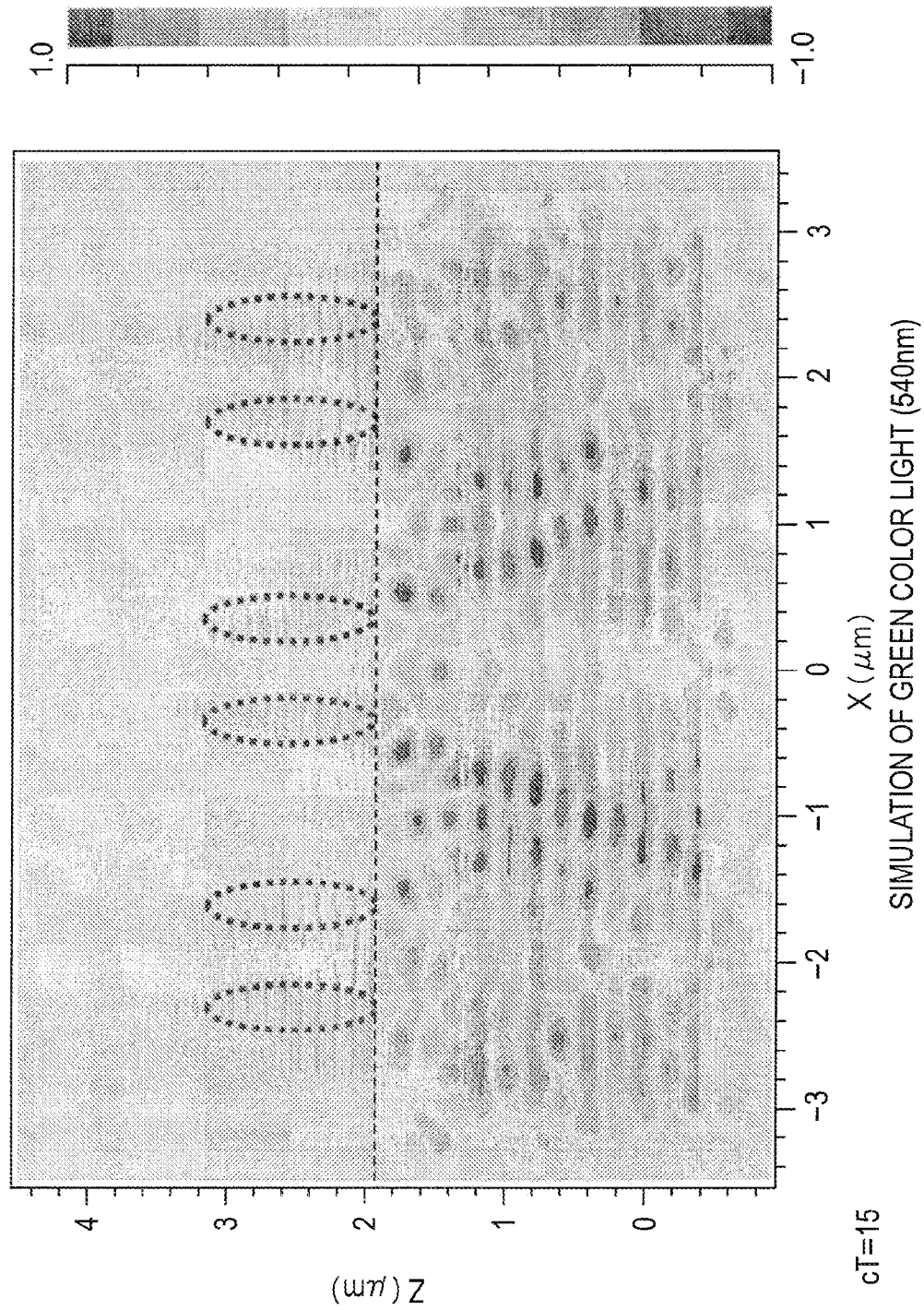

FIG. 48 is a diagram of computation simulation illustrating a spectral method for a visible light band using green light (wavelength 540 nm) incident on the light-receiving surface of a spectral image sensor having the structure shown in FIG. 46.

Figure 49:
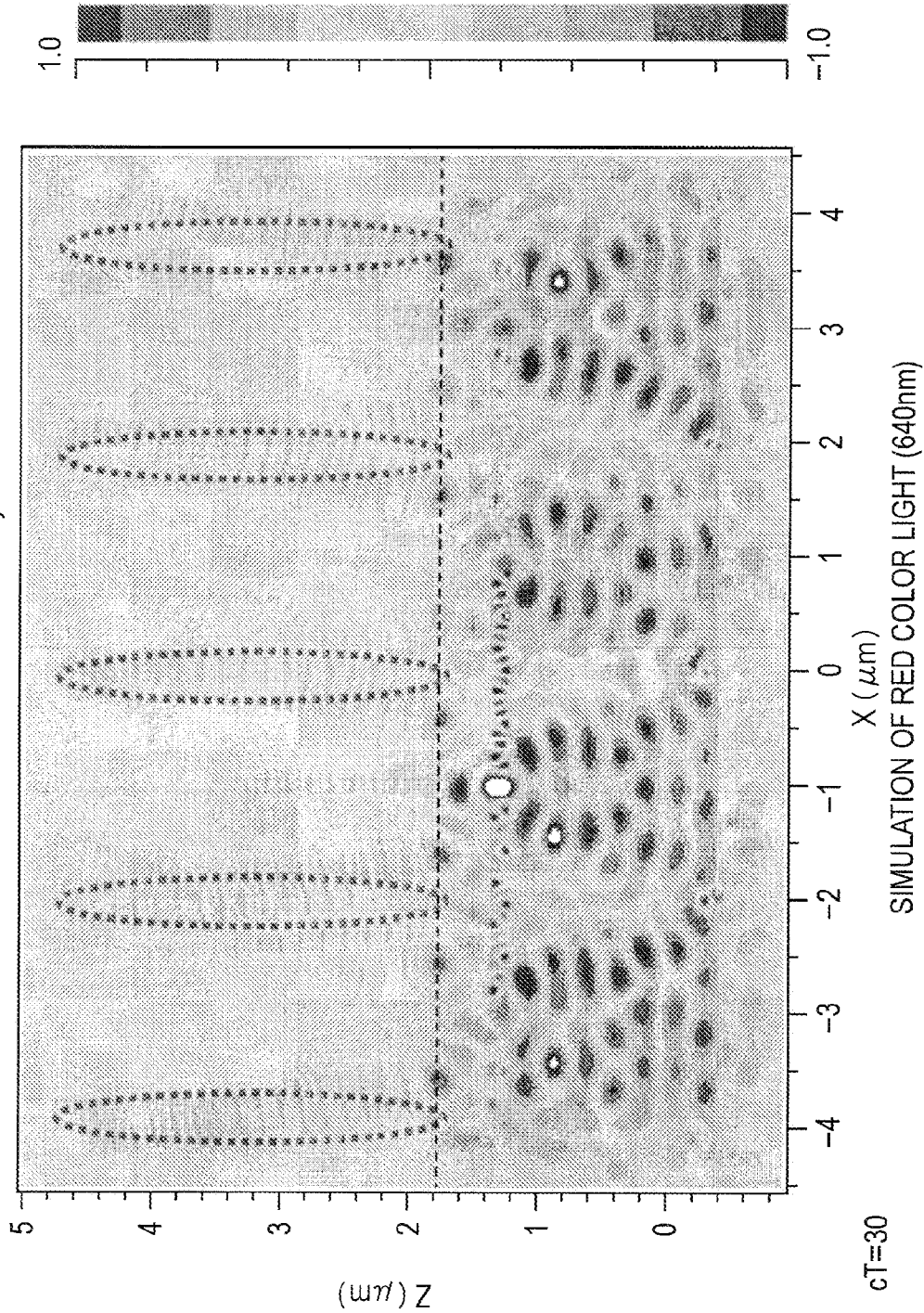

FIG. 49 is a diagram of computation simulation illustrating a spectral method for a visible light band using red light (wavelength 640 nm) incident on the light-receiving surface of a spectral image sensor having the structure shown in FIG. 46.

Figure 50:
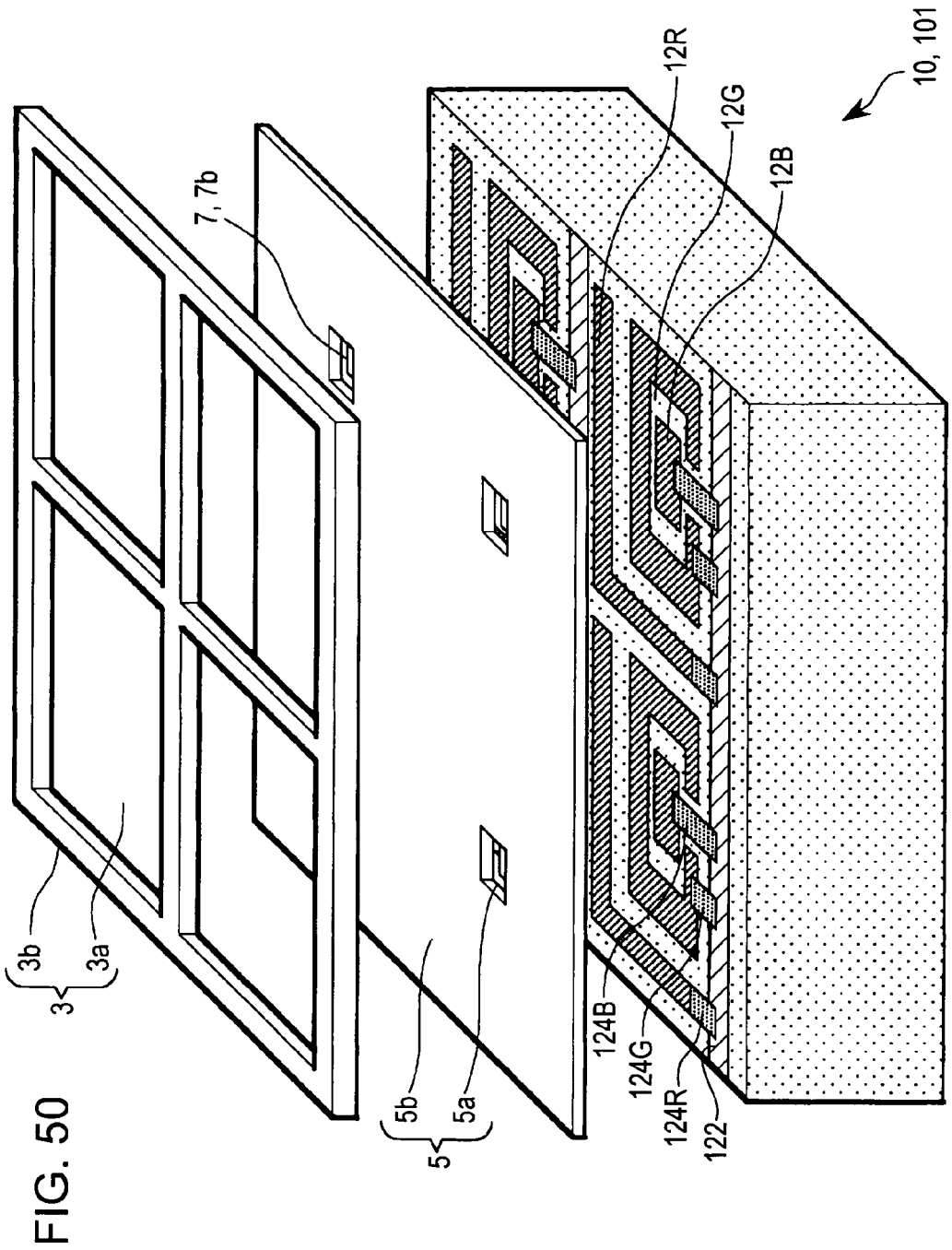

FIG. 50 is a sketch drawing showing an example of a structure when a sensor structure having scatterers with an enclosed shape is applied to an IT_CCD image sensor.

Figure 51:
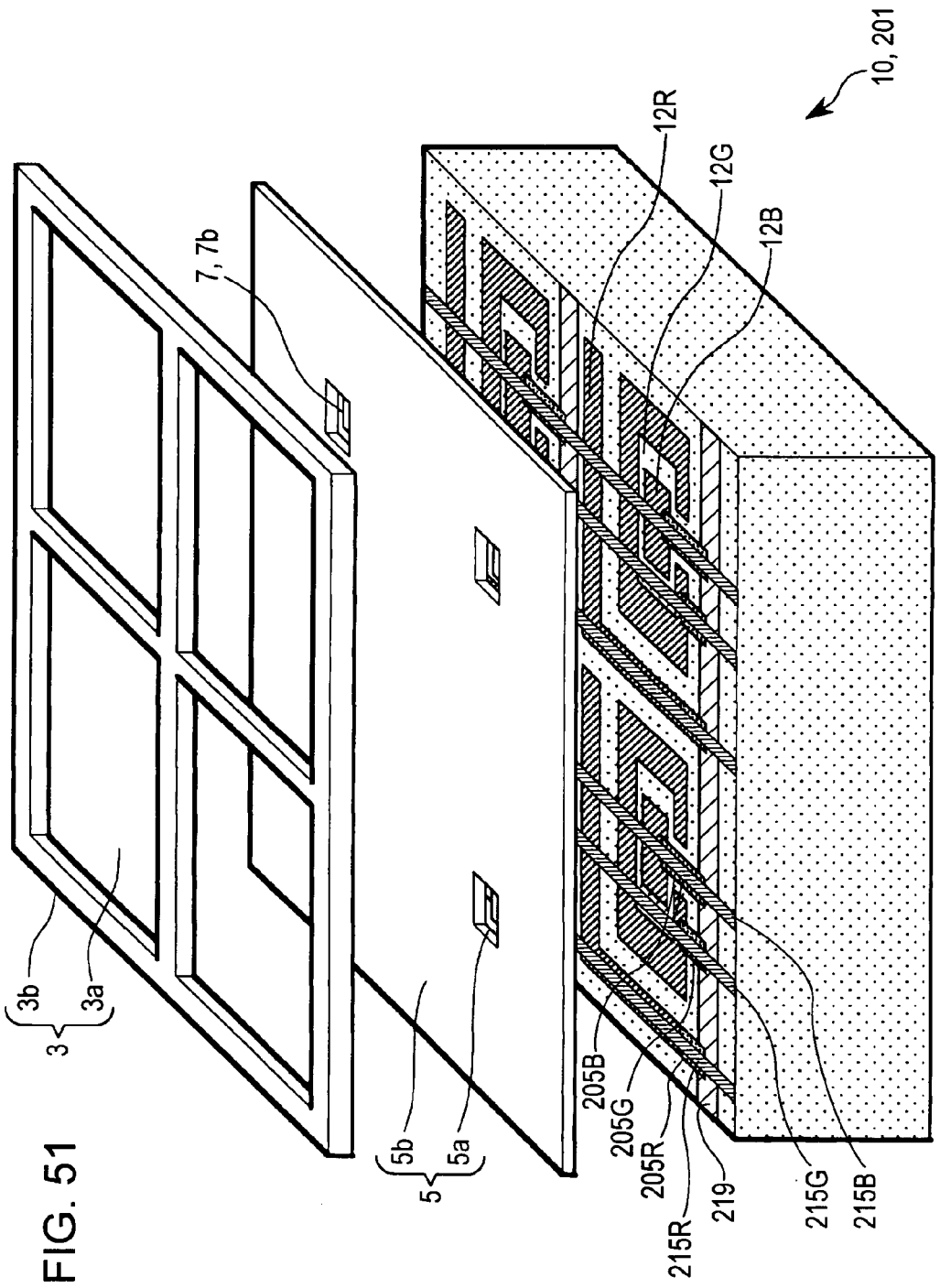

FIG. 51 is a sketch drawing showing an example of a structure when a sensor structure having scatterers with an enclosed shape is applied to a CMOS image sensor.

Figure 52:
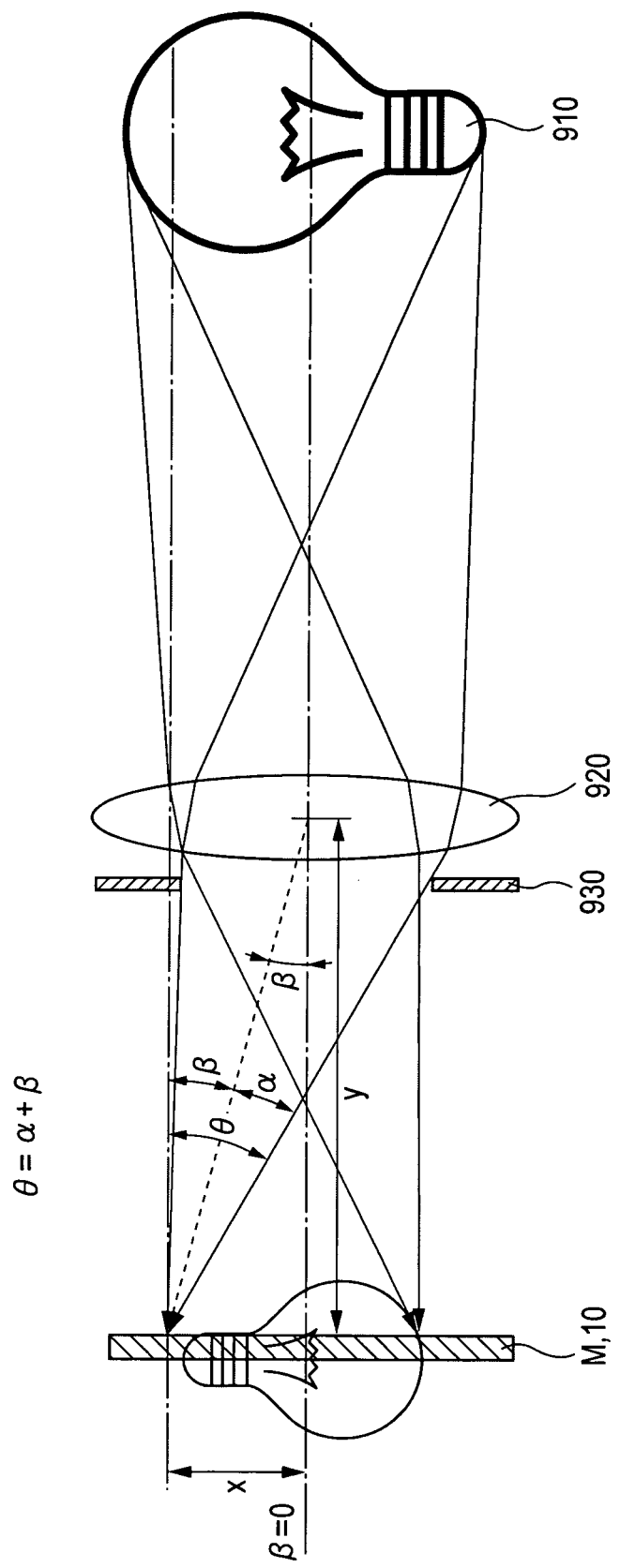

FIG. 52 is a drawing illustrating the influence of oblique incidence and a correction method therefor.

Figure 53:
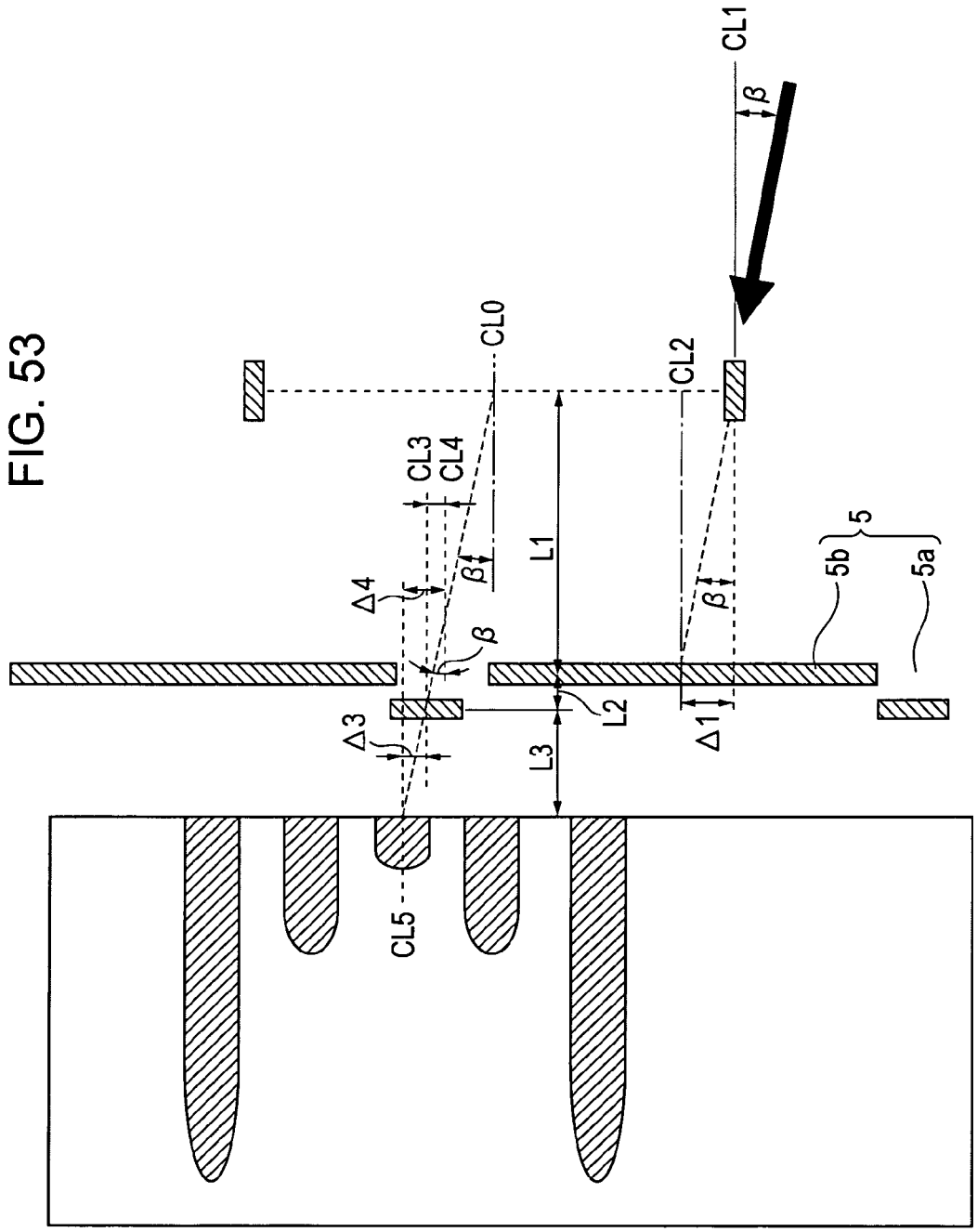

FIG. 53 is a drawing illustrating a method for correcting angle β for illustrating a method for correcting the relation between detection positions.

Figure 54:
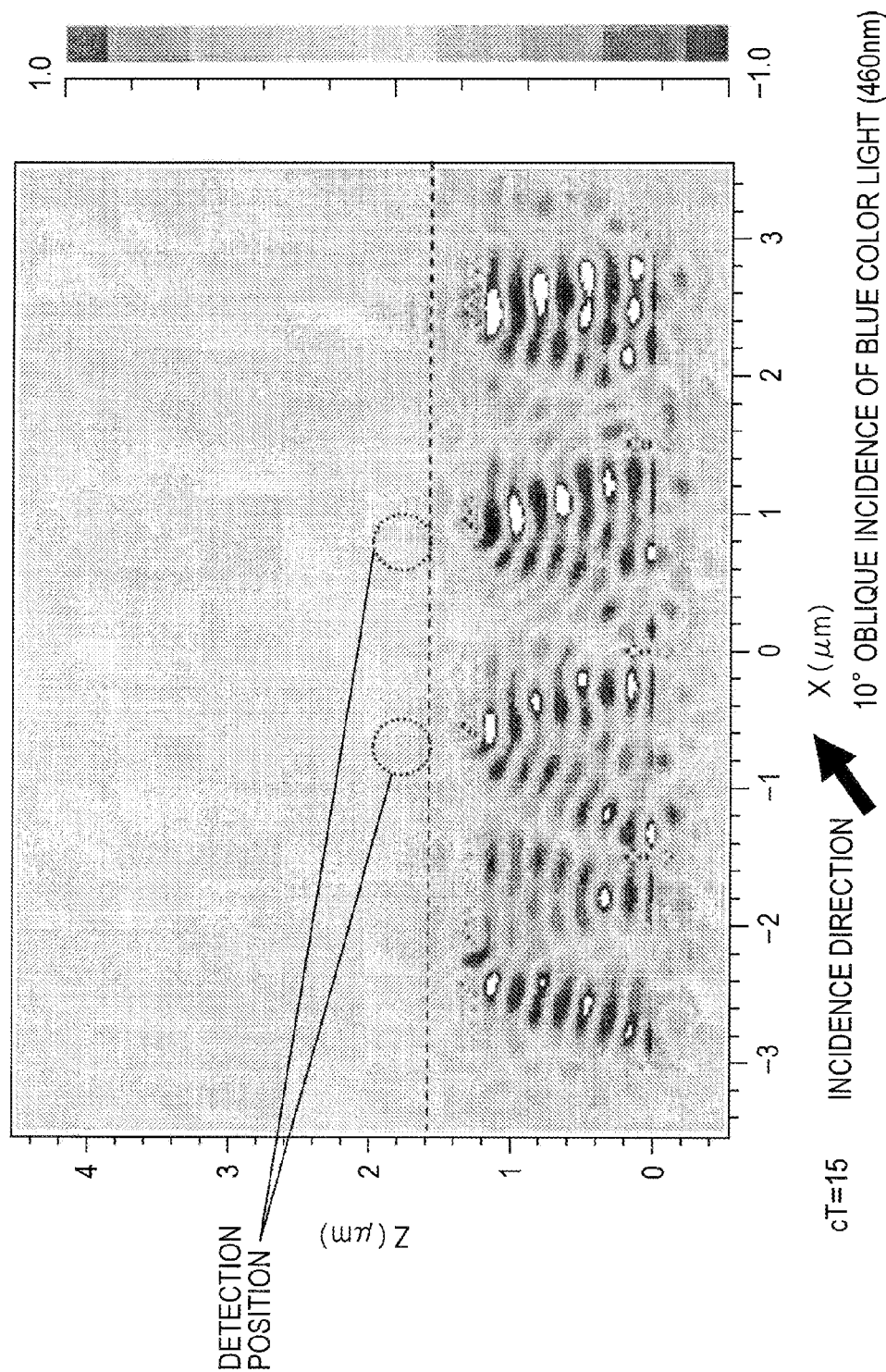

FIG. 54 is a diagram of computation simulation using blue light (wavelength 460 nm) obliquely incident at 10°.

Figure 55:
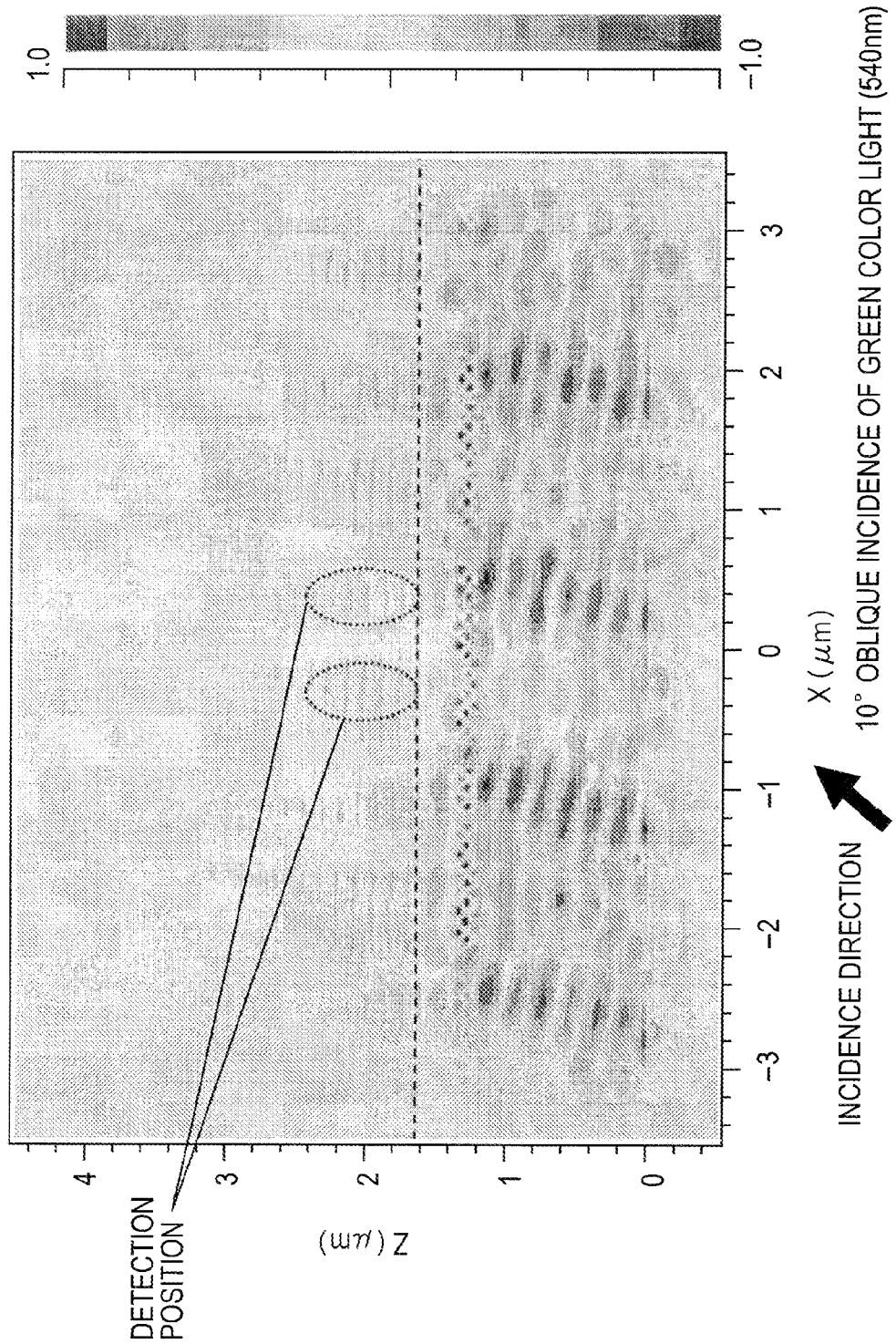

FIG. 55 is a diagram of computation simulation using green light (wavelength 540 nm) obliquely incident at 10°.

Figure 56:
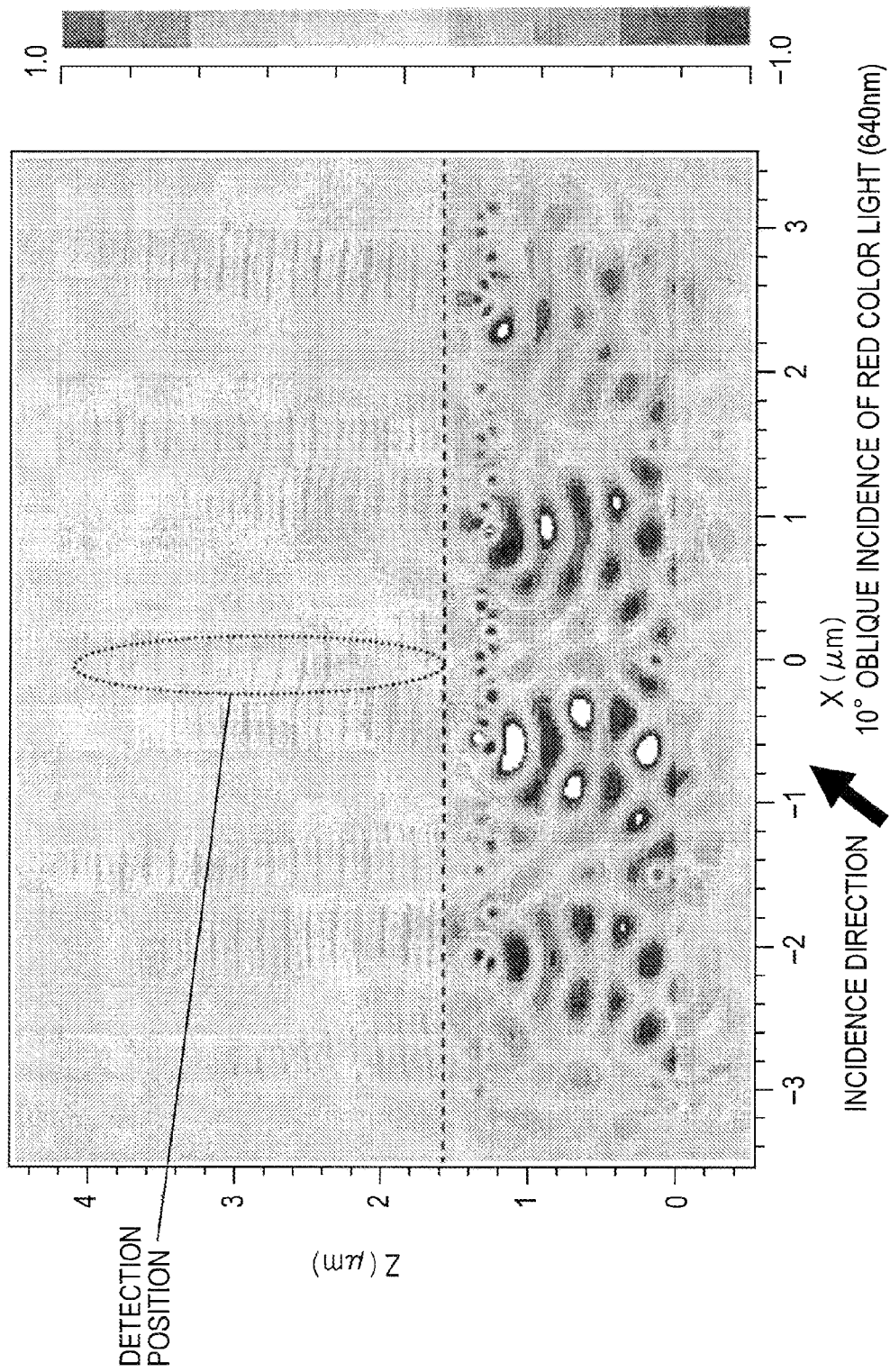

FIG. 56 is a diagram of computation simulation using blue light (wavelength 640 nm) obliquely incident at 10°.

Figure 57:
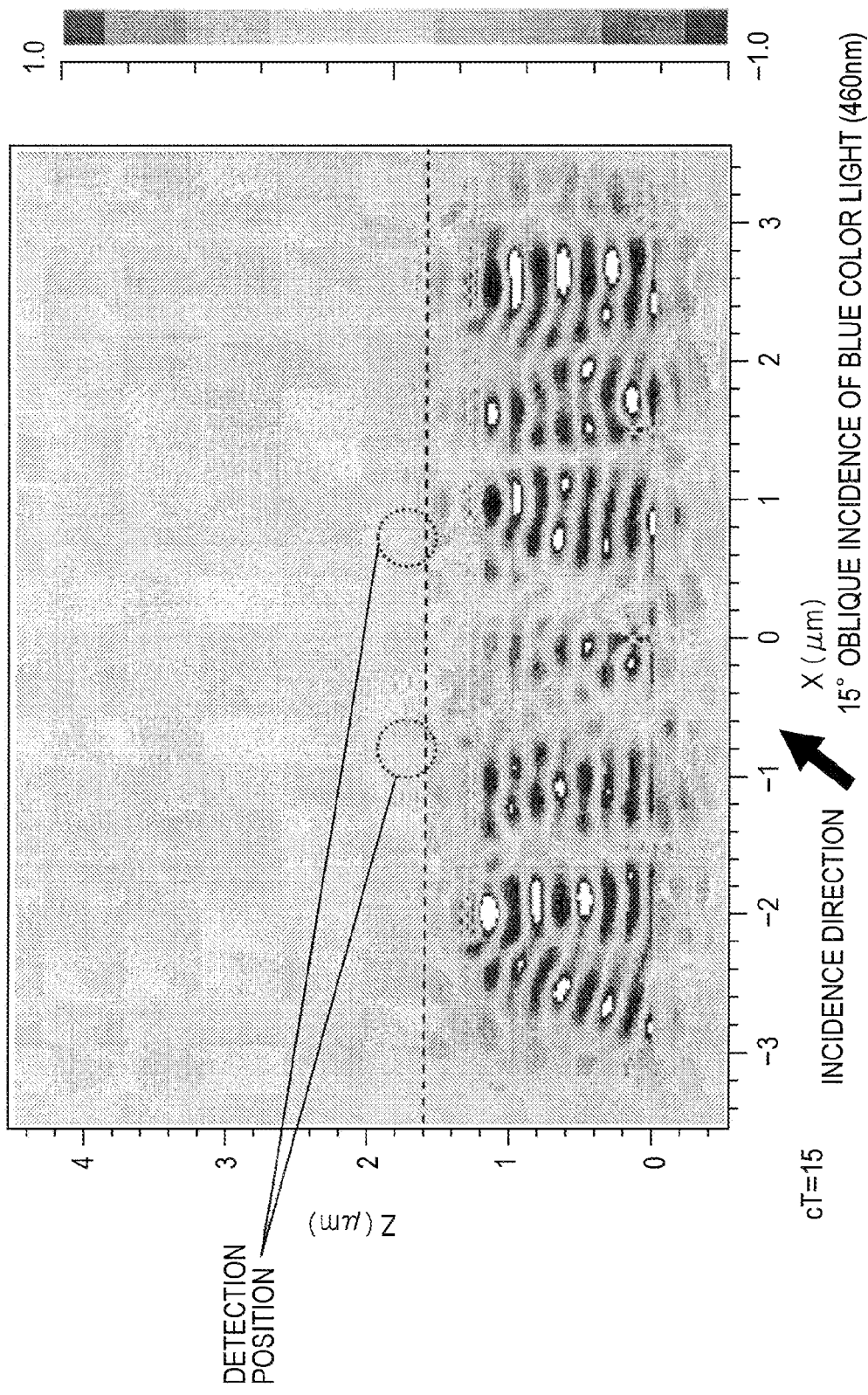

FIG. 57 is a diagram of computation simulation using blue light (wavelength 460 nm) obliquely incident at 15°.

Figure 58:
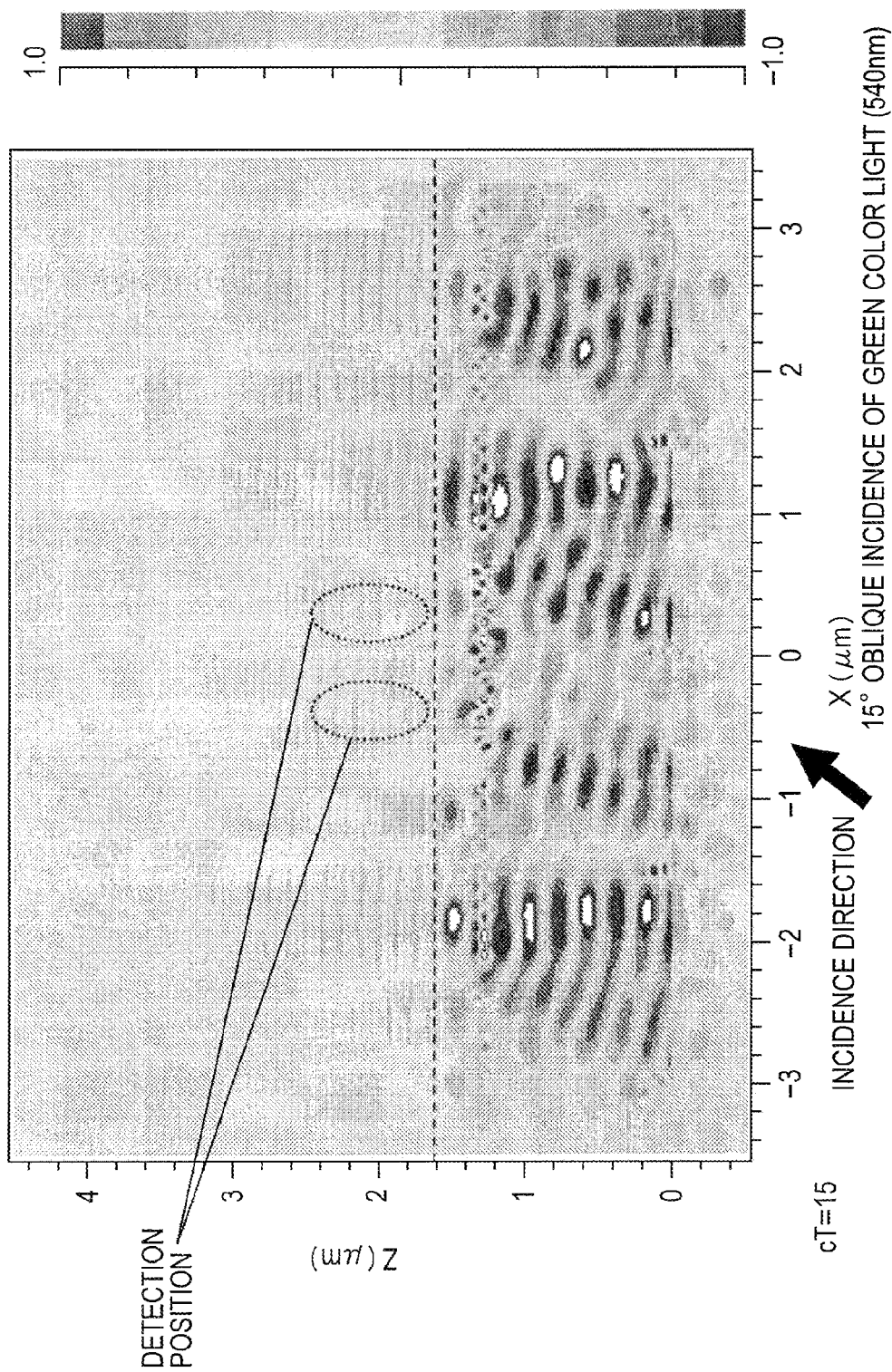

FIG. 58 is a diagram of computation simulation using green light (wavelength 540 nm) obliquely incident at 15°.

Figure 59:
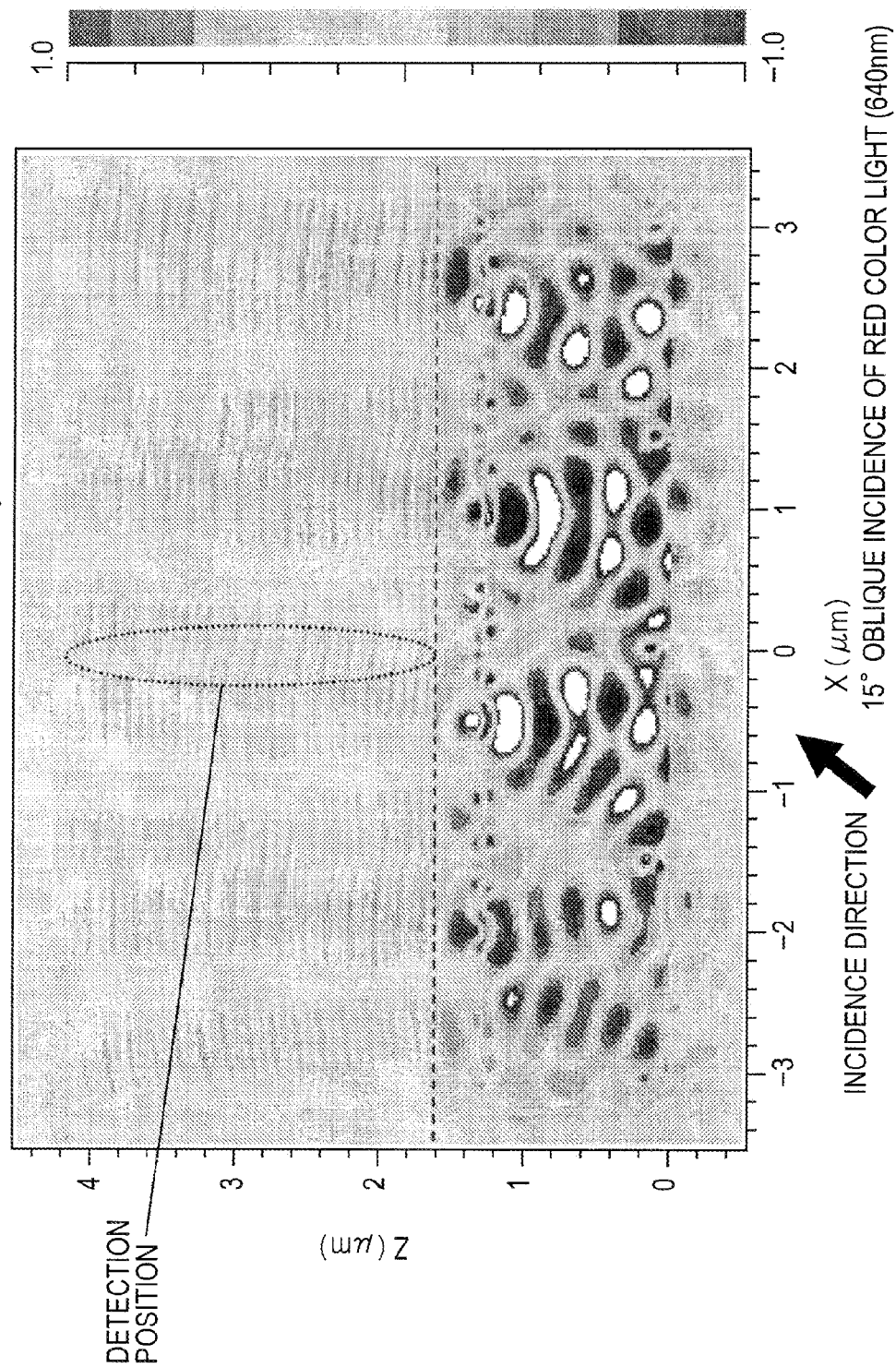

FIG. 59 is a diagram of computation simulation using red light (wavelength 640 nm) obliquely incident at 15°.

Figure 60:
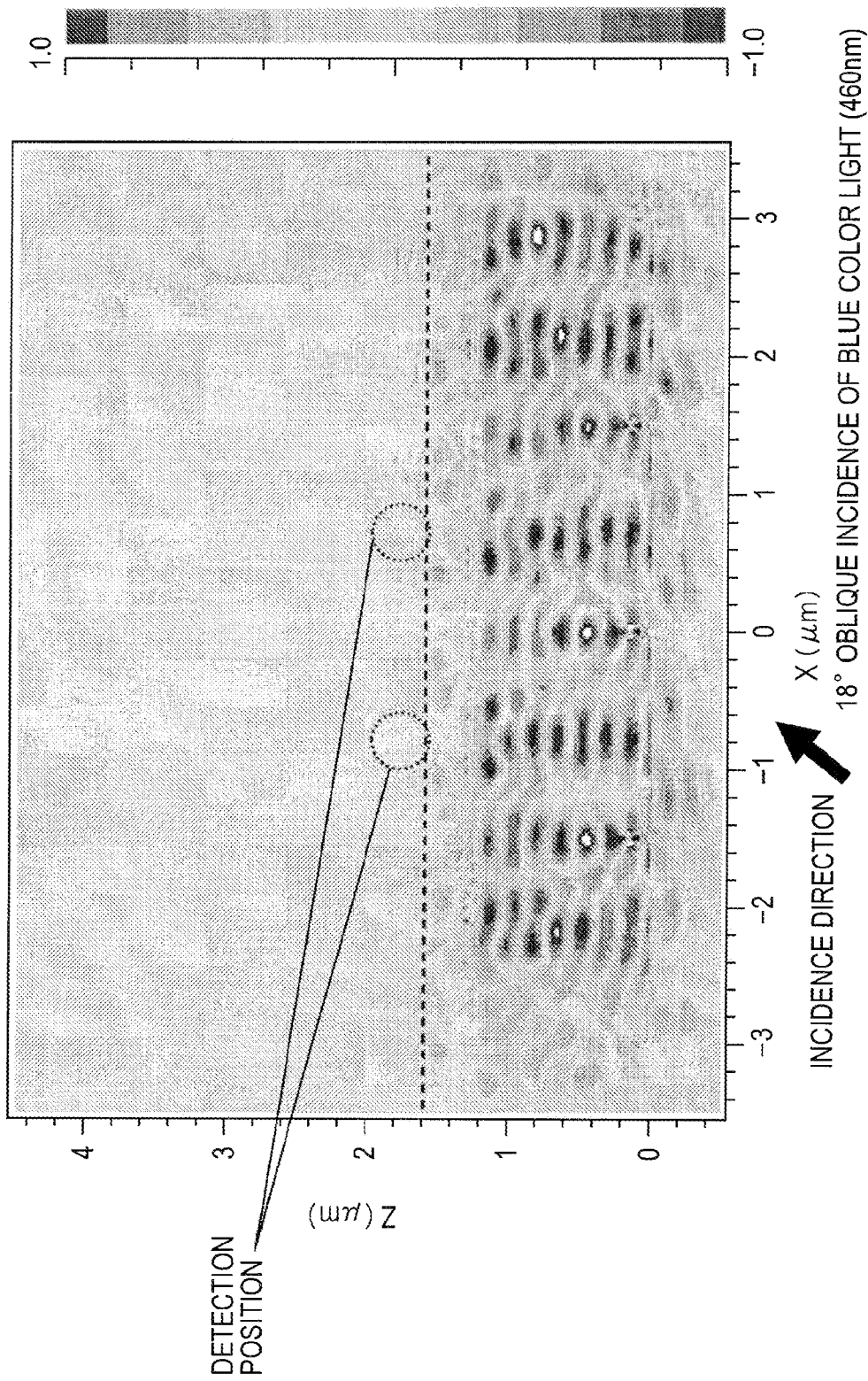

FIG. 60 is a diagram of computation simulation using blue light (wavelength 460 nm) obliquely incident at 18°.

Figure 61:
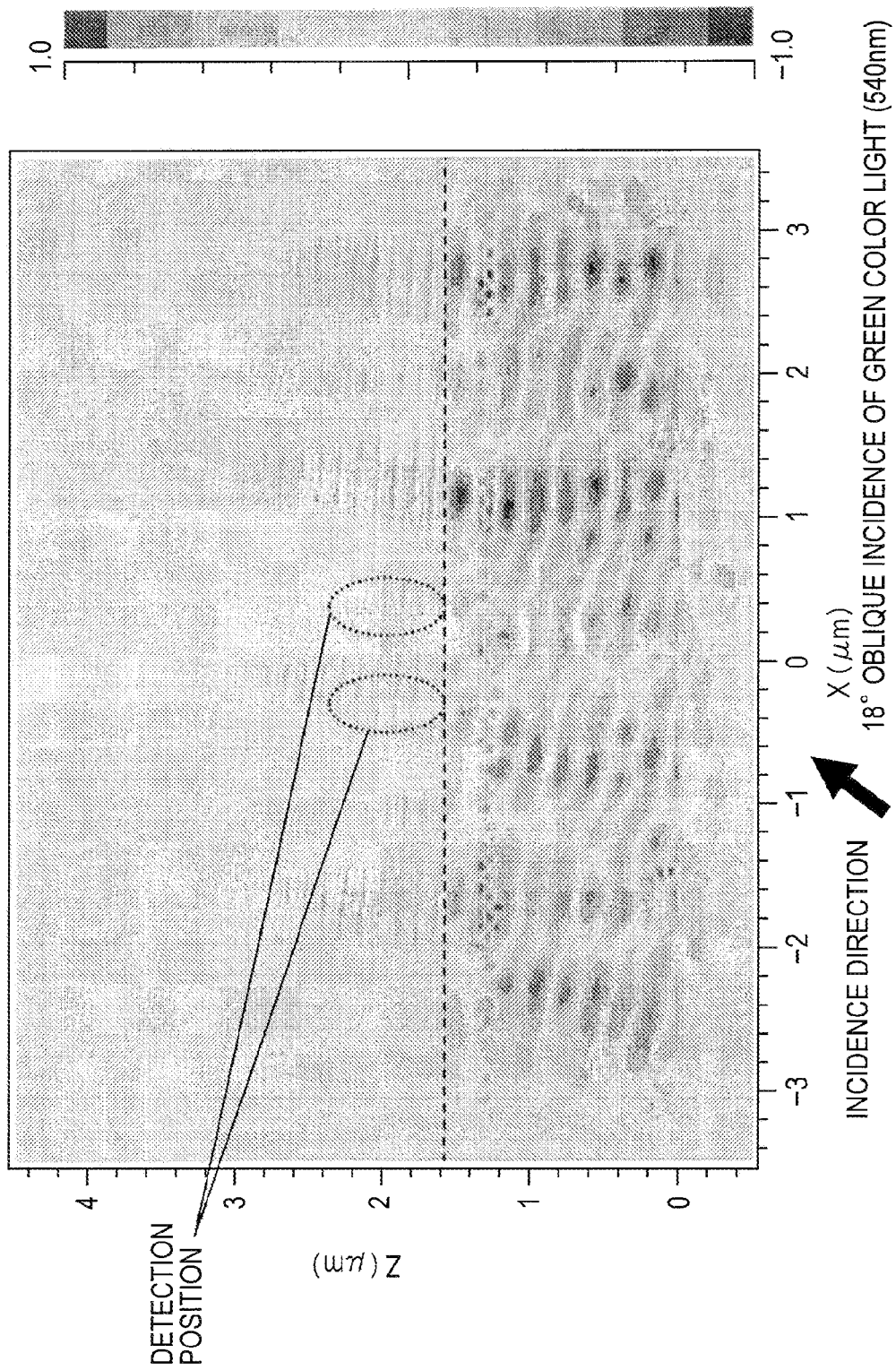

FIG. 61 is a diagram of computation simulation using green light (wavelength 540 nm) obliquely incident at 18°.

Figure 62:
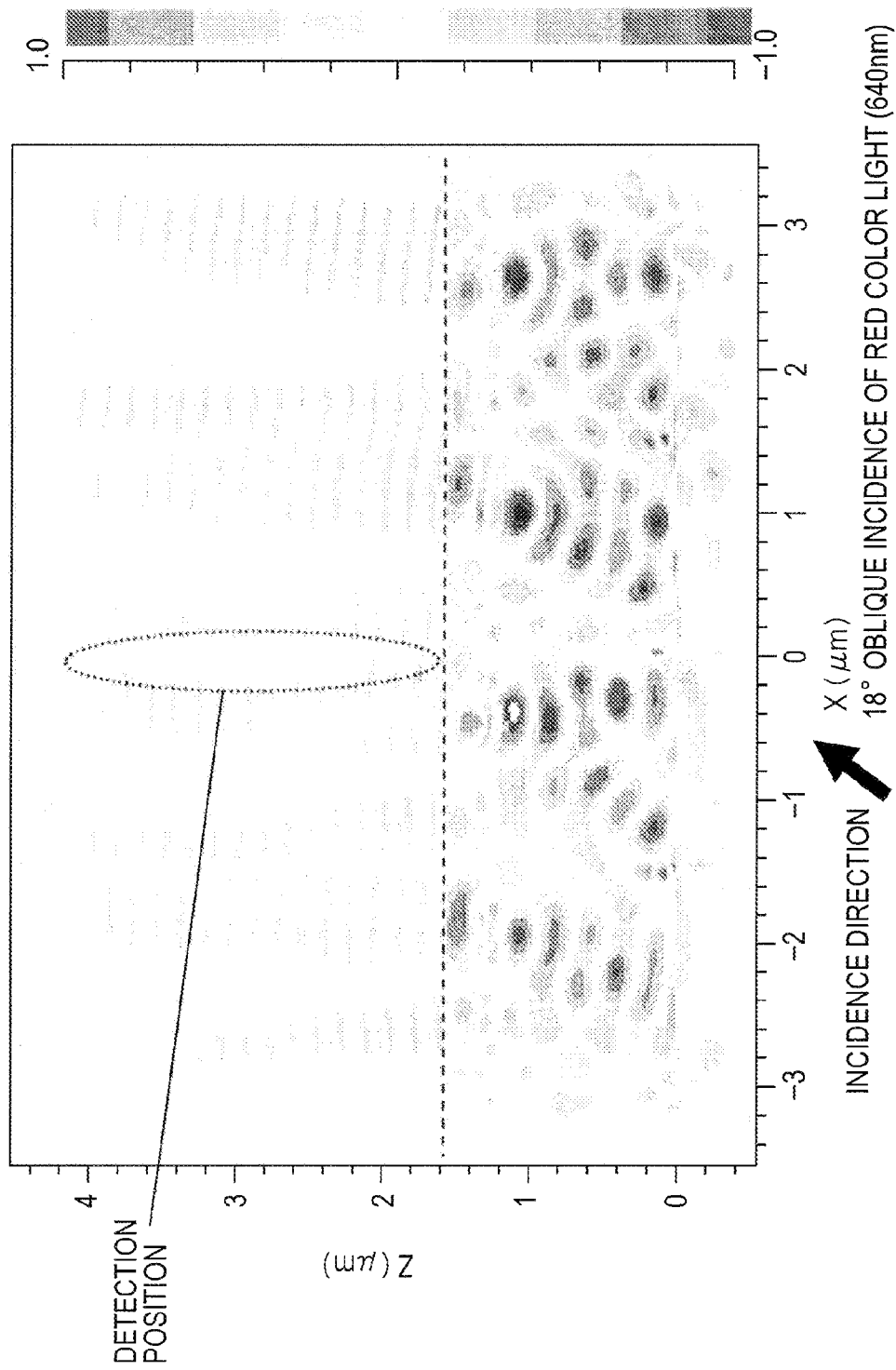

FIG. 62 is a diagram of computation simulation using red light (wavelength 640 nm) obliquely incident at 18°.

Figure 63:
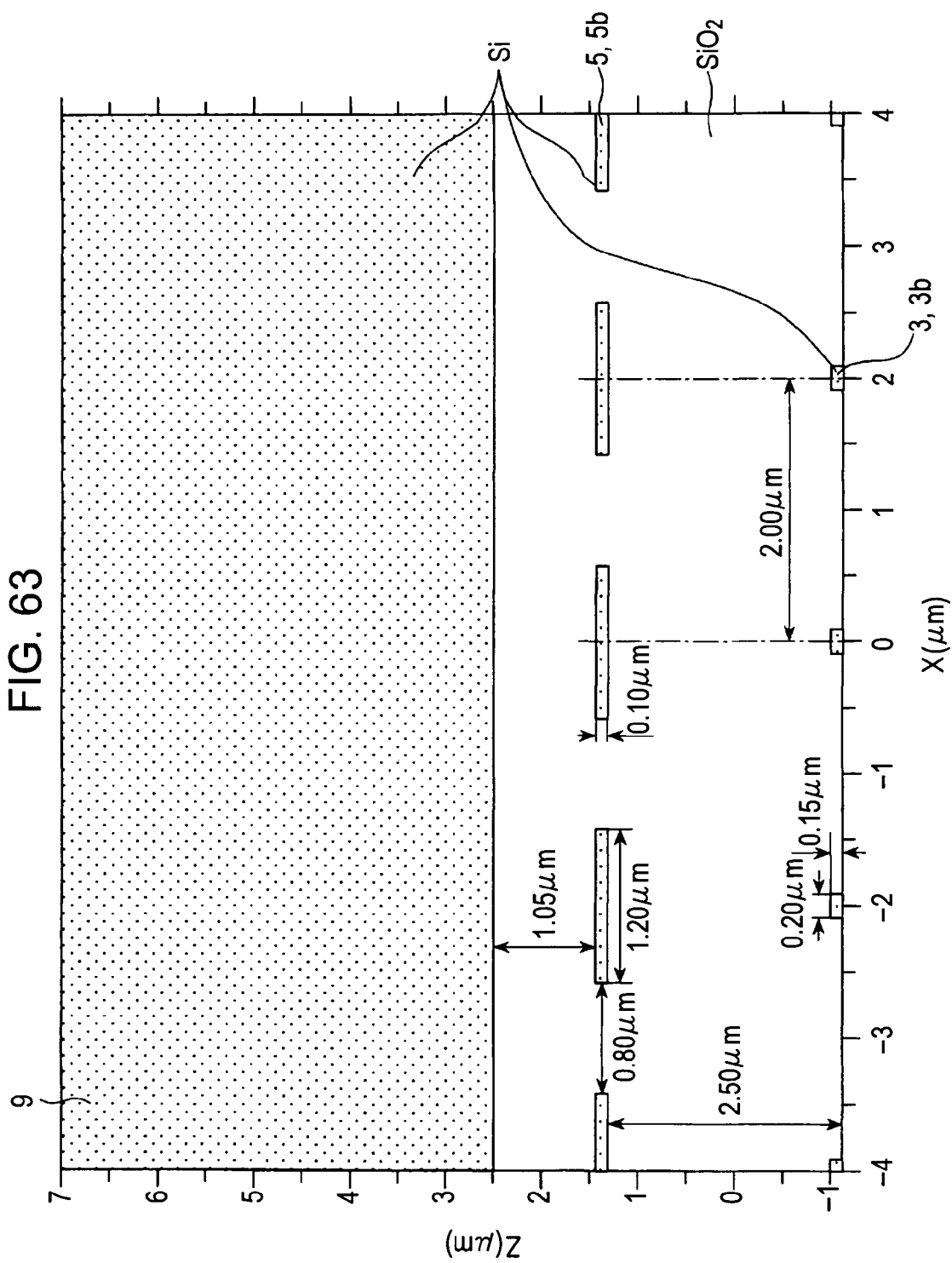

FIG. 63 is a drawing illustrating a spectral image sensor according to another embodiment (for infrared light) in which a diffraction grating is disposed on the incidence surface side of a Si substrate.

FIG. 64 is a table showing the relation of wavelength dispersion to the refractive index and extinction coefficient of Si used in a spectral image sensor for infrared light.

Figure 65:
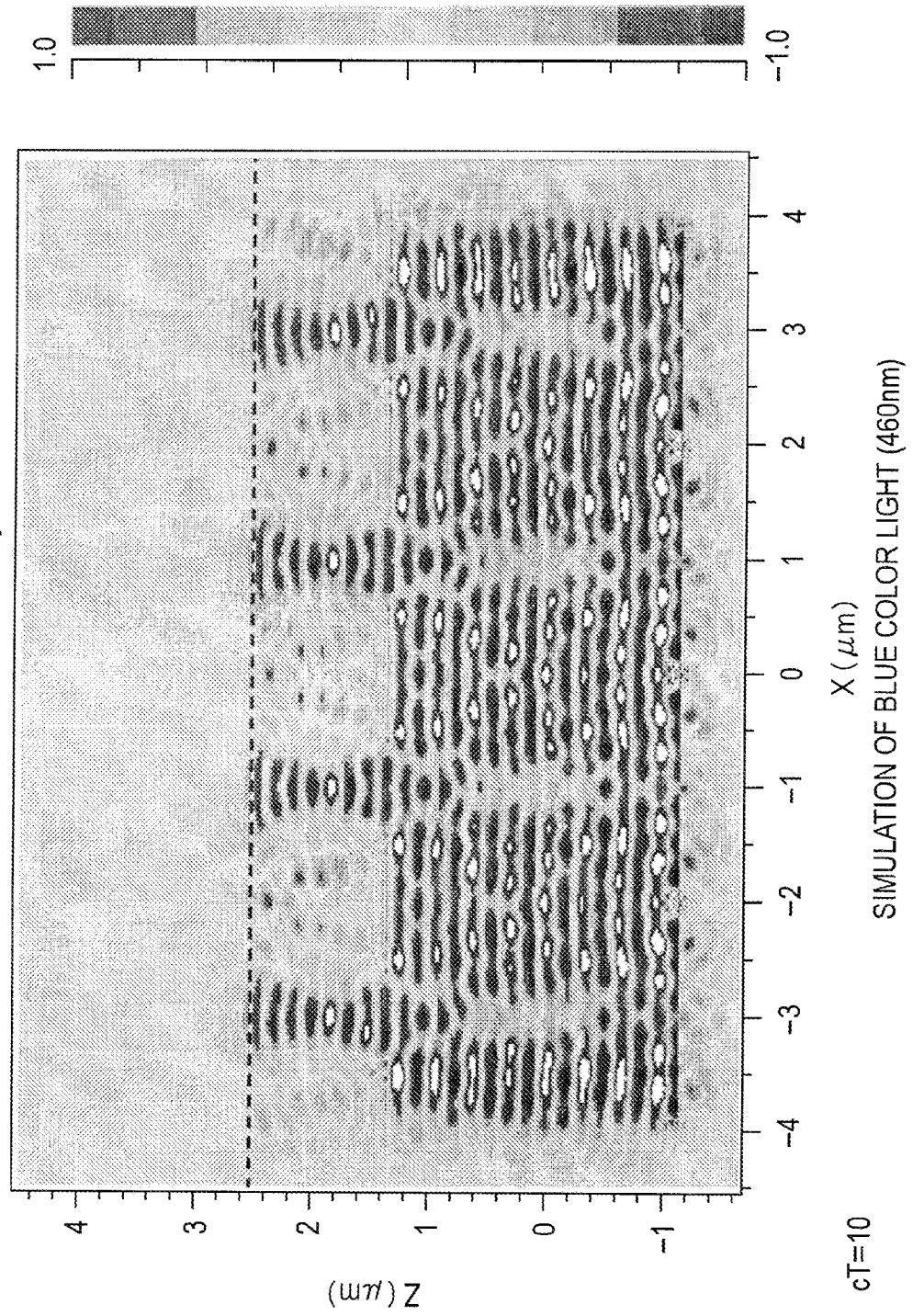

FIG. 65 is a diagram of computation simulation for illustrating a spectral method using blue light (wavelength 460 nm) incident on the light-receiving surface of a spectral image sensor having the structure shown in FIG. 63.

Figure 66:
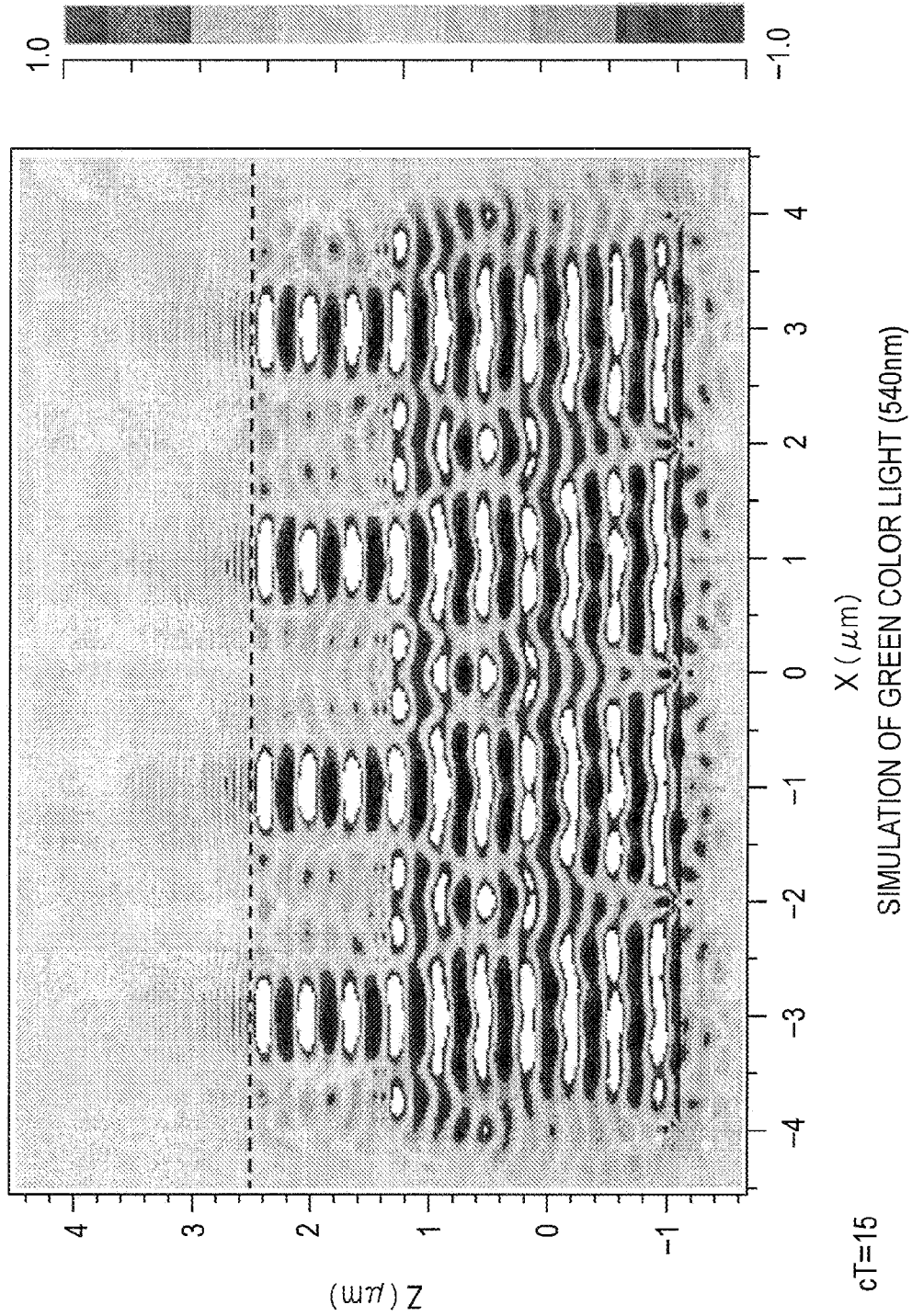

FIG. 66 is a diagram of computation simulation for illustrating a spectral method using green light (wavelength 540 nm) incident on the light-receiving surface of a spectral image sensor having the structure shown in FIG. 63.

Figure 67:
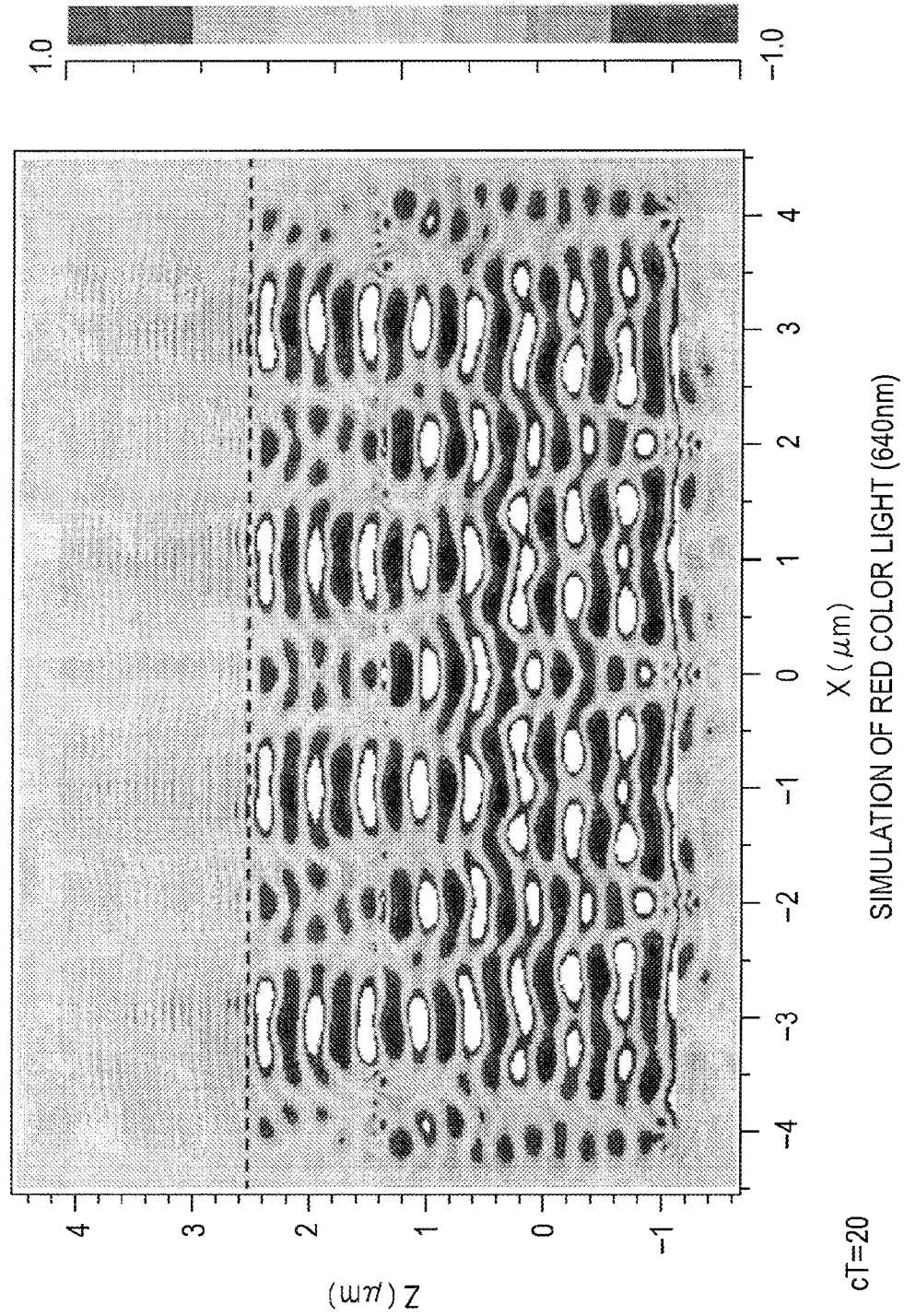

FIG. 67 is a diagram of computation simulation for illustrating a spectral method using red light (wavelength 640 nm) incident on the light-receiving surface of a spectral image sensor having the structure shown in FIG. 63.

Figure 68:
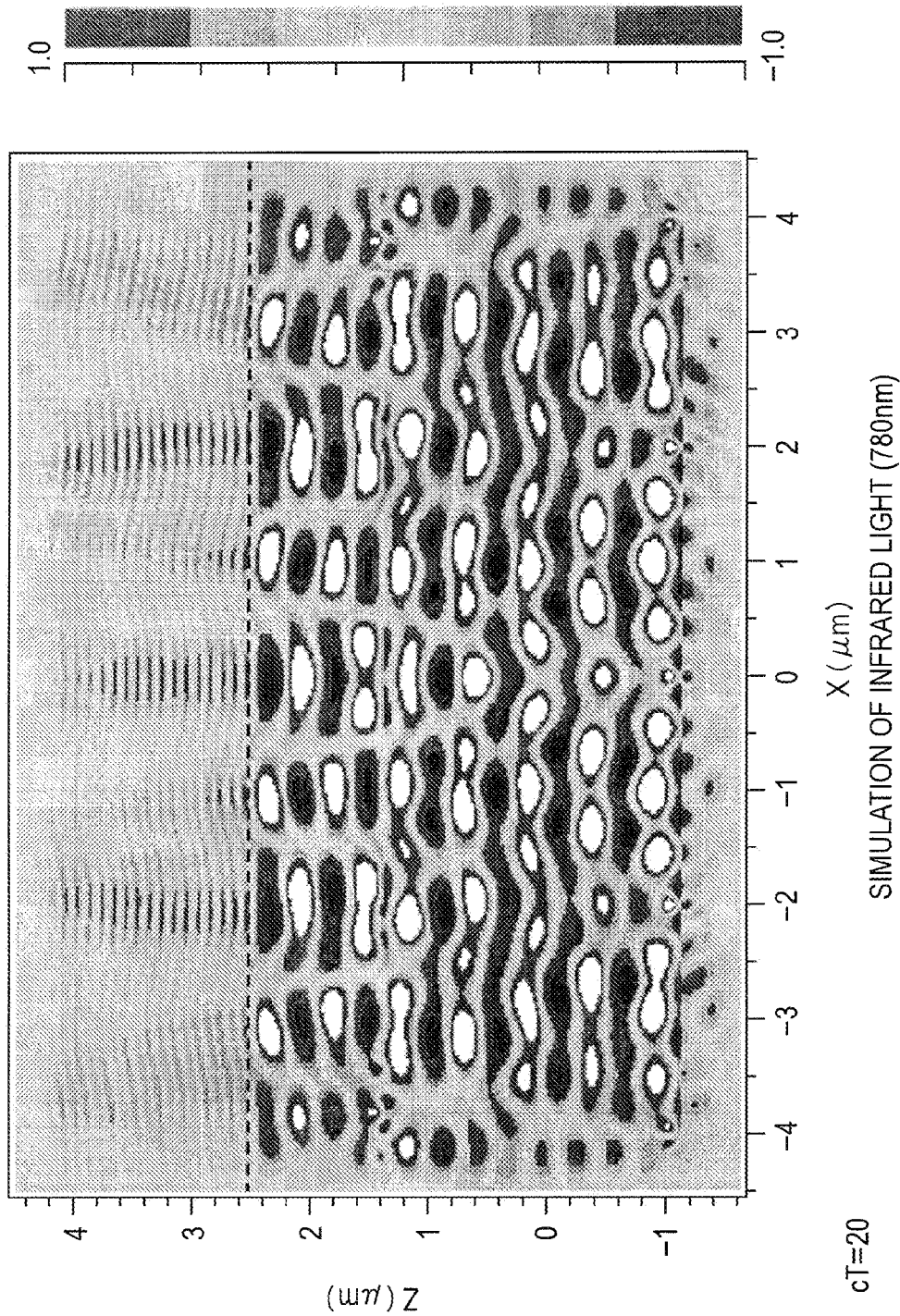

FIG. 68 is a diagram of computation simulation for illustrating a spectral method using infrared light (wavelength 780 nm) incident on the light-receiving surface of a spectral image sensor having the structure shown in FIG. 63.

Figure 69:
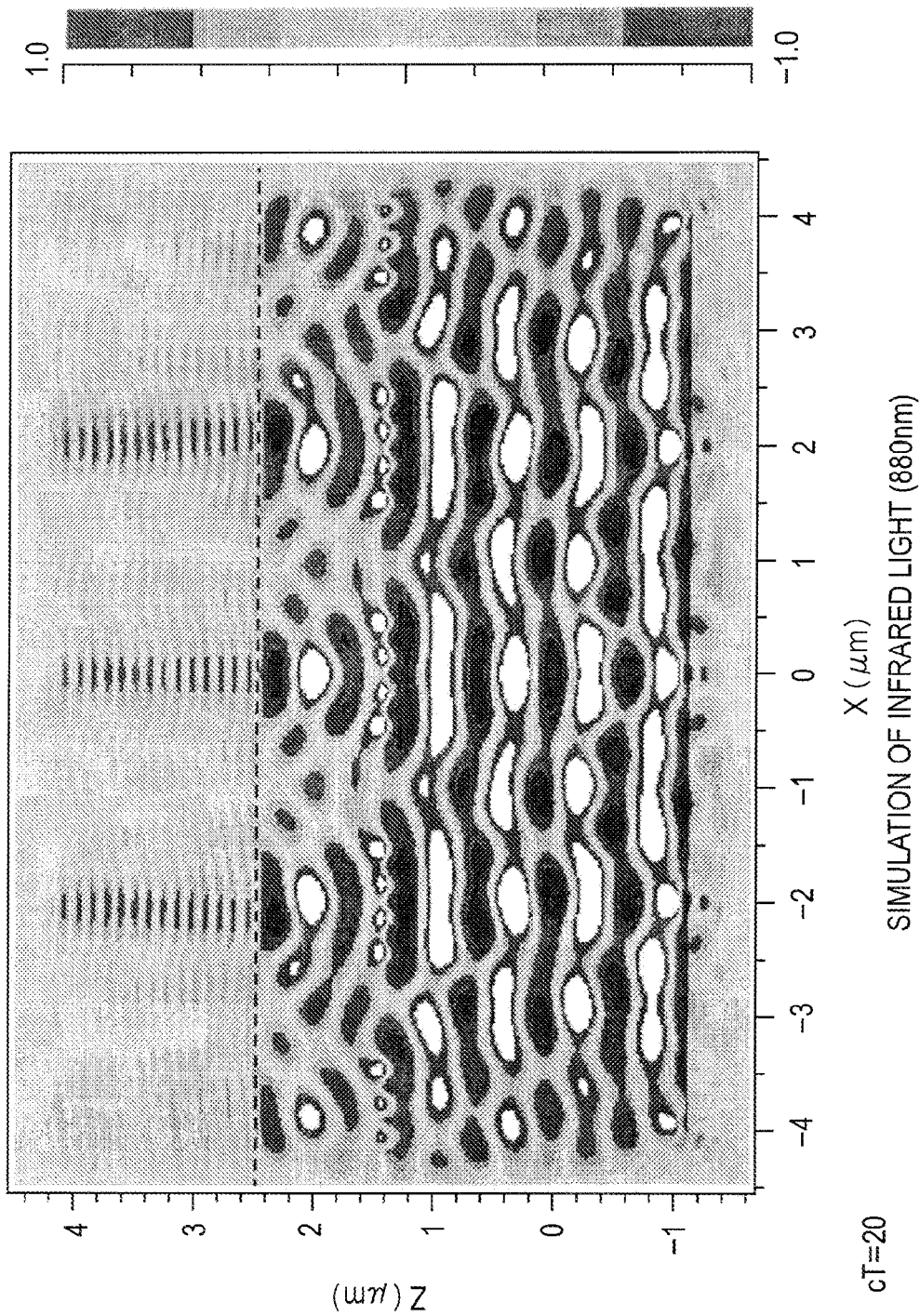

FIG. 69 is a diagram of computation simulation for illustrating a spectral method using infrared light (wavelength 880 nm) incident on the light-receiving surface of a spectral image sensor having the structure shown in FIG. 63.

Figure 70:
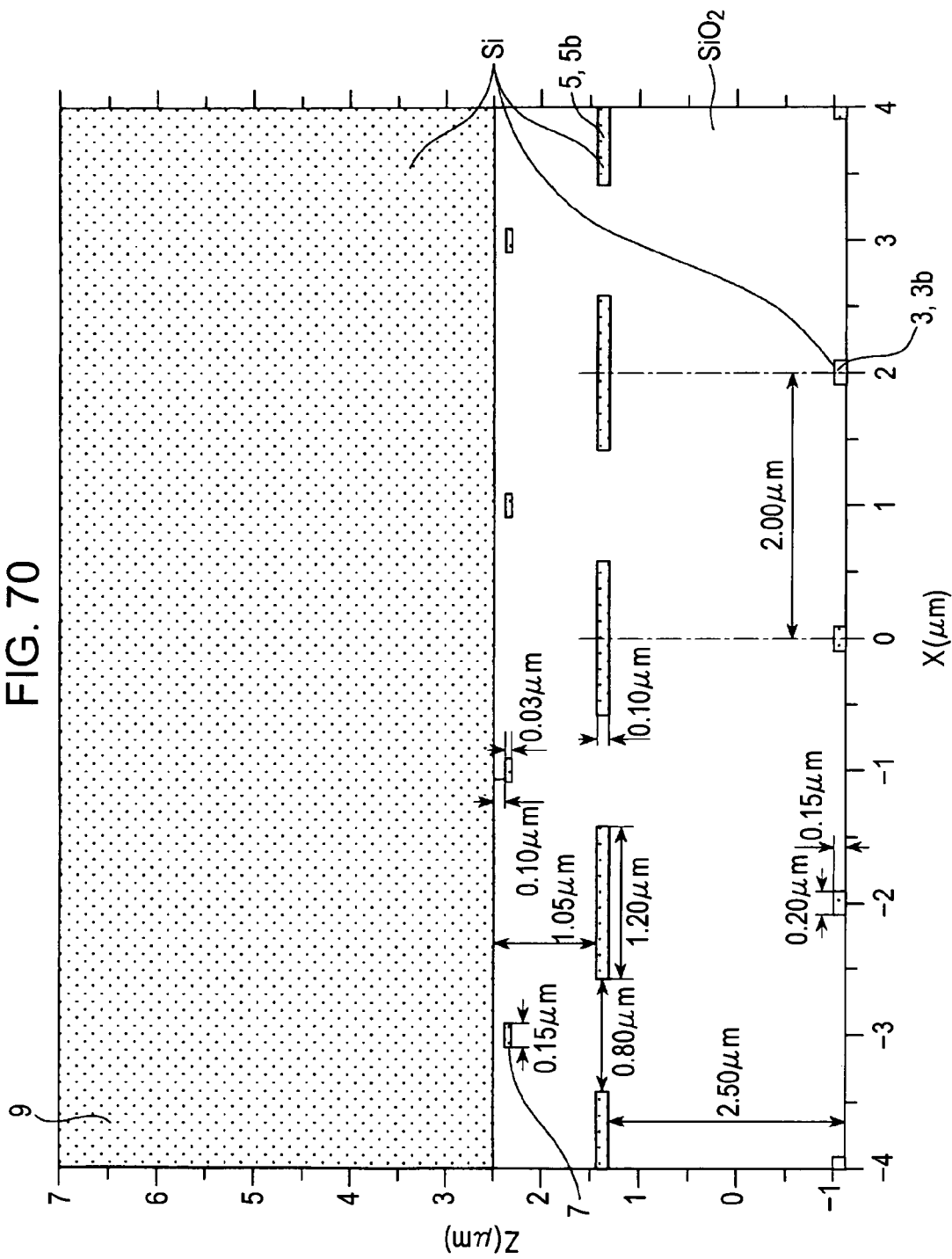

FIG. 70 is a sectional view showing a sectional structure of a spectral image sensor for dispersing light into infrared light the primary color components of the visible light band.

Figure 71:
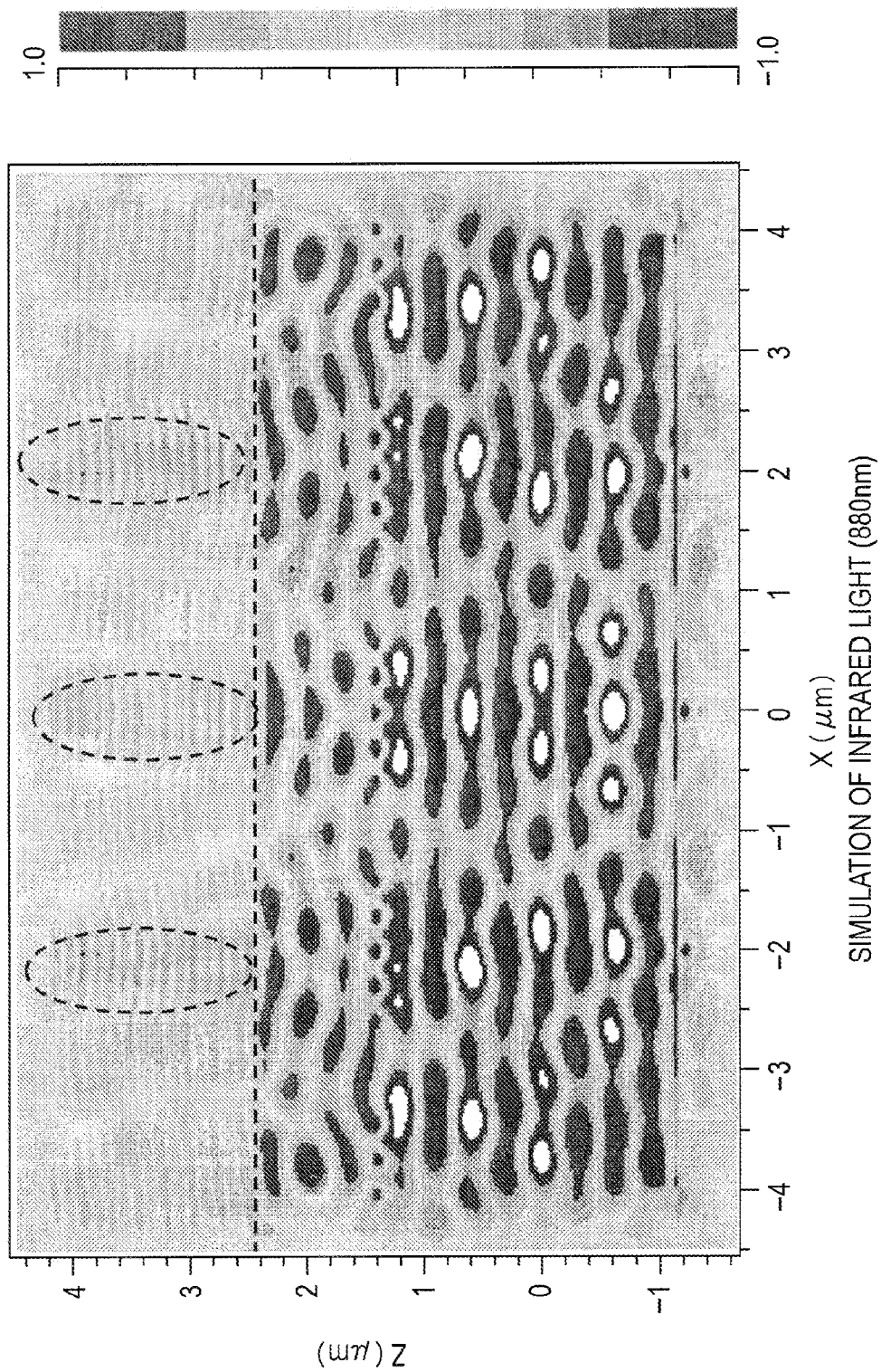

FIG. 71 is a diagram of computation simulation for illustrating a spectral method using infrared light (wavelength 880 nm) incident on the light-receiving surface of a spectral image sensor having the structure shown in FIG. 70.

Figure 72:
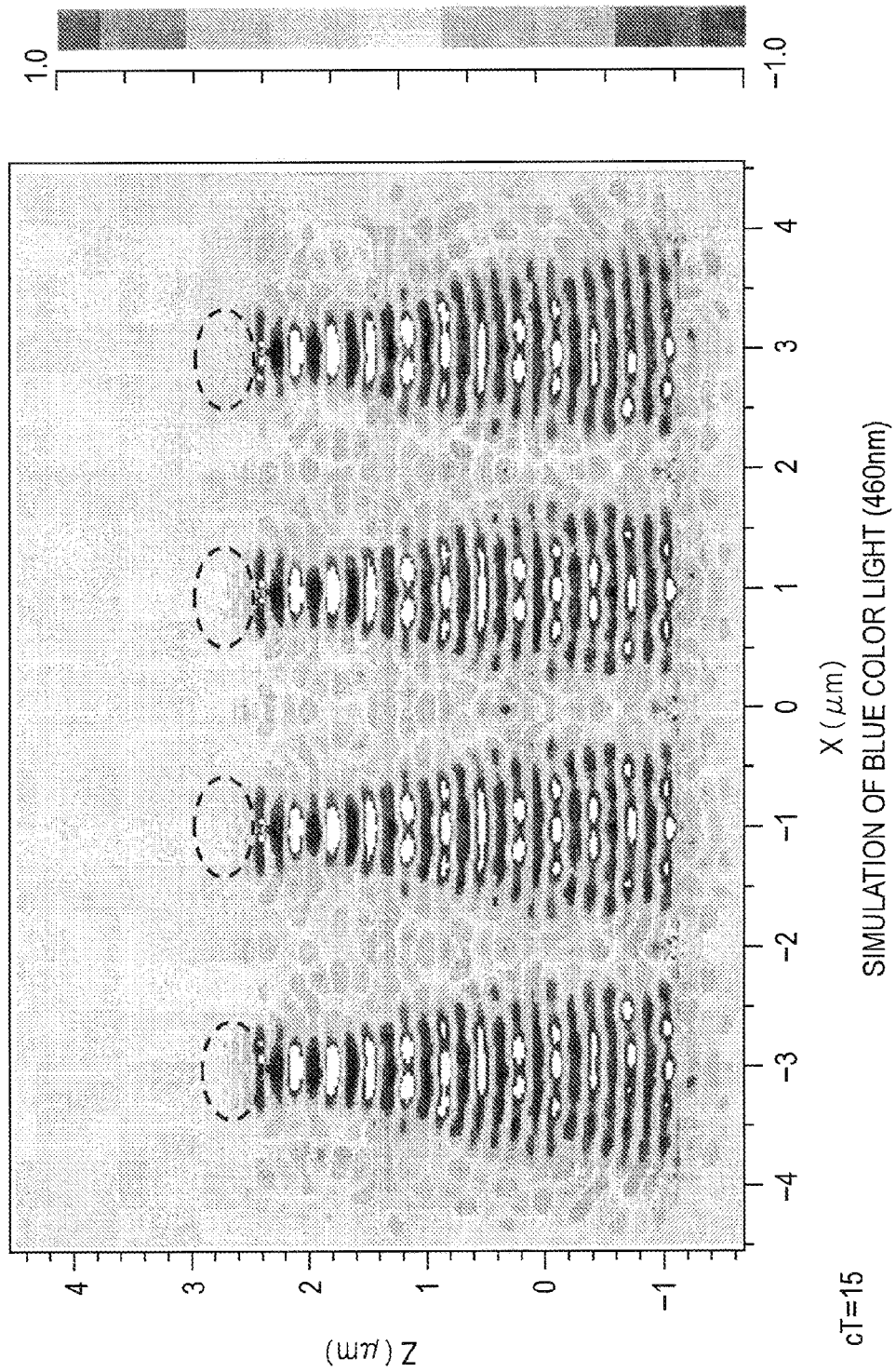

FIG. 72 is a diagram of computation simulation for illustrating a spectral method using blue light (wavelength 460 nm) incident on the light-receiving surface of a spectral image sensor having the structure shown in FIG. 70.

Figure 73:
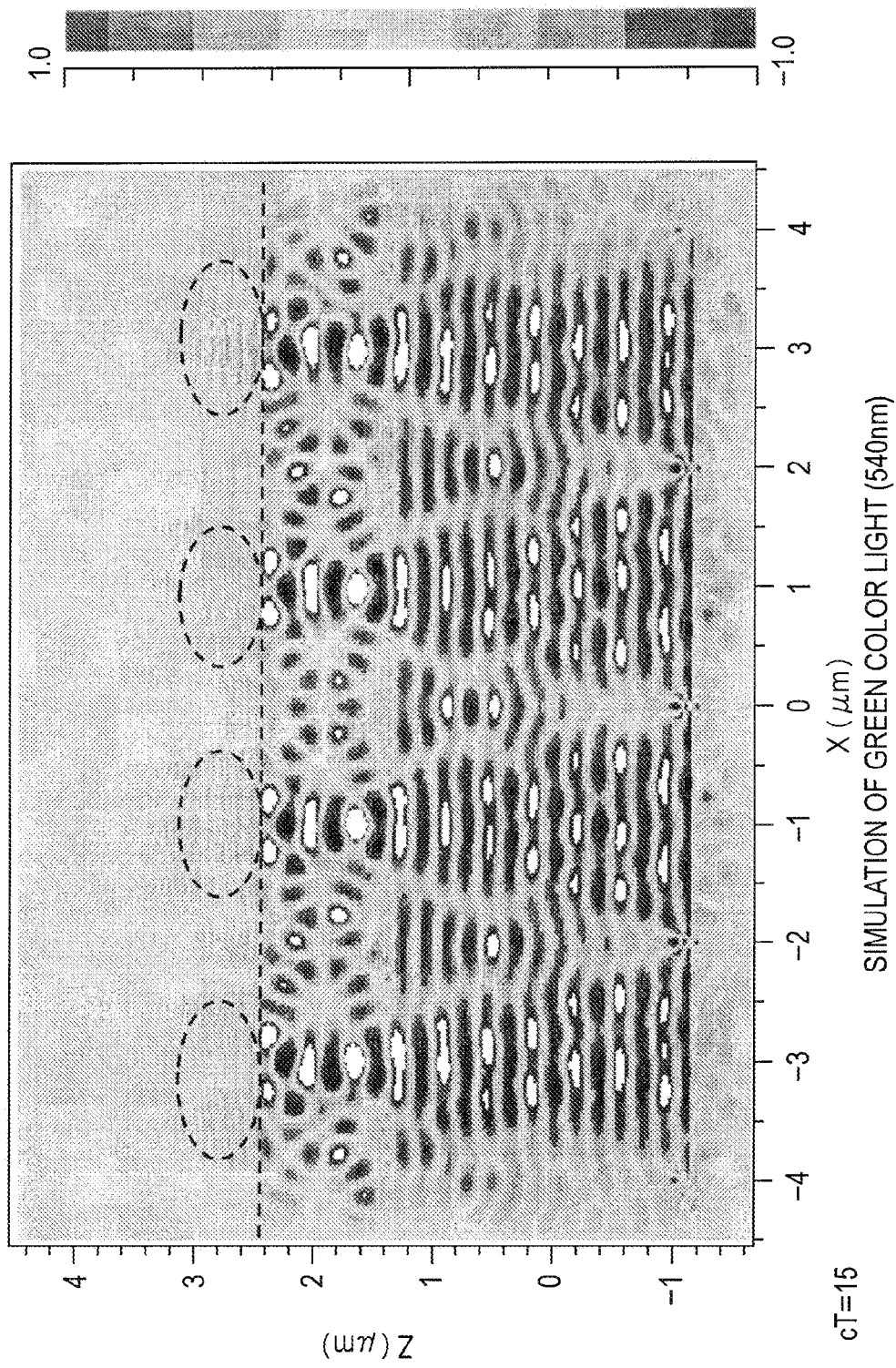

FIG. 73 is a diagram of computation simulation for illustrating a spectral method using green light (wavelength 540 nm) incident on the light-receiving surface of a spectral image sensor having the structure shown in FIG. 70.

Figure 74:
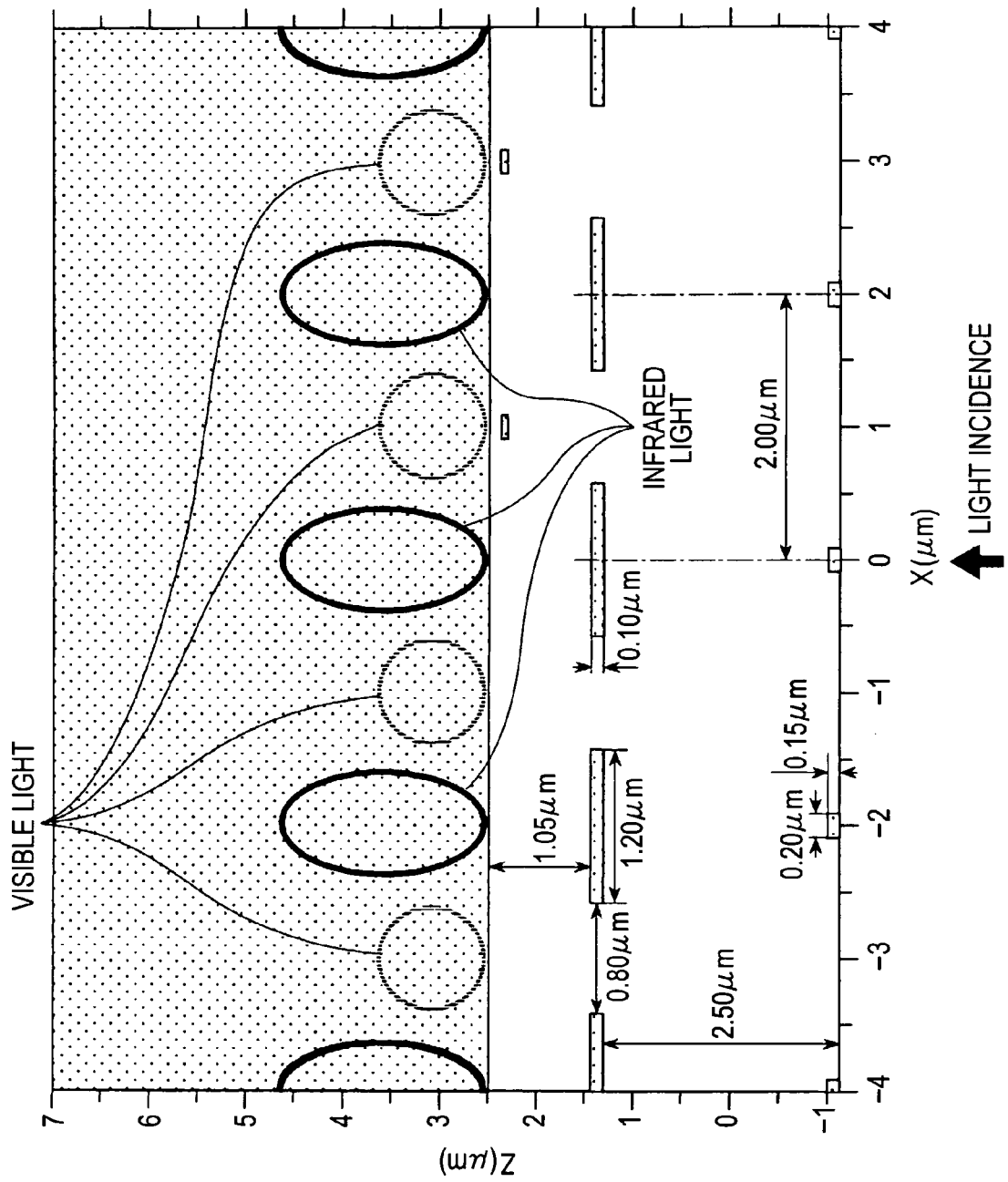

FIG. 74 is a drawing illustrating a proper example of detection positions for dispersing light into visible light and infrared light on the basis of simulation results.

Figure 75:
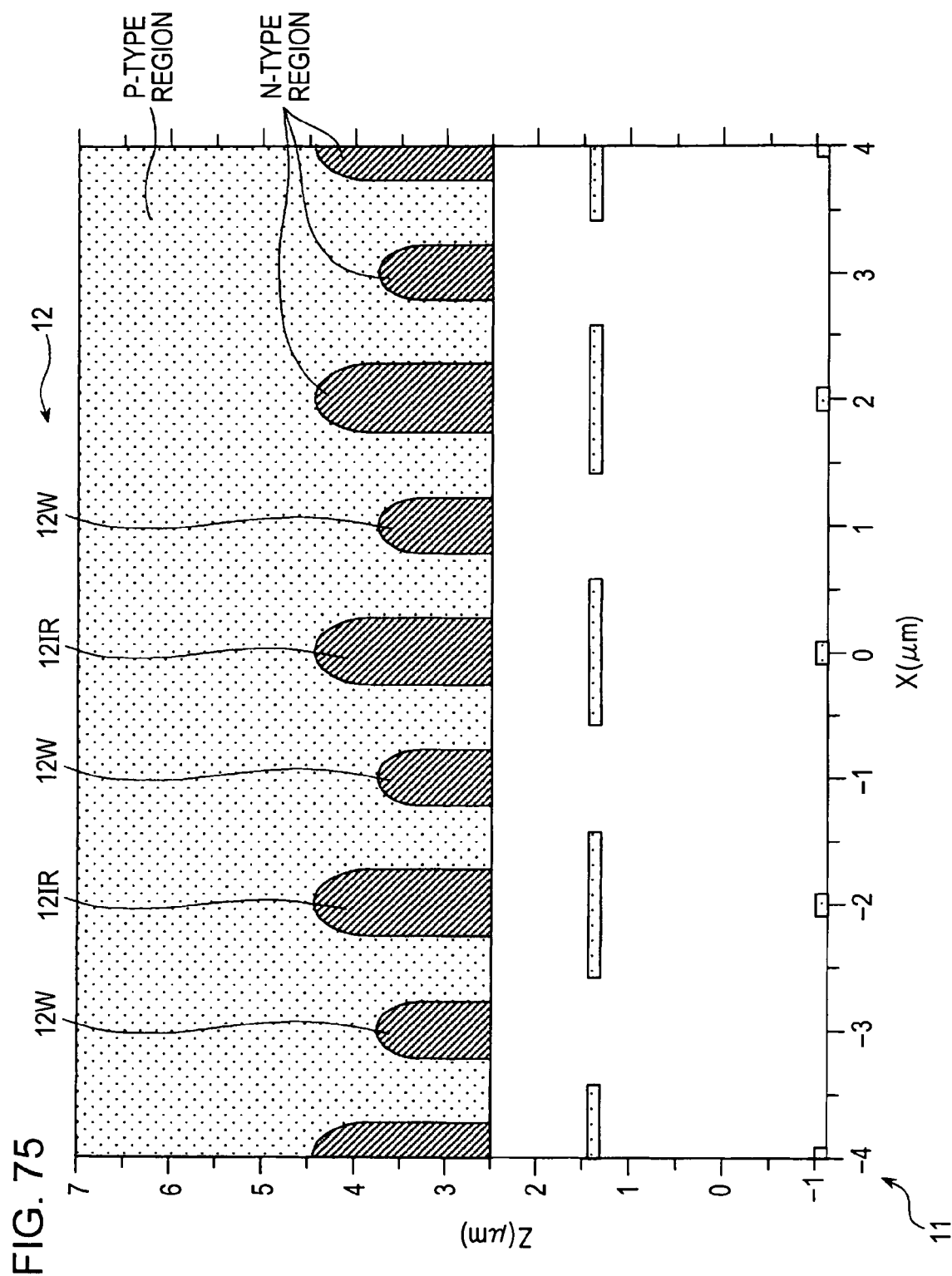

FIG. 75 is a sectional view showing a configuration example of a sensor structure for infrared light corresponding to the detection positions shown in FIG. 74.

Figure 76:
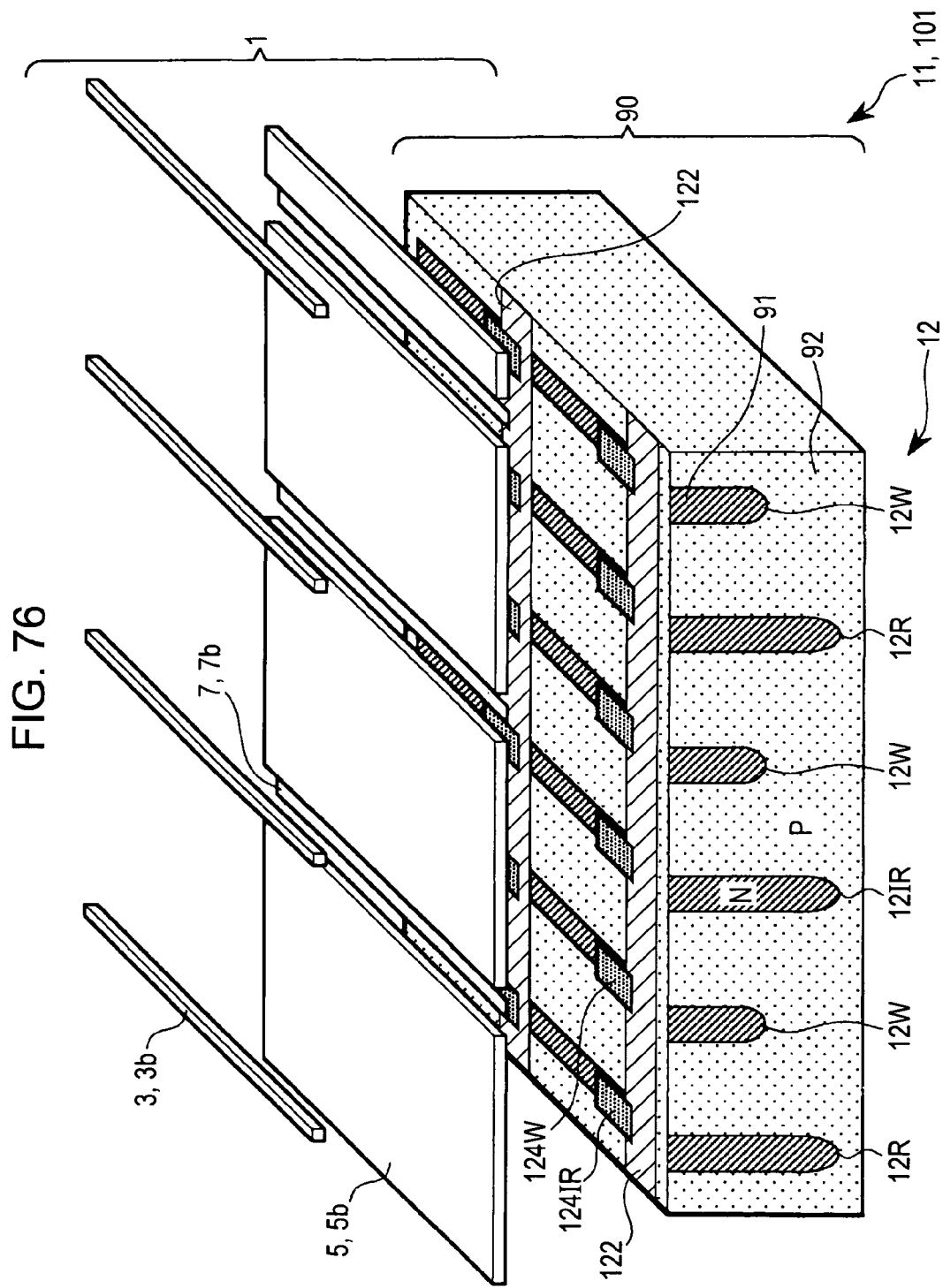

FIG. 76 is a sketch drawing showing an example of a structure when the sensor structure for infrared light shown in FIG. 75 is applied to an IT_CCD image sensor.

Figure 77:
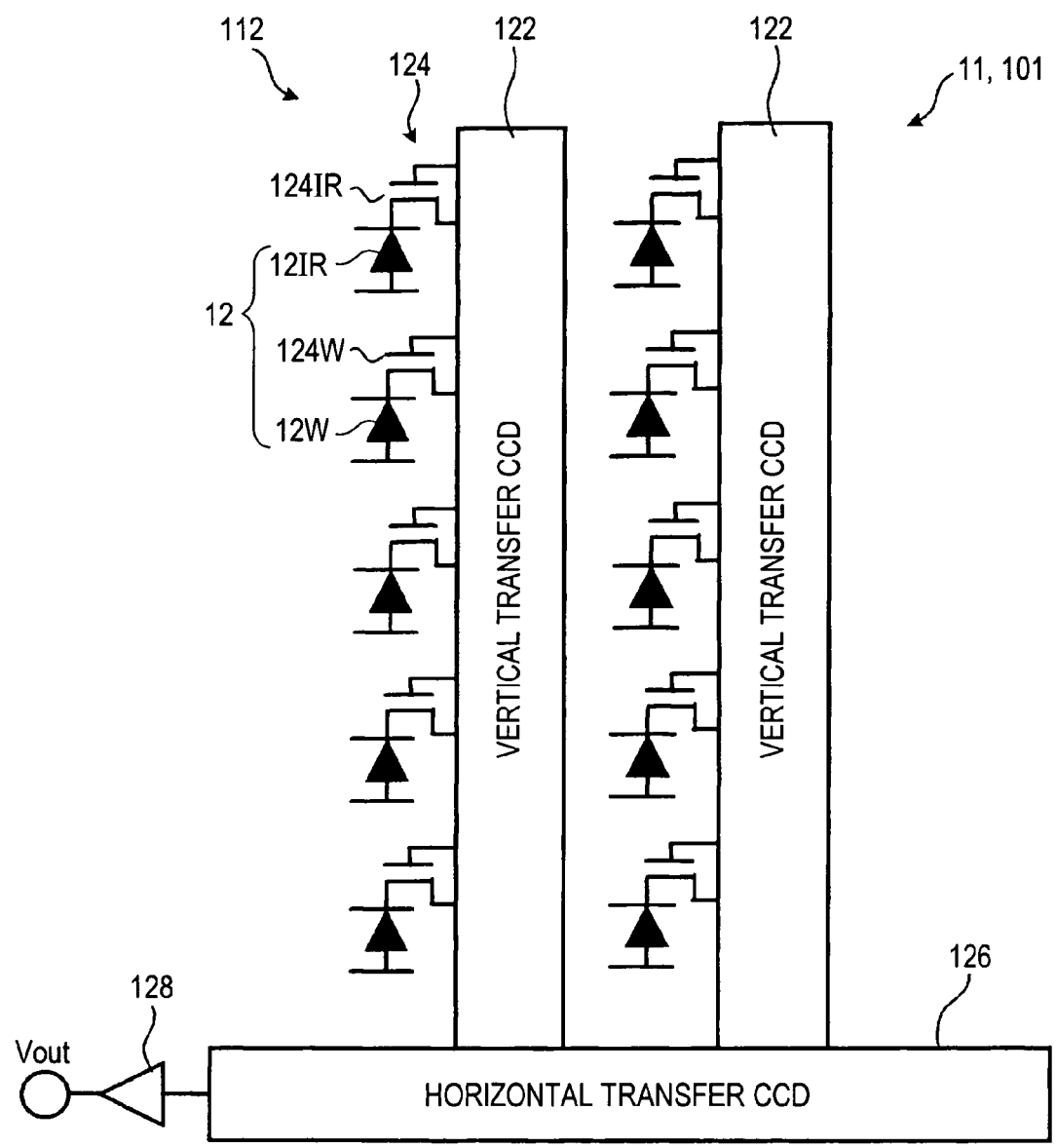

FIG. 77 is a drawing showing a circuit for application to an IT_CCD image sensor.

Figure 78:
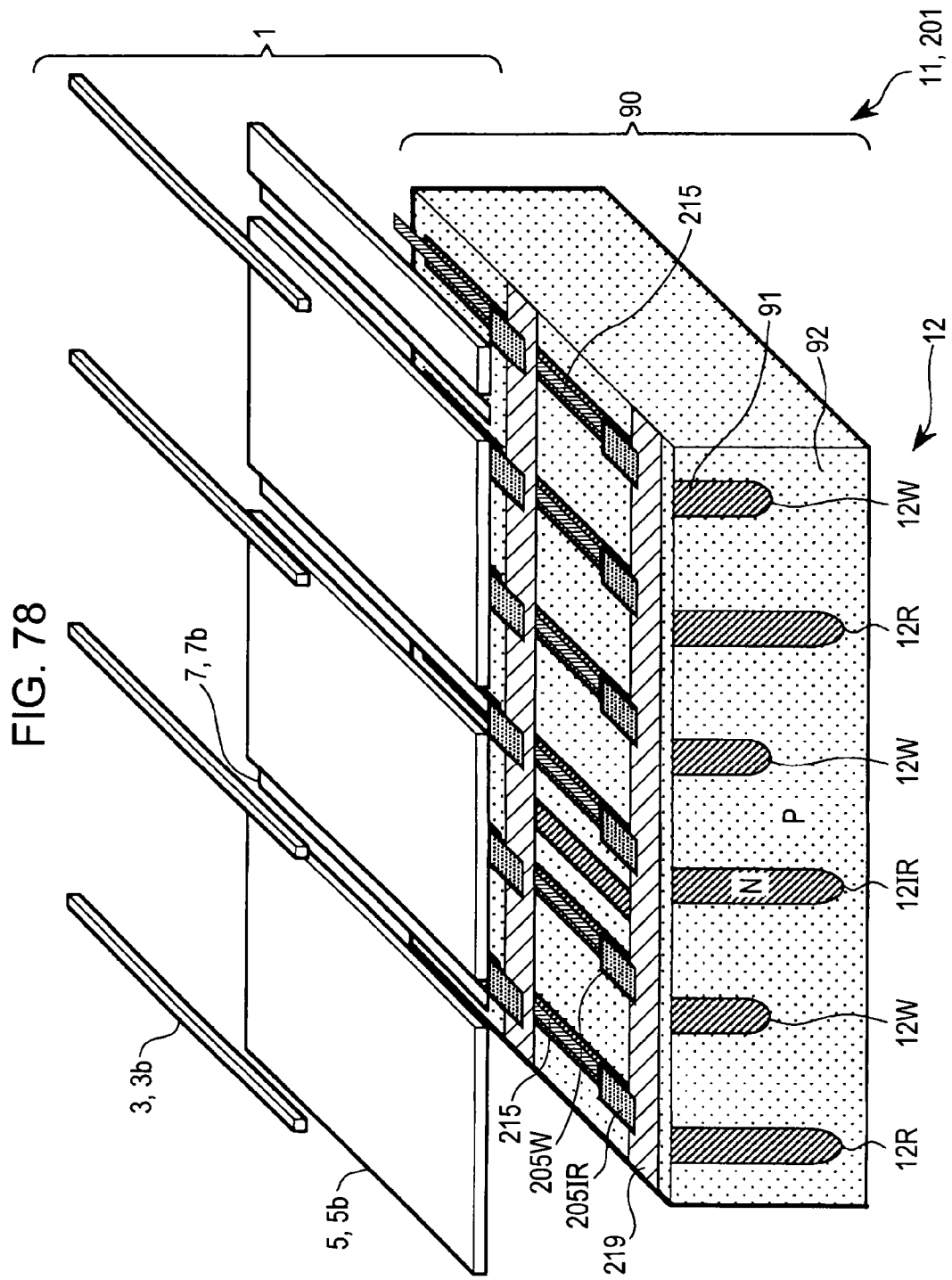

FIG. 78 is a sketch drawing showing an example of a structure when the sensor structure for infrared light shown in FIG. 75 is applied to a CMOS image sensor.

Figure 79:
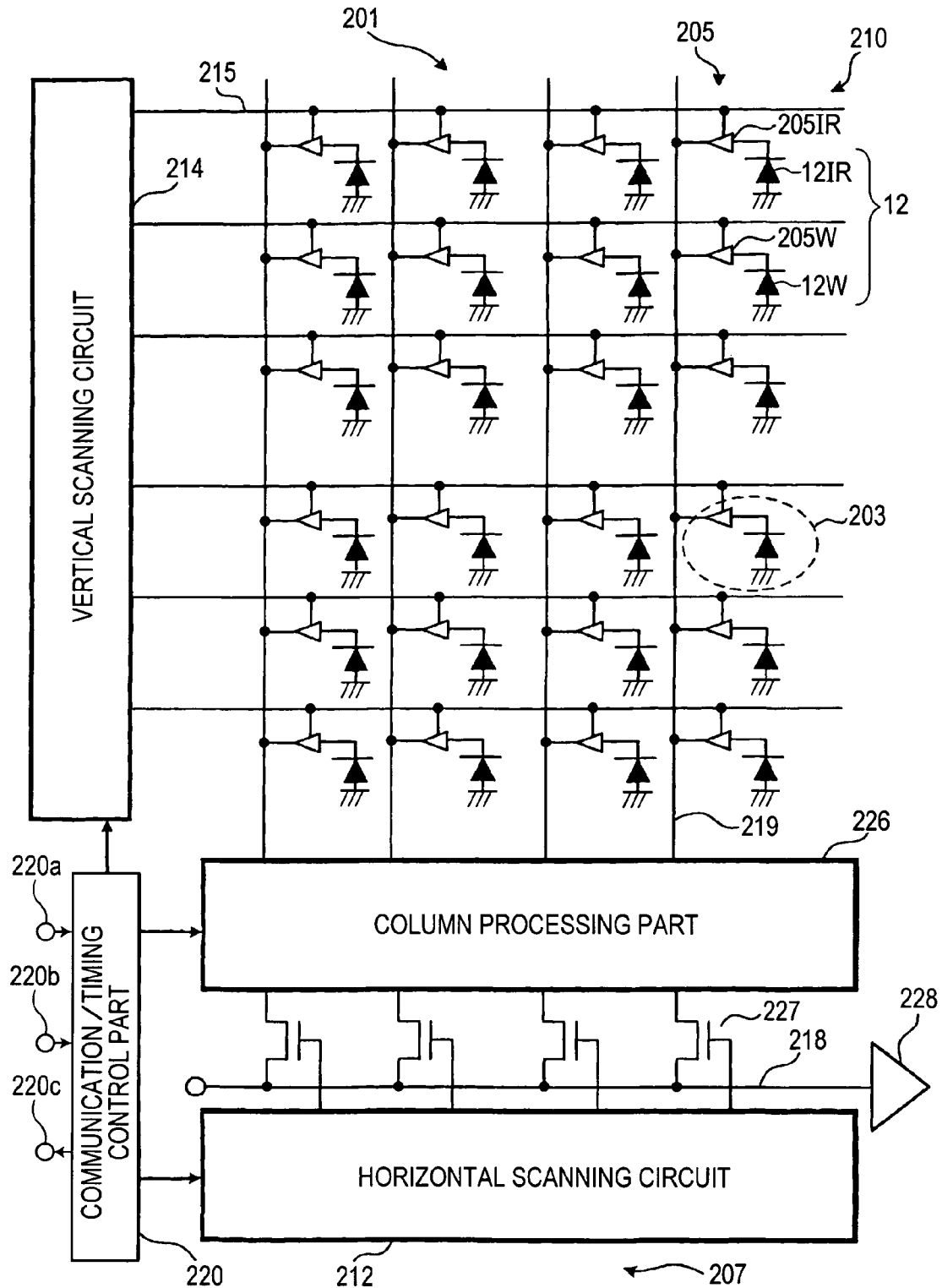

FIG. 79 is a drawing showing a circuit for application to a CMOS image sensor.

Figure 80:
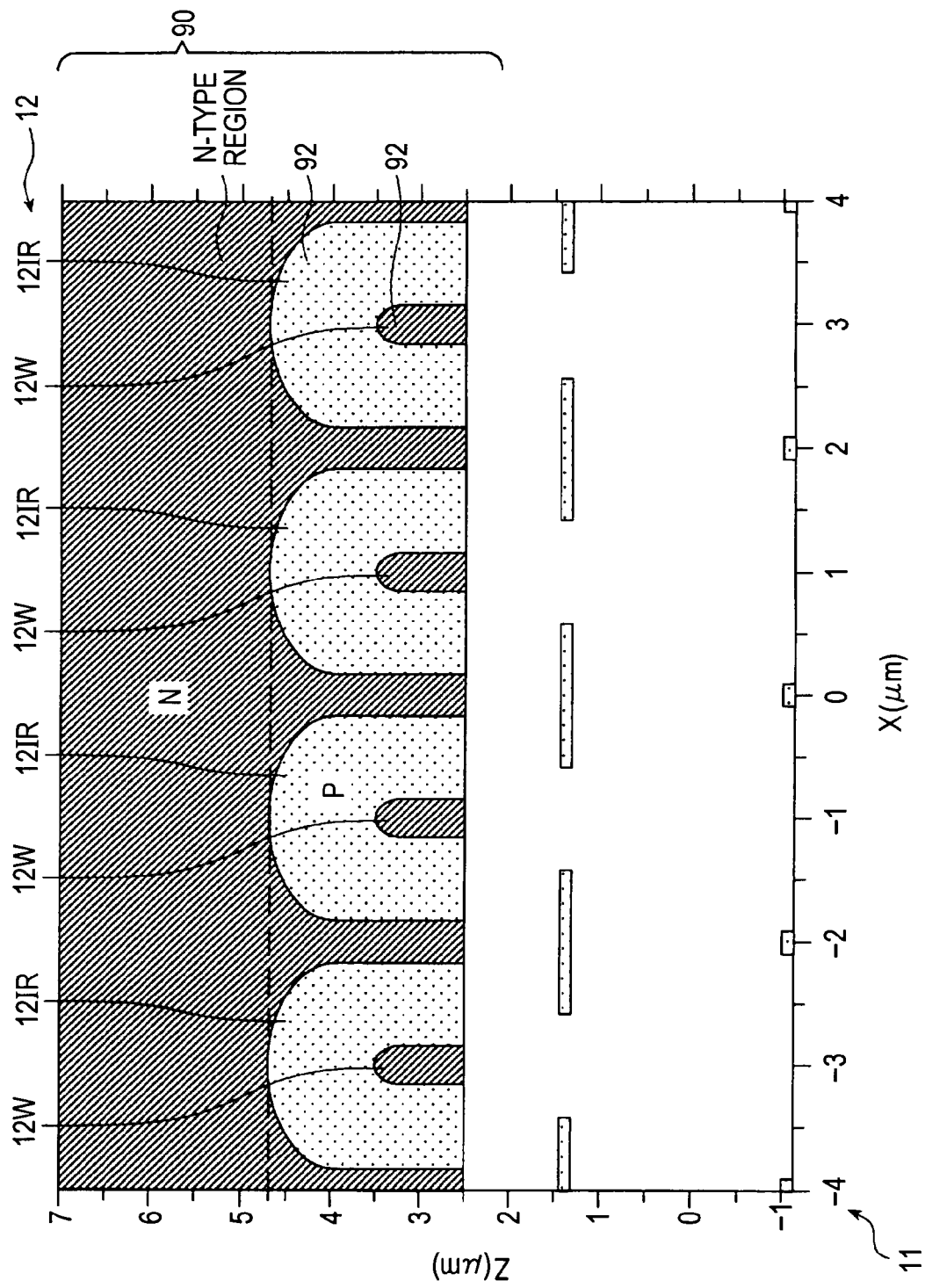

FIG. 80 is a sectional view showing a configuration example of a sensor structure of a second example corresponding to the detection positions for infrared light shown in FIG. 74.

Figure 81:
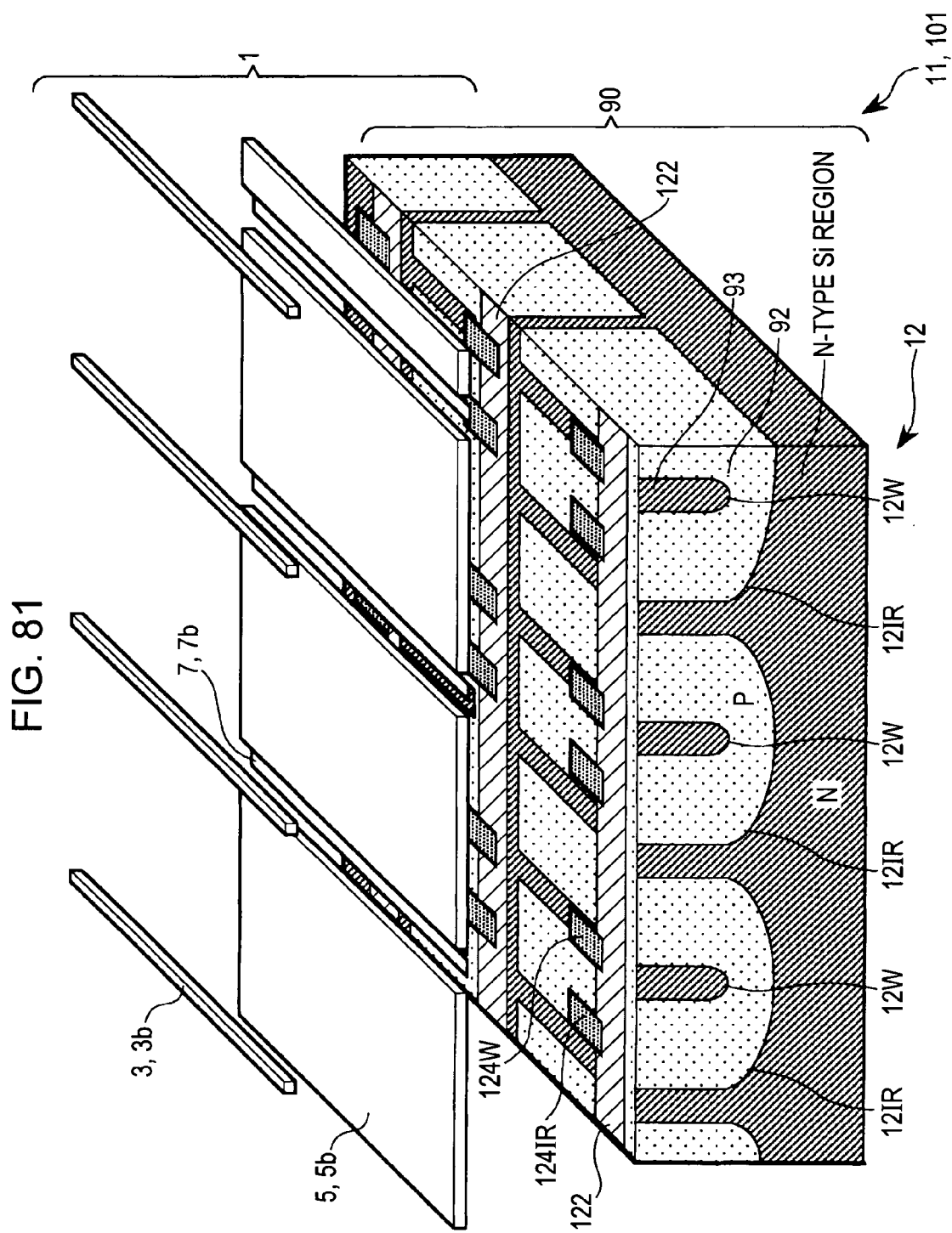

FIG. 81 is a sketch drawing showing an example of a structure when the sensor structure of the second example shown in FIG. 80 is applied to an IT_CCD image sensor.

Figure 82:
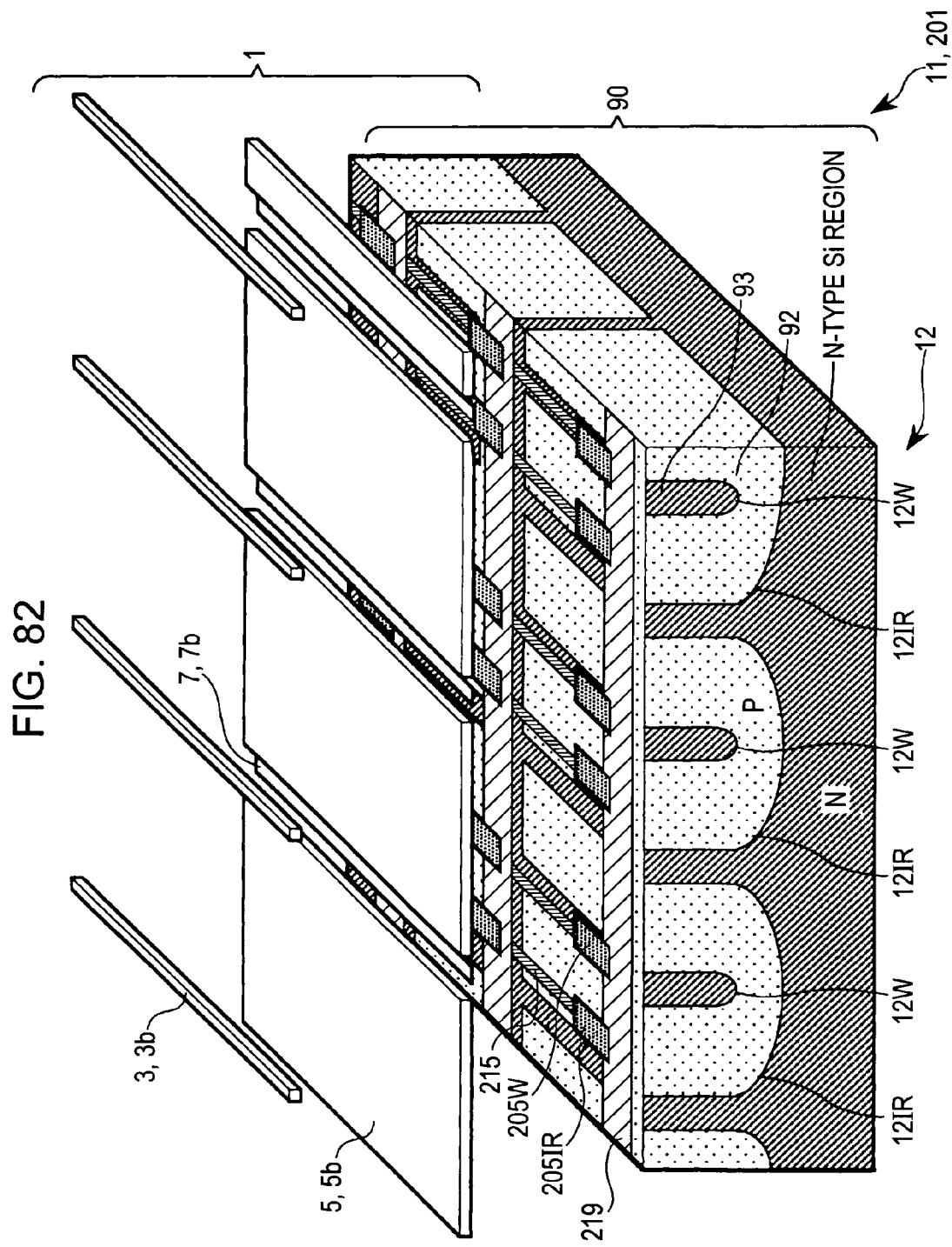

FIG. 82 is a sketch drawing showing an example of a structure when the sensor structure of the second example shown in FIG. 80 is applied to a CMOS image sensor.

Figure 83:
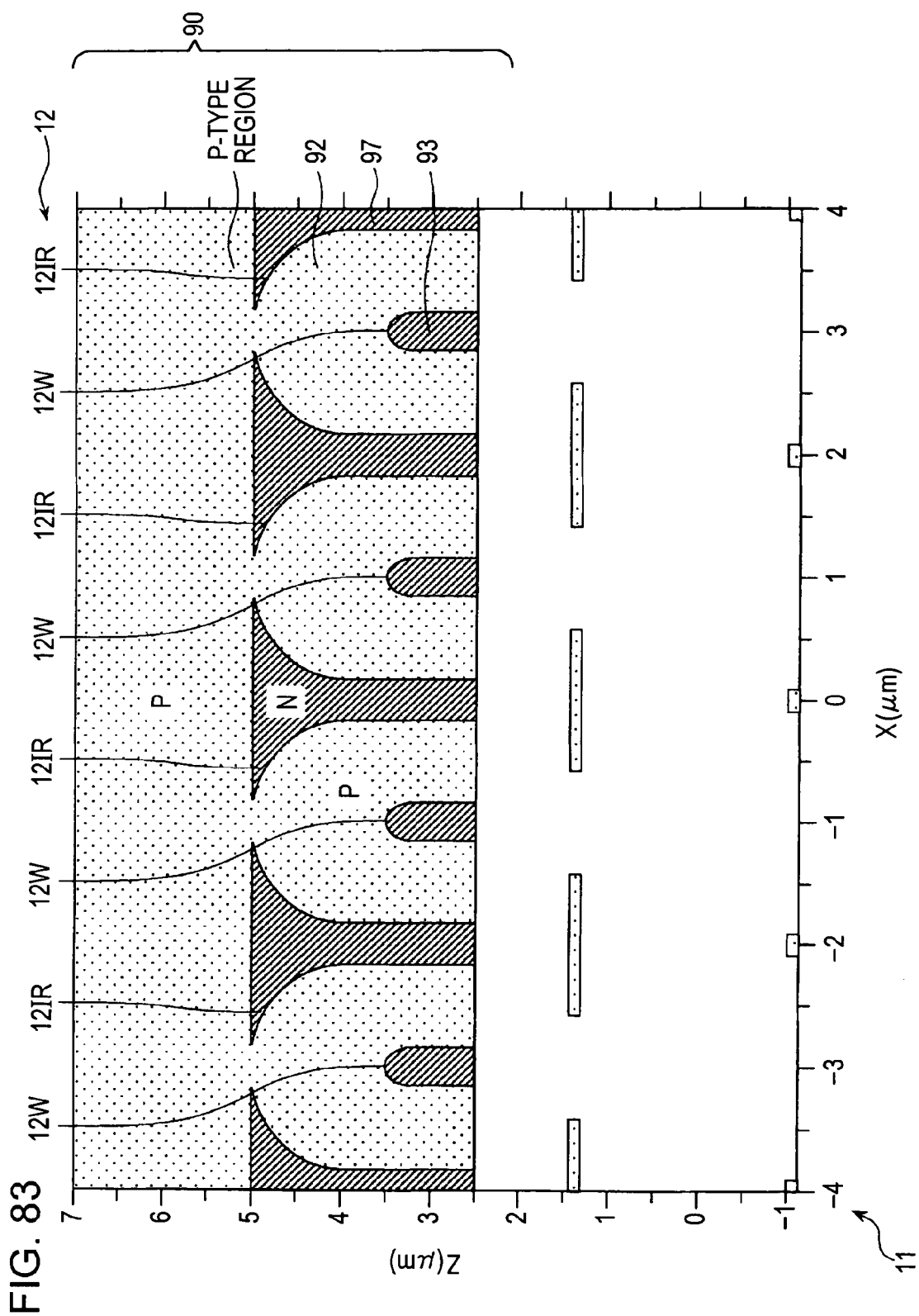

FIG. 83 is a sectional view showing a configuration example of a sensor structure of a third example corresponding to the detection positions for infrared light shown in FIG. 74.

Figure 84:
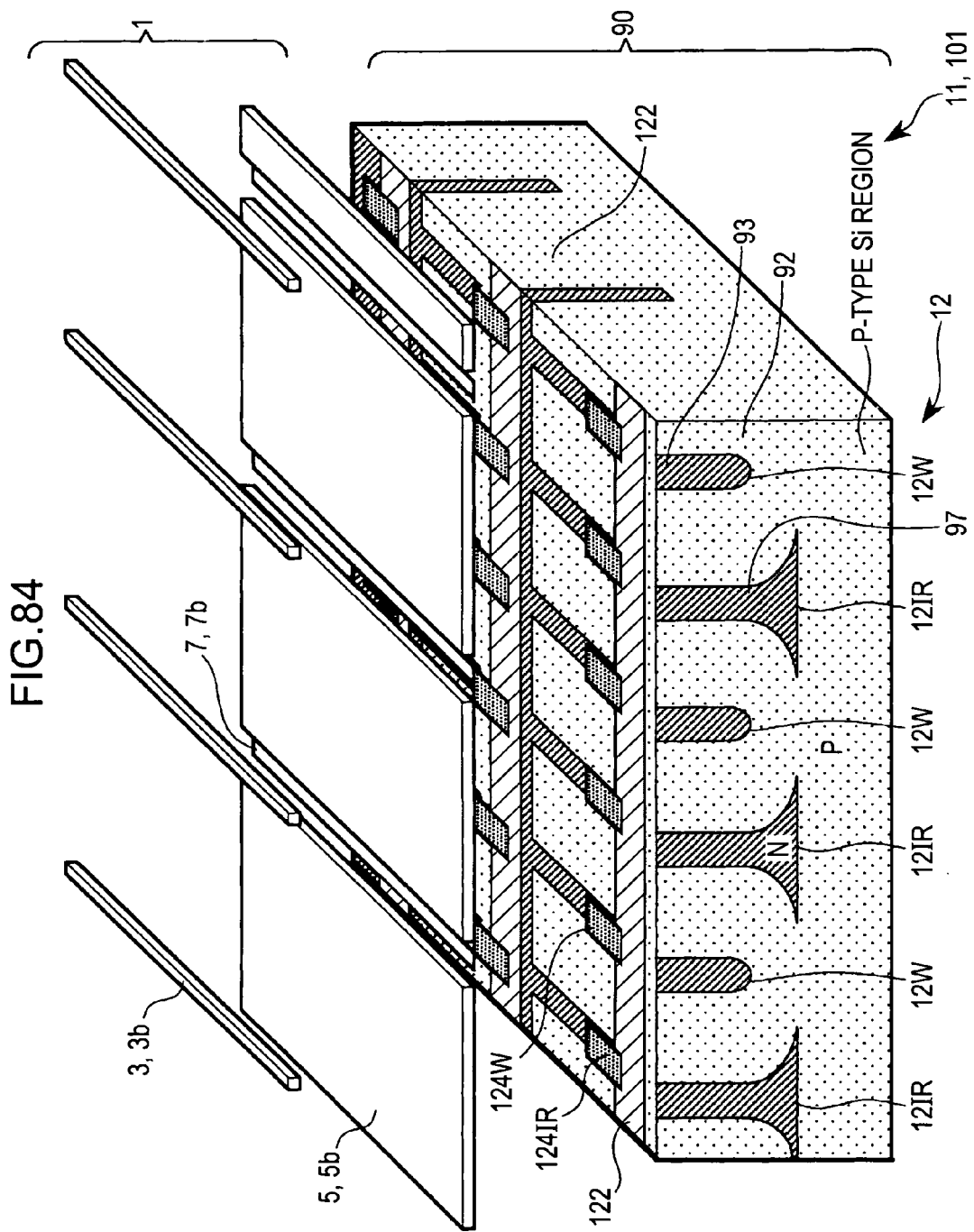

FIG. 84 is a sketch drawing showing an example of a structure when the sensor structure of the third example shown in FIG. 83 is applied to an IT_CCD image sensor.

Figure 85:
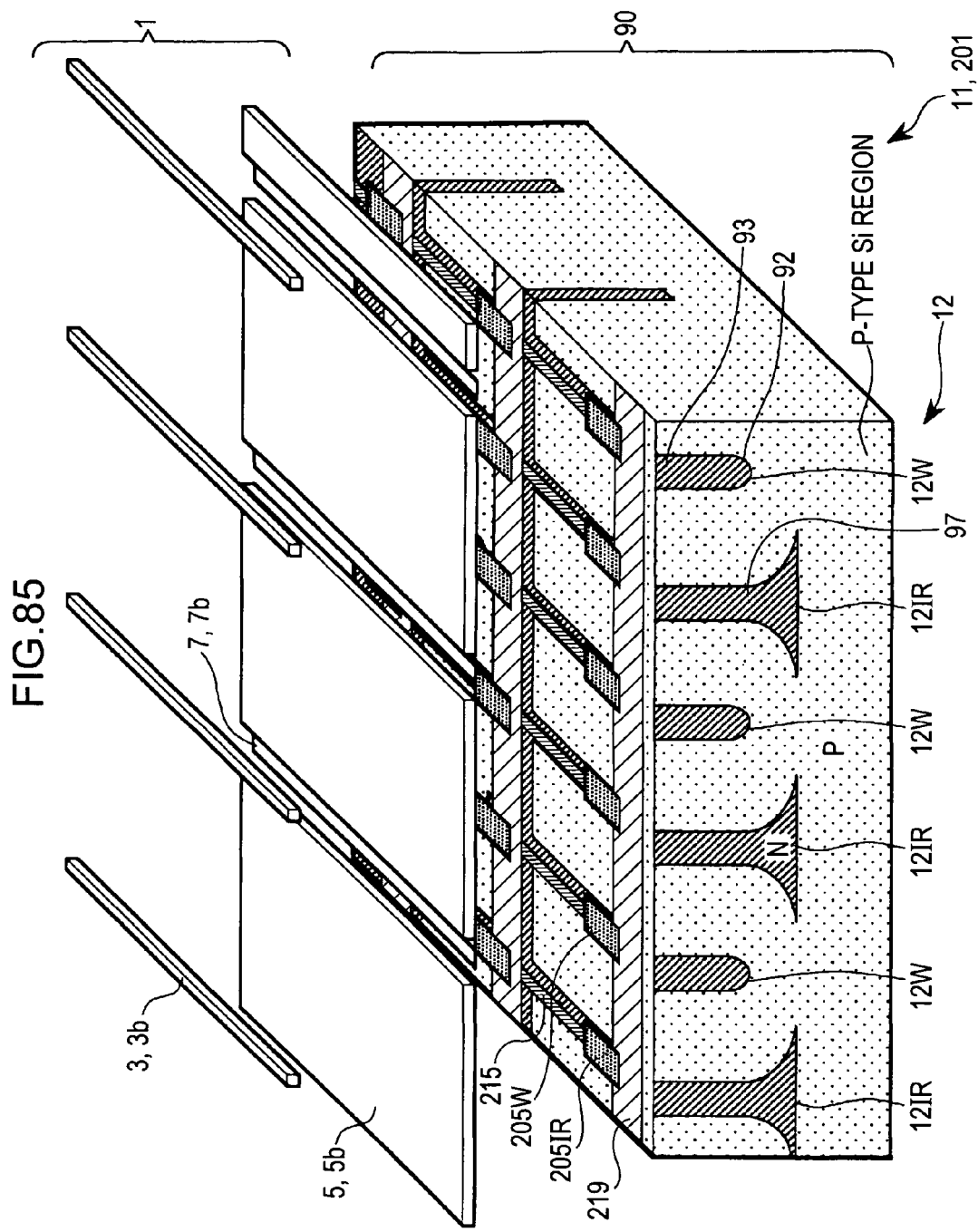

FIG. 85 is a sketch drawing showing an example of a structure when the sensor structure of the third example shown in FIG. 83 is applied to a CMOS image sensor.

Figure 86:
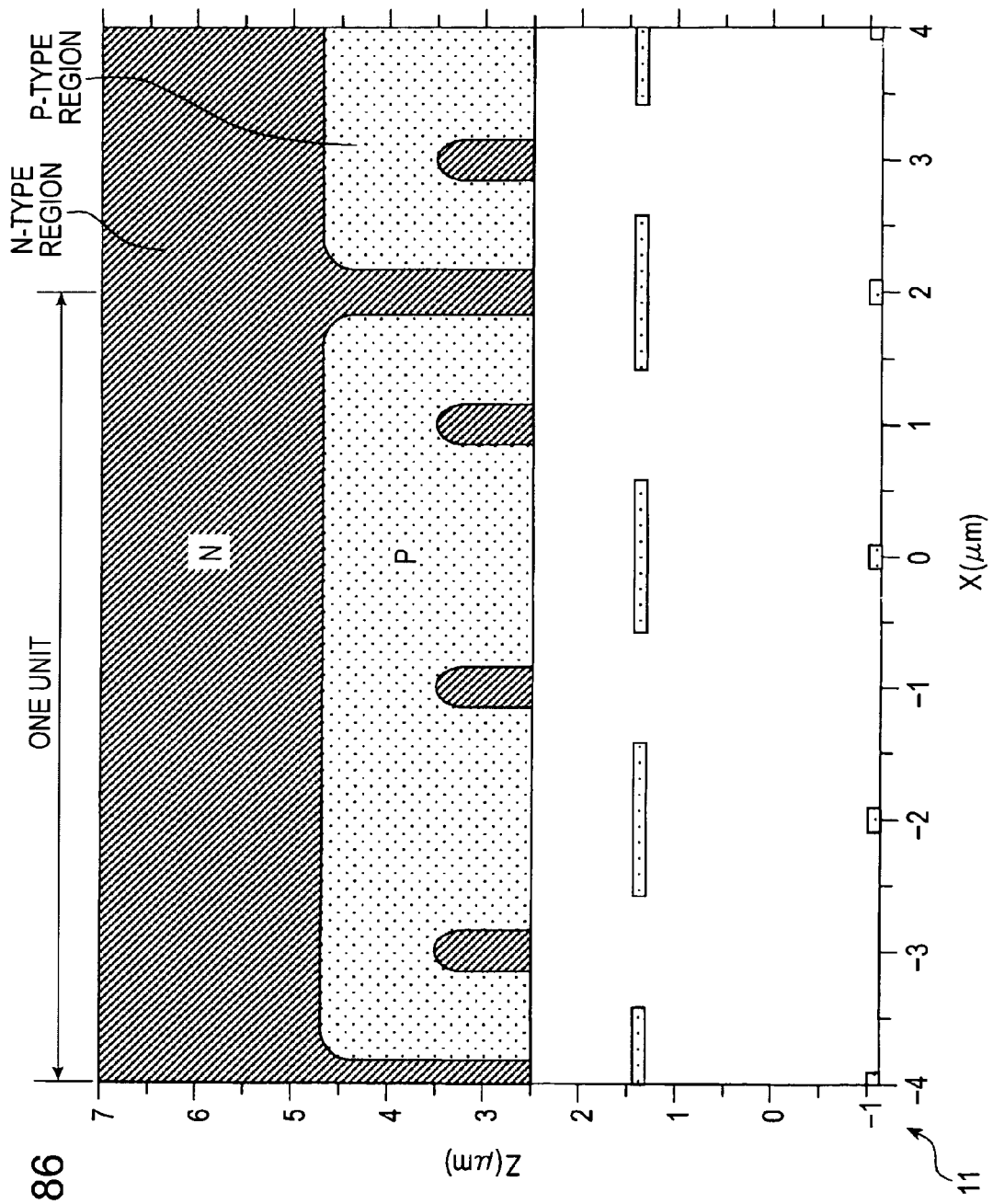

FIG. 86 is a sectional view showing a modified example of the sensor structures for infrared light of the first to third second examples.

Figure 87:
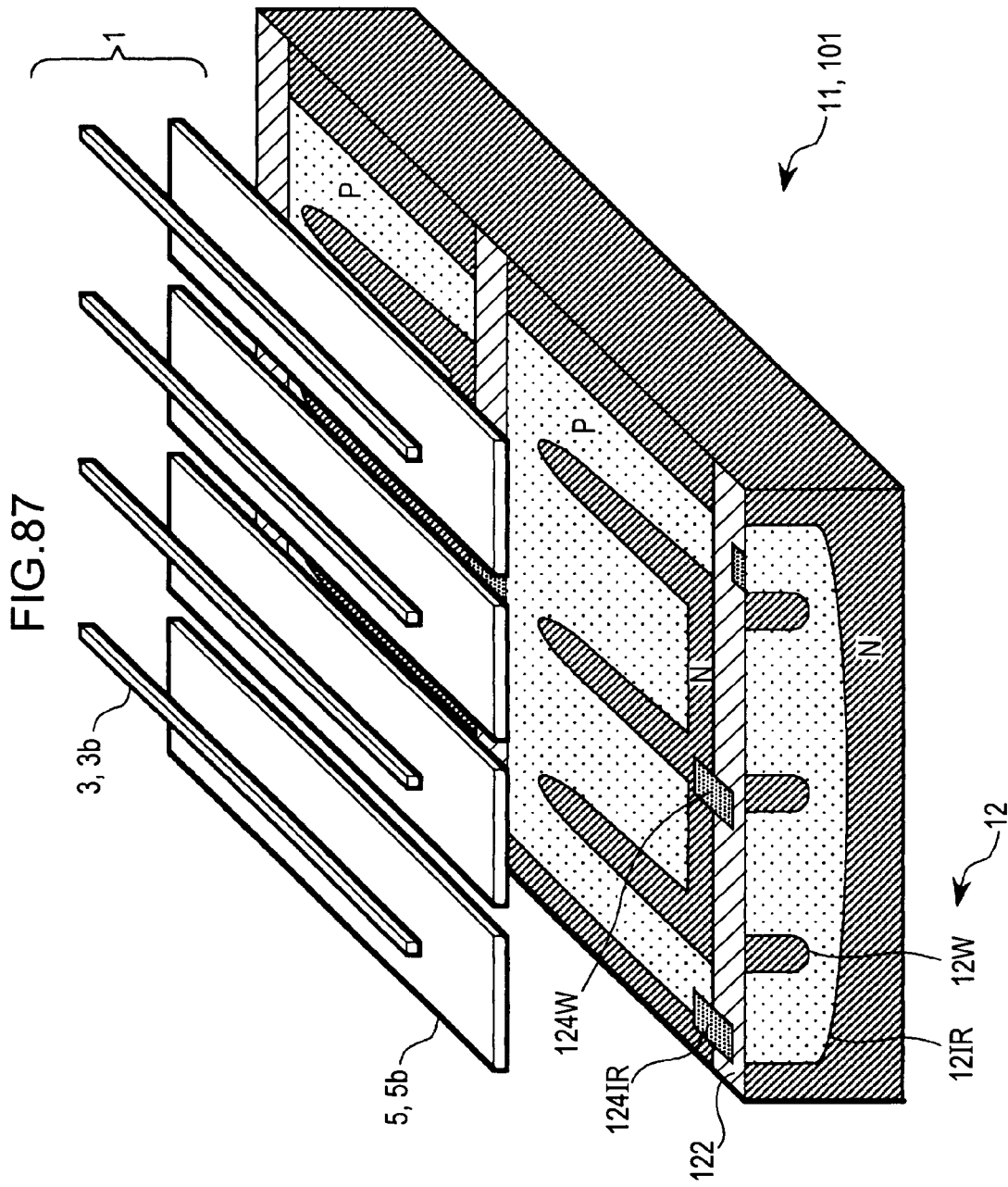

FIG. 87 is a sketch drawing showing an example of a structure when the sensor structure of the modified example shown in FIG. 86 is applied to an IT_CCD image sensor.

Figure 88:
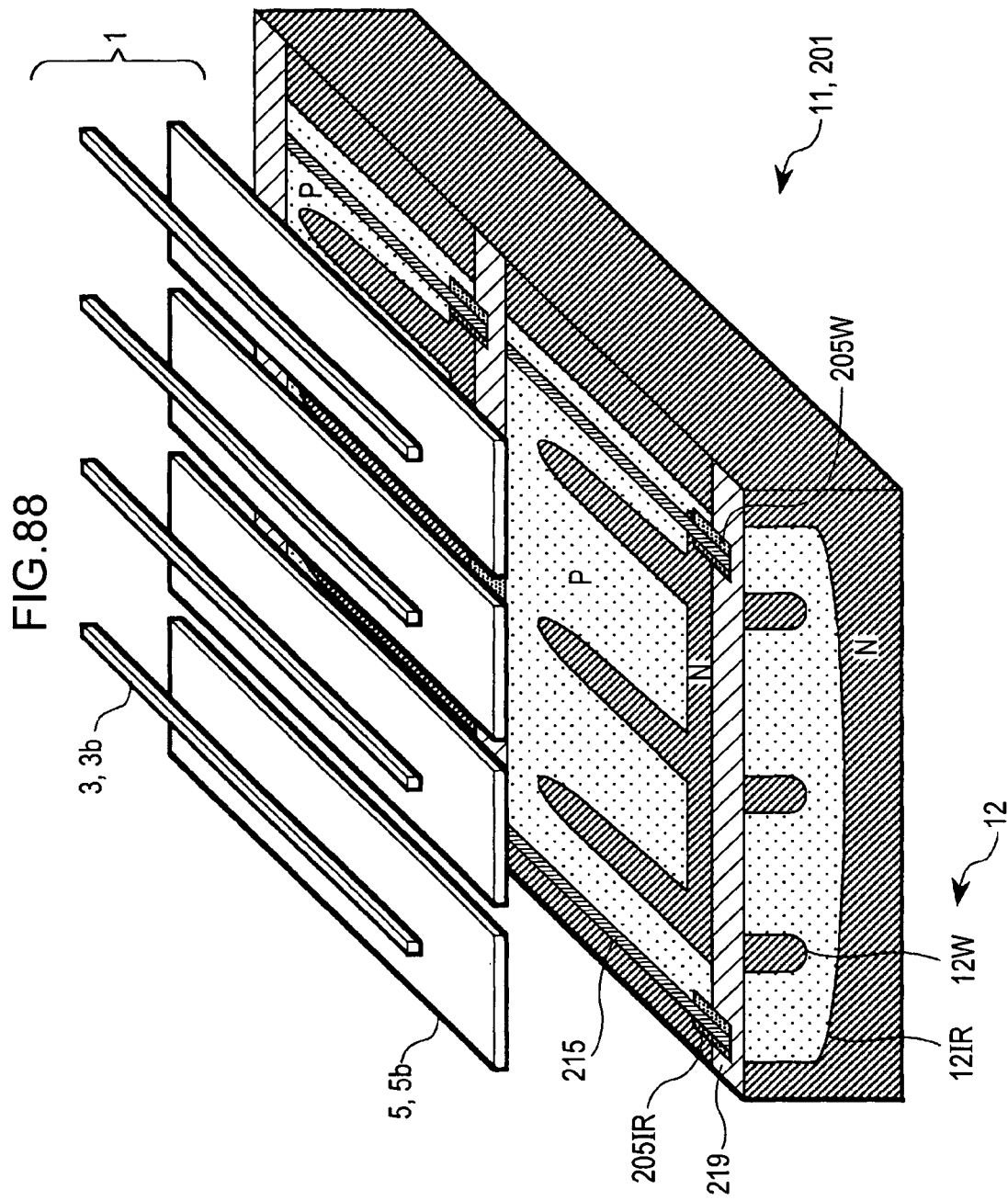

FIG. 88 is a sketch drawing showing an example of a structure when the sensor structure of the modified example shown in FIG. 86 is applied to a CMOS image sensor.

FIG. 89 is a sketch drawing showing an example of a structure when a sensor structure for infrared light comprising scatterers with an enclosed shape is applied to an IT_CCD image sensor.

FIG. 90 is a sketch drawing showing an example of a structure when a sensor structure for infrared light comprising scatterers with an enclosed shape is applied to a CMOS image sensor.

FIG. 91 is a drawing (1) showing a specific example of a process for manufacturing a spectral image sensor.

Figure 92:
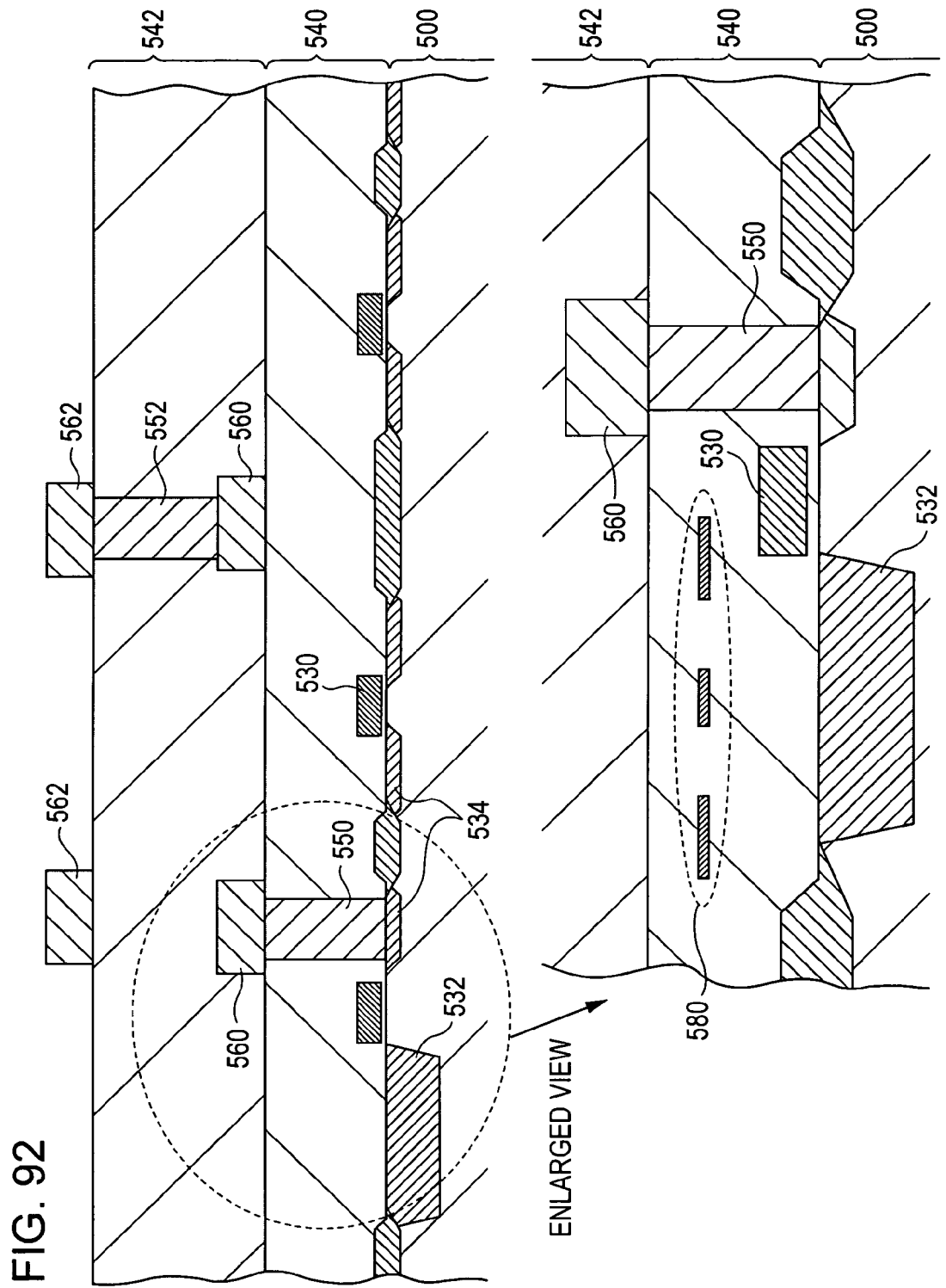

FIG. 92 is a drawing (2) showing a specific example of a process for manufacturing a spectral image sensor.

Figure 93:
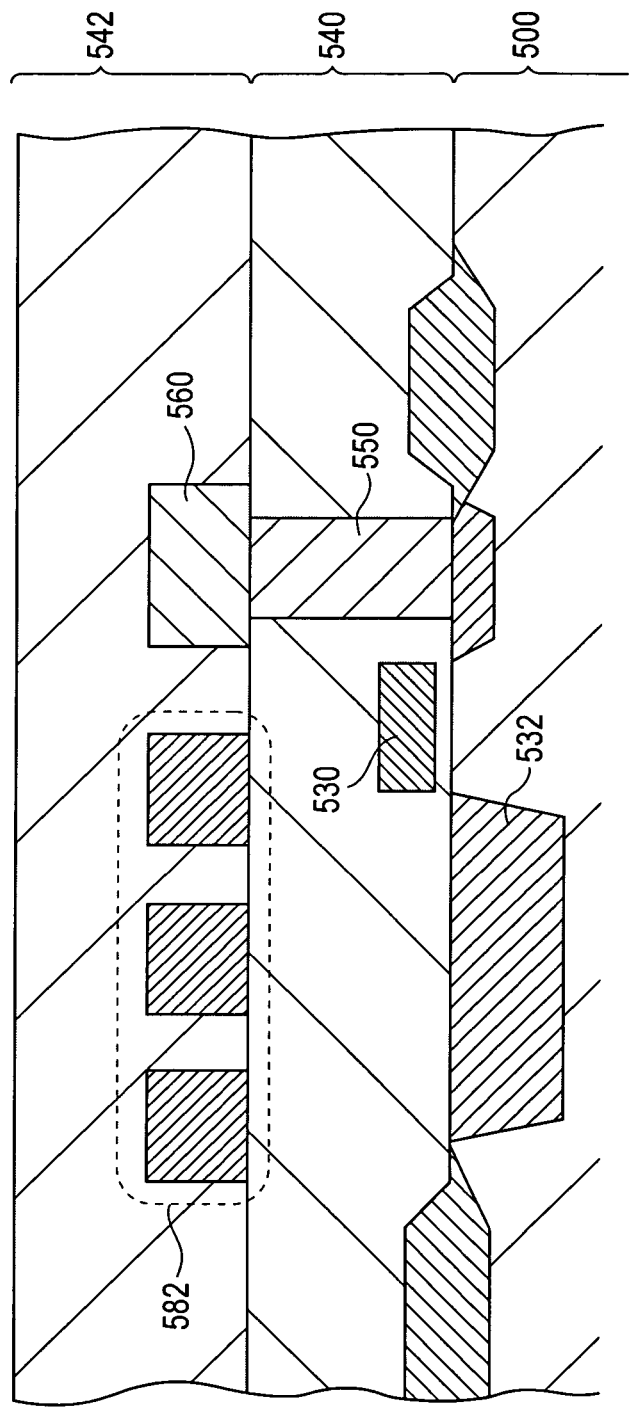

FIG. 93 is a drawing (3) showing a specific example of a process for manufacturing a spectral image sensor.

Figure 94:
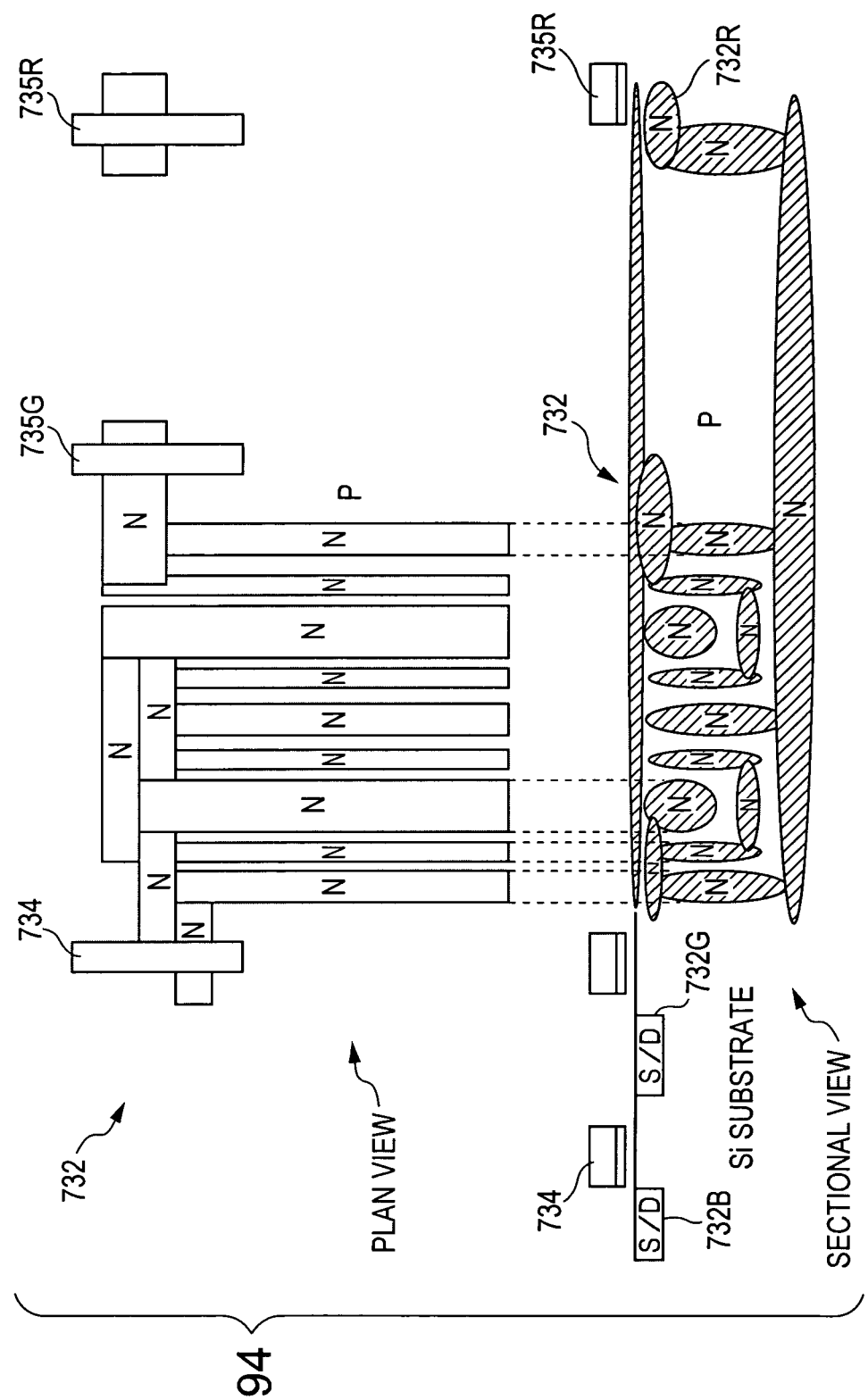

FIG. 94 is a drawing showing a first example of a structure of a CMOS solid-state image sensing device for dispersing a visible light band into the primary color components.

Figure 95A:
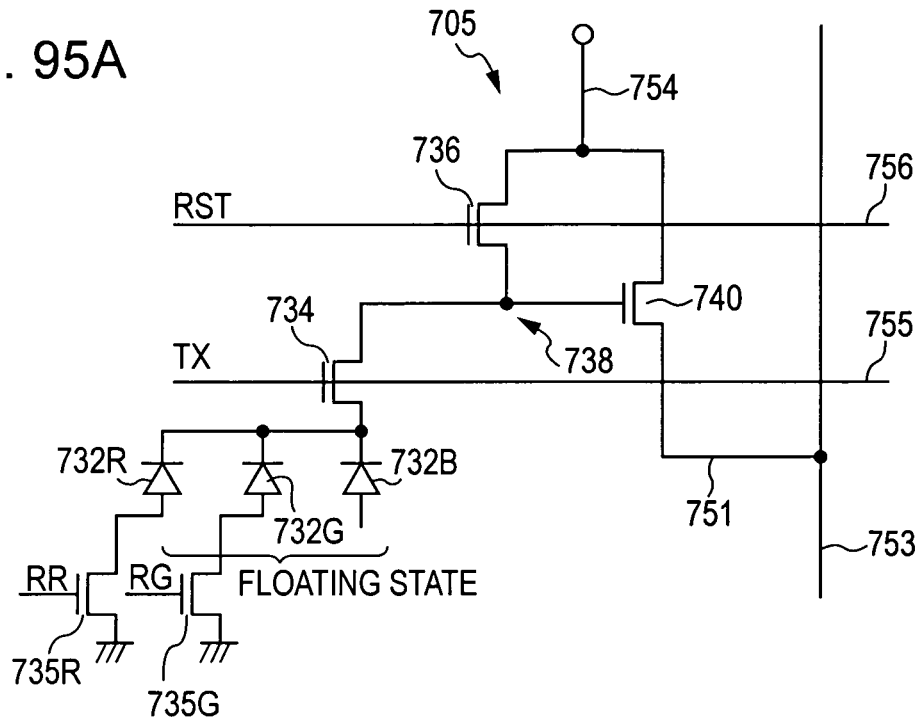
Figure 95B:
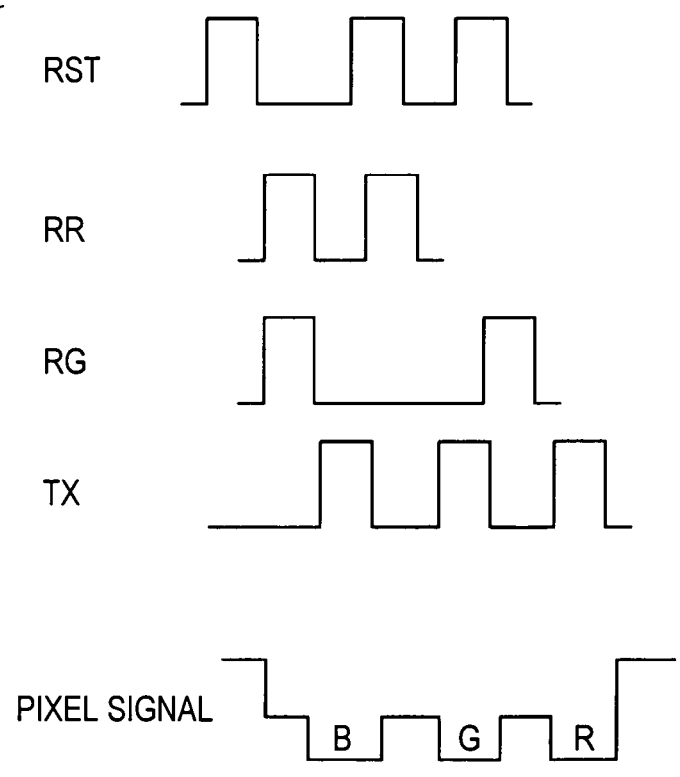

FIG. 95 is a drawing showing a circuit and signal timing corresponding to the first example of a structure of a CMOS solid-state image sensing device for dispersing a visible light band into the primary color components.

FIG. 96 is a drawing showing a second example of a structure of a CMOS solid-state image sensing device for dispersing a visible light band into the primary color components.

FIG. 97 is a drawing showing a circuit and signal timing corresponding to the second example of a structure of a CMOS solid-state image sensing device for dispersing a visible light band into the primary color components.

Figure 98:
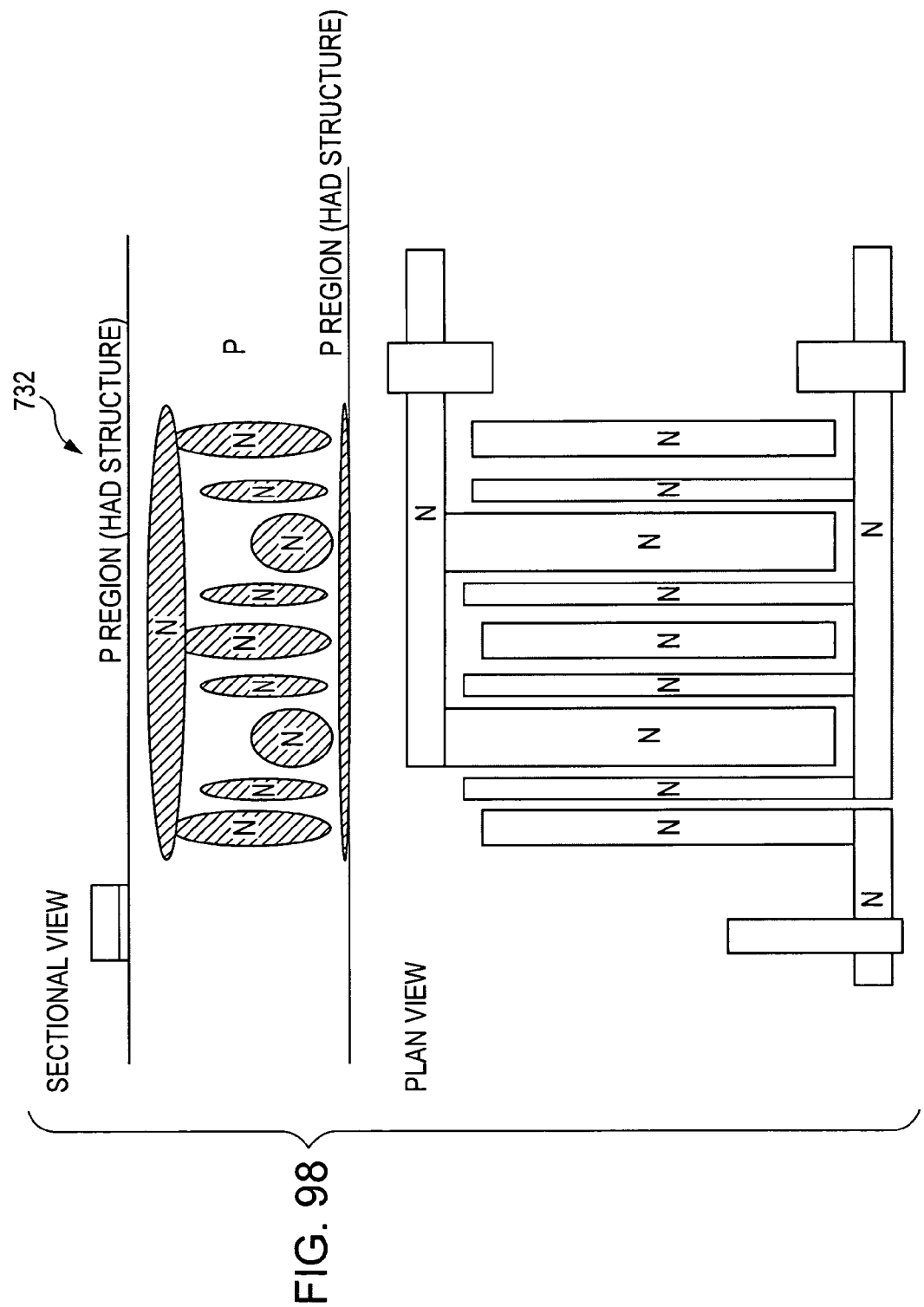

FIG. 98 is a drawing (1) showing a third configuration example in which a photoelectric conversion element region is formed on the back of a CMOS solid-state image sensing device.

Figure 99:
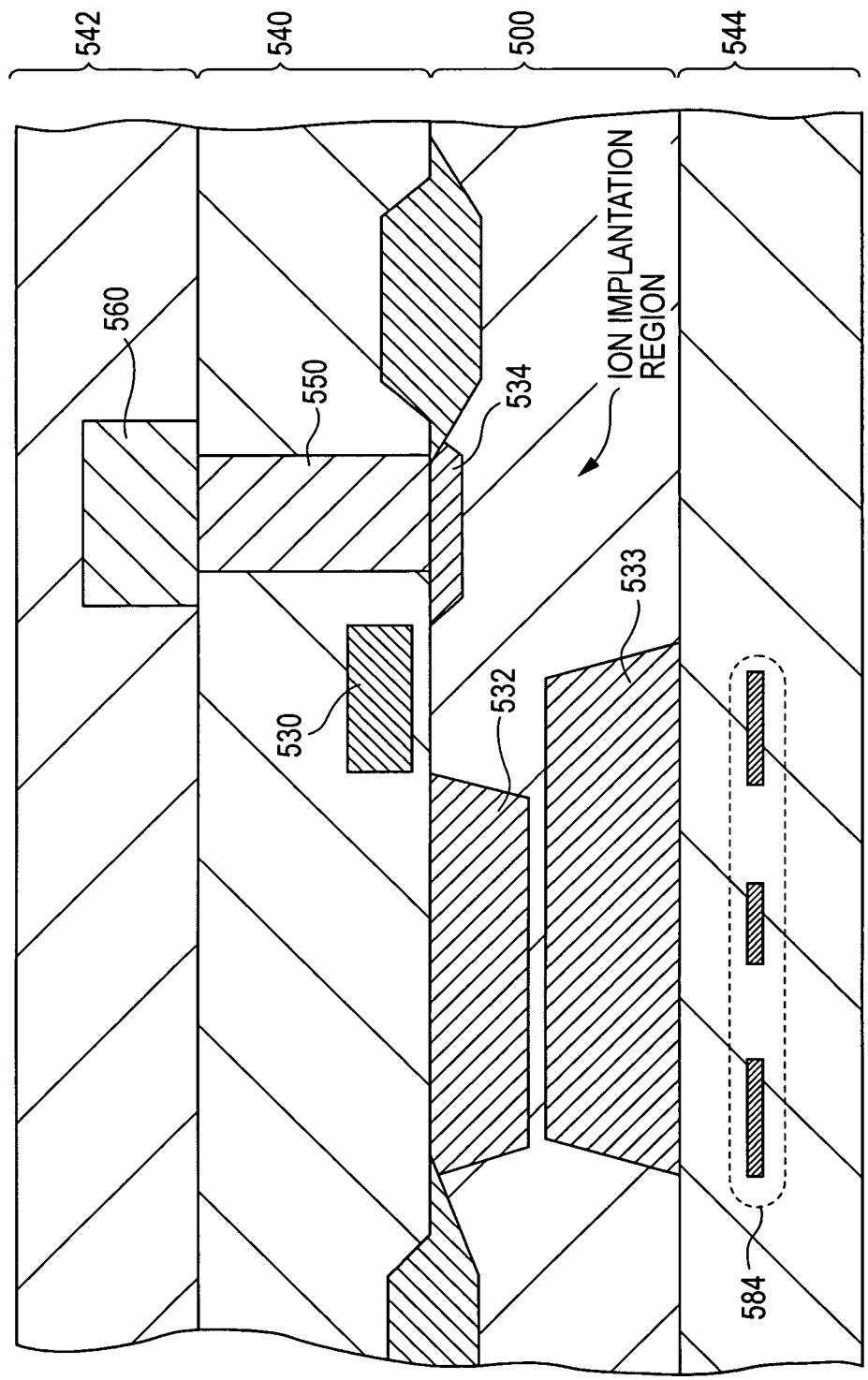

FIG. 99 is a drawing (2) showing a third configuration example in which a photoelectric conversion element region is formed on the back of a CMOS solid-state image sensing device.

Figure 100:
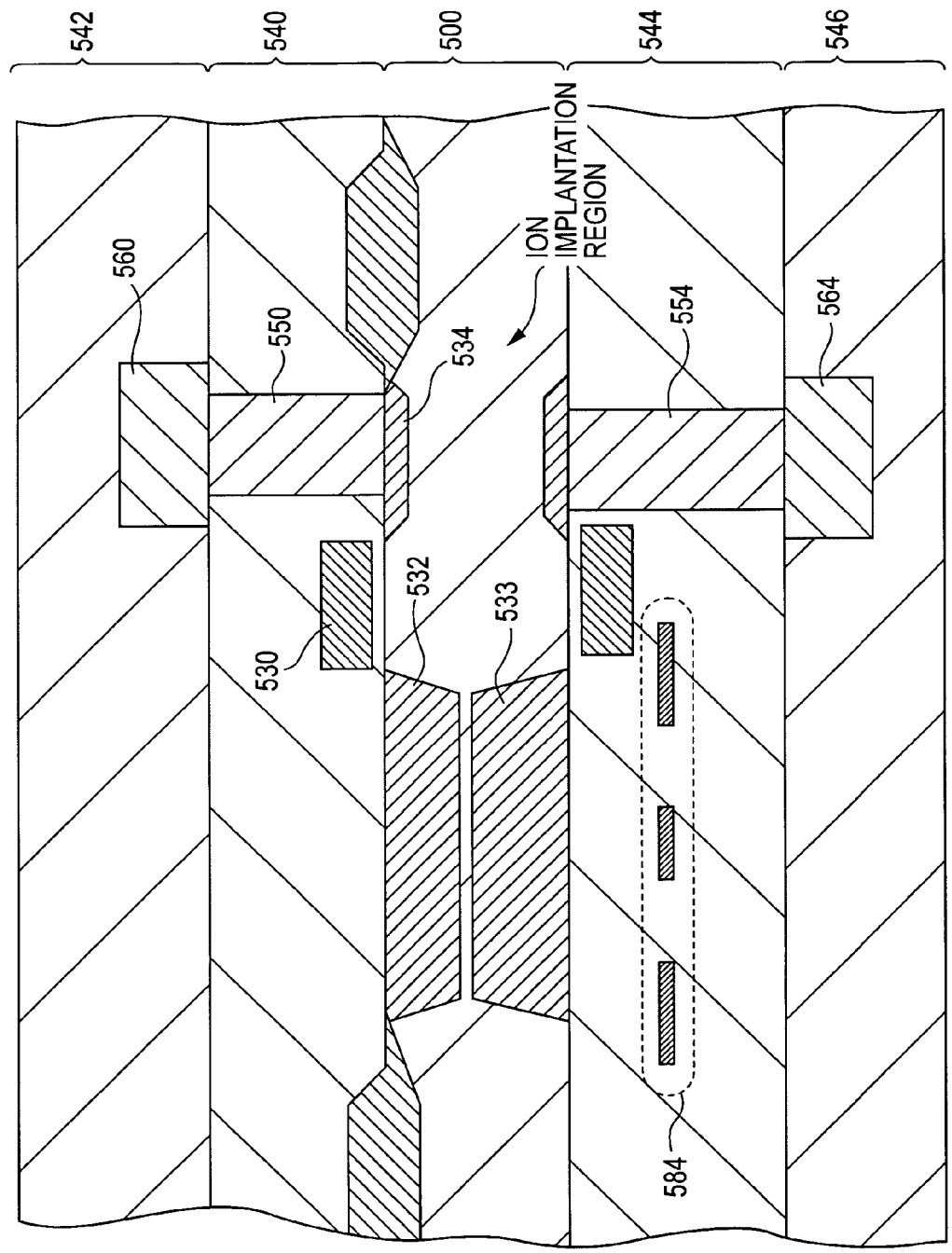

FIG. 100 is a drawing (3) showing a third configuration example in which a photoelectric conversion element region is formed on the back of a CMOS solid-state image sensing device.

Figure 101:
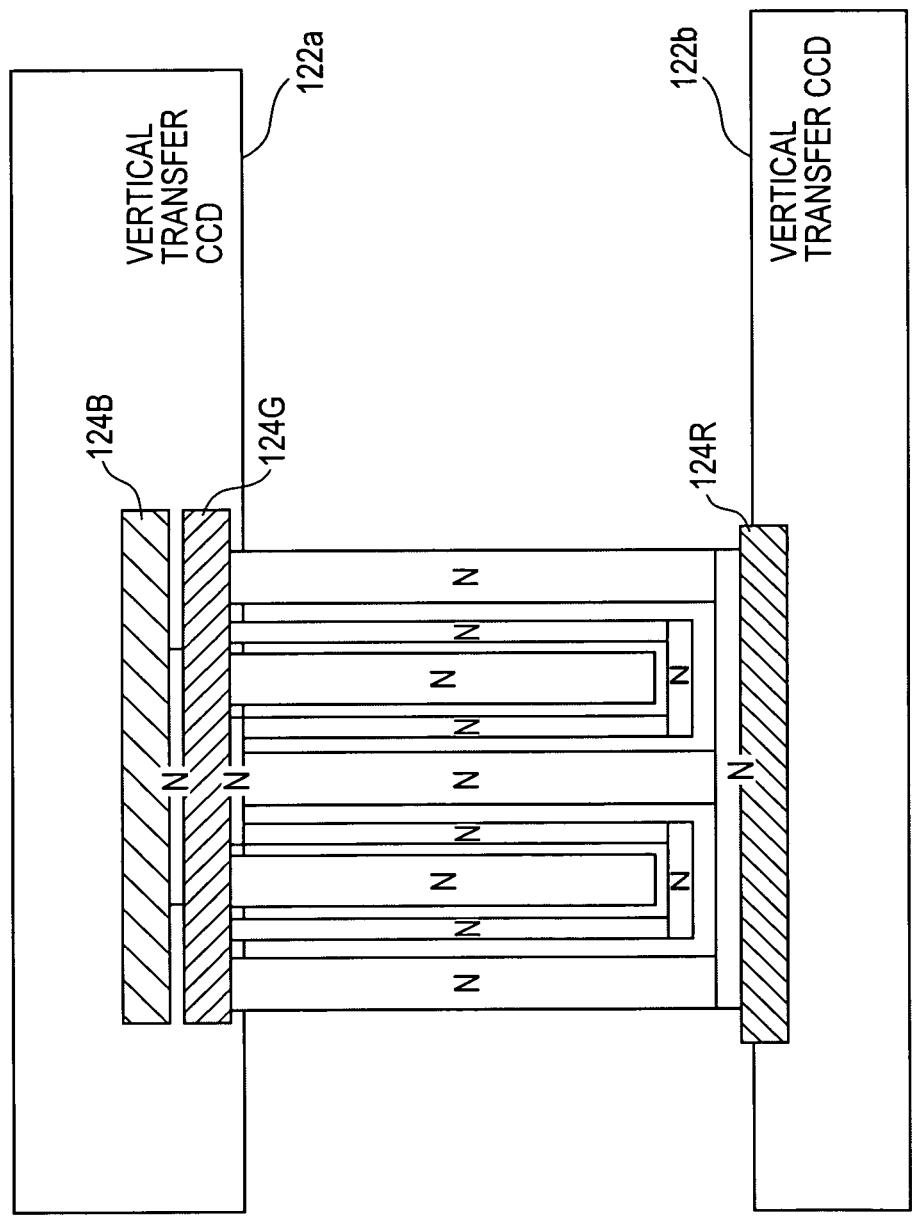

FIG. 101 is a drawing (1) showing a configuration example (fourth example) of a CCD solid-state image sensing device for dispersing a visible light band into the primary color components.

Figure 102:
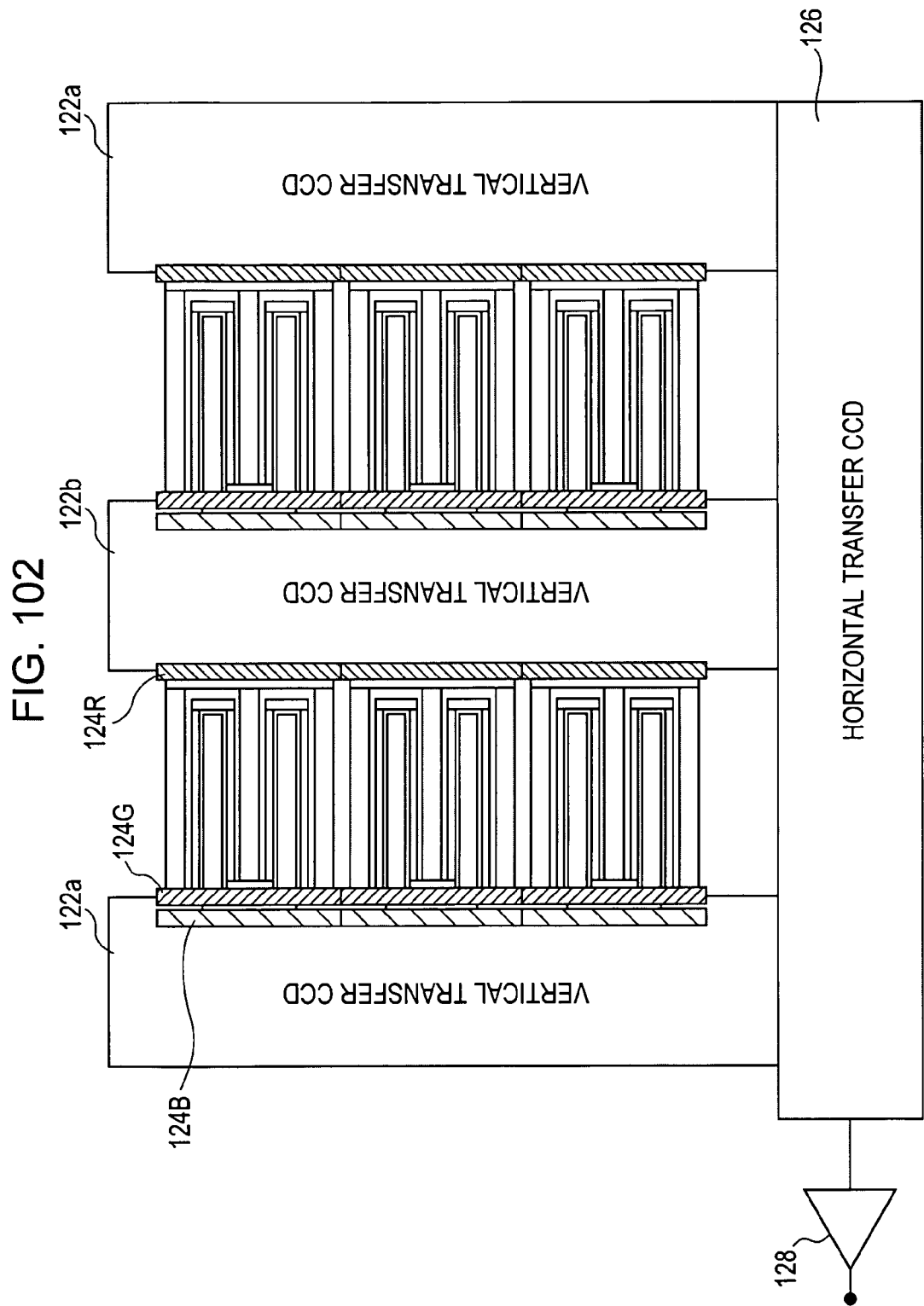

FIG. 102 is a drawing (2) showing a configuration example (fourth example) of a CCD solid-state image sensing device for dispersing a visible light band into the primary color components.

FIG. 103 is a drawing showing a circuit and signal timing corresponding to the configuration example (fourth example) of a CCD solid-state image sensing device for dispersing a visible light band into the primary color components.

FIG. 104 is a drawing showing a first example of a structure of a CMOS solid-state image sensing device for infrared light.

FIG. 105 is a drawing (1) showing a circuit and signal timing corresponding the first example of a structure of a CMOS solid-state image sensing device for infrared light.

FIG. 106 is a drawing (2) showing a circuit and signal timing corresponding the first example of a structure of a CMOS solid-state image sensing device for infrared light.

Figure 107:
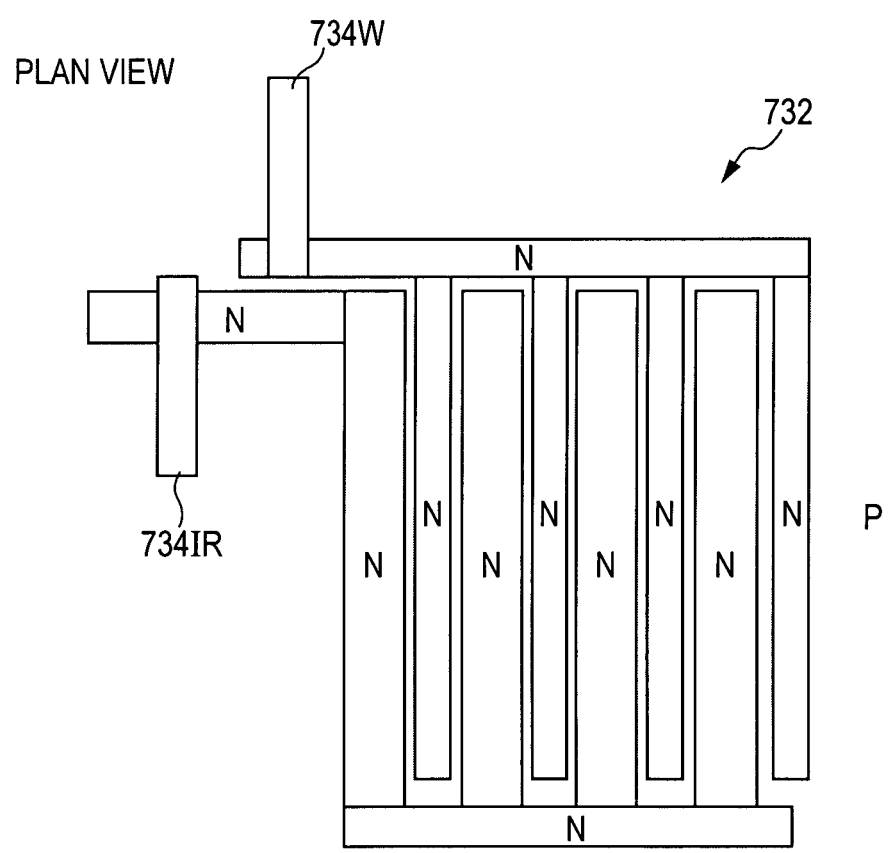

FIG. 107 is a drawing showing a second example of a structure of a CMOS solid-state image sensing device for infrared light.

Figure 108A:
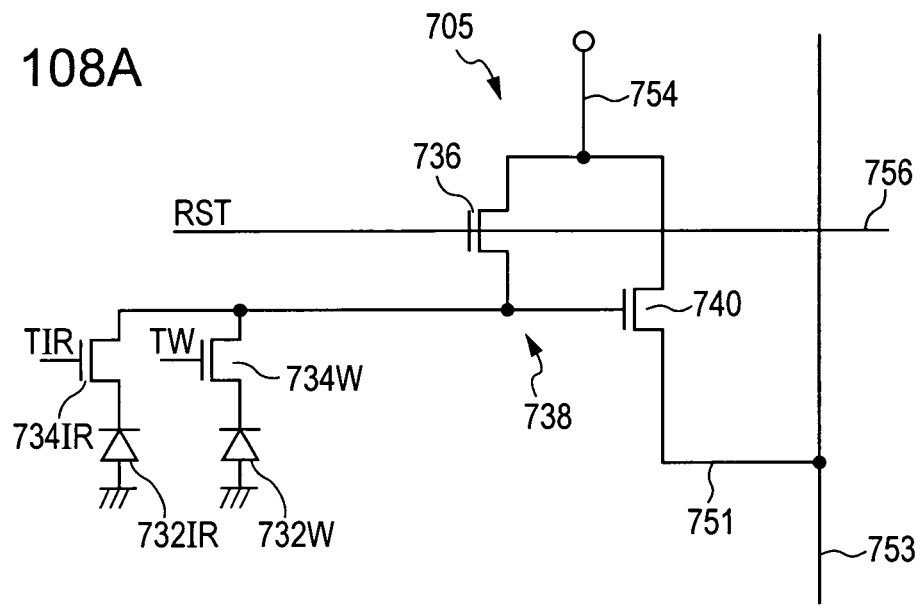
Figure 108B:
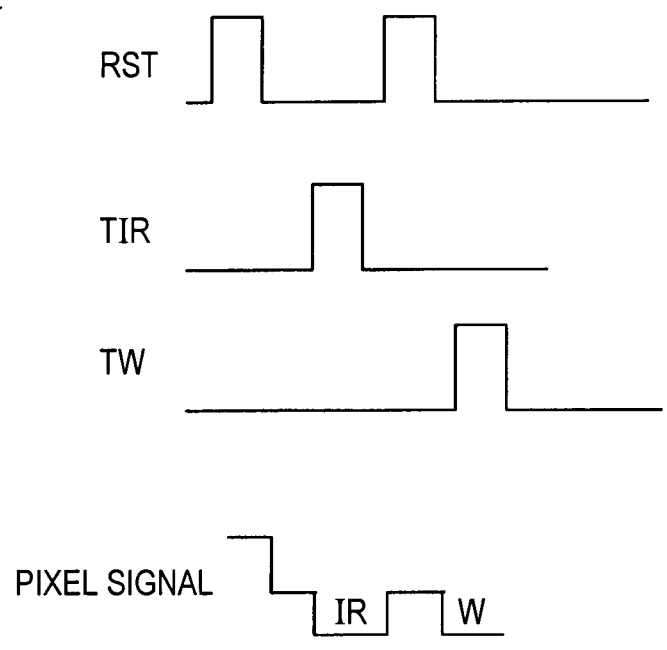

FIG. 108 is a drawing showing a circuit and signal timing corresponding the second example of a structure of a CMOS solid-state image sensing device for infrared light.

Figure 109:
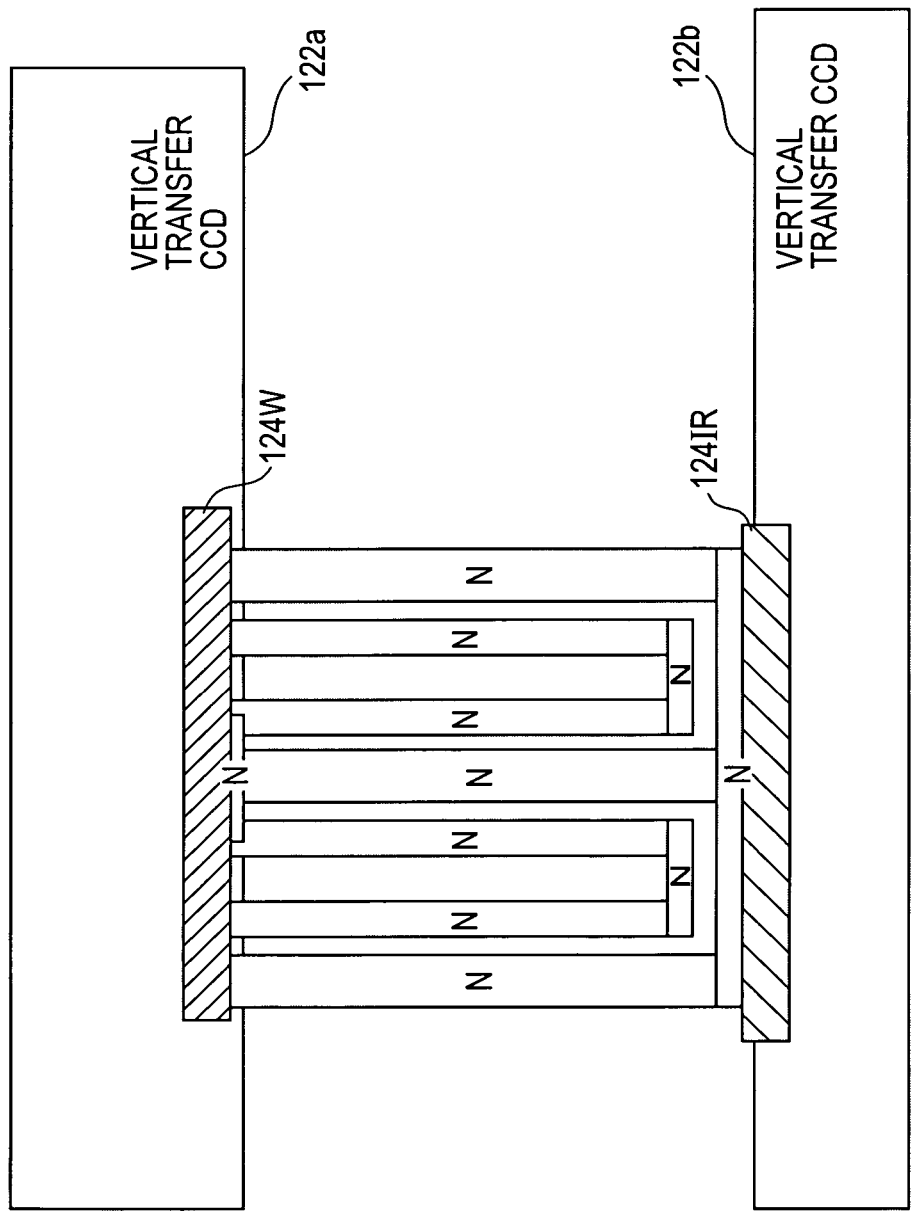

FIG. 109 is a drawing (1) showing a configuration example (fourth example) of a CCD solid-state image sensing device for infrared light.

Figure 110:
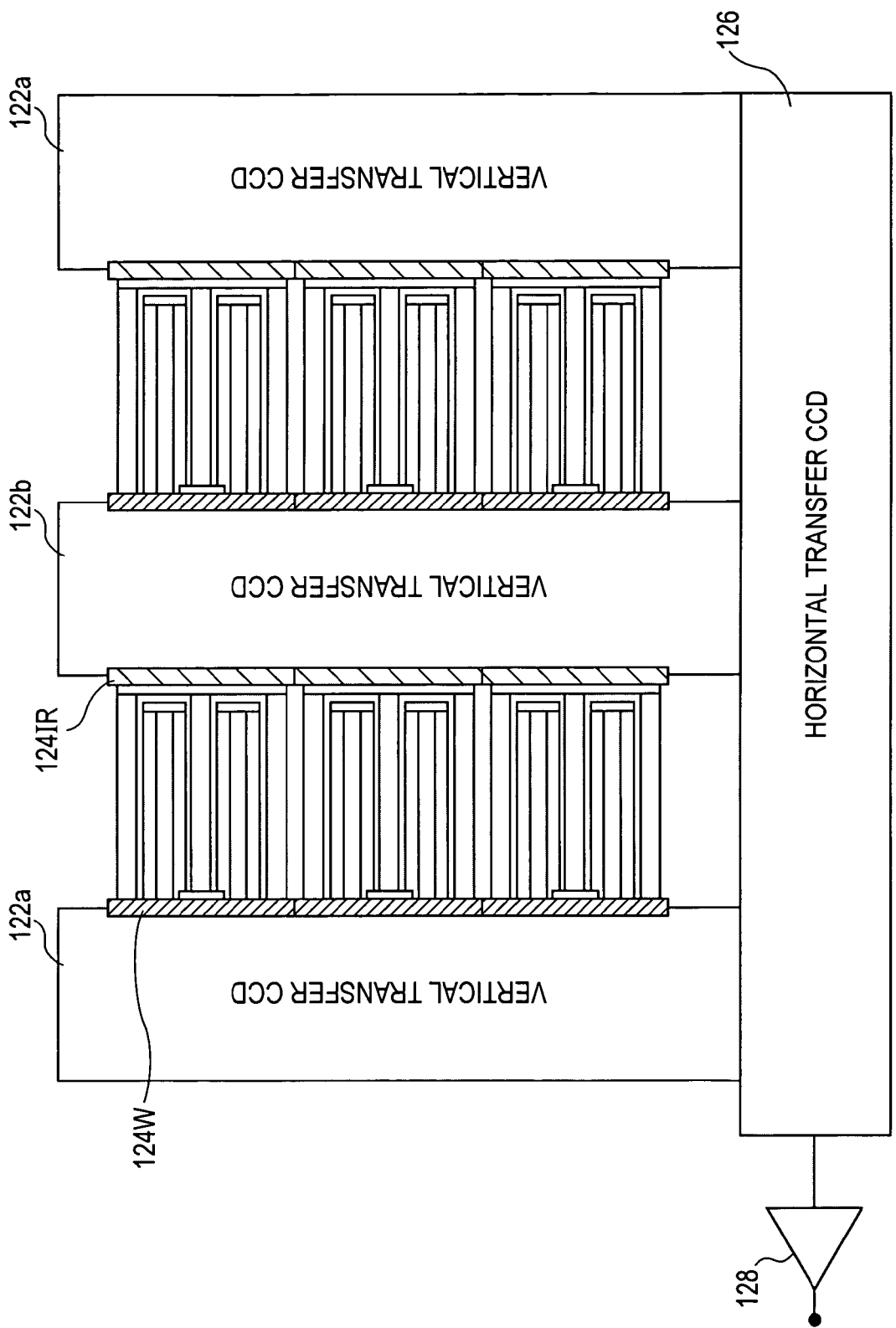

FIG. 110 is a drawing (2) showing a configuration example (fourth example) of a CCD solid-state image sensing device for infrared light.

FIG. 111 is a drawing showing an example (1) of a laminated structure of a device.

FIG. 112 is a drawing showing an example (2) of a laminated structure of a device.

Figure 113A:
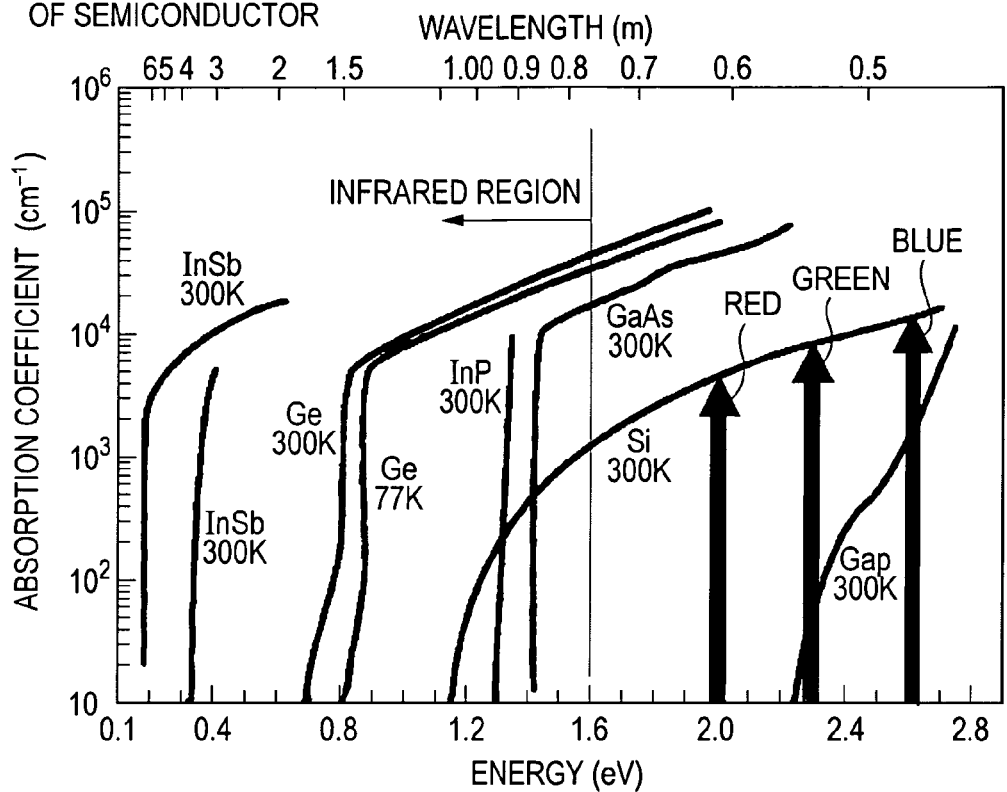
Figure 113B:
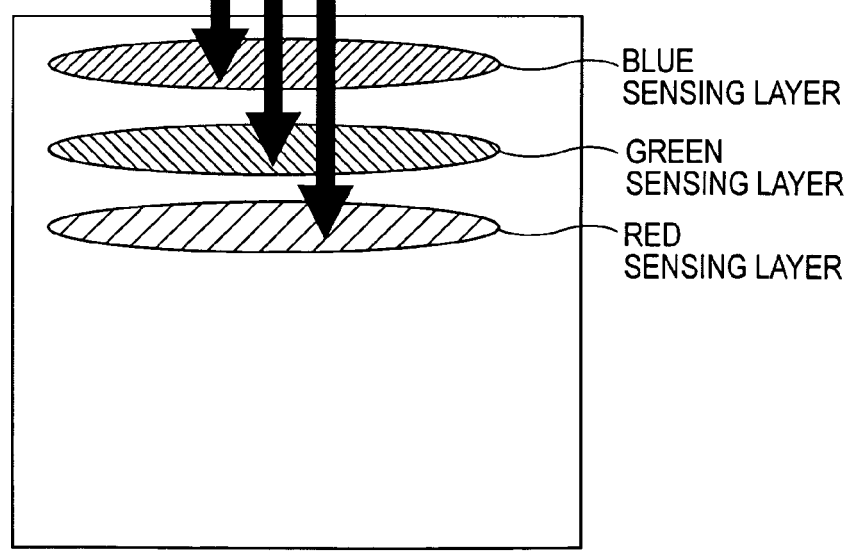

FIG. 113 is a drawing illustrating the mechanism of the sensor.

DESCRIPTION OF THE PREFERRED EMBODIMENTS

Embodiments of the present invention will be described in detail below with reference to drawings.

FIG. 1 is a drawing illustrating the concept of a spectral image sensor in which an electromagnetic wave is dispersed into predetermined wavelength components using a diffraction grating. As an example, description will be made of a spectral image sensor in which light as an example of electromagnetic waves is dispersed into predetermined wavelength components.

Figure 1B:
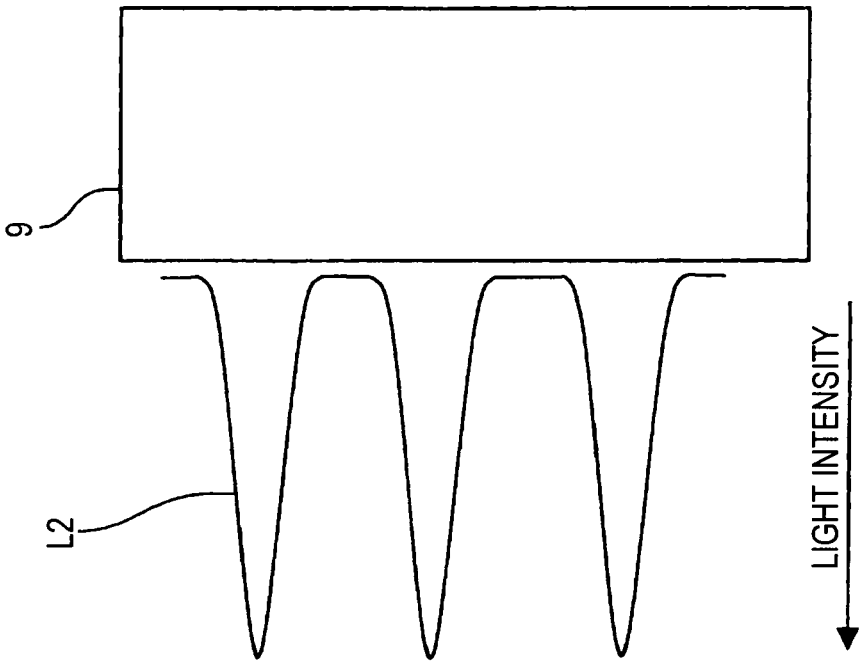
FIG. 1 is a drawing illustrating the concept of a spectral image sensor for dispersing an electromagnetic wave into predetermined wavelengths using a diffraction grating.
Figure 1A:
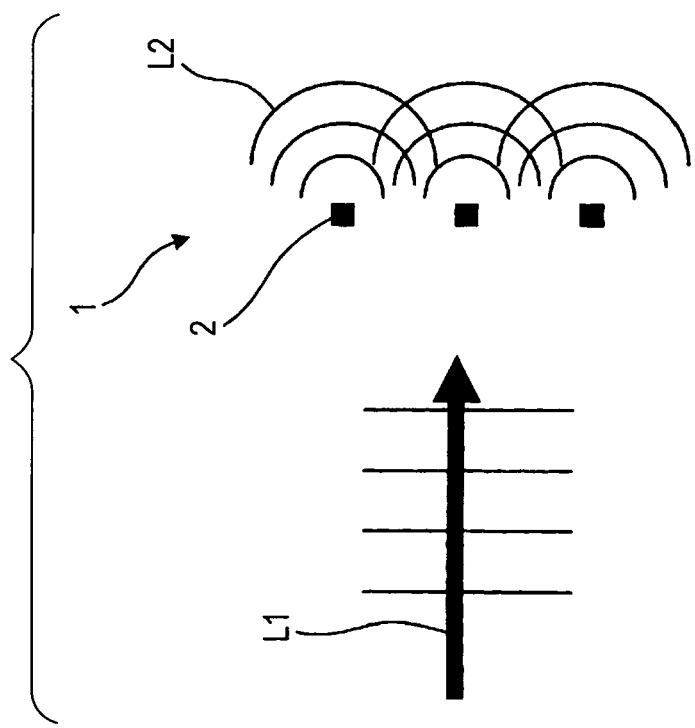

As shown in FIG. 1A, a diffraction grating 1 has a structure in which scatterers 2 each comprising a member for cutting off (shielding light) electromagnetic waves (for example, light) are periodically arrayed so that incident light L1 is scattered by each of the scatterers 2 to produce diffracted waves L2. Also, the diffracted waves L2 are interfered with each other by the scatterers 2 periodically provided.

As a result, as shown in FIG. 1(B), light intensity increases at positions where the phases of the respective diffracted waves L2 coincide with each other, and in contrast, light intensity decreases at positions where the phases deviate from each other by half of the wavelength. Consequently, interference fringes occur on a surface of a Si (silicon) substrate 9 and in the Si substrate 9.

In this embodiment, the spectral image sensor is realized by using the phenomenon that the interference fringe pattern exhibits wavelength dispersibility changing with wavelength λ.

FIG. 2 is a conceptual view illustrating the basic configuration of a spectral image sensor using a diffraction grating. FIG. 3 is an enlarged view showing one photodiode group 12 of the spectral image sensor 10 shown in FIG. 2.

The photodiode group 12 corresponds to one photodiode for each pixel in a conventional image sensing device. This embodiment is characterized in that each photodiode group 12 includes a plurality of photoelectric conversion elements for respective wavelengths (respective colors) which detect respective wavelength components (color components) separated by a diffraction effect when the electromagnetic wave passes through openings, thereby increasing the resolution and the density of pixels. Unlike in a configuration in which any one of color components to be separated is assigned to a photoelectric conversion element for each color constituting each pixel, in this configuration, all color components to be separated are assigned to one photodiode group 12 constituting each pixel.

The spectral image sensor 10 comprising the photodiode groups 12 each including a plurality of photoelectric conversion elements shown in FIG. 2 is characterized in that a wavelength dispersion portion comprises scatterers 3 (first scatterers), slits 5 (second scatterers), and scatterers 7 (third scatterers), for separating an electromagnetic wave into a plurality of wavelength components by utilizing the diffraction effect and entering the respective wavelength components into adjacent different positions on the incidence surface.

Specifically, the scatterers 3 are provided on the incident light L1 side and comprise long (linear or bar-shaped) openings 3a for passing electromagnetic waves (for example, light) therethrough and long (linear or bar-shaped) light-shielding portions 3b for cutting off (shielding light) electromagnetic waves (for example, light), the openings 3a and the light-shielding portions 3b being alternately disposed so that the light-shield portions 3b are arrayed periodically in parallel in a predetermined direction (for example, the transverse direction; the X direction shown in the drawings) in a light-receiving plane. The transverse direction (the X direction) corresponds to the reading direction of image signals from the photoelectric conversion elements for respective colors contained in each photodiode group 12.

The term "linear" means a form in which the sectional area infinitely close to 0 (zero) for light wavelengths, and the term "bar-shaped" means a form in which the sectional area is finite. However, both forms mean long and narrow shapes, i.e., long shapes.

The spectral image sensor 10 also comprises the slit-shaped light scatterers (simply referred to as the "slits" hereinafter) 5 disposed near a portion where the diffracted waves 12 converge between the scatterers 3 and the Si substrate 9, the slits 5 serving as a principal portion of the diffraction grating 1 and comprising long openings (slit openings) 5a for passing electromagnetic waves (for example, light) therethrough and light-shielding portions 5b provided around the openings 5a, for cutting off (shielding light) electromagnetic waves (for example, light).

In the slits 5, the period of the openings 5a (the distance between the adjacent openings 5a) is the same as the period of the scatterers 3 (the distance between the adjacent light-shielding portions 3b, i.e., the width of the openings 3a), and these members are disposed in parallel. In addition, the openings 5a are disposed on substantially centerlines CLO (perpendicular to the surfaces of the photodiode groups 12) passing through the respective centers between the adjacent scatterers 3.

Furthermore, the spectral image sensor 10 comprises the scatterers 7 disposed between the slits 5 and the photodiode groups 12 and including long light-shielding portions 7b and openings 7a which are periodically disposed in parallel. In the scatterers 7, the period of the scatterers 7 (the distance between the adjacent light-shielding portions 7b) is the same as the period of the scatterers 3 (the distance between the adjacent light-shielding portions 3b) or the period of the openings Sa of the slits 5 (the distance between the adjacent openings 5a of the slits 5). In addition, the light-shield portions 7b of the scatterers 7 are substantially disposed on centerlines CLO (perpendicular to the surfaces of the photodiode groups 12) passing through the respective centers between the adjacent scatterers 3.

In the spectral image sensor 10 having the above-described structure, the scatterers 3 are periodically disposed to produce positions where the diffracted waves L2 converge as shown in FIG. 2. In particular, when the scatterers 3 are periodically disposed at equal intervals in parallel in the transverse direction, the diffracted waves L2 converge on the centerlines CLO between the respective scatterers 3.

Furthermore, by using the long scatterers 3, the diffracted waves L2 converge in a long shape, and the interference fringes (light intensity distribution) of the diffracted waves L2 occur in a long shape. Therefore, each of the photoelectric conversion elements (photodetectors) provided in each photodiode group 12 can be formed in a long structure, thereby causing the advantage of easy design of a device structure.

Although FIG. 2 shows the spectral image sensor 10 with attention to the light converging effect, the diffracted waves L2 are further dispersed by the effect of the slits 5 and the other scatterers 7 as shown in FIG. 3.

Therefore, light convergence and dispersion can be achieved by combination of these two effects. The slits 5 are disposed near the portion where the diffracted waves 2 converge between the scatterers 3 and the photodiode groups 12 so that the long openings 5a (slit openings) are periodically arrayed in parallel in the transverse direction. As a result, the incident light L1 can be dispersed into blue color light L3-B, green color light L3-G, red color light L3-R, and infrared light L3-IR (collectively referred to as "spectral components L3") with sufficient controllability.

In the spectral image sensor 10 including the photodiode groups 12 each comprising a plurality of the photoelectric conversion elements shown in FIG. 2, the long (linear or bar-shaped) scatterers 3 are periodically disposed on the incident light L1 side so as to be parallel to each other in the predetermined direction (for example, the transverse direction, i.e., the X direction shown in the drawings) on the light-receiving surface. The transverse direction (the X direction) corresponds to the reading direction of pixel signals from the photoelectric conversion elements for the respective colors contained in each photodiode group 12.

In particular, when the scatterers 3 and the slits 5 are disposed in parallel so that the period of the openings 5a of the slits 5 (the distance between the adjacent openings 5a) is the same as the period of the scatterers 3 (the distance between the adjacent light-shielding portions 3b), the periodicity and symmetry of the whole structure (particularly, relation between the scatterers 3 and the slits 5) are increased to improve light interference characteristics. As a result, spectral characteristics are improved.

Also, the light (diffracted waves L2) diffracted by the scatterers 3 converges near the centers (between the light-shielding portions 3b). Therefore, when the openings 5a of the slits 5 are disposed on the substantially centerlines CLO (perpendicular to the surfaces of the photodiode groups 12) passing through the respective centers between the scatterers 3, the efficiency of dispersion is improved.

It was also found that when the slit width Ds is 800 nm±300 nm, the incident light can be dispersed into visible light components (blue color light L3-B, green color light L3-G, and red color light L3-R) and infrared light L3-IR.

It was further found that according to circumstances, the scatterers 7 may be disposed between the slits 5 and the photodiode groups 12 so as to be positioned on the centerlines CLO between the openings 5a of the slits 5.

When the scatterers 7 are disposed between the slits 5 and the photodiode group 12 so as to be positioned on the centerlines CLO between the openings 5a of the slits 5, light at longer wavelengths (green color light to red color light) converges apart from the scatters 7 due to diffraction. However, photofield computation by a FDTD method (Finite Difference Time Domain Method) according to a Maxwell equation showed that light at shorter wavelengths (particularly, blue color light) converges on the centerlines CLO of the photodiode groups 12 disposed behind the scatterers 7.

When the long scatterers 7 are used, the diffracted waves L2 converge in a long shape, and the interference fringes (light intensity distribution) of the diffracted waves L2 occur in a long shape. In view of a device structure, the photoelectric conversion elements (photodetectors) provided in each photodiode group 12 can be formed in a long structure, thereby causing the advantage of ease of design. Also, when the scatterers 7 are periodically disposed in parallel, the periodicity and symmetry of the entire structure are improved to improve interference characteristics of light. As a result, the spectral characteristics are improved, and a structure with satisfactory spectral characteristics and ease of design can be formed by combining these two arrangement conditions.

Furthermore, when the scatterers 7 and 3 are disposed in parallel so that the period of the scatterers 7 (the distance between the adjacent light-shielding portions 7b) is the same as the period of the scatterers 3 (the distance between the adjacent light-shielding portions 3b), the periodicity and symmetry of the whole structure (particularly, relation between the scatterers 3 and the scatterers 7) are increased to improve light interference characteristics. As a result, spectral characteristics are improved.

Furthermore, when the scatterers 5 and the slits 5 are disposed in parallel so that the period of the scatterers 7 (the distance between the adjacent light-shielding portions 7b) is the same as the period of the openings 5a of the slits 5 (the distance between the adjacent openings 5a), the periodicity and symmetry of the whole structure (particularly, relation between the slits 5 and the scatterers 7) are increased to improve light interference characteristics. As a result, spectral characteristics are improved.

In particular, when the scatterers 7 and 3 and the slits 5 are disposed in parallel so that the period of the scatterers 3 (the distance between the adjacent light-shielding portions 3b) and the period of the adjacent openings 5a of the slits 5 (the distance between the adjacent openings 5a) are the same as the period of the scatterers 7 (the distance between the adjacent light-shielding portions 7b), the positional relation between all scatterers can be controlled to obtain the maximum effect on the periodicity and symmetry. As a result, interference characteristics of light are extremely improved to significantly improve spectral characteristics.

Figure 4A:
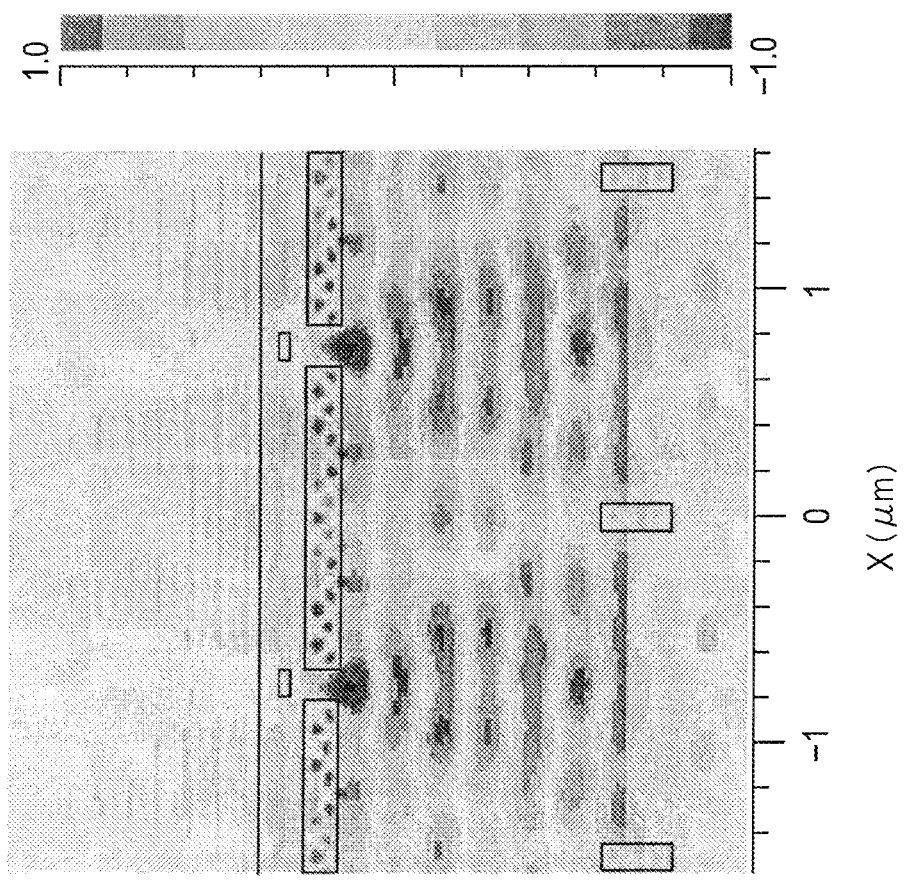
FIG. 4 is a diagram of computation simulation (1) illustrating a method for dispersing visible light into a plurality of wavelength components on the basis of the concept shown in FIG. 2.
Figure 4B:
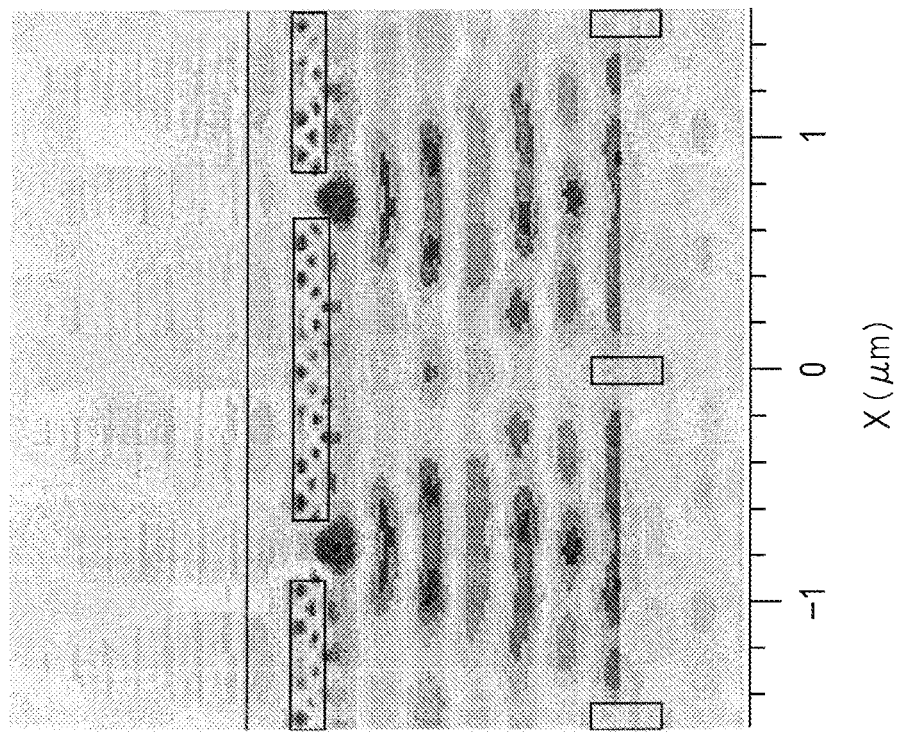

FIGS. 4 and 5 are drawings of computation simulation each illustrating a method for dispersing visible light into a plurality of wavelength components based on the concept shown in FIG. 2. FIG. 4 shows the results of computation simulation using incident green light at a wavelength of 540 nm, in which FIG. 4(A) shows the results of simulation using the scatterers 7, and FIG. 4(B) shows the results without using scatterers 7 (the same structure except the scatterers 7).

The results indicate that without the scatterers 7, green light goes straight and converges on the centerlines CLO, and thereby light converges at six points, as shown in the drawings. However, by using the scatterers 7, the light is efficiently diffracted and converges at four points excluding points on the centerlines CLO, thereby increasing the optical density.

FIG. 5 shows the results of computation simulation using blue incident light at a wavelength of 460 nm, in which FIG. 5(A) shows the results of simulation using the scatterers 7, and FIG. 5(B) shows the results without using scatterers 7 (the same structure except the scatterers 7).

The results indicate that the blue light converges on the centerlines CLO in the respective photodiode groups 12 regardless of the presence of the scatterers 7.

Therefore, if the scatterers 7 are not provided, green light and blue light are mixed, but the green light and blue light are efficiently separated by the scatterers 7. Apart from these results, a state in which light converges by the scatterers 3 can be also shown by other computation results.

This embodiment is characterized in that the spectral image sensor 10 is realized by utilizing the spectral method using the above-described diffraction characteristics. The above-described structure may comprise scatterers buried in a transparent oxide film or nitride film used as a base material. Namely, the scatterers are preferably buried in a predetermined transparent member (base material) so that they can be integrated with a semiconductor substrate. In this case, the scatters may be made of a material having a higher refractive index than that of the base material.

The oxide film or nitride film is used as the base material from the following two reasons: One of the reasons is that the film is used for general semiconductor processes and is formed at low cost. The other reason is that the film has a lower refractive index than that of silicon, and thus a large difference in refractive index is obtained by combination with silicon, thereby achieving efficient diffraction.

Also, an oxide film or nitride film is preferably used as a transparent material. As the oxide film, a $SiO_x$ film, particularly a $SiO_2$ film, is preferred. As the nitride film, a $SiN_x$ film is preferred. This is because $SiO_x$, particularly completely oxidized $SiO_2$, is chemically stable and has the lowest refractive index. Similarly, $SiN_x$, particularly $Si_3N_4$, is chemically most stable.

Each of the scatterers is preferably made of silicon (Si) having high consistency in a process, but another member may be used. For example, silicon nitride SiN can also be used. In this case, both the scatterers 3 and 7 may be made of the same material or different materials. $SiN_x$ is a material used for general semiconductor processes and is advantageous in cost.

The scatterers may be made of germanium because the refractive index is higher than that of silicon Si and thus has the advantage of increasing the scattering effect and diffraction effect.

The scatterers may be made of a metal or its compound as long as it has a different refractive index. Namely, a transition metal, a transition metal silicide, a transition metal nitride, a transition metal nitroxide, a noble metal, a noble metal silicide, a high-melting-point metal, a high-melting-point metal silicide, or the like can be used. Specific examples of such materials include Al, Cu, Ni, Cr, W, WSi, $WSi_2$, Ti, $TiSi_2$, TiSi, TiN, TiON, Ta, TaN, NiSi, $NiSi_2$, Hf, HfN, $HfSi_2$, Ag, Au, Pt, $CoSi_2$, RuN, $RuO_x$, and $RuO_xN$. In particular, use of Al, Cu, or Ni can decrease the cost.

FIG. 6 is a view illustrating a spectral image sensor according to an embodiment in which a diffraction grating 1 is disposed on the incidence surface side of a Si substrate 9 (corresponding to photodiode groups of the spectral image sensor). FIG. 6 shows the sectional structure of the spectral image sensor 10 for dispersing the visible light band. In FIG. 6, a Si material is shown by a hatched portion, and an oxide film $SiO_2$ is shown by a blank portion.

In the spectral image sensor 10 of this embodiment, the periodicity of scatterers 3 (the distance between the centers of adjacent scatterers 3 in the transverse direction) is 1.5 μm. Also, an oxide ($SiO_2$) film is formed over the entirety of the Si substrate 9. In the spectral image sensor 10 of this embodiment, beside the Si substrate 9, the scatterers 3, slits 5, and scatterers 7 are formed using Si materials.

The long scatterers 3 are periodically disposed on the incidence surface side of the Si substrate 9 (corresponding to the photodiode groups 12) so as to be parallel to each other in the transverse direction (the X direction shown in the drawing). The scatterers 3 each have a thickness of 0.2 μm, and the periodicity of the scatterers 3, i.e., the distance between the centers of the adjacent scatterers 3 in the transverse direction (the X direction), is 1.5 μm. The scatterers 3 are disposed at a distance of 1.6 μm from the surface of the Si substrate 9.

The spectral image sensor 10 comprises the slits 5 which are disposed at a distance of 1.225 μm from the surface (the incidence sides of the scatterers 3) in the depth direction and at a distance of 0.25 μm from the Si substrate 9, i.e., at a position between the scatterers 3 and the Si substrate 9 (corresponding to the photodiode groups 12), the slits 5 having a thickness of 0.125 μm and a slit width Ds of 0.3 μm.

The slits 5 are provided so that the openings 5a with the slid width Ds are periodically arranged in parallel in the transverse direction (the X direction) and are substantially positioned on the centerlines CLO (perpendicular to the surface of the Si substrate 9 or the photodiode groups 12) passing through the centers between the respective scatterers 3. Also, the openings 5a are disposed in parallel with the long scatterers 3. In other words, the periodicity of the openings 5a of the slits 5 (the distance between the adjacent openings 5a) is the same as the periodicity of the scatterers 3 (the distance between the adjacent light shielding portions 3b) and the phase thereof, and these members are disposed in parallel.

The spectral image sensor 10 further comprises the long scatterers 7 provided at the centers of the respective openings 5a of the slits 5 and substantially at the centers between the slits 5 and the Si substrate 9 (corresponding to the photodiode groups 12), the scatterers 7 having a thickness of 0.03 μm and a width of 0.1 μm. The scatterers 7 are provided so as to be periodically arranged in parallel in the transverse direction (the X direction) and substantially positioned on the centerlines CLO (perpendicular to the surface of the Si substrate 9 or the photodiode groups 12) passing through the centers between the respective scatterers 3. Also, the scatterers 7 are disposed in parallel with the long scatterers 3. In other words, the periodicity of the scatterers 7 (the distance between the adjacent scatterers 7) is the same as the periodicity of the scatterers 3 (the distance between the adjacent light-shielding portions 3b) and the phase thereof and the same as the periodicity of the openings 5a of the slits 5 (the distance between the adjacent openings 5a) and the phase thereof. These members are disposed in parallel.

FIG. 7 is a table showing an example of the relation of wavelength dispersion to the refractive index (n) and extinction coefficient (K) of Si (silicon) used in the spectral image sensor 10 of this embodiment. In this table, 460 nm, 540 nm, and 640 nm are used as typical wavelengths of blue light, green light, and red light, respectively. The values of the refractive index and extinction coefficient are document values. Since the refractive index of the oxide film $SiO_2$ is very low, the refractive index and extinction coefficient thereof are 1.4 and 0, respectively, for any wavelength.

Figure 8:
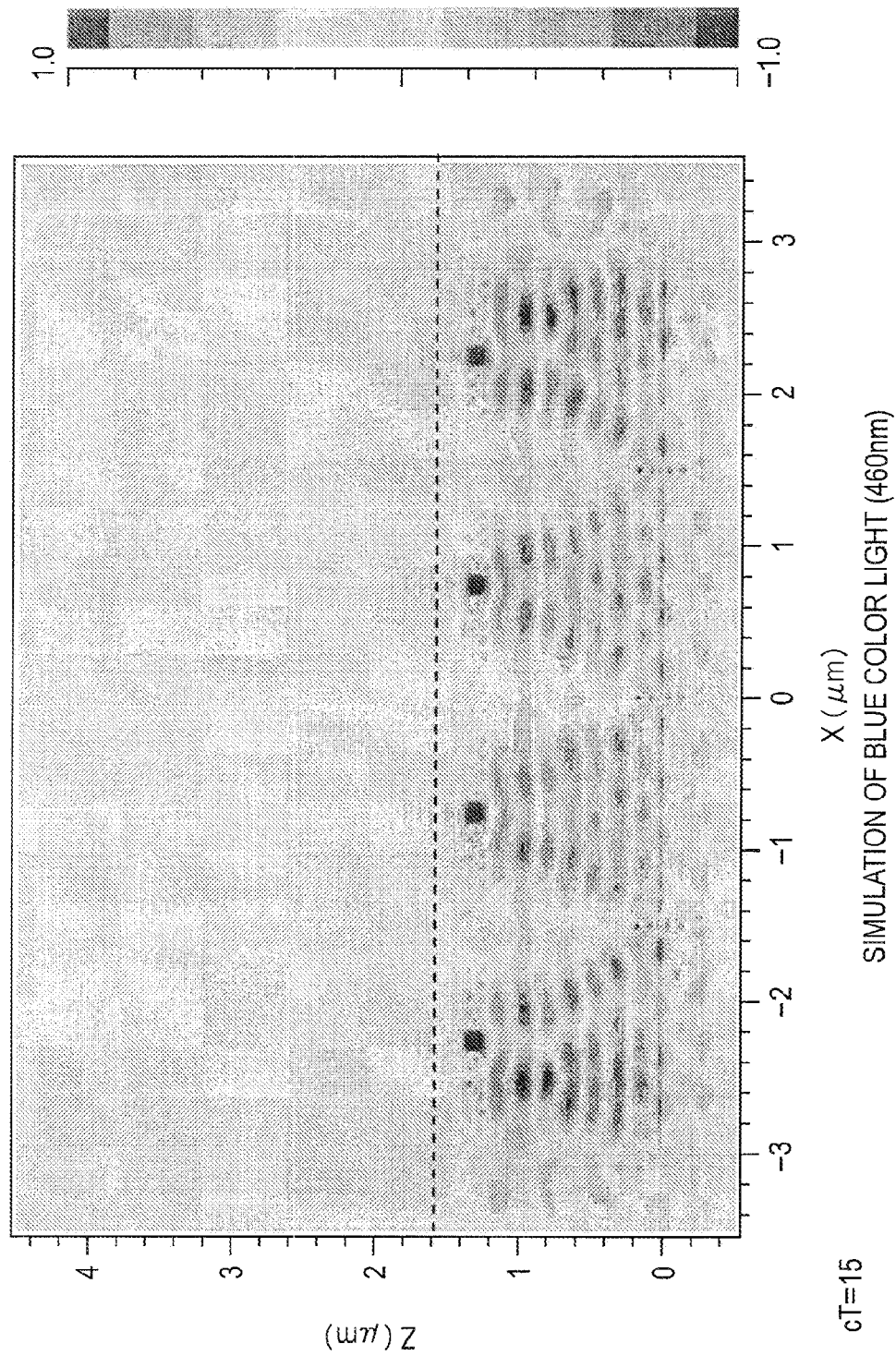
FIG. 8 is a diagram of computation simulation illustrating a spectral method using blue light (wavelength 460 nm) incident on the light-receiving surface of a spectral image sensor having the characteristics shown in FIG. 7 and the structure shown in FIG. 6.
Figure 9:
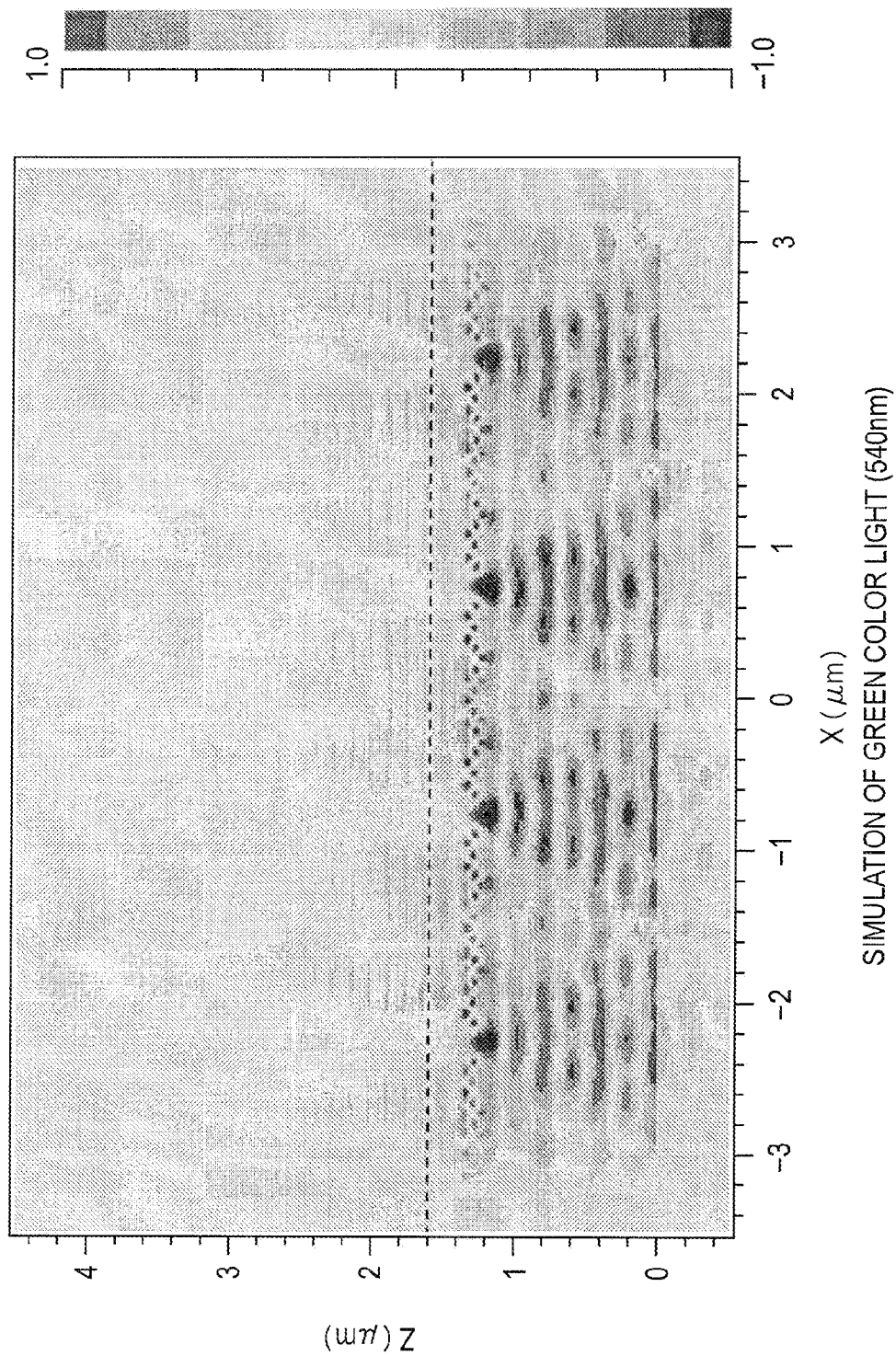
FIG. 9 is a diagram of computation simulation illustrating a spectral method using green light (wavelength 540 nm)

Each of FIGS. 8 to 10 is a diagram of computation simulation for illustrating a spectral method for the visible light band using each color light incident to the light-receiving surface (lower side of the drawing) of the spectral image sensor 10 having the characteristics shown in FIG. 7 and the structure shown in FIG. 6. In each of FIGS. 8 to 10, a horizontal broken line at Z=1.6 μm shows the interface (sensor surface) between the photodiode groups 12 and the silicon oxide film $SiO_2$. The simulation was performed by photofield computation using a FDTD method.

FIG. 8 shows the results of computation simulation using blue light (wavelength λ=460 nm) as incident light. This diagram indicates that light intensity increases in a region of Z=1.6 to 1.8 μm (to a depth of 0.2±0.1 μm from the surfaces of the photodiode groups 12) at positions of X=−2.25, −0.75, 0.75, and 2.25 μm. Namely, the light intensity increases near the sensor surface.

FIG. 9 shows the results of computation simulation using green light (wavelength λ=540 nm) as incident light. This diagram indicates that light intensity increases in a region of Z=1.6 to 2.4 μm (to a depth of 0.8±0.3 μm from the surfaces of the photodiode groups 12) at positions of X=−2.67, −1.83, −1.17, −0.33, 0.33, 1.17, 1.83, and 2.67 μm. Namely, with the green light, the light intensity increases not only near the sensor surface but also at slightly deep positions.

FIG. 10 shows the results of computation simulation using red light (wavelength λ=640 nm) as incident light. This diagram indicates that light intensity increases in a region of Z=1.6 to 4.0 μm (to a depth of 1.4±0.6 μm from the surfaces of the photodiode groups 12) at positions of X=−3.0, −1.5, 0, 1.5, and 3.0 μm. In particular, the light density increases near Z=2.8 μm. Namely, with the red light, the light intensity increases not only near the sensor surface and at slightly deep positions but also at deep positions.

In other words, it is found that when the incident light L1 is incident on the spectral image sensor 10 shown in FIG. 6, the blue light, green light, and red light contained in the incident light L1 exhibit the position dependence in both the width direction (the X direction) and the depth direction according to wavelengths.

Each of the numeral limitations in the parenthesis was induced from the results of simulation by the FDTD method according to the Maxwell equation on the basis of the fact that light is mainly concentrated in each numeral range shown in the parenthesis.

When light is incident on the Si surface, the approach depth (=1/α; decrease in light intensity to 1/e) estimated from the document values of absorption coefficient α (refer to FIG. 113A) is 0.6 μm for blue light (λ=460 nm), 1.4 μm for green light (λ=540 nm), and 3 μm for red light (λ=640 nm). In this estimation, e is a natural logarithm.

Therefore, in a preferred device structure, the maximum depth of a pn junction is 0.6 μm or less and preferably 0.3 μm or less for blue light, 1.4 μm or less and preferably 1.0 μm or less for green light, and 3 μm or less and preferably 2.4 μm or less for red light.

FIGS. 11 to 13 are diagrams illustrating respective proper examples of detection positions for dispersion of the visible light band on the basis of the above-described simulation results.

For example, when the spectral image sensor 10 is formed to be capable of light detection in the areas in a first example shown in FIG. 11, visible light can be dispersed into the three primary colors, i.e., red, green, and blue, and detected. Namely, the blue light (wavelength 460 nm) may be detected at positions of X=−2.25, −0.75, 0.75, and 2.25 μm and Z=1.6 to 1.8 μm (pn junction maximum depth of 0.3 μm or less, particularly a depth of 0.2±0.1 μm from the surfaces of the photodiode groups 12); the green light (wavelength 540 nm) may be detected at positions of X=−2.67, −1.83, −1.17, −0.33, 0.33, 1.17, 1.83, and 2.67 μm and Z=1.6 to 2.4 μm (pn junction maximum depth of 1.0 μm or less, particularly a depth of 0.8±0.2 μm from the surfaces of the photodiode groups 12); and the red light (wavelength 640 nm) may be detected at positions of X=−3.0, −1.5, 0, 1.5, and 3.0 μm and Z=1.6 to 2.4 μm (pn junction maximum depth of 2.4 μm or less, particularly a depth of 1.4±0.6 μm from the surfaces of the photodiode groups 12).

Namely, the maximum depth of the pn junction constituting each of the respective wavelength photoelectric conversion elements as an example of wavelength detectors may be set in the above range in the Z direction. More specifically, the maximum depth of the pn junction constituting a photoelectric conversion element 12B for blue light is set to 0.6 μm or less and preferably 0.3 μm or less from the surfaces of the photodiode groups 12; the maximum depth of the pn junction constituting a photoelectric conversion element 12G for green light is set to 1.4 μm or less and preferably 1.0 μm or less from the surfaces of the photodiode groups 12; and the maximum depth of the pn junction constituting a photoelectric conversion element 12R for red light is set to 3 μm or less and preferably 2.4 μm or less from the surfaces of the photodiode groups 12. In this case, the detection efficiency of each color can be increased.

In order to prevent color mixing between the photodiode groups 12, the width of each photodiode group 12 in the transverse direction (the X direction) is preferably not more than the distance of 1.5 μm between the scatterers 3 in the transverse direction (the X direction). Also, in each photodiode group 12, the width of the pn junction constituting the photoelectric conversion element for each color in the transverse direction (the X direction) is preferably 0.5 μm or less and more preferably 0.3 μm or less. These values facilitate mass production in a semiconductor process.

The value of 0.5 μm is determined on the basis of the maximum value considered as 1.5 μm/3=0.5 μm for dispersion into the three primary colors. The value of 0.3 μm is determined as a value which permits mass production by a current 0.25-μm process. In recent years, a finer process have been made practical, and thus the distance between the scatterers 3 in the transverse direction (the X direction) can be further decreased.

However, any one of the blue light, green light, and red light exhibits the position dependence in the depth direction according to wavelengths, and the blue light and green light significantly attenuate to a position of 2.4 μm in the Z direction (0.8 μm from the surfaces of the photodiode groups 12 in the depth direction). Therefore, in view of this point, the detection positions of the red light need not necessarily be limited in the X direction as long as Z is larger than 2.4 μm (0.8 μm or more from the surface of the photodiode group 12 in the depth direction), as in the second example shown in FIG. 12.

Similarly, in view of the point that the blue light significantly attenuates to a position of Z=1.8 μm (depth of 0.2 μm from the surfaces of the photodiode groups 12), the detection positions of the green light need not necessarily be limited in the X direction excluding the red regions (X=−3.0, −1.5, 0, 1.5, and 3.0 μm), as in the third example shown in FIG. 13.

FIG. 14 is a table showing another example of relation of wavelength dispersion to the refractive index (n) and extinction coefficient (K) of Si (silicon) used in the spectral image sensor 10. In this table, 460 nm, 540 nm, and 640 nm are used as typical wavelengths of blue light, green light, and red light, respectively. Each of the values of refractive index (n) and extinction coefficient is a value observed for a polysilicon film prepared by CVD (Chemical vapor Deposition). Since the refractive index of an oxide film $SiO_2$ is very low, the refractive index and the extinction coefficient of the oxide film were 1.4 and 0, respectively, for any wavelength.

Each of FIGS. 15 to 17 is a diagram of computation simulation for illustrating a spectral method for the visible light band using each color light incident to the light-receiving surface (lower side of the drawing) of the spectral image sensor 10 having the characteristics shown in FIG. 14 and the structure shown in FIG. 6. FIG. 7 shows the document values of the refractive index and extinction coefficient used for simulation. However, FIG. 14 shows the observed values of the refractive index and extinction coefficient used for simulation.

In each of FIGS. 15 to 17, a horizontal broken line at Z=1.6 μm shows the interface (sensor surface) between the photodiode groups 12 and the silicon oxide film $SiO_2$. FIG. 15 shows the results of computation simulation using blue light (wavelength 460 nm) as incident light. This diagram indicates that light intensity increases in a region of Z=1.6 to 1.8 μm (to a depth of 0.2 μm from the surfaces of the photodiode groups 12) at positions of X=−2.25, −0.75, 0.75, and 2.25 μm. Namely, the light intensity increases near the sensor surface.

FIG. 16 shows the results of computation simulation using green light (wavelength 540 nm) as incident light. This diagram indicates that light intensity increases in a region of Z=1.6 to 2.2 μm (to a depth of 0.6 μm from the surfaces of the photodiode groups 12) at positions of X=−2.67, −1.83, −1.17, −0.33, 0.33, 1.17, 1.83, and 2.67 μm. Namely, with the green light, the light intensity increases not only near the sensor surface but also at slightly deep positions.

FIG. 17 shows the results of computation simulation using red light (wavelength 640 nm) as incident light. This diagram indicates that light intensity increases in a region of Z=1.6 to 4.0 μm (depth of 2.4 μm from the surfaces of the photodiode groups 12) at positions of X=−3.0, −1.5, 0, 1.5, and 3.0 μm. Namely, with the red light, the light intensity increases not only near the sensor surface and at slightly deep positions but also at deep positions.

Namely, with respect to the position dependence of the blue light, green light, and red light contained in the incident light L1 in the width direction (the X direction) and in the depth direction according to wavelengths, a degree of dispersion is changed by an amount corresponding to a difference between the relation of wavelength dispersion to the refractive index and extinction coefficient shown in FIG. 7 and the relation of wavelength dispersion to the refractive index and extinction coefficient shown in FIG. 14. It is thus found that the proper positions (for example, the pn junction maximum depths) of the photoelectric conversion elements 12B, 12G, and 12R for detecting the respective color components must be adjusted according to the relation of wavelength dispersion.

Namely, proper examples of the detection positions for dispersion of the visible light band on the basis of the results of simulation shown in FIGS. 15 to 17 are as follows:

For example, the blue light (wavelength 460 nm) may be detected at positions of X=−2.25, −0.75, 0.75, and 2.25 μm and Z=1.6 to 1.8 μm (depth of 0.2 μm from the surfaces of the photodiode groups 12); the green light (wavelength 540 nm) may be detected at positions of X=−2.67, −1.83, −1.17, −0.33, 0.33, 1.17, 1.83, and 2.67 μm and Z=1.6 to 2.2 μm (depth of 0.6 μm from the surfaces of the photodiode groups 12); and the red light (wavelength 640 nm) may be detected at positions of X=−3.0, −1.5, 0, 1.5, and 3.0 μm and Z=1.6 to 4.0 μm (depth of 2.4 μm from the surfaces of the photodiode group 12s). In this case, the detection efficient of each color can be increased.

In the above-described example of configuration, a wavelength dispersion portion comprises the combination of the three types of scatterers, i.e., the scatterers 3, the slits 5, and the scatterers 7. However, the configuration of the wavelength dispersion portion is not limited to this, and any configuration may be used as long as an electromagnetic wave can be separated into a plurality of wavelength components using the diffraction effect, and the respective wavelength components can be incident on adjacent different positions in the incidence surface. In other words, any configuration may be used as long as it has a structure for separating (dispersing) an electromagnetic wave containing various wavelength components into the respective wavelength components and exhibits wavelength dispersibility in which the interference fringe pattern changes with wavelengths. All of the scatterers 3, the slits 5, and the scatterers 7 need not be provided.

From this viewpoint, the slits 5 greatly contributing the spectral effect in the above-described structure are thought to have an important function for realizing the spectral image sensor 10 for dispersing light into the three colors B, G, and R. However, in simple dispersion of only a high wavelength region, not three-color dispersion, the dispersion can be performed even by a wavelength dispersion portion comprising only one type of scatterers having a structure other than the slits 5.

For example, FIGS. 18 to 20 shows a modified example. FIG. 18 shows a sectional structure of the modified example, and each of FIGS. 19 and 20 is a diagram of computation simulation for illustrating the spectral method (FDTD method) for the visible light band using light incident to the light-receiving surface (the lower side in the drawing) of the spectral image sensor 10 having the characteristics shown in FIG. 7 and the structure shown in FIG. 18. In FIGS. 19 and 20, a horizontal broken line at Z=4.8 μm shows the interface (sensor surface) between the photodiode groups 12 and the silicon oxide film $SiO_2$.

The structure shown in FIG. 18 is greatly different from the structure shown in FIG. 6 in that the wavelength dispersion portion does not comprise the slits 5 and the scatterers 7. Like in the structure shown in FIG. 6, the scatterers 3 are disposed at a distance of 1.6 μm from the surface of the Si substrate 9.

FIG. 19 shows the results of computation simulation using light at a wavelength $\lambda$=640 nm as incident light. This diagram indicates that light intensity increases in a region of Z=3.8 to 5.8 μm (to a depth of about 1.0 μm from the surfaces of the photodiode groups 12) at positions of X=−2.25, −1.5, −0.75, 0, 0.75, 1.5, and 2.25 μm. Namely, with the light at the wavelength $\lambda$=640 nm, the light intensity increases not only near the sensor surface but also at slightly deep positions.

FIG. 20 shows the results of computation simulation using light at a wavelength $\lambda$=460 nm as incident light. This diagram indicates that light intensity increases in a region of Z=3.8 to 4.2 μm (depth of about 0.2 μm from the surfaces of the photodiode groups 12) at positions of X=−2.625, −1.875, −1.125, −0.375, 0.375, 1.125, 1.875, and 2.625 μm. Namely, with the light at the wavelength $\lambda$=460 nm, the light intensity increases near the sensor surface.

It is thus found that even in the structure of the modified example in which the wavelength dispersion portion includes only the scatterers 3, lights at wavelengths of 640 nm and 460 nm converge different positions. In other words, the two wavelength components can be separated.

FIG. 21 shows a sectional structure of a configuration example of a sensor structure of a first example corresponding to the deposition positions shown in FIG. 11. FIGS. 22 and 23 are diagrams illustrating dispersion into wavelength components other than the three primary colors. FIG. 22 shows the results of computation simulation for illustrating a spectral method using yellow light (wavelength $\lambda$=590 nm) incident on the device shown in FIG. 6. FIG. 23 is the CIE 1976 UCS/u'v' chromaticity diagram.

In the spectral image sensor 10 of the first example, a p-type Si substrate 90 is doped with n-type impurities at each of detection positions for blue light, green light, and red light in the width direction (the X direction shown in the drawing) and in the depth direction (the Z direction shown in the drawing) in each photodiode group 12.

As a result, n-type Si regions 91 for the blue light, green light, and red light, respectively, are formed to provide photoelectric conversion elements (photodiodes) 12B, 12G, and 12R for the respective colors. The photoelectric conversion elements 12B, 12G, and 12R are arranged in the order of blue, green, red, green, blue, green, red, green, blue, . . . in the transverse direction (the X direction) on the light-receiving surface of the Si substrate 90 and within the Si substrate 90.

When the photoelectric conversion elements 12B, 12G, and 12r are arranged in the transverse direction (X direction) so that the colors are arranged as described above, a device can be formed in consideration of continuity of wavelengths. Namely, the wavelength is shifted from a short wavelength to a long wavelength in the order "blue→green→red". Conversely, the wavelength is shifted from a long wavelength to a short wavelength in the order "red→green→blue". Light at an intermediate wavelength other than the three primary colors of blue, green, and red can be detected by the adjacent two of the photoelectric conversion elements 12B, 12G, and 12R, and thus appropriate color information can be obtained.

For example, as seen from FIG. 22, yellow light at a wavelength of 590 nm is dispersed by both the red and green photoelectric conversion elements 12R and 12G. This means that when a signal of yellow light is input into the display, red color and green color are simultaneously displayed to express a yellow color due to color mixing, as shown in the u'v' chromaticity diagram of FIG. 23.

Furthermore, the photoelectric conversion element 12R for detecting red light among the photoelectric conversion elements 12B, 12G, and 12R is used in common to the adjacent photodiode groups 12. In this case, the pixel centers of the photoelectric conversion elements 12B and 12G for detecting blue light and green light, respectively, and the pixel center of the photoelectric conversion element 12R for detecting red light are positioned on the centerlines CLO.

In this example, light is absorbed by a depletion layer near the interface between the n-type and p-type Si semiconductors to produce electrons and holes, and the electrons and holes move to the n-type and p-type semiconductors, respectively, due to an electric field in the depletion layer to store signal electric charge. The signal electric charge is read from each of the photoelectric conversion elements 12B, 12G, and 12R and detected as an electric signal.

Namely, in each of the photodiode groups 12, detection regions for independently detecting blue light, green light, and red light are provided at the detection positions in the width direction (the X direction) and the depth direction (the Z direction). In such a structure, the quantity of light incident on a unit area is increased because a subtractive filter is not used. Therefore, the efficiency of conversion of light to electric signals is increased to obtain high sensitivity characteristics. Furthermore, a color separating filter is not required to decrease the cost.

Each of the photodiode groups 12 has a structure for independently detecting blue light, green light, and red light, and the unit of color separation (color separation unit) can be realized by each photodiode group 12 constituting one pixel. In other words, each photodiode group 12 substantially has a structure comprising the photoelectric conversion elements for respective colors, and thus the photodiode groups 12 corresponding to each pixel need not be prepared for each of the colors. Therefore, one photodiode group 12 may be provided for one color separation unit, and thereby the spectral image sensor 10 having high-density pixels can be realized.

In addition, the incident light L1 is incident on the Si substrate 90 through a diffraction grating 1, and thus the position dependence in the width direction (the X direction) according to wavelengths can be utilized. As a result, for example, red light and green light are not absorbed by a layer for detecting blue light, thereby preventing the occurrence of alias, as compared with the sensor described using changes in absorption coefficient with wavelengths. Therefore, color discrimination is improved to achieve high color reproducibility, and accurate correction can be made by computation signal processing for the whole of the three primary colors. In some cases, the computation is not required to decrease the cost due to the omission of a circuit.

FIG. 24 is a sketch drawing showing an example of a structure when the sensor structure of the first example shown in FIG. 21 is applied to an inter-line transfer-system CCD solid-state image sensing device (IT_CCD image sensor). FIG. 25 is a drawing showing a circuit for application to an inter-line transfer-system CCD solid-state image sensing device.

In the structure shown in FIG. 24, a CCD solid-state image sensing device 101 comprises a Si substrate 9 comprising a semiconductor doped with a III group element, for example, Al (aluminum) or B (boron). However, an n-type semiconductor doped with a V group element such as p (phosphorus) or Sb (antimony) may be used as the Si substrate 9.

As shown in FIGS. 24 and 25, the CCD solid-state image sensing device 101 having the sensor structure shown in FIG. 21 includes a plurality of vertical transfer CCDs 122 arrayed in a direction perpendicular to the long scatterers 3 in addition to the photodiode groups 12. The charge transfer direction of the vertical transfer CCDs 122, i.e., the read direction of pixel signals, coincides with the transverse direction (the X direction). The long scatterers 3 are disposed in a direction perpendicular to the vertical transfer CCDs 122.

Furthermore, read gates 124 (124B, 124G, and 124R for respective colors) comprising MOS transistors are interposed between the respective photodiode groups 12 and the corresponding vertical transfer CCDs 122, and a channel stop (not shown) is provided at the boundary of each unit cell (unit component).

As seen from FIGS. 11 and 21, each of the photodiode groups 12 has a structure for independently detecting blue light, green light, and red light, and substantially has a structure in which the photoelectric conversion elements 12B, 12G, and 12R for the respective colors are provided. An image sensing area 110 comprises the plurality of vertical transfer CCDs 122 provided for the respective vertical lines of sensor portions 112 each including the photodiode groups 12 so that signal charge read from each sensor portion by the read gates 124 is vertically transferred.

In the sensor structure corresponding to the detection positions of the first example shown in FIG. 11, the read gates 124 are provided corresponding to the photoelectric conversion elements 12B, 12G, and 12R for the respective colors which are arrayed in the order of blue, green, red, green, blue, green, red, green, blue, . . . in the width direction (the X direction) on the light-receiving surface of the Si substrate 9. As a result, the pixels are also arranged in the order of blue, green, red, green, blue, green, red, green, blue, . . . .

When drive pulse φROG corresponding to read pulse ROG is applied to the read gates 124, the signal charges stored in the photodiode groups 12 (the photoelectric conversion elements 12B, 12G, and 12R) of the sensor portions 112 are read by the vertical transfer CCD 122 in the same vertical line. The vertical transfer CCDs 122 are driven by, for example, drive pulse φVx based on three-phase or eight-phase vertical transfer clock Vx, and the read signal charges are sequentially transferred in the vertical direction for portions corresponding to respective scanning lines (lines) during a horizontal blanking period. The vertical transfer for each line is referred to as "line shift".

The CCD solid-state image sensing device 101 further comprises horizontal transfer CCDs 126 (HL register, horizontal transfer portion) provided in a line extending in a predetermined direction (for example, the right-left direction) so as to be disposed at the transfer ends of the plurality of vertical transfer CCDs 122, i.e., disposed adjacent to the vertical transfer CCDs 122 in the last row. The horizontal transfer CCDs 126 are driven by drive pulses φH1 and φH2 based on, for example, two-phase horizontal transfer clocks H1 and H2 to sequentially horizontally transfer the signal charges transferred from the plurality of vertical transfer CCDs 122 in each line during a horizontal scanning period after a horizontal blanking period. Therefore, a plurality (two) of horizontal transfer electrodes corresponding to two-phase drive is provided.

Also, an output amplifier 128 having a charge-voltage conversion portion comprising, for example, a floating-diffusion amplifier (FDA), is provided at the transfer end of the horizontal transfer CCDs 126. The output amplifier 128 is an example of physical information acquiring portions. In the charge-voltage conversion portion, the signal charges horizontally transferred by the horizontal transfer CCDs 126 are converted to voltage signals, amplified to a predetermined level, and then output. On the basis of the voltage signals, pixel signals are output as CCD output (Vout) corresponding to the quantity of incident light from an object. An interline transfer system CCD solid-state image sensing device 11 has the above-described configuration.

The pixel signals output as the CCD output (Vout) from the output amplifier 128 are input to an image signal processing portion (not shown). The image signal processing portion performs, for example, primary color separation for dispersing light and synchronizing primary color signals of red (R), green (G), and blue (B) based on image data of complementary colors, synchronization for synchronizing image data of the primary colors (pixel data of R, G, and B), stripe noise correction for correcting stripe noise components produced by smearing and blooming, WB control for controlling white balance (WB), gamma correction for controlling gradient, dynamic range elongation for elongating a dynamic range using pixel information of two pictures having different charge storage times, or YC signal generation for generating luminance signal (Y) and color data (C). After the processing, the pixel signals are stored in a hard disk device or transmitted to another functional portion.

FIG. 26 is a sketch drawing showing an example of a structure when the sensor structure of the first example shown in FIG. 21 is applied to a CMOS solid-state image sensing device (CMOS image sensor). FIG. 27 is a drawing of a circuit for application to a CMOS solid-state image sensing device.

When the structure shown in FIG. 21 is applied to CMOS, an image sensor has a structure in which a cell amplifier is provided for each of the photoelectric conversion elements 12B, 12G, and 12R in the photodiode groups 12. This structure is as shown in FIGS. 26 and 27. In the structure, pixel signals are amplified by the cell amplifiers and then output through a noise cancel circuit or the like.

For example, a CMOS solid-state image sensing device 201 comprises a pixel region in which a plurality of pixels each including a light-receiving element (an example of charge generators), which outputs a signal corresponding to the quantity of incident light, is arrayed in rows and columns (i.e., a two-dimensional matrix form), a signal output from each pixel being a voltage signal. Also, CDS (Correlated Double Sampling) processing functional portions and digital conversion portions (ADC; Analog Digital Converter) are provided in parallel in the column direction. In the structure in which the CDS processing functional portions and the digital conversion portions are provided in parallel in the column direction, the extension direction of vertical signal lines 219, which is also the read direction of pixel signals, coincides with the transverse direction (the X direction shown in the drawing), and the long scatterers 3 are disposed in a direction perpendicular to the extension direction of the vertical signal lines 219.

The sentence "CDS processing functional portions and digital conversion portions are provided in parallel in the column direction" means that a plurality of the CDS processing functional portions and a plurality of the digital conversion portions are provided in substantially parallel with the vertical signal lines 219 in the vertical lines. In a plan view of the device, the plurality of the functional portions may be disposed only on one (the output side shown on the lower side of the drawing) of the sides of the pixel region 210 in the column direction or may be divided and disposed at one (the output side shown on the lower side of the drawing) of the sides of the pixel region 210 in the column direction and the opposite edge (the upper side of the drawing). In the latter case, horizontal scanning portions for read scanning (horizontal scanning) in the row direction are preferably divided and provided at both sides so that they can function independently.

A typical example is a column type in which the CDS processing functional portions and the digital conversion portions are provided in parallel in the column direction, the CDS processing functional portions and the digital conversion portions are provided for each vertical column in a region referred to as a "column region" provided on the output side of the imaging portion, so that signals are sequentially read to the output side. An example other than the column type is a type in which one CDS processing function portion and one digital conversion portion are assigned to a plurality (for example, two) adjacent vertical signal lines 219 (vertical column) or one CDS processing function portion and one digital conversion portion are assigned to N (N is an integer; including N−1 lines) vertical signal lines 219 (vertical column).

In the type other than the column type, a plurality of the vertical signal lines 219 (vertical column) use the common CDS processing function portion and digital conversion portion, and thus a switching circuit (switch) is provided for supplying the pixel signals for a plurality of columns supplied from the pixel region 210 to the CDS processing function portion and the digital conversion portion. If required, memory for holding output signals is provided according to subsequent processing.

Any of the cases, one CDS processing function portion and one digital conversion portion are assigned to a plurality of vertical signal lines 219 (vertical column), so that each of the pixel signals is processed after the pixel signals are read by pixel column units. Therefore, the structure in each unit pixel can be simplified to comply with increase in the number of pixels of the image sensor and decreases in the size and cost thereof, as compared with a case in which the signal processing is performed within each unit pixel.

Also, the pixel signals for one row can be processed by a plurality of signal processing portions disposed in parallel in the column direction, and thus the signal processing portions can be operated at a low speed in comparison to a case in which signal processing is performed by one CDS processing function portion and one digital conversion portion on the output circuit side or outside the device. As a result, the image sensing device is advantageous in view of power consumption, band performance, and noise. In contrast, with the same power consumption and band performance, a sensor can be operated at a high speed as a whole.

The column type can be operated at a low speed and is thus advantageous in view of power consumption, band performance, and noise, and is also advantageous in that the switching circuit (switch) is not required. Description will be made with reference to the column type unless otherwise specified.

As shown in FIGS. 26 and 27, the CMOS solid-state image sensing device 201 comprises the pixel region (mage region) 210 in which a plurality of unit pixels 203 are arrayed in rows and columns, and a driving control portion 207, a column processing portion 226, and an output circuit 228 which are provided outside the pixel region 210.

If required, an AGC (Auto Gain Control) circuit having a signal amplifying function or the like can be provided in front of or behind the column processing portion 226 in the same semiconductor region as the column processing portion 226. When AGC is performed in front of the column processing portion 226, analogue amplification is performed, while when AGC is performed behind the column processing portion 226, digital amplification is performed. When n-bit digital data is simply amplified, gradation may be degraded. Therefore, rather preferably, analogue amplification is first performed, and then digital conversion is performed.

The drive control part 207 functions as a control circuit for sequentially reading the signals of the pixel region 210. For example, the drive control portion 207 comprises a horizontal scanning circuit (column scanning circuit) 212, a vertical scanning circuit (row scanning circuit) 214 for controlling row addresses and raw scanning, and a communication timing control part 220 having the function as an interface with the outside and the function to generate internal clocks.

The horizontal scanning circuit 212 has the function as a read scanning part for reading count values from the column processing part 226. The components of the drive control portion 207 are integrally formed together with the pixel regions 210 in the semiconductor region composed of single crystal silicon using a technique similar to a technique for manufacturing a semiconductor integrated circuit to form a solid-state image sensing device (image sensing device) as an example of semiconductor systems.

Although, in FIGS. 26 and 27, the rows and columns are partially omitted for the sake of simplicity, several tens to several thousands of unit pixels 203 are actually disposed in each line and each column. Each of the unit pixels 203 typically comprises a photodiode group 12 serving as a light-receiving element (charge generator), and a pixel amplifier (cell amplifier; pixel signal generator) 205 (one of 205B, 205G, and 205B for respective colors) including an amplification semiconductor element (for example, a transistor).

As seen from FIGS. 11 and 21, each photodiode group 12 has a structure for independently detecting blue light, green light, and red light, and substantially has the photoelectric conversion elements 12B, 12G, and 12R for the respective colors.

In the sensor structure corresponding to the detection positions of the first example shown in FIG. 11, the pixel amplifier 205, which is an example of a physical information acquiring portion, is provided for each of the photoelectric conversion elements 12B, 12G, and 12R for the respective colors arranged on the light-receiving surface side of the Si substrate 9 in the order of blue, green, red, green, blue, green, red, green, blue, . . . in the transverse direction (the X direction). As a result, the pixels are also arrayed in the order of blue, green, red, green, blue, green, red, green, blue, . . . .

Each of the pixel amplifiers 205 is, for example, a floating diffusion amplifier. For example, each of the pixel amplifiers 205 comprises a read selection transistor which is an example of charge read portions (transfer gates/read gates), a reset transistor which is an example of reset gates, a vertical selection transistor, and a source-follower amplification transistor which is an example of sensors for detecting voltage changes in floating diffusion. Namely, four general-purpose transistors for a CMOS sensor can be used.

Alternatively, as described in U.S. Pat. No. 2,708,455, it is possible to use the three transistors including an amplification transistor connected to a drain line (DRN) in order to amplifying signal voltages corresponding to the signal charges generated by the charge generator, a reset transistor for resetting the pixel amplifier 205, and a read selection transistor (transfer gate) scanned by a vertical shift register through a transfer line (TRF).

The unit pixel 203 is connected to a corresponding vertical scanning circuit 214 through a row control line 215 for row selection and a column processing portion 226 through the corresponding vertical signal line 219. Each of the row control lines 215 extends from the vertical scanning circuit 214 to the corresponding pixel. For example, the row control lines 215 are disposed in parallel with the long scatterers 3.

Each of the horizontal scanning circuit 212 and the vertical scanning circuit 214 comprises, for example, a shift register and a decoder so as to start an address selection operation (scanning) in response to a control signal supplied from the communication timing control part 220. Therefore, the row control lines 215 contain various pulse signals (for example, reset pulse RST, transfer pulse TRF, DRN control pulse DRN, and the like) for driving the unit pixels 203.

Although not shown in the drawing, the communication timing control part 220 has a functional block of a timing generator TG (an example of read address control devices) for supplying clocks and predetermined timing pulse signals necessary for operating each portion, and a functional block of a communication interface for receiving a master clock CLK0 through a terminal 220a and data DATA for instructing an operation mode through a terminal 220b, and outputting data containing information of the MOS solid-state image sensing device 201 through a terminal 220c.

For example, a horizontal address signal is output to a horizontal decoder, and a vertical address signal is output to a vertical decoder. Each of the decoders selects the corresponding row or column to drive the unit pixels 203 and the column processing portion 226 through the driving circuit.

In this case, the unit pixels 203 are arranged in a two-dimensional matrix, and thus (vertical) scanning is performed to access the analogue pixel signals, which are generated in the pixel signal generation portions 5 and output through the vertical signal lines 219 in the column direction, by row units (parallel in the column direction) and read in. Then, (horizontal) scanning is performed to access the signals in the row direction in which the vertical columns are arrayed and read out pixel signals (for example, digital pixel data) to the output side. As a result, the reading speed of the pixel signals and pixel data can be desirably increased. Of course, random access can be made, in which the address of the unit pixel 203 from which the pixel signal and pixel data are desired to be read is directly specified to read out only the information of the necessary unit pixel 203.

The communication timing control part 220 supplies a clock CLK1 with the same frequency as that of the master clock CLK0 input through the terminal 220a, a low-speed lock with a frequency obtained by dividing that frequency by 2 or more to each of the portions in the device, for example, the horizontal scanning circuit 212, the vertical scanning circuit 214, the column processing portion 226, etc.

The vertical scanning circuit 214 selects a row of the pixel region 210 and supplies necessary pulses to the selected row. For example, the vertical scanning circuit 214 comprises a vertical decoder for specifying a read row in the vertical direction (selecting a row of the pixel region 210), and a vertical driving circuit for supplying pulses to the row control line 215 corresponding to the unit pixels 203 at the read address (in the row direction) specified by the vertical decoder and driving the pixels 230. In addition to read of signals, the vertical decoder also selects a row for electron shutter.

The horizontal scanning circuit 212 sequentially selects the column circuits (not shown) in the column processing portion 226 in synchronism with a low-speed clock CLK2 and leads the signals to the horizontal signal lines (horizontal output lines) 218. For example, the horizontal scanning circuit 212 comprises a horizontal decoder for specifying a read column in the horizontal direction (selecting a column circuit in the column processing portion 226), and a horizontal driving circuit for leading the signals of the column processing portion 226 to the horizontal signal lines 218 through selection switches according to the read address specified by the horizontal decoder. The horizontal signal lines 218 are provided in a number corresponding the number n (positive integer) of the bits handled by the column AD circuits. For example, when the number is 10 (=n), 10 horizontal signal lines 218 are arranged.

In the CMOS solid-state image sensing device 201 having the above-described configuration, the pixel signals output from the unit pixels 203 are supplied, for each vertical column, to the column circuits in the column processing portion 226 through the vertical signal lines 219 which are disposed in the direction perpendicular to the long scatterers 3. The signal charges stored in the photodiode groups 12 (the photoelectric conversion elements 12B, 12G, and 12B) are read through the vertical signal lines 219 in the same vertical column.

Each of the column circuits in the column processing portion 226 receives signals of the pixels in one column and processes the signals. For example, each of the column circuits has an ADC (Analog Digital Converter) circuit for converting an analog signal to 10-bit digital data using, for example, the low-speed clock CLK2.

The circuit configuration can be modified to permit processing of voltage-mode pixel signals input through the vertical signal lines 219 to obtain a difference between a signal level (noise level) immediately after pixel reset and a true signal level Vsig (corresponding to the quantity of received light). This processing can remove noise signal components such as fixed pattern noise (FPN) and reset noise.

The analog pixel signals (or digital pixel data) processing in the column circuits are transmitted to the horizontal signal lines 218 through horizontal selection switches 217 which are driven by horizontal selection signals from the horizontal scanning circuit 212, and further input to the output circuit 228. The number of bits is, for example, 10, but the number of bits may be less than 10 (for example, 8) or over 10 (for example, 14), or another number.

In the above-described configuration, pixel signals are sequentially output, for each vertical column, from the pixel region 210 in which the photodiode groups (the photoelectric conversion elements 12B, 12G, and 12B) serving as the charge generators are arranged in a matrix. As a result, an image corresponding to the pixel region 210 in which light-receiving elements are arranged in a matrix, i.e., a frame image, is displayed by a collection of the pixel signals over the entire pixel regions 210.

The output circuit 228 corresponds to the output amplifier 128 in the CCD solid-state image sensing device 101. Like in the CCD solid-state image sensing device 101, an image processing portion (not shown) is provided behind the output circuit 228.

FIG. 28 is a sectional view showing a configuration example of a sensor structure of a second example corresponding to the detection positions shown in FIG. 12. FIG. 29 is a sketch drawing showing an example of a structure when the sensor structure of the second example shown in FIG. 28 is applied to an interline transfer-system solid-state image sensing device (IT_CCD image sensor) 101. FIG. 30 is a sketch drawing showing an example of a structure when the sensor structure of the second example shown in FIG. 28 is applied to a CMOS solid-state image sensing device (CMOS image sensor) 201.

In the spectral image sensor 10 of the second example, an n-type Si substrate 90 is doped with p-type impurities at each of detection positions in the width direction (the X direction shown in the drawing) and in the depth direction (the Z direction shown in the drawing) to form a p-type Si region 92 for each photodiode group 12. The p-type Si region 92 corresponding to each photodiode group 12 is doped with n-type impurities at the detection positions for blue light and green light, respectively, in the width direction (the X direction) and the depth direction (the Z direction) to form n-type Si regions 93 for detecting blue light and green light, respectively, thereby forming the photoelectric conversion elements (photodiodes) 12B, 12G, and 12R for the respective colors.

In the spectral image sensor having the structure of the second example, each of the photodiode groups 12 detects blue light and green light by charges which are generated between layers of the photoelectric conversion elements 12B and 12G, respectively, each of the photoelectric conversion elements 12B and 12G comprising a n-type layers (n-type Si region 93) and a corresponding common p-type layer (p-type Si region 92). On the other hand, red light is detected by charges which are generated between the n-type Si substrate 90 and the photoelectric conversion element 12R corresponding to each pixel, the photoelectric conversion element 12R comprising a p-type layer (p-type Si region 92).

As a result, the photoelectric conversion elements 12B, 12G, and 12R are independently provided in each photodiode group 12. The photoelectric conversion elements 12B, 12G, and 12R are arranged in the order of red, green, blue, green, red, . . . in the transverse direction (the X direction) on the light-receiving surface of the Si substrate 90 and within the Si substrate 90.

Among the photoelectric conversion elements 12B, 12G, and 12R, each of the photoelectric conversion elements 12R for red light includes the common semiconductor layers (p-type region 92 and n-type Si substrate 90) on both sides. Therefore, as shown in FIGS. 29 and 30, the read gate 124 and the pixel amplifier 205 may be provided one of the sides.

The arrangement order of the pixels is the same as the color arrangement order of the read gates 124 and the pixel amplifiers 205. As a result, like in the sensor structure of the first example, the color arrangement order is blue, green, red, green, blue, green, red, green, blue, . . . .

FIG. 31 is a drawing showing the outlines of a process (particularly, an impurity diffusion process) for manufacturing the spectral image sensor 10 having the structure of the second example. In the structure of the second example, when a p-type layer is formed by diffusing impurities of a III group element such as Al, B, or the like, and an n-type layer is formed by diffusing impurities of a V group element such as P, Sb, or the like, n-type and p-type impurities can be successively diffused in diffusion regions using the same mask. Such a manufacturing process is capable of forming a plurality of (multilayer) of photodiode regions, thereby simplifying the process and decreasing the cost.

For example, in the structure shown in FIG. 29 (FIGS. 28 to 30), the photoelectric conversion elements 12B for blue light and the photoelectric conversion elements 12R for red light can be formed using a common mask.

Furthermore, the width of each photodiode group 12 in the transverse direction (the X direction) can be made smaller than the distance of 1.5 μm or less of the respective scatterers 3 in the transverse direction (the X direction). This is desirable for preventing color mixing between the photodiode groups 12.

FIG. 32 is a sectional view showing a configuration example of a sensor structure of the third example corresponding to the detection positions shown in FIG. 13. FIG. 33 is a sketch drawing showing an example of a structure when the sensor structure of the third example shown in FIG. 32 is applied to an interline transfer-system solid-state image sensing device (IT_CCD image sensor) 101. FIG. 34 is a sketch drawing showing an example of a structure when the sensor structure of the third example shown in FIG. 32 is applied to a CMOS solid-state image sensing device (CMOS image sensor) 201.

In the spectral image sensor 10 of the third example, an n-type Si substrate 90 is doped with p-type impurities at each of detection positions in the width direction (the X direction shown in the drawing) and in the depth direction (the Z direction shown in the drawing) to form an independent p-type Si region 92 for each photodiode group 12. The p-type Si region 92 corresponding to each photodiode group 12 is doped with n-type impurities at each of the detection positions for green light in the width direction (the X direction) and the depth direction (the Z direction) to form n-type Si regions 94 for detecting green light, thereby forming photoelectric conversion elements 12G for the green light.

Furthermore, the n-type Si regions 94 are doped with p-type impurities at the detection positions for blue light in the width direction (the X direction) and the depth direction (the Z direction) to form p-type Si regions 95. The p-type Si regions 95 are doped with n-type impurities at the detection positions for blue light in the width direction (the X direction) and the depth direction (the Z direction) to form n-type Si regions 96 for detecting blue light, thereby forming photoelectric conversion elements 12B for the blue light.

Namely, the structure of the second example shown in FIGS. 28 to 30 is further developed to a Baumkuchen-like_ structure in which the p-type Si regions 92, the n-type Si regions 94, the p-type Si regions 95, and the n-type Si regions 96 are alternately laminated in a curved form.

In the spectral image sensor 10 having the structure of the third example, each of the photodiode groups 12 detects blue light by charges which are generated between layers of the photoelectric conversion element 12B comprising a n-type layer (n-type Si region 96) and a corresponding p-type layer (p-type Si region 95) of each pixel. The green light is detected by charges which are generated between layers of the photoelectric conversion element 12G comprising a n-type layer (n-type Si region 94) and a corresponding p-type layer (p-type Si region 92) of each pixel. On the other hand, red light is detected by charges which are generated between layers of the n-type Si substrate 90 and the photoelectric conversion element 12R corresponding to each pixel, the photoelectric conversion element 12R comprising a p-type layer (p-type Si region 92).

As a result, like in the sensor structure of the second example, the photoelectric conversion elements 12B, 12G, and 12R are independently provided in each photodiode group 12. The photoelectric conversion elements 12B, 12G, and 12R are arranged in the order of red, green, blue, green, and red in the transverse direction (the X direction) on the light-receiving surface of the Si substrate 90 and within the Si substrate 90.

Among the photoelectric conversion elements 12B, 12G, and 12R, each of the photoelectric conversion elements 12G for green light includes the common semiconductor layers (p-type region 95 and n-type Si region 94) on both sides, and each of the photoelectric conversion elements 12R for red light includes the common semiconductor layers (p-type region 92 and n-type Si substrate 90) on both sides. Therefore, as shown in FIGS. 33 and 34, the read gate 124 and the pixel amplifier 205 may be provided on one of the sides of each of the photoelectric conversion elements 12G and 12R.

The arrangement order of the pixels is the same as the color arrangement order of the read gates 124 and the pixel amplifiers 205. As a result, unlike in the sensor structures of the first and second examples in each of which the color arrangement order is blue, green, red, green, blue, green, red, green, blue, . . . , the color arrangement order is, for example, red, blue, green, red, blue, green, . . . , as shown in FIGS. 33 and 34, or red, green, blue, red, green, blue, . . . (not shown).

FIG. 35 is a drawing showing the outlines of a process (particularly, an impurity diffusion process) for manufacturing the spectral image sensor 10 having the structure of the third example. In the structure of the third example, when a p-type layer is formed by diffusing impurities of a III group element such as Al, B, or the like, and an n-type layer is formed by diffusing impurities of a V group element such as P, Sb, or the like, n-type and p-type impurities can be successively diffused in diffusion regions using the same mask. Such a manufacturing process is capable of forming a plurality of (multilayer) of photodiode regions, thereby simplifying the process and decreasing the cost.

In particular, in the spectral image sensor 10 having the Baumkuchen-like structure of the third example, all the photoelectric conversion elements 12B, 12G, and 12R for the three primary colors can be formed using a common mask.

FIG. 36 is a sectional view showing a modified example of the sensor structure of the second example corresponding to the detection positions shown in FIG. 12. FIG. 37 is a sketch drawing showing an example of a structure when the sensor structure of the modified example shown in FIG. 36 for the second example is applied to an interline transfer-system solid-state image sensing device (IT_CCD image sensor) 101. FIG. 38 is a sketch drawing showing an example of a structure when the sensor structure of the modified example shown in FIG. 36 for the second example is applied to a CMOS solid-state image sensing device (CMOS image sensor) 201.

In a spectral image sensor 10 having the sensor structure of the modified example of the second example, a p-type Si region 92 formed by diffusing III group impurities of Al, B, or the like, and a n-type Si region 97 formed by diffusing V group impurities of P, Sb, or the like are laminated on a p-type Si substrate 90. The p-type Si regions 92 have the same conductivity as the p-type Si substrate 90 and are connected to the p-type Si substrate 90.

The p-type Si regions 92 are independently provided at respective corresponding positions in the width direction (the X direction) and the depth direction (the Z direction) for each photodiode group 12. Also, n-type Si regions 97 are disposed between the boundaries of the respective p-type Si regions 92.

Like in the sensor structure of the second example, the p-type Si region 92 corresponding to each of the photodiode groups 12 is doped with n-type impurities at the detection positions in the width direction (the X direction) and the depth direction (the Z direction) to form n-type Si regions 93 for detecting blue light and green light, respectively, thereby forming the photoelectric conversion elements (photodiodes) 12B, 12G, and 12R for the respective colors.

Namely, in the spectral image sensor 10 having the structure of the modified example of the second example, a portion below the bottom (shown by a dotted line at $Z \neq 3$ μm in FIG. 28) in each of the p-type regions 92 in the n-type Si substrate 90 shown in FIG. 28 is changed from n-type to p-type, FIG. 28 showing the sensor structure of the second example.

In many cases, mass-production of image sensors is performed using a p-type substrate, and thus the structure of the modified example has the advantage that it can be manufactured by an ordinary process. In this case, when carriers are handled as electrons, an n-type region can be formed on a p-type substrate to form a pn junction, thereby achieving complete N depletion.

As a result, the photoelectric conversion elements 12B, 12G, and 12R are independently provided for each photodiode group 12. Like in the second example, the photoelectric conversion elements 12B, 12G, and 12R are arranged in the order of red, green, blue, green, red, . . . in the transverse direction (the X direction) on the light-receiving surface of the Si substrate 90 and within the Si substrate 90.

Among the photoelectric conversion elements 12B, 12G, and 12R, each of the photoelectric conversion elements 12R for red light is used in common to the adjacent photodiode groups 12. In this case, like in the first example, the pixel centers of the photoelectric conversion elements 12B and 12G for blue light and green light and the pixel centers of the photoelectric conversion elements 12R for red light are disposed on the centerlines CLO.

In this structure, each of the photodiode groups 12 detects blue light, green light, and red light independently. Like in the second example, each of the photodiode groups 12 substantially includes the photoelectric conversion elements 12B, 12G, and 12R for the respective colors.

The photoelectric conversion elements 12B, 12G, and 12R are arrayed in the order of blue, green, red, green, blue, green, red, green, blue, . . . in the transverse direction (the X direction) on the light-receiving surface of the Si substrate 90 and within the Si substrate 90.

Furthermore, a shown in FIGS. 37 and 38, the read gate 124 and the pixel amplifier 205 are provided for each of the photoelectric conversion elements 12B, 12G, and 12R which are arrayed in the order of blue, green, red, green, blue, green, red, green, blue, . . . in the transverse direction (the X direction) on the light-receiving surface of the Si substrate. As result, like in the second example, the pixels are also arrayed in the order of blue, green, red, green, blue, green, red, green, blue, . . . .

FIG. 39 is a drawing showing the outlines of a process (particularly, an impurity diffusion process) of a second example for manufacturing the spectral image sensor 10 having the structure of the modified example of the second example.

As shown in FIG. 39, n-type layers (n-type Si regions 97) are formed on the p-type Si substrate by diffusing V group impurities of P, Sb, or the like. Then, p-type layers (p-type Si region 92s) are formed by selectively diffusing III group impurities of Al, B, or the like through a mask comprising an oxide film. The p-type layers (p-type Si regions 92) are connected to the p-type Si substrate 90 with the same conductivity.

Consequently, pn junctions are independently formed between the n-type layers (n-type Si regions 92) or p-type Si regions 92 and the n-type Si regions 97, and the p-type layers (p-type Si regions 92) are used in common. The n-type layers (n-type Si regions 97) for detecting red light in the respective pixels are independent from each other. Namely, the photoelectric conversion element or the pn junction constituting the photoelectric conversion element of each pixel is entirely or partially isolated. Therefore, like blue light and green light, red light can be detected by reading charges produced between the n-type layer (n-type Si region 97) corresponding to red light and the common p-type layer (p-type Si region 92).

FIG. 40 is a sectional view showing a modified example of the sensor structure of the third example corresponding to the detection positions shown in FIG. 13. FIG. 41 is a sketch drawing showing an example of a structure when the sensor structure of the modified example shown in FIG. 40 corresponding to the third example is applied to an interline transfer-system solid-state image sensing device (IT_CCD image sensor) 101. FIG. 42 is a sketch drawing showing an example of a structure when the sensor structure of the modified example shown in FIG. 40 corresponding to the third example is applied to a CMOS solid-state image sensing device (CMOS image sensor) 201.

Like in the spectral image sensor having the sensor structure of the modified example of the second example, in the spectral image sensor 10 of the modified example of the third example, a p-type Si region 92 formed by diffusing III group impurities of Al, B, or the like, and a n-type Si region 97 formed by diffusing V group impurities of P, Sb, or the like are laminated on a p-type Si substrate 90. The p-type Si regions 92 have the same conductivity as the p-type Si substrate 90 and are connected to the p-type Si substrate 90. The p-type Si regions 92 are independently provided at respective corresponding positions in the width direction (the X direction) and the depth direction (the Z direction) in each photodiode group 12, and the n-type Si regions 97 are disposed between the boundaries of the respective p-type Si regions 92.

Like in the sensor structure of the third example, the p-type Si region 92 corresponding to each of the photodiode groups 12 is doped with n-type impurities at the detection positions in the width direction (the X direction) and the depth direction (the Z direction) to form n-type Si regions 94 for detecting green light, thereby forming the photoelectric conversion elements (photodiodes) 12G for green light.

Furthermore, each of the n-type Si regions 94 is doped with p-type impurities at the detection positions for blue light in the width direction (the X direction) and the depth direction (the Z direction) to form p-type Si regions 95, and each of the p-type Si regions 95 is doped with n-type impurities at the detection positions for blue light in the width direction (the X direction) and the depth direction (the Z direction) to form p-type Si regions 96, thereby forming the photoelectric conversion elements (photodiodes) 12B for the blue light.

Namely, in the spectral image sensor 10 having the structure of the modified example of the third example, a portion below the bottom (shown by a dotted line at Z≠3 μm in FIG. 32) in each of the p-type regions 92 in the n-type Si substrate 90 shown in FIG. 32 is changed from n-type to p-type, FIG. 32 showing the sensor structure of the third example.

As a result, the photoelectric conversion elements 12B, 12G, and 12R are independently provided for each photodiode group 12. Like in the second example, the photoelectric conversion elements 12B, 12G, and 12R are arranged in the order of red, green, blue, green, red, . . . in the transverse direction (the X direction) on the light-receiving surface of the Si substrate 90 and within the Si substrate 90.

Among the photoelectric conversion elements 12B, 12G, and 12R, each of the photoelectric conversion elements 12R for red light is used in common to the adjacent photodiode groups 12. In this case, the pixel centers of the photoelectric conversion elements 12B and 12G for blue light and green light and the pixel centers of the photoelectric conversion elements 12R for red light are disposed on the centerlines CL0.

Among the photoelectric conversion elements 12B, 12G, and 12R, each of the photoelectric conversion elements 12G for green light includes the common semiconductor layers (p-type region 95 and n-type Si region 94) on both sides. Therefore, as shown in FIGS. 41 and 42, the read gate 124 and the pixel amplifier 205 may be provided on one of the sides of each of the photoelectric conversion elements 12G.

The arrangement order of the pixels is the same as the color arrangement order of the read gates 124 and the pixel amplifiers 205. As a result, the color arrangement order is, for example, red, blue, green, red, blue, green, . . . , as shown in FIGS. 41 and 42, or red, green, blue, red, green, blue, . . . (not shown).

A drawing of a process (particularly, an impurity diffusion process) for manufacturing the spectral image sensor 10 having the structure of the modified example of the third example is omitted. However, the process for the modified example of the third example is the same as the process shown in FIG. 39 for the spectral image sensor 10 having the structure of the modified example of the second example. In particular, the same effect as in the modified example of the second example can be obtained except that the spectral image sensor has the same Baumkuchen-like_structure as in FIG. 35.

FIG. 43 is a sectional view showing another modified example of the sensor structures of the first to third examples. Herein, description is made of another modified example of the sensor structure of the second example corresponding to the deposition positions shown in FIG. 12. FIG. 44 is a sketch drawing showing an example of a structure when the sensor structure of the modified example shown in FIG. 43 corresponding to the second example is applied to an interline transfer-system solid-state image sensing device (IT_CCD image sensor) 101. FIG. 45 is a sketch drawing showing an example of a structure when the sensor structure of the modified example shown in FIG. 43 corresponding to the second example is applied to a CMOS solid-state image sensing device (CMOS image sensor) 201.

In each of the above-described structures, when the distance between the adjacent scatterers 3 is 1.5 μm, each of the photoelectric conversion elements 12B, 12G, and 12B occupies an area of about quarter of 1.5 μm. However, in order to further increase the area to increase the quantity of incident light, p-type and n-type patterns on the light-receiving surface may be formed in a comb-like structure. As a result, a detection area can be effectively increased.

For example, FIG. 43 shows the modified example of the sensor structure of the second example, in which p-type and n-type patterns on the light-receiving surface are formed in a comb structure so that one unit corresponds to three times the above-described period. Specifically, an independent p-type Si region 98 is produced for each unit on the n-type Si substrate 90. Also, the sensor structure of the second example is provided for three times the period in each of the p-type Si regions 98. Consequently, an image sensing device comprises pixels each having a length corresponding to three times the period of a diffraction grating 1.

As shown in FIGS. 44 and 45, a plurality of corresponding photoelectric conversion elements or pn junctions constituting the photoelectric conversion elements are formed in a comb form on the light-receiving surface so as to be electrically connected to each other.

In the example shown in the drawings, in the surface of a p-type Si region 92 constituting each of the photoelectric conversion elements 12R for red light, an n-type Si region 93 constituting each of the photoelectric conversion elements 12G for green light and an n-type Si region 93 constituting each of the photoelectric conversion elements 12B for blue light are arrayed in a comb form so that the comb teeth are arranged in a nest-like form. Furthermore, one read gage 124 and pixel amplifier 205 are provided for each comb for green light and blue light (for example, a roof panel the comb for electrically connecting the comb teeth), and one read gage 124 and pixel amplifier 205 are also provided for red light.

As seen from FIG. 44, unlike in the structure shown in FIG. 24, signal charges stored in the photoelectric conversion elements 12G and 12R among the photoelectric conversion elements 12B, 12G, and 12R of each photodiode group 12 are read out to the vertical transfer CCDs 122a on the same vertical column, but signal charges stored in the photoelectric conversion elements 12B are read out to the vertical transfer CCDs 122b for the photoelectric conversion elements 12G and 12R in the adjacent photodiode group 12.

As seen from FIG. 45, unlike in the structure shown in FIG. 26, signal charges stored in the photoelectric conversion elements 12G and 12R among the photoelectric conversion elements 12B, 12G, and 12R of each photodiode group 12 are read out to the vertical signal lines 219a on the same vertical column, but signal charges stored in the photoelectric conversion elements 12B are read out to the vertical signal lines 219b for the photoelectric conversion elements 12G and 12R in the adjacent photodiode group 12.

The number of the periods provided in one unit cell is not limited as long as in the resultant device, each photodiode group 12 bears at least two times the period of the diffraction grating 1. Although not shown in the drawings, the number of combs may be determined to correspond to two times the period or a number corresponding to at least three times the period, for example, 4 times.

In any one of the above-described sensor structures, the p-type semiconductor and the n-type semiconductor may be reversed. In addition, in FIGS. 21, 24, 26, 36, 40, and 37 to 42, an n-type substrate may be used for suppressing noise. In this case, the n-type substrate may be subjected to thermal diffusion treatment with a III group dopant such as Al, B, or the like to form a p-type region to a depth of 2 µm or more from the surface.

Furthermore, in any one of the structures shown in all drawings up to FIG. 45, a region to a depth of 0.1 µm or less from the uppermost surface of a semiconductor may be made p-type by thermal diffusion of a III group dopant such as Al, B, or the like, for suppressing a current leakage.

In each of the examples of the sensor structure corresponding to the simulation results described above with reference to FIG. 6, the period of the scatterers 3 (the distance between the centers of the adjacent scatterers 3 in the transverse direction) is 1.5 µm. However, it can easily be supposed that when the period is changed, the same effect can be obtained. Since the period corresponds to the array pitch (pixel pitch in a conventional structure) of the photodiode groups 12, the pixel pitch can be controlled by changing the period of the scatterers 3. When a high-density device is manufactured, the period may be decreased, while when a low-density device is manufactured, the period may be increased.

For example, even when the period of the scatterers 3 is 0.5 to 5 µm, the same effect can be obtained. The lower limit of 0.5 m is set on the basis of the diffraction limit of visible light. Namely, the diffraction limit of visible light is 0.3 µm or more. Since a period must be at least this value or more, the lower limit is set to 0.5 µm. However, the lower limit may be set to 0.3 µm without any problem.

On the other hand, the upper limit of 5 µm is determined on the basis of the order in which a diffraction phenomenon significantly occurs. Of course, the upper limit need not be particularly set because a diffraction phenomenon occurs with a period of 5 µm or more. From this viewpoint, the upper limit is preferably 5 µm or less with no problem.

The period is not necessarily specified, but it is preferably in a range of 1 to 2 µm, and more preferably in a range of 1.5 µm as described above. In this case, the lower limit of 1 µm is determined on the basis of the periodic structure of a general diffraction grating for visible light and the ease of manufacture of two photoelectric conversion elements in one period. On the other hand, the upper limit of 2 µm is determined on the basis of the fact that the ease of manufacture with a period of up to 2 µm was confirmed from the results of simulation.

Furthermore, in FIG. 6, the scatterers 3 and 7 may be formed to achieve the diffraction effect and converging property, and each of the scatterers 3 and 7 may be formed to a thickness of 0.01 µm or more. The lower limit of 0.01 m is determined on the basis of the minimum value with which light scattering and diffraction can be produced. Generally, a scatterer with a thickness of about ¹⁄₁₀ the wavelength of light produces light scattering and diffraction.

In view of the relation to the diffractive index of $SiO_2$ used as a base material, the thickness of the scatterers 3 is preferably 0.1 µm or more, and more preferably in a range of 0.2±0.05 µm. The lower limit of 0.1 µm is determined on the basis of a thickness with which scattering and diffraction effectively occur. The center value of 0.2 µm is determined on the basis of the fact that the simulation results show satisfactory spectral characteristics. The range of 0.05 µm is determined in view of variation in manufacture.

Furthermore, each of the scatterers 3 and 7 may have a width of 0.05 µm or more in the transverse direction in order to achieve an efficient function as the scatterer. The lower limit of 0.05 µm is determined on the basis of the minimum value with which light scattering and diffraction can be produced. In general, a scatterer with a width of about ¹⁄₁₀ the wavelength of light can produce light scattering and diffraction. Although the lower limit of the width in the transverse direction is desired to be 0.01 µm in view of matching with the thickness, the width depends on whether or not a width of 0.05 µm can be formed by a latest process. Therefore, the lower limit is set to 0.05 µm in view of the possibility of light scattering and diffraction and the minimum width attained by the process.

In particular, the width of the scatterers may be in a range of $0.05\ \mu m \leq d \leq 0.3\ \mu m$ (0.1−0.05/+0.2 µm). The center value of this range is determined to 0.1 µm because of the fact that the simulation results show satisfactory spectral characteristics. The range of −0.05 µm is defined in relation to the lower limit, and the upper limit is determined to +0.2 µm in view of amass production process (0.25 µm process) capable of easy manufacture.

The width (slit width Ds) of the openings 5a of the slits 5 is 0.1 µm or more and preferably 0.4 µm or less. The lower limit of 0.1 µm is determined on the basis of the minimum value with which diffraction effectively occurs. The upper limit of 0.4 µm is determined on the basis of the point that with a slit width of 0.4 µm or less, the efficiency of dispersion of visible light ($\lambda \leq 780$ nm), particularly red light at 640 nm and green light at 540 nm, is improved. However, dispersion occurs even with a slit width of 0.5 µm, and the slit width is preferably 0.4 µm or less.

In particular, in order to improve the spectral characteristics, the slit width Ds may be in a range of 0.3±0.1 µm. The center value is determined to 0.3 µm because of the fact that the simulation results show satisfactory spectral characteristics. The range of ±0.1 µm is determined on the basis of the conditions for effective diffraction of visible light according to the simulation results. For infrared light, the range of the slit width is increased.

The thickness of the slits 5 may be 0.01 μm or more in order to obtain the spectral effect. The lower limit of 0.01 μm is determined on the basis of the minimum value with which the slit function is exerted. Namely, the minimum thickness means a thickness with which the function, i.e., a light shielding effect, is exhibited as much as possible. In particular, in order to obtain the effective effect, the thickness may be in a range of 0.125±0.1 μm. The center value is determined to 0.125 μm because of the fact that the simulation results show satisfactory spectral characteristics. The lower limit of −0.1 μm of the range of +0.1 μm is determined because of the sufficient effect of shielding blue light, and the upper limit of +0.1 μm is determined from the viewpoint of ease of manufacture.

For example, FIG. 46 shows a variation example of a sensor structure in which the period of the scatterers 3 is 2.0 μm. The relation of wavelength dispersion to the refractive index and extinction coefficient of Si (silicon) used for the spectral image sensor 10 is the same as that shown in FIG. 7.

FIGS. 47 to 49 are diagrams each showing the computation simulation results for illustrating a spectral method for the visible light band, in which light of each wavelength component is incident on the light-receiving surface of the spectral image sensor having the structure shown in FIG. 46. In each of FIGS. 47 to 49, a horizontal dotted line at $Z \neq 1.9$ μm shows the interface (sensor surface) between the photodiode groups 12 and a silicon oxide film $SiO_2$. The simulation was conducted by photofield computation by the FDTD method.

FIG. 47 shows the results of simulation using blue light (wavelength 460 nm) as incident light. This diagram indicates that light intensity increases at positions of X=−3.0, −1.0, 1.0, and 3.0 μm in a region of $Z \neq 1.9$ to 2.3 μm (depth of about 0.4 μm from the surfaces of the photodiode groups 12), i.e., in the vicinity of the sensor surface.

FIG. 48 shows the results of simulation using green light (wavelength 540 nm) as incident light. This diagram indicates that light intensity increases at positions of X=−2.7, −1.8, −1.2, −0.3, 0.3, 1.2, 1.8, and 2.7 μm in a region of $Z \neq 1.9$ to 3.2 μm (depth of about 1.3 μm from the surfaces of the photodiode groups 12). Namely, with green light, light intensity increases not only on the sensor surface but also at a relatively deep position.

FIG. 49 shows the results of simulation using red light (wavelength 640 nm) as incident light. This diagram indicates that light intensity increases at positions of X=−3.0, −1.5, 0, 1.5, and 3.0 μm in a region of $Z \neq 1.9$ to 4.8 μm (depth of about 2.9 μm from the surfaces of the photodiode groups 12). In particular, the light density increases near Z=3.4 μm. Namely, with red light, light intensity increases not only on the sensor surface and at a relatively deep position but also at a deeper position.

Namely, even in the spectral image sensor shown in FIG. 46 in which the period of the scatterers is 2.0 μm, the blue light, green light, and red light contained in incident light L1 exhibit show the position dependence in the transverse direction (X direction) and in the depth direction according to wavelengths.

Therefore, like in the method shown in FIGS. 11 to 13, the maximum depth of pn junction may be set in a proper range in the Z direction for dispersing light and detecting each of the primary three colors, i.e., red, green, and red. Specifically, the maximum depth of a pn junction constituting the photoelectric conversion element 12B for blue light may be set in a depth range of 0.4 μm from the surfaces of the photodiode groups 12; the maximum depth of a pn junction constituting the photoelectric conversion element 12G for green light may be set in a depth range of 1.8 μm from the surfaces of the photodiode groups 12; and the maximum depth of a pn junction constituting the photoelectric conversion element 12R for red light may be set in a depth range of 2.9 μm from the surfaces of the photodiode groups 12. As a result, the detection efficiency of each color is increased.

The above description relates to the use of the scatterers 3 such as linear scatterers or rod-shape scatterers, i.e., relates to an array in which long openings 3a and long light-shielding portions 3b are alternately disposed. However, scatterers each having an enclosed opening may be used. By using scatterers having enclosed openings, the diffraction effect can be obtained not only in the one-dimensional direction (the above-described transverse direction) but also in the direction perpendicular to the transverse direction, i.e., the two-dimension direction.

The term "scatterers having enclosed openings" means scatterers having a structure in which a member for cutting off (shielding light) electromagnetic waves (for example, light) is provided not only in the transverse direction but also in the direction perpendicular to the transverse direction, the transverse direction corresponding to the charge transfer direction of the vertical transfer CCDs 122 in the CCD solid-state image sensing device 101 and the extension direction of the vertical signal lines 219 in the CMOS solid-state image sensing device 201, the member having an opening formed therein for transmitting electromagnetic waves (for example, light).

For example, scatterers each including a cutting-off member (light-shielding member) having a quadrate opening (square or rectangular opening) formed therein can be used. For example, long scatterers are arrayed with gaps therebetween in both the longitudinal and transverse directions so that quadrate (square or rectangular) openings are periodically arrayed in both the directions to form cube-type scatterers. In this case, the openings 5a of the slits 5 may be formed in a square or rectangular shape. Namely, the scatterers and slits having the same opening shape may be combined.

Alternatively, scatterers each including a cutting-off member (light-shielding member) having a circular opening (circular or elliptical opening) formed therein can be used. In this case, the openings 5a of the slits 5 may be formed in a circular shape. Namely, the scatterers and slits having the same opening shape may be combined.

The combination of the scatterers and slits is not limited to the combination of the scatterers and slits having the same opening shape. For example, quadrant openings and circular openings may be combined.

When the scatterers 3 having quadrant or circular openings and the slits 5 having quadrant or circular openings are used, the shape of the scatterers 7 provided between the slits 5 and the photodiode groups 12 may square, rectangular, or circular in spite of the shapes of the openings of the scatterers 3 and the slits 5 and combination thereof. When the scatterers 3 and the slits 5 having the same opening shape are combined, the scatterers 7 having the same shape are more preferably used for increasing the diffraction effect.

FIG. 50 is a sketch drawing showing an example of a structure when a sensor structure using the scatterers 3 having enclosed openings is applied to an interline transfer-system solid-state image sensing device (IT_CCD image sensor) 101. FIG. 51 is a sketch drawing showing an example of a structure when a sensor structure using the scatterers 3 having enclosed openings is applied to a CMOS solid-state image sensing device (CMOS image sensor) 201. The sensor structure in each of the cases may have the same sectional structure as that shown in FIG. 21, 28, 32, 36, or 40.

Even when the scatterers 3 having enclosed openings are used, the arrangement relation between the scatterers 3, the slits 5, and the scatterers 7 may be determined as described above with reference to FIG. 2. In this case, the same effect as described above can be obtained.

For example, the scatterers 3 each having an opening 3a with a predetermined shape (for example, a square, rectangular, or circular shape), and a light-shielding portion 3b surrounding the opening 3a are periodically disposed in the transverse direction (the X direction) on the incident light L1 side so as to be arrayed in parallel in a predetermined direction of the light-receiving surface. The light-shielding portions 3b correspond to the scatterers 3 each comprising a long light-shielding member for cutting off (shielding light) electromagnetic waves (for example, light).

Also, the slits 5 are provided between the scatterers 3 and the Si substrate 9 so that openings 5a with a predetermined shape (for example, a square, rectangular, or circular shape) are disposed near a portion where diffracted waves 2 converge. The period of the openings 5a (the distance between the adjacent openings 5a) of the slits 5 is the same as that of the openings 3a (the distance between the adjacent openings 3a) of the scatterers 3, and the scatterers 3 and the slits 5 are parallel to each other. In addition, the openings 5a of the slits 5 are substantially disposed on centerlines CLO (perpendicular to the photodiode groups 12) passing through the respective centers between the openings 3a of the adjacent scatterers 3.

Furthermore, the scatterers 7 with another predetermined shape (for example, a square, rectangular, or circular shape) are periodically provided in parallel between the slits 5 and the photodiode groups 12. The period of the scatterers 7 (the distance between the adjacent scatterers 7) is the same as that of the openings 3a (the distance between the adjacent openings 3a) of the scatterers 3 or that of the openings 5a (the distance between the adjacent openings 5a) of the slits 3. In addition, the scatterers 7 are substantially disposed on the centerlines CLO (perpendicular to the photodiode groups 12) passing through the centers of the openings 3a of the respective scatterers 3, i.e., passing through the centers between the light-shielding portions 3b of the adjacent scatterers 3.

For example, when the scatterers 3 (cube-type scatterers 3) having the quadrant openings 3a and the slits 5 having the square openings 5a are used in the CCD structure shown in FIG. 50 or the CMOS structure shown in FIG. 51, the scatterers 7 provided between the slits 5 and the photodiode groups 12 (photoelectric conversion elements 12B, 12G, and 12R) have a square, rectangular, or circular shape.

Each of the photodiode groups 12 (photoelectric conversion elements 12B, 12G, and 12R) has such a shape as shown in the drawings. Namely, when the scatterers with an enclosed shape are used, the diffraction effect can be obtain in a two-dimensional direction, and thus blue light converges on a vertical light passing through the center of each opening 5a, green light is dispersed in the periphery thereof, and red light is dispersed in the periphery of the portion for green light.

Therefore, the photoelectric conversion element 12B for detecting blue light is disposed on the vertical line passing through the center of each opening 5a, the photoelectric conversion element 12G for detecting green light is disposed in the periphery of the portion for blue light, and the photoelectric conversion element 12R for detecting red light is disposed in the periphery of the portion for green light.

For example, as shown in FIGS. 50 and 51, an n-type Si region 91 (or an n-type Si region 93) constituting the photoelectric conversion element 12B for blue light is disposed on the vertical line passing through each opening 5a, an n-type Si region 91 constituting the photoelectric conversion element 12G for detecting green light is disposed in the periphery of the region for blue light with a p-type Si region 92 provided therebetween, and an an-type Si region 91 constituting the photoelectric conversion element 12R for detecting red light is disposed in the periphery of the region for green light with a p-type Si region 92 provided therebetween.

However, as shown in the drawings, an empty space must be provided in each photoelectric conversion element 12G for green light, for providing a read gate 124G and a pixel amplification 205G for the photoelectric conversion element 12B for blue light. Therefore, as shown in the drawings, a portion of the four sides of the n-type Si region 91 constituting each photoelectric conversion element 12G is preferably hollowed out (for example, a U-like shape).

Furthermore, for the photoelectric conversion elements 12R for red light, the read gates 124B and 124G and cell amplifiers 205B and 205G for the photoelectric conversion elements 12B and 12G for blue light and green light, respectively, must be made independent, and the adjacent photoelectric conversion elements 12R for red light must be also made independent of each other. Therefore, a portion of the four sides of the n-type Si region 91 constituting each photoelectric conversion element 12R is preferably hollowed out.

However, the hollowed portion of the n-type Si region 91 constituting each photoelectric conversion element 12R for red light must be made larger than that of the n-type Si region 91 constituting each photoelectric conversion element 12G for green light. Therefore, a portion of the four sides of the n-type Si region 91 constituting each photoelectric conversion element 12R for red light is preferably hollowed out to form a L-like shape as shown in the drawings or an I-like shape (not shown).

The above-describe simulation was performed with vertical incident light. However, when the spectral image sensor 10 using the diffraction grating is used as an image sensing device, an image is formed on the surface of the image sensing device through an optical system comprising a lens and diaphragm. Therefore, consideration must be given to oblique incident light.

FIG. 52 is a drawing illustrating the influence of oblique incidence and a correction method therefor. In FIG. 52, an image of an object 910 is led to the spectral image sensor 10 through a lens 920 and a diaphragm 930. In this case, the spectral image sensor 10 is disposed on an imaging area M, but light passing through the vicinity of the diaphragm 930 is incident at an angle θ from the vertical direction.

As shown in FIG. 52, the angle θ can be possibly divided into two angles, i.e., an angle β produced by a deviation of the detection position of the spectral image sensor 10 from the center, and an angle α produced by a deviation of light passing through the diaphragm 930 from the center. The angle θ is determined by a total of both angles (angles α and β).

The angle α is expressed by equation (1) wherein D represents the aperture of the diaphragm 930.

Equation 1

$$\alpha = \mathrm{ArcTan}(D/(2*y)) \tag{1}$$

On the other hand, as shown in FIG. 52, the angle β is determined by a relation between the distance x between the detection position and the center and the distance y between the lens 920 and the center in the light-receiving surface of the spectral image sensor (photodiode groups 12) according to the following equation (2):

Equation 2

$$\beta = \text{ArcTan}(x/y) \qquad (2)$$

Although only one lens 920 is shown in FIG. 52, a plurality of lenses may be actually provided. In this case, the distance y may be a distance from the lens closest to the spectral image sensor 10.

In this case, the influence of the angle β can be removed by correcting the relation between the scatterers 3, the slits 5, the scatterers 7, and the detection positions for the respective colors in the photodiode groups 12 (the positional relation between the photoelectric conversion elements 12R, 12G, and 12B). When the influence of the angle β is corrected, the angle α produced by a deviation of light passing through the diaphragm 930 becomes equal to the angle θ.

FIG. 53 is a drawing illustrating the correction method for angle θ for illustrating a method for correcting the relation between the detection positions. The positional relation may be shifted by a length corresponding to the angel determined according to equation (2), as shown in FIG. 53.

Specifically, with respect to the positional relation of the center b of the light-shielding portion 5b of each slit 5 to the corresponding scatterer 3 disposed on the incident light L1 side, as shown in FIG. 53, the center b may be first shifted to position CL2 by a length corresponding to the angle β from the original center position CL1 on the assumption that the distance between the centers of the scatterer 3 and the slit 5 is L1. Since the angle β is generally small and Sin β≠β, a shift amount Δ1 may be made equal to the product of the distance L1 and the angle β.

The central position CL3 of each scatterer 7 is generally disposed on the central position CL4 of each opening 5a, but the central position CL3 may be preferably shifted by a length corresponding to the angle β from the central position CL4 of each opening 5a, as shown in FIG. 53. Since the angle β is generally small and Sin β≠β, a shift amount Δ2 may be made equal to the product of the distance L2 and the angle β on the assumption that the distance L2 is the distance between the center of the slit 5 and the scatterer 7.

Furthermore, the photodiode groups 12 are generally disposed so that the central position CL4 of each opening 5a and the central positions CL3 and CL5 of each scatterer 7 and each photoelectric conversion element 12B for blue light are aligned in the vertical direction (the transverse direction of the drawing). However, as shown in FIG. 52, the photodiode groups 12 may be more preferably shifted as a whole so that the central position CL5 of each photoelectric conversion element 12B for blue light is shifted by a length corresponding to the angle β from the central portion CL4 of the corresponding opening 5a (or corresponding to the angle β from the central portion CL3 of the corresponding scatterer 7).

As a result, the central positions VL4, CL3, and CL5 of the opening 5a, the scatterer 7, and the photoelectric conversion element 12B for blue light, respectively, are disposed on a segment LO of the angle β with respect to the centerline CLO (the center between the adjacent scatterers 3).

Since the angle β is generally small and Sin β≠β, the shift amount Δ3 of each photodiode group 12 from the central position CL3 of the corresponding scatterer 7 may be made equal to the product of the distance L3 and the angle β on the assumption that the distance L3 is the distance between the scatterer 7 and the light-receiving surface of the photodiode group 12. Also, the shift amount Δ4 of each photodiode group 12 from the central position CL4 of the corresponding opening 5a may be made equal to the product of the distance (L2+L3) and the angle β on the assumption that the distance (L2+L3) is the distance between the opening 5a and the light-receiving surface of the photodiode group 12.

Namely, the scatterers 3, the slits 5, the scatterers 7, and the photodiode groups 12 may be shifted as a whole according to the angle β. Each of the shift amounts increases as the distance between the photodiode group 12 and the scatterers 3 or the like increases.

Although, in the above-described example, the three types of shift operations are simultaneously made, these shift operations may be independently made or any desired two of the shift operations may be simultaneously made. In this case, the same effect can be obtained.

Even if correction is made for the angle component β from the vertical direction in which light incident to the photodiode groups 12 in the spectral image sensor 10, the angle component α still remains. In an ordinary optical system, the angle α is frequently in a range of ±20 degrees from the vertical direction. Therefore, simulation was performed with light incident at each of angles of 10°, 15°, and 18° from the vertical direction in air.

FIGS. 54 to 62 are diagrams showing the results of simulation using oblique incident light. FIGS. 54 to 56 show the results obtained using blue light (wavelength 460 nm), green light (wavelength 540 nm), and red light (wavelength 640 nm), respectively, each of which is 10° obliquely incident. FIGS. 57 to 59 show the results obtained using blue light (wavelength 460 nm), green light (wavelength 540 nm), and red light (wavelength 640 nm), respectively, each of which is 15° obliquely incident. FIGS. 60 to 62 shows the results obtained using blue light (wavelength 460 nm), green light (wavelength 540 nm), and red light (wavelength 640 nm), respectively, each of which is 18° obliquely incident.

In each of the diagrams, a portion with electric field intensity of over "1" is shown in white. However, assuming that the refractive index of silicon oxide film $SiO_2$ is 1.4, the angles of 10°, 15°, and 18° are 7°, 10.6°, and 13°, respectively, in a $SiO_2$ film according to the Snell's law.

The results shown in the diagrams indicate that with an incidence angle of 10°, light can be dispersed into the three primary colors and detected at substantially determined positions at the detection positions shown in FIG. 11, 12, or 13. It is also found that with an incidence angle of 15°, detection of blue light is significantly decreased, but the three primary colors can be detected. It is further found that with an incidence angle of 18°, blue light can be hardly detected, but green light and red light can be detected at the predetermined positions.

It is thus found from the results that the effect can be obtained with an incident angle up to 18°, preferably 15° or less, and more preferably 10° or less. This is true for any case regardless of whether or not correction is made for the angle β.

Namely, when the spectral image sensor 10 using the diffraction grating is formed, the angle β from the vertical direction is 18° or less, preferably 15° or less, and more preferably 10° or less in the optical system comprising a lens and a diaphragm. In the structure of the spectral image sensor 10, correction is more preferably made for the angle component β from the vertical direction. In this case, the angle β (=the angle α produced by a deviation of light passing through the diaphragm from the center after correction) from the vertical direction is 18° or less, preferably 15° or less, and more preferably 10° or less in the optical system comprising a lens and a diaphragm.

Although dispersion of the visible light band into the wavelength components of the three primary colors B, G, and R has been described above, in fact, photoelectric conversion elements for respective colors in each photodiode group 12 may be arrayed with a smaller pitch in the transverse direction so as to permit finer dispersion, i.e., detection of four or more colors. In this case, correct color information of an image, which could not be taken by a conventional primary color system, can be detected. In other words, light can be dispersed into four or more colors and detected, and more correct information can be obtained by increasing the number of spectral color components other than red, green, and blue.

In a primary color imaging system, colors outside the triangle formed by the origins of the three primary colors in a chromaticity diagram cannot be detected. However, a photoelectric conversion element for detecting a fourth color (for more colors) component outside the triangle may be disposed in each photodiode group 12 so as to permit finer dispersion of colors. As a result, a correct color outside the triangle can be detected. Therefore, when a signal of the fourth color is reproduced on the display side, color reproduction is also correctly performed. Furthermore, a multicolor display system for four or more colors may be provided on the display side so that a correct image can be obtained in a wide color reproduction range in the chromaticity diagram.

For example, a photoelectric conversion element for detecting emerald as the fourth color may be disposed in addition to the photoelectric conversion elements for red (R), green (G), and blue (B) so as to permit dispersion into the four colors. The wavelength of emerald positions between blue light and green light, and an emerald spectral is detected between blue light and green light. Therefore, a photoelectric conversion element 12E for detecting emerald may be disposed between the photoelectric conversion element 12B for detecting blue light and the photoelectric conversion element 12g for detecting green light.

In this case, fourth color pixels E are added to color pixels, for increasing color reproducibility, and the entire operation is the same as described above to exhibit the same effect as described above. For the four colors, more correct image can be obtained. When an image detected by the sensor can be converted to signals and then reproduced on the display side, color reproduction is also correctly performed. Furthermore, a multicolor display system for four or more colors may be provided on the display side so that a correct image can be obtained in a wide color reproduction range in the chromaticity diagram.

Although detail description of color signal processing is omitted, an image processing processor is provided behind the output amplifier 28, for performing matrix operation close to human eyes to create the RGB three colors from pixel signals of each color of an image taken in the four colors. When the emerald (E) can be detected in addition to red (R), green (G), and blue (B), a difference in color reproduction can be decreased as compared with detection of the three colors R, G, and B. For example, reproducibility of blue-green color and red color can be improved.

Furthermore, use of the above-described technique is not necessarily limited to use for dispersion of the visible light band into a plurality of wavelength components. When the above-described structure is optimized, dispersion and detection of infrared light or ultraviolet light can be made without using a subtractive filter. In this case, infrared light or ultraviolet light can be detected at the same time as, for example, visible light to form an image. Also, for the visible light to be detected at the same time, a monochrome image may be taken without dispersion, or the visible light band may be dispersed into the three primary color components as described above to detect a color image. In this case, image information of infrared light or ultraviolet light, which cannot be detected with the eyes, can be obtained in correspondence with a visible light image (monochrome image or color image) which can be seen with the eyes. As a result, the device can be applied to a key device of a new information system such as a dark-field camera, an optical synthesis monitoring camera, or the like.

FIG. 63 is a diagram illustrating another embodiment of a spectral image sensor in which a diffraction grating is disposed on the incident light side of a Si substrate 9 (corresponding to the photodiode groups 12 of the spectral image sensor 11), and showing a sectional structure of the spectral image sensor 11 for dispersing into infrared light and visible light. A Si material is shown by an hatched portion, and oxide film $SiO_2$ is shown by a blank portion. In the spectral image sensor 11 of this embodiment, as a whole, the oxide film $SiO_2$ is formed on the Si substrate 9.

Unlike the spectral image sensor for dispersing the visible light band into a plurality of (in the above-descried embodiment, three colors of blue, green, and red) of wavelength components, the spectral image sensor for dispersing into the two wavelength components including infrared light and visible light according to this embodiment is characterized in that scatterers 7 are not provided between slits 5 and the photodiode groups 12.

As described above with reference to FIGS. 4 and 5, when the scatterers 7 are not provided, green light and glue light are mixed. Therefore, in order to detect visible light, a single photoelectric conversion element for detecting visible light is disposed in addition to a photoelectric conversion element for detecting infrared light in each photodiode group 12, so that the visible light band is not dispersed to obtain a monochrome image.

Long scatterers 3 are periodically disposed in parallel in the transverse direction (the X direction) on the incidence surface side of the Si substrate 9 (corresponding to the photodiode groups 12). Each of the scatterers 3 has a thickness of 0.15 μm, and the period of the scatterers 3, i.e., the distance between the adjacent scatterers 3 in the transverse direction (the X direction) is 2.0 μm.

In the spectral image sensor 11, slits 5 each having a thickness of 0.1 μm and a slit width Ds of 0.80 μm are provided at a depth of 2.50 μm in the depth direction (the Z direction) from the surface (the side of the scatterers 3 on which incident light L1 is incident), i.e., between the scatterers 3 and the Si substrate (corresponding to the photodiode groups 12). As a result, the light-shielding portions 5b for cutting off (shielding light) electromagnetic waves (for example, light) have a width of 1.20 μm, each opening portion 5a being surrounded by the light-shielding portion 5b.

The slits 5 are periodically disposed so that the openings 5a each having the slit width Ds are arranged in parallel in the transverse direction (the X direction), and the openings 5a are positioned on the respective centerlines CLO (perpendicular to the surfaces of the Si substrate and the photodiode groups 12) passing through the respective centers between the scatterers 3. The slits 5 are disposed in parallel with the scatterers 3. Namely, the period of the openings 5a of the slits 5 (the distance between the adjacent openings 5a) is the same as the period of the scatterers 3 (the distance between the adjacent scatterers 3) and the phase thereof.

FIG. 64 is a table showing the relation of wavelength dispersion to the refractive index and extinction coefficient of Si (silicon) used in the spectral image sensor 11 for detecting infrared light. In this table, 460 nm, 540 nm, and 640 nm are used as typical wavelengths of blue light, green light, and red light, respectively. The values of visible light (blue, green, and red) shown in this table are different from those shown in FIG. 7 because of differences in Si production conditions.

Since the refractive index of oxide film $SiO_2$ is very low, the refractive index and extinction coefficient of SiO2 are 1.4 and 0, respectively, for any wavelength.

Each of FIGS. 65 to 69 is a diagram of computation simulation (photofield computation by the FDTD method) for illustrating a spectral method for infrared light and visible light using each wavelength component incident on the light-receiving surface (lower side of the drawing) of the spectral image sensor 11 having the structure shown in FIG. 63. In each of FIGS. 65 to 69, a horizontal broken line at Z=2.5 μm shows the interface (sensor surface) between the photodiode groups 12 and the silicon oxide film SiO2.

FIGS. 65, 66, and 67 show the results of computation simulation using blue light (wavelength 460 nm), green light (wavelength 540 nm), and red light (wavelength 640 nm), respectively, as incident light. These diagrams indicate that light intensity of visible light (any one of blue light, green light, and red light) increases in a region of Z=2.5 to 3.5 μm (to a depth of 1.0 μm from the surfaces of the photodiode groups 12) at positions of X=−3.0, −1.0, 1.0, and 3.0 μm. Namely, the light intensity increases in a region from the vicinity of the sensor surface to a slightly deep position.

FIGS. 68 and 69 show the results of computation simulation using infrared light (wavelength 780 nm) and infrared light (wavelength 880 nm), respectively, as incident light. The wavelength of 780 nm lies near the boundary between visible light and infrared light. FIG. 69 indicates that light intensity of infrared light (wavelength 880 nm) increases in a region of Z=2.5 to 4.5 μm (to a depth of 2.0 μm from the surfaces of the photodiode groups 12) at positions of X=−2.0, 0, and 2.0 μm. Namely, the light intensity increases in a region from the vicinity of the sensor surface to a very deep position.

In other words, with respect to the relation between the visible light (blue light, green light, and red light) and infrared light contained in the incident light L1, the light incident to the spectral image sensor 11 shown in FIG. 63 exhibits the position dependence both in the transverse direction (the X direction) and the depth direction according to wavelengths.

Also, FIG. 68 showing the wavelength of 780 nm near the boundary between visible light and infrared light indicates that light intensity increases in a region of Z=2.5 to 4.5 μm (to a depth of 2.0 μm from the surfaces of the photodiode groups 12) at positions of X=−3.0, −2.0, −1.0, 0, 1.0, 2.0, and 3.0 μm. Namely, the light intensity increases in a region from the vicinity of the sensor surface to a very deep position. FIG. 68 shows the properties shown in FIGS. 65 to 67 of visible light (blue light, green light, and red light) and the properties shown in FIG. 69 of infrared light (wavelength 880 nm).

When the scatterers 7 and the slits 5 are disposed between the photodiode groups 12 and the light-receiving surface, the efficiency of dispersion into green light and blue light can be improved (refer to the description of FIGS. 4 and 5). Therefore, in addition to the photoelectric conversion element for detecting infrared light, photoelectric conversion elements for detecting blue light, green light, and red light, respectively, in the visible light band are disposed in each photodiode group 12, so that an infrared image and a color image can be obtained.

FIG. 70 shows a sectional structure of a spectral image sensor 11 for dispersing into infrared light and the three primary color components in the visible light band. In FIG. 70, a Si material is shown by a hatched portion, and oxide film $SiO_2$ is shown by a blank portion. In the spectral image sensor 11 of this embodiment, as a whole, the oxide film $SiO_2$ is formed on the Si substrate 9.

Each of FIGS. 71 to 73 is a diagram of computation simulation (photofield computation by the FDTD method) for illustrating a spectral method for infrared light and visible light (the three primary color components) using each wavelength component incident to the light-receiving surface (lower side of the drawing) of the spectral image sensor 11 having the structure shown in FIG. 70. In each of FIGS. 71 to 73, a horizontal broken line at Z≠3.8 μm shows the interface (sensor surface) between the photodiode groups 12 and the silicon oxide film SiO2.

FIGS. 71, 72, and 73 show the results of computation simulation using infrared light (wavelength 880 nm), blue light (wavelength 460 nm), and green light (wavelength 540 nm), respectively, as incident light.

FIG. 72 indicates that light intensity of blue light (wavelength 460 nm) increases in a region of Z≠2.5 to 3.0 μm (to a depth of 0.5 μm from the surfaces of the photodiode groups 12) at positions of X=−3.0, −1.0, 1.0, and 3.0 μm.

FIG. 73 indicates that light intensity of green light (wavelength 540 nm) increases in a region of Z≠2.5 to 3.2 μm (to a depth of 0.7 μm from the surfaces of the photodiode groups 12) at positions of X=−3.0, −1.0, 1.0, and 3.0 μm.

Although simulation with red light (wavelength 640 nm) is not shown, the performance of dispersion into infrared light and red light is degraded by the scatterers 7. From this viewpoint, in order to complete dispersion into visible light (red, green, and blue) and infrared light, it is thought to be optimum to avoid the scatterers 7.

However, as seen from FIGS. 72 and 73, the central position of blue light in the X direction is the same at that of green light, but green light becomes wider in the X direction and has high intensity to a deeper position from the surface.

Namely, in any of the cases, the position dependence is exhibited in both in the width direction (the X direction) and the depth direction according to wavelengths. If the scatterers 7 are provided, dispersion into blue light and green light is not necessarily satisfactorily performed. However, over the entire structure, the effect of permitting dispersion into blue light and green light can be obtained to some extent.

In the spectral image sensor applicable to infrared light, the scatterers 7 may be disposed between the sensor surface and the slits 5. In this case, when the maximum depth of pn junctions is set in a proper range in the Z direction for detecting each of the primary colors, red, green, and blue, as in the manner shown in FIGS. 11 to 13, infrared light and visible light can be simply separated, and the visible light band can be separated into the three primary color components of red, green, and blue, thereby increasing the detection efficiency of each color. Therefore, dispersion of the visible light band into red, green, and blue, and desperation into visible light and infrared light can be performed.

However, the performance of dispersion into red, green, and blue is lower than that of dispersion of the visible light band into the three primary colors, red, green, and blue. However, the effect of reproducing a color image, not a completely monochrome image, can be obtained even by slight dispersion into the three primary colors, red, green, and blue.

Furthermore, when the above-described structure is optimized, dispersion and detection of infrared light and visible light or ultraviolet light can be made without using a subtractive filter. In this case, infrared light or ultraviolet light can be detected at the same time as, for example, visible light to form an image. Also, image information of infrared light and ultraviolet light, which cannot be detected with the eyes, can be obtained in correspondence with a visible light image (monochrome image or color image) which can be seen with the eyes. As a result, the device can be applied to a key device of a new information system.

Although not shown in the drawings, a color separation filter for separating visible light into a plurality of wavelength components may be disposed instead of the scatterers 7 disposed between the sensor surface and the slits 5. For example, subtractive filters (color separation filters) for red, green, and blue for separating visible light into wavelength components of the three primary colors blue, green, and red, respectively, are disposed in front of the photoelectric conversion elements (photodetectors) for the three primary colors, respectively, by using the same method as in a conventional structure so that the visible light band can be dispersed into the three primary colors as in a conventional structure. It is possible to utilize the property that it is optimum to avoid the scatterers 7 in order to completely disperse into visible light (red, green, and blue) and infrared light.

In this case, a subtractive filter may be disposed in front of the photoelectric conversion element for infrared light. When infrared light leaks and incident on the photoelectric conversion elements for visible light, a cut filter for weakly cutting infrared light may be disposed. For example, a cut filter for cutting infrared light by 50% or less may be disposed. In this case, even when visible light is cut to a level with substantially no problem, infrared light converges in the photoelectric conversion elements for infrared light, thereby achieving sufficient sensitivity.

FIG. 74 is a diagram illustrating a proper example of detection positions for dispersion into visible light and infrared light on the basis of the above-described simulation results.

For example, in a spectral image sensor capable of detecting light in the areas in the example shown in FIG. 74, dispersion into visible light comprising the three primary colors, red, green, and blue, and infrared light (wavelength 880 nm) and detection thereof can be performed.

Namely, visible light (blue light at a wavelength of 460 nm, green light at a wavelength of 540 nm, and red light at a wavelength of 640 nm) may be detected at positions of X=−3.0, −1.0, 1.0, and 3.0 μm in a region of Z=2.5 to 3.5 μm (to a depth of 1.0 μm from the surfaces of the photodiode groups 12), and infrared light (wavelength 880 nm) may be detected at positions of X=−2.0, 0, and 2.0 μm in a region of Z=2.5 to 4.5 μm (to a depth of 2.0 μm from the surfaces of the photodiode groups 12).

Namely, the maximum depths of pn junctions may be set in the respective ranges in the Z direction. Specifically, the maximum depth of a pn junction constituting each photoelectric conversion element 12W for visible light may be set in a depth range from 1.0 μm from the surface of the photodiode groups 12, and the maximum depth of a pn junction constituting each photoelectric conversion element 121R for infrared light may be set in a depth range from 2.0 μm from the surface of the photodiode groups 12. As a result, the detection efficiency of each wavelength component can be increased.

In order to prevent color mixing between the photodiode groups 12, the width of each photodiode group 12 in the transverse direction (the X direction) may be smaller than the distance of 2.0 μm between the scatterers 3 in the transverse direction (the X direction). Also, the width of a pn junction constituting each of the photoelectric conversion elements for the respective wavelengths (visible light and infrared light) provided in each photodiode group 12 is preferably 1.0 μm or less and more preferably 0.3 μm or less in the transverse direction (the X direction). These values facilitate mass production in a semiconductor process.

The width of 0.5 μm of a pn junction is determined on the basis of the maximum value of 2.0 μm/2=1.0 μm for dispersion into infrared light and visible light. The width of 0.3 μm is determined as a value permitting mass production by a current 0.25 μm process. When only the visible light band is dispersed, the width may be generally set to 0.5 (only the visible light band) to 1.0 (for infrared light) μm or less in view of the dimension of 0.5 μm.

FIG. 75 is a drawing of a sectional structure of an example of a sensor structure for infrared light corresponding to the detection positions shown in FIG. 74. In the spectral image sensor 11, a p-type Si substrate 90 is doped with n-type impurities at each of detection positions for the visible light (blue light, green light, and red light) and infrared light, respectively, in each photodiode group 12 in the transverse direction (the X direction) and the depth direction (the Z direction).

As a result, n-type Si regions 91 are formed for detecting the visible light and infrared light, respectively, to form photoelectric conversion elements (photodiode) 12W and 121R for the respective wavelength components. The photoelectric conversion elements (photodiode) 12W and 121R are disposed in the order of visible light, infrared light, visible light, infrared light, . . . , in the light-receiving surface of the Si substrate 90 and in the Si substrate 90.

In this example, light is absorbed by a depletion layer near the interface between the n-type and p-type Si semiconductors to produce electrons and holes, and the electrons and holes move to the n-type and p-type semiconductors, respectively, due to an electric field in the depletion layer to store signal electric charge. The signal electric charge is read from each of the photoelectric conversion elements 12W and 121R and detected as an electric signal.

Namely, in each of the photodiode groups 12, detection regions for detecting visible light and infrared light, respectively, are provided at the detection positions in the width direction (the X direction) and the depth direction (the Z direction). In such a structure, the quantity of light incident on a unit area is increased because an infrared cut filter used for usual image sensors need not be used (or the cutting rate can be decreased). Therefore, the efficiency of conversion of light to electric signals is increased to obtain high sensitivity characteristics for visible light. Furthermore, an infrared cut filter is not required to decrease the cost.

Each of the photodiode groups 12 has a structure for independently detecting visible light (blue light, green light, and red light) and infrared light, and the unit of wavelength dispersion (wavelength dispersion unit) can be realized by each photodiode group 12 constituting one pixel. In other words, the photodiode group 12 substantially has a structure comprising the photoelectric conversion elements for respective wavelengths, and thus the photodiode group 12 for each pixel need not be prepared for each wavelength.

Therefore, one photodiode group 12 may be provided for one wavelength dispersion unit, and a monochrome image with visible light and an infrared image with an infrared light can be simultaneously taken. Therefore, an infrared luminous point is previously prepared so that an infrared luminous point in the visible image can be detected by tracing the previously prepared infrared luminous point.

When scatterers 7 are disposed between the slits 5 and the light-receiving surfaces of the photodiode groups 12, instead of the photoelectric conversion elements 12W for detecting the visible light band, photoelectric conversion elements 12B, 12G, and 12R for receiving blue light, green light, and red light, respectively, in the visible light band may be disposed in addition to the photoelectric conversion elements 121R for detecting infrared light in each photodiode group 12. In this case, a single image sensor is capable of simultaneously taking a correct color image with visible light and an image with infrared light.

Also, without visible light, for example, in the night, a clear image can be taken by irradiation with infrared light, and thus the device can also be used as a security image sensor. In this case, image information of infrared light, which cannot be detected with the eyes, can be obtained in correspondence with a visible light image which can be seen with the eyes. As a result, the device can be applied to a key device of a new information system, thereby widening the application range.

FIG. 76 is a sketch drawing showing an example of a structure when the sensor structure for infrared light shown in FIG. 75 is applied to an inter-line transfer-system CCD solid-state image sensing device (IT_CCD image sensor). FIG. 77 is a drawing showing a circuit for application to an inter-line transfer-system CCD solid-state image sensing device.

Although detailed description is omitted, the basic structure is the same as that shown in FIGS. 24 and 25, in which visible light (blue light, green light, and red light) and infrared light are independently detected by one photodiode group 12. Each photodiode group 12 substantially comprises photoelectric conversion elements 12W and 121R for the respective wavelengths.

FIG. 78 is a sketch drawing showing an example of a structure when the sensor structure for infrared light shown in FIG. 75 is applied to a CMOS solid-state image sensing device (CMOS image sensor). FIG. 79 is a drawing showing a circuit for application to a CMOS solid-state image sensing device.

Although detailed description is omitted, the basic structure is the same as that shown in FIGS. 26 and 27, in which visible light (blue light, green light, and red light) and infrared light are independently detected by one photodiode group 12. Each photodiode group 12 substantially comprises photoelectric conversion elements 12W and 121R for the respective wavelengths.

FIG. 80 is a drawing of a sectional structure of an example of a sensor structure of a second example corresponding to the detection positions for infrared light shown in FIG. 74. FIG. 81 is a sketch drawing showing an example of a structure when the sensor structure of the second example shown in FIG. 80 is applied to an inter-line transfer-system CCD solid-state image sensing device (IT_CCD image sensor) 111. FIG. 82 is a sketch drawing showing an example of a structure when the sensor structure of the second example shown in FIG. 80 is applied a CMOS solid-state image sensing device (CMOS image sensor) 211.

In the spectral image sensor 11 for infrared light of the second example, an n-type Si substrate 90 is doped with p-type impurities at each of detection positions in each photodiode group 12 in the transverse direction (the X direction) and the depth direction (the Z direction) to form independent p-type Si regions 92. Each of the p-type Si regions 92 is doped with n-type impurities at each of detection positions for visible light in each photodiode group 12 in the transverse direction (the X direction) and the depth direction (the Z direction) to form independent n-type Si regions 94 for detecting visible light. As a result, the photoelectric conversion elements (photodiodes) 12W and 121R for respective wavelengths are provided.

Namely, the spectral image sensor for infrared light of the second example has the same structure as the spectral image sensor of the third example of dispersion of the visible light band into the primary color components. In other words, the p-type regions 92 and the n-type regions 94 are alternately laminated in a curved shape to form a Baumkuchen-like structure.

In the spectral image sensor 11 having the structure of the second example, each of the photodiode groups 12 detects visible light by charges which are generated between layers of the photoelectric conversion element 12W comprising a n-type layer (n-type Si region 93) and a corresponding common p-type layer (p-type Si region 92) in each pixel. The infrared light is detected by charges which are generated between layers of the n-type Si substrate 90 and the photoelectric conversion element 121R corresponding to each pixel, the photoelectric conversion element 12R comprising a p-type layer (p-type Si region 92).

As a result, each photodiode group 12 comprises independent photoelectric conversion elements 12W and 121R. The photoelectric conversion elements 12W and 121R are disposed in the order of infrared light, visible light, infrared light, visible light, . . . in the transverse direction (the X-direction) in the light-receiving surface of the Si substrate 90 ad in the Si substrate 90.

Although the outlines of the process for manufacturing the spectral image sensor 11 for infrared light of the second example are not shown, the manufacturing process is the same as that for the spectral image sensor of the third example shown in FIG. 35 for dispersion of the visible light band into the primary color components, and the same effect can be achieved. When the manufacturing process is stopped at the step for producing the n-type Si regions 94, the spectral image sensor 11 for infrared light of the second example can be manufactured.

FIG. 83 is a drawing of a sectional structure of an example of a sensor structure of a third example corresponding to the detection positions infrared light shown in FIG. 74. FIG. 84 is a sketch drawing showing an example of a structure when the sensor structure of the third example shown in FIG. 83 is applied to an inter-line transfer-system CCD solid-state image sensing device (IT_CCD image sensor) 111. FIG. 85 is a sketch drawing showing an example of a structure when the sensor structure of the third example shown in FIG. 83 is applied a CMOS solid-state image sensing device (CMOS image sensor) 211.

In the spectral image sensor 11 for infrared light of the third example, a p-type Si region 92 formed by diffusing III group impurities of Al, B, or the like, and an n-type Si region 97 formed by diffusing V group impurities of P, Sb, or the like are laminated on a p-type Si substrate 90. The p-type Si regions 92 have the same conductivity as the p-type Si substrate 90 and are connected to the p-type Si substrate 90.

The p-type Si regions 92 are independently provided at respective corresponding positions in the width direction (the X direction) and the depth direction (the Z direction) for each photodiode group 12. Also, n-type Si regions 97 are disposed between the boundaries of the respective p-type Si regions 92.

Namely, in the spectral image sensor 10 having the structure for infrared light of the third example, a portion below the bottom (shown by a dotted line at $Z \neq 4.7$ μm in the drawing) in each of the p-type regions 92 in the n-type Si substrate 90 shown in FIG. 80 is changed from n-type to p-type, FIG. 80 showing the sensor structure of the second example. This example corresponds to FIGS. 36 to 42 showing the modified example of the second or third example of the spectral image sensor 10 for dispersion of the visible light band into the three primary color components, and exhibits the same effect.

FIG. 86 is a sectional view showing a modified example of the sensor structures for infrared light of the first to third examples. FIG. 87 is a sketch drawing showing an example of a structure when the sensor structure of the modified example shown in FIG. 86 is applied to an interline transfer-system solid-state image sensing device (IT_CCD image sensor) 101. FIG. 88 is a sketch drawing showing an example of a structure when the sensor structure of the modified example shown in FIG. 86 is applied to a CMOS solid-state image sensing device (CMOS image sensor) 201.

In each of the above-described structures, when the distance between the adjacent scatterers 3 is 2.0 μm, each of the photoelectric conversion elements 12W and 121R occupies an area of about a half of 2.0 μm. However, as shown in FIGS. 43 to 45 showing the spectral image sensor 10 for dispersion of the visible light band into the primary color components, in order to further increase the area to increase the quantity of incident light, p-type and n-type patterns on the light-receiving surface may be formed in a comb structure. As a result, like in the structure shown in FIGS. 43 to 45, a detection area can be effectively increased.

For example, in the example shown in FIG. 86 to 88, the n-type Si region 93 constituting each photoelectric conversion element 12W for visible light is formed in a comb structure pattern of p-type and n-type in the surface of the p-type Si region 92 constituting each photoelectric conversion element 121R for infrared light so that one unit cell corresponds to three times the period, and a read gate 124 and pixel amplifier 205 are provided for each of the patterns. Since the approach depth of infrared light is larger than that of visible light, the p-type Si regions 92 may be formed at positions of Z=3.5 μm or more (1 μm or more from the surfaces of the photodiode groups).

The number of the periods provided in one unit cell is not limited to 3 as long as in the resultant device, each photodiode group 12 bears at least two times the period of the diffraction grating 1, and the number of comb teeth may be determined to a value corresponding to two times or three times the period.

In any one of the above-described sensor structures for infrared light, the p-type semiconductor and the n-type semiconductor may be reversed. In addition, in FIGS. 75, 76, 78, 83, 84, and 85, an n-type substrate may be used for suppressing noise. In this case, the n-type substrate may be subjected to thermal diffusion treatment with a III group dopant such as Al, B, or the like to form a p-type region to a depth of 4.5 μm or more from the surface.

Furthermore, in any one of the structures shown in all drawings up to FIG. 85, a region to a depth of 0.1 μm or less from the uppermost surface of a semiconductor may be made p-type by thermal diffusion of a III group dopant such as Al, B, or the like, for suppressing a current leakage.

In each of the examples of the sensor structure corresponding to the simulation results described above with reference to FIG. 63, the period of the scatterers 3 (the distance between the centers of the adjacent scatterers 3 in the transverse direction) is 2.0 μm. However, it can easily be supposed that when the period is changed, the same effect can be obtained. Since the period corresponds to the array pitch (pixel pitch in a conventional structure) of the photodiode groups 12, the pixel pitch can be controlled by changing the period of the scatterers 3. When a high-density device for infrared light is manufactured, the period may be decreased, while when a low-density device for infrared light is manufactured, the period may be increased.

For example, even when the period of the scatterers 3 is 0.5 to 5 μm, the same effect can be obtained. Like in dispersion of the visible light band into the three primary color components, the lower limit of 0.5 μm is set on the basis of the diffraction limit of infrared light. However, the lower limit may be set to 0.3 μm without any problem.

The period is not necessarily specified, but it is preferably in a range of 1 to 2 μm, and more preferably in a range of 1.5 μm as described above. In this case, the lower limit of 1 μm is determined on the basis of the periodic structure of general diffraction gratings for visible light and infrared light and the ease of manufacture of two photoelectric conversion elements in one period. On the other hand, the upper limit of 2 μm is determined on the basis of the fact that the ease of manufacture with a period of up to 2 μm was confirmed from the results of simulation.

Furthermore, in FIG. 63, the scatterers 3 may be formed to achieve the diffraction effect and converging property, and each of the scatterers 3 and 7 may be formed to a thickness of 0.01 μm or more. The lower limit of 0.01 μm is determined on the basis of the minimum value with which light scattering and diffraction can be produced. Generally, a scatterer with a thickness of about 1/10 the wavelength of light produces light scattering and diffraction.

In view of the relation to the diffractive index of $SiO_2$ used as a base material, the thickness of the scatterers 3 is preferably 0.1 μm or more, and more preferably in a range of 0.15±0.05 μm. The lower limit of 0.1 μm is determined on the basis of a thickness with which scattering and diffraction effectively occur. The center value of 0.15 μm is determined on the basis of the fact that the simulation results show satisfactory spectral characteristics. The range of 0.05 μm is determined in view of variations in manufacture.

When the scatterers 7 are provided between the slits 5 and the surfaces of the photodiode groups 12 to permit further dispersion of visible light and simultaneously obtain a color image and an infrared image, like the scatterers 3, the thickness of the scatterers 7 is generally 0.01 μm or more.

Furthermore, each of the scatterers 3 may have a width of 0.05 μm or more in the transverse direction. The lower limit of 0.05 μm is determined on the basis of the minimum value with which light scattering and diffraction can be produced. In general, a scatterer with a width of about 1/10 the wavelength of light can produce light scattering and diffraction. Although the lower limit of the width in the transverse direction is desired to be 0.01 μm in view of matching with the thickness, the width depends on whether or not a width of 0.05 μm can be formed by a latest process. Therefore, the lower limit is set to 0.05 μm in view of the possibility of light scattering and diffraction and the minimum width attained by the process.

When the scatterers 7 are provided between the slits 5 and the surfaces of the photodiode groups 12 to permit further dispersion of visible light and simultaneously obtain a color image and an infrared image, like the scatterers 3, the width of the scatterers 7 in the transverse direction is preferably 0.05 μm or more.

In particular, the width d of the scatterers in the transverse direction may be in a range of 0.05 μm≦d≦0.3 μm (0.2−0.15/+0.1 μm). The center value of this range is determined to 0.2 μm because of the fact that the simulation results show satisfactory spectral characteristics. The range of −0.15 μm is defined in relation to the lower limit, and the upper limit is determined to +0.1 μm in view of a mass production process (0.25 μm process) capable of easy manufacture.

The width (slit width Ds) of the openings 5a of the slits 5 is 0.1 μm or more. The lower limit of 0.1 μm is determined on the basis of the minimum value with which diffraction effectively occurs. The slit width Ds is preferably in a range of 0.8±0.3 μm, and particularly preferably in a range of 0.8±0.1 μm for improving the spectral characteristics. The center value of 0.8 μm and the range of +0.3 μm are determined on the basis of the fact that with a slit width of 800 nm±300 nm, dispersion into visible light and infrared light can be performed, as described above with reference to the conceptual view of FIG. 1. The range of ±0.1 μm is also determined on the basis of the conditions for correct dispersion near the boundary wavelength of 780 nm between visible light and infrared light, which were determined from the simulation results.

The thickness t of the slits 5 may be 0.01 μm or more in order to obtain the spectral effect. The lower limit of 0.01 μm is determined on the basis of the minimum value with which the slit function is exerted. In particular, in order to obtain the effective effect, the thickness may be in a range of 0.01 μm≦t≦0.2 μm (0.1−0.09/+0.1 μm). The center value is determined to 0.1 μm because of the fact that the simulation results show satisfactory spectral characteristics. The range of −0.09/+0.1 μm is also determined on the basis of the conditions (±0.1) for efficient dispersion into visible light and infrared light, which were determined from the simulation results. The lower limit of −0.09 μm is determined to satisfy the condition of 0.01 μm or more.

The distance between the slits 5 and the surfaces of the photodiode groups 12 may be 1.5±1.3 μm. This is determined on the basis of a distance permitting the process and infrared dispersion. In particular, in order to improve the spectral characteristics, the distance is preferably in a range of 1.05±0.5 μm. The center value of 1.05 μm is determined on the basis of the simulation result value causing the highest degree of dispersion, and the range of ±0.5 μm is defined on the basis of the results of simulation.

In the example of the structure for infrared light, the wavelength dispersion portion comprises the combination of two types of scatterers including the scatterers 3 and the slits 5 or the combination of three types of scatterers including the scatterers 3, the slits 5, and the scatterers 7. However, as described above in the paragraph "Modified example of wavelength dispersion portion" for dispersing the visible light band into the primary color components, the configuration of the wavelength dispersion portion is not limited tot his. Since a wide wavelength region including infrared light and visible light is dispersed, dispersion into infrared light and visible light can be made even by a wavelength dispersion portion comprising only one type (scatterers 3) having a structure other than the slits 5.

FIG. 89 is a sketch drawing showing an example of a structure when a sensor structure for infrared light using scatterers 3 having an enclosed shape is applied to an interline transfer-system solid-state image sensing device (IT_CCD image sensor) 111. FIG. 90 is a sketch drawing showing an example of a structure when a sensor structure for infrared light using the scatterers 3 having an enclosed shape is applied to a CMOS solid-state image sensing device (CMOS image sensor) 211. In each of the cases, scatterers 7 are also used. The sensor structure in each of the cases may have the same sectional structure as that shown in FIG. 75, 80, or 83.

The above description relates to the use of the scatterers 3 such as linear scatterers or rod-shape scatterers. However, like in the sensor structure for dispersing the visible light band into a plurality of wavelength components (in the above-described example, the three wavelength components of blue, green, and red), scatterers having an enclosed shape may be used. By using scatterers having an enclosed shape, the diffraction effect can be obtained not only in the one-dimensional direction (the above-described transverse direction) but also in the direction perpendicular to the transverse direction, i.e., the two-dimension direction.

Even when the scatterers 3 having an enclosed shape are used, the arrangement relation between the scatterers 3 and the slits 5 may be as described above with reference to FIG. 2, and the same effect as described above can be obtained.

For example, scatterers each including a light-shielding portion 3b and an opening 3a with a predetermined shape (e.g., square, rectangular, or circular) surrounded by the light-shielding portion 3b are periodically disposed in the transverse direction (the X direction) so as to be aligned in parallel in a predetermined direction of the light-receiving surface on the incident light L1 side. The light-shielding portions 3b correspond to the scatterers 3 each comprising a long light-shielding member for cutting off (shielding light) electromagnetic waves (for example, light).

Also, the slits 5 are provided between the scatterers 3 and the Si substrate 9 so that openings 5a with a predetermined shape (for example, a square, rectangular, or circular shape) are disposed near a portion where diffracted waves 2 converge. The period of the openings 5a (the distance between the adjacent openings Sa) of the slits 5 is the same as that of the openings 3a (the distance between the adjacent openings 3a) of the scatterers 3, and the scatterers 3 and the slits 5 are parallel to each other. In addition, the openings 5a of the slits 5 are substantially disposed on centerlines CLO (perpendicular to the photodiode groups 12) passing through the respective centers between the openings 3a of the adjacent scatterers 3.

For example, when the scatterers 3 (cube-type scatterers 3) having the quadrant openings 3a and the slits 5 having the square openings 5a are used in the CCD structure shown in FIG. 89 or the CMOS structure shown in FIG. 90, the photodiode groups 12 (photoelectric conversion elements 12W and 121R) have the structure shown in FIG. 89 or 90. Namely, when the scatterers with an enclosed shape are used, the diffraction effect can be obtained in the two-dimensional direction, and thus visible light converges on a vertical line passing through the center of each opening 5a, and infrared light is dispersed in the periphery thereof.

Therefore, the photoelectric conversion element 12W for detecting visible light is disposed on the vertical line passing through the center of each opening 5a, and the photoelectric conversion element 121R for detecting infrared light is disposed in the periphery of the portion for visible light.

For example, as shown in FIGS. 89 and 90, on the light-receiving surface side of the photodiode groups 12, an n-type Si region 91 (or an n-type Si region 93) constituting the photoelectric conversion element 12W for visible light is disposed on the vertical line passing through each opening Sa, and an n-type Si region 91 constituting the photoelectric conversion element 121R for detecting infrared light is disposed in the periphery of the region for visible light with a p-type Si region 92 provided therebetween.

However, as shown in the drawings, for the photoelectric conversion elements 121R for infrared light, read gates 124W and cell amplifiers 205W for the photoelectric conversion elements 12W for visible light must be made independent, and the adjacent photoelectric conversion elements 121R for infrared light must be also made independent of each other. Therefore, a portion of the four sides of the n-type Si region 91 constituting each photoelectric conversion element 121R is preferably hollowed out. For example, a portion of the four sides of the n-type Si region 91 constituting each photoelectric conversion element 121R for infrared light is preferably hollowed out to form a L-like shape as shown in the drawings or an I-like shape (not shown).

FIGS. 91 to 93 are drawings showing a specific example of the process for manufacturing the spectral image sensor 10 or 11 having the sensor structure of any one of above-described embodiments. FIGS. 91 to 93 are drawings showing an example of the process for manufacturing the sensor structure shown in FIG. 13, 21, or 74. The method for manufacturing the structure includes patterning an oxide film mask on a n-type Si semiconductor by a lithographic technique, and doping with a III element by a thermal diffusion technique. In this case, the doping depth is controlled by controlling the time.

Figure 91A:
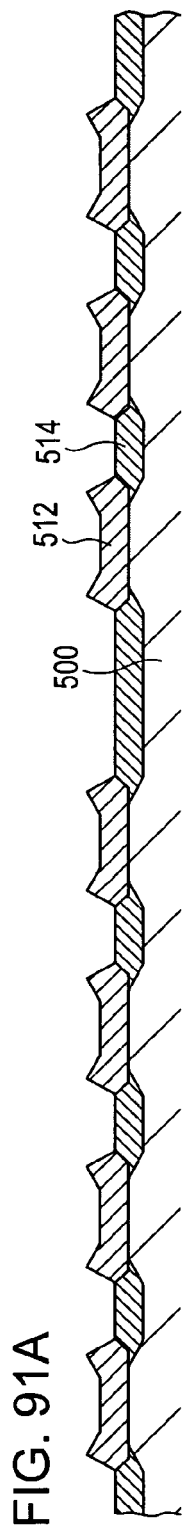
Figure 91B:
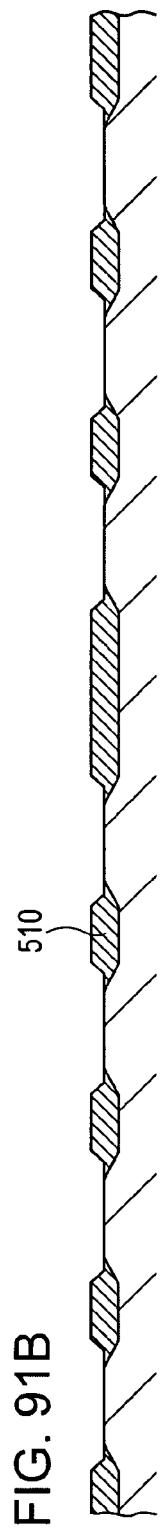
Figure 91C:
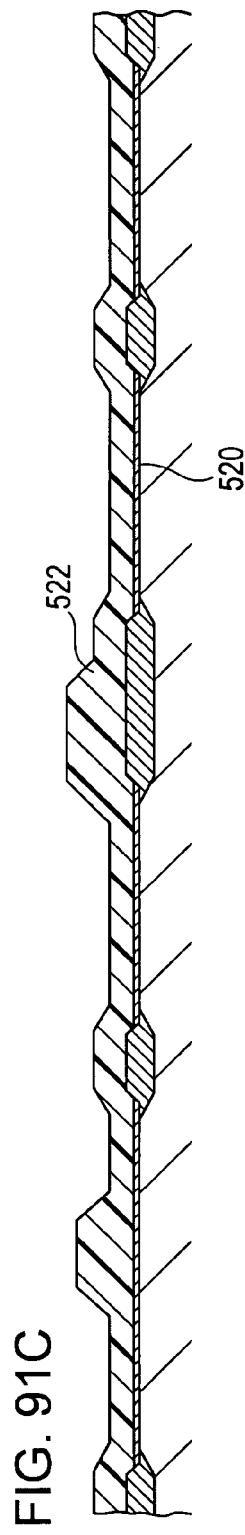
Figure 91D:
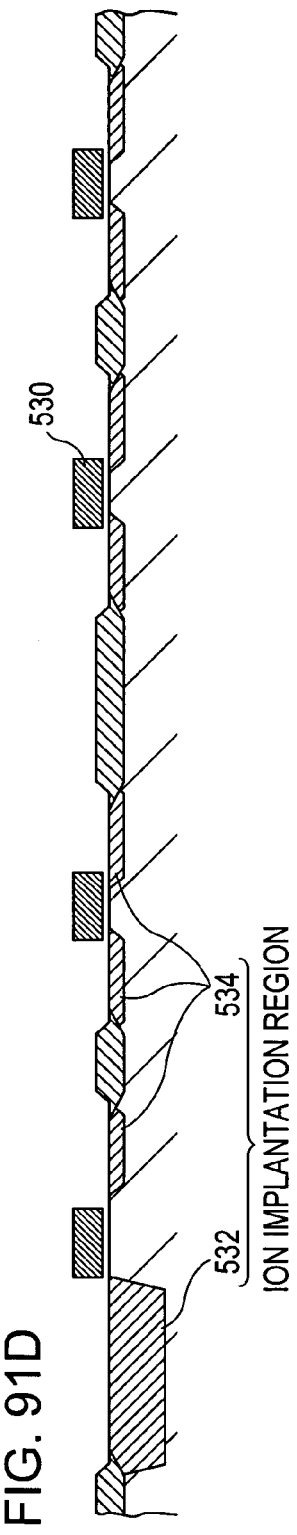

For example, a silicon nitride (SiN) film 512 for element separation is deposited on a n-type Si semiconductor substrate 500, and then patterned and oxidized to form silicon oxide (SiO2) films 514 (FIG. 91A). Then, the silicon nitride film 512 is removed to form element separation regions 510 (FIG. 91B) Then, a gate oxide film (Gate Ox.) 520 is formed, and then a gate polysilicon film (Poly Si; gate polycrystalline Si) 522 is deposited (91C).

Then, gate wiring 530 is patterned by lithography and dry etching (91D). Also, ion implantation is performed to form sensor regions 532 and transistor regions 534 (both referred to as "ion sensor regions") (91D).

The impurity doping and thermal diffusion are performed before or after the formation of the gate wiring according to purposes.

Then, interlayer films 540 and 542 comprising a silicon oxide ($SiO_2$) film are formed. When the interlayer films 540 and 542 are formed after the formation of the gate wiring 530, for example, a diffraction grating film such as a polysilicon (Poly Si) film or a silicon nitride (SiN) film is formed in the interlayer film 540. The diffraction grating film can be formed using a wiring metal film. Then, the diffraction grating film is patterned by lithography and dry etching to form a diffraction grating 580 (refer to an enlarged view of FIG. 92).

Then, electrical connection holes 550 and 552 comprising metal wiring and metal wiring comprising wiring metal films 560 and 562 are formed in the interlayer films 540 and 542, respectively. Furthermore, a passivation film (not shown) is deposited to form a sensor comprising semiconductor LSI (FIG. 92)

As shown in FIG. 93, the diffraction grating is formed as the same time as the formation of the wiring metal film 560 between the interlayer films 540 and 542 so that the diffraction grating can be formed as a metal diffraction grating 582 or formed using another film (another metal).

FIGS. 94 and 95 are drawings showing a first configuration example of a CMOS solid-state image sensing device 201 for dispersing the visible light band into the three primary color components, the sensing device being manufactured by the above-described manufacturing process. FIG. 94 includes a plan view and sectional view (both are schematic views) of the structural example, and 95A and 95B are drawing showing a circuit and signal timing, respectively.

Each of photoelectric conversion elements 732B, 732G, and 732R for respective colors constituting a photodiode group 732 has a structure, a so-called HAD (Hole Accumulated Diode) structure, in which a hole storage layer (referred to as a "second sensor region) comprising a $p^+$-type impurity region is laminated on a charge storage layer comprising a $N^+$-type impurity region on the surface side of a NP diode (refer to, for example, Japanese Unexamined Patent Application Publication Nos. 5-335548 and 2003-78125).

The cathodes of the photoelectric conversion elements 732B, 732G, and 732R are connected to a common transfer gate 734, and the anodes are in a floating state.

A pixel amplifier 705 comprising the three transistors including an amplification transistor connected to a drain line (DRN) for amplifying a signal voltage corresponding to a signal charge, which is generated by each of the photoelectric conversion elements (S/D) 732B, 732G, and 732R corresponding to charge generators and which is held by a floating diffusion 738; a rest transistor 736 controlled on the basis of reset pulses RST through reset wiring 756; and the transfer gate (read selection transistor) 734 as an example of transfer parts scanned by driving pulses TX through the transfer gate wiring 755. The amplification transistor 740 outputs a signal voltage a corresponding vertical signal line 753 through a pixel signal line 751.

As a characteristic configuration of the structure of this example, the transfer gate 734 contributes to read from all the photoelectric conversion elements 732B, 732G, and 732R (the cathodes of the photoelectric conversion elements 732B, 732G, and 732R being connected to a common source), and the reset transistor 735G serving as a switch for reading from the photoelectric conversion element 732G on the basis of the reset pulses RG is provided for the photoelectric conversion element 732G. Similarly, the reset transistor 735R serving as a switch for reading from the photoelectric conversion element 732R on the basis of the reset pulses RR is provided for the photoelectric conversion element 732R.

The transfer gate 734 and the reset transistors 735G and 835R are controlled by a control part (corresponding to the drive control part 207 shown in FIG. 27).

The photoelectric conversion elements 732B, 732G, and 732R for the respective colors separated by the grating are connected to each pixel amplifier 705 through the amplification transistor 740 and the reset transistor 736 to output a pixel signal to the corresponding vertical signal line 753 according to the timing shown in FIG. 93B which shows a reset state and a signal read state.

In FIGS. 94 and 95A, a signal charge is output from each of the photoelectric conversion elements 732B, 732G, and 732R to the pixel amplifier 705 through the transfer gate 734. However, the configuration is not limited to this, and the photoelectric conversion elements 732B, 732G, and 732R may be electrically connected directly to the pixel amplifier 705 without using the transfer gate 734. The circuit for output from the photoelectric conversion elements 732B, 732G, and 732R is not limited to this example, and signals output from the photoelectric conversion elements 732B, 732G, and 732R for the respective colors separated by the diffraction grating can be applied any circuit system.

In this example, a red component R and a green component G are reset to a potential state by reset switches (rest transistors 735G and 735R) before a blue component B is read out. The red component R is further reset to a potential state before the green component G is read out. Although pixel signals are read through the same transfer gate 734, a signal charge can be read from only the photoelectric conversion element for the color component which has been not reset. The blue component B is reset by the transfer gate 734 in reading. When the floating diffusion 738 is reset before each signal charge is read out, pixel signals B, G, and R can be independently read in that order.

FIGS. 96 and 97 are drawings showing a second configuration example of a CMOS solid-state image sensing device 201 for dispersing the visible light band into the three primary color components, the sensing device being manufactured by the above-described manufacturing process. FIG. 96 includes a plan view and sectional view (both schematic views) of the structural example, and 97A and 97B are drawing showing a circuit and signal timing, respectively.

In comparison to the first configuration example shown in FIGS. 94 and 95, the second example is different from the first example in a connection structure between a floating diffusion 783 and each of photoelectric conversion elements 732B, 732G, and 732R for respective colors constituting a photodiode group 732. Specifically, transfer gates 734B, 734G, and 734R for respective colors are provided for the photoelectric conversion elements 732B, 732G, and 732R, respectively. Each of the transfer gates 734B, 734G, and 734R is controlled by a control part (not shown) (corresponding to the drive control part 207 shown in FIG. 27).

Figure 97A:
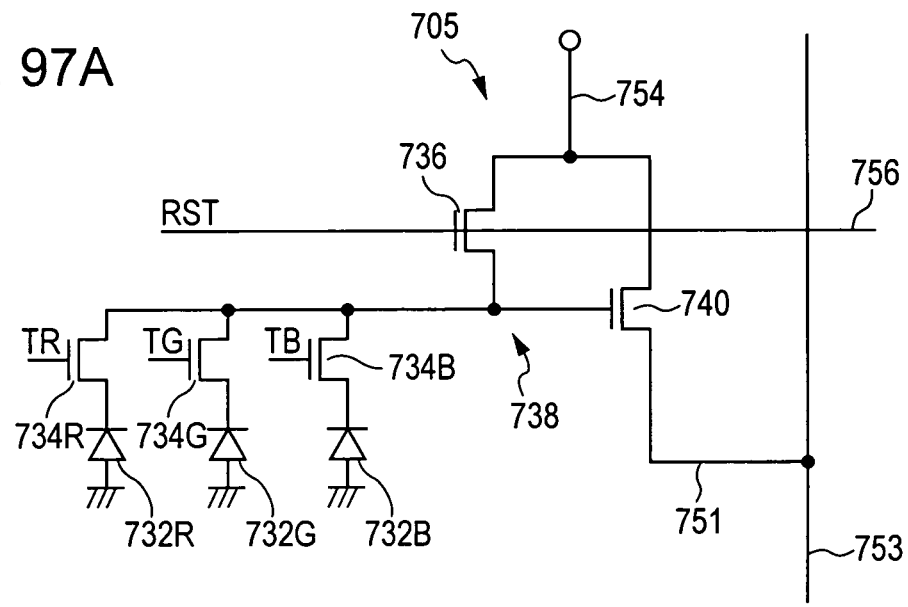
Figure 97B:
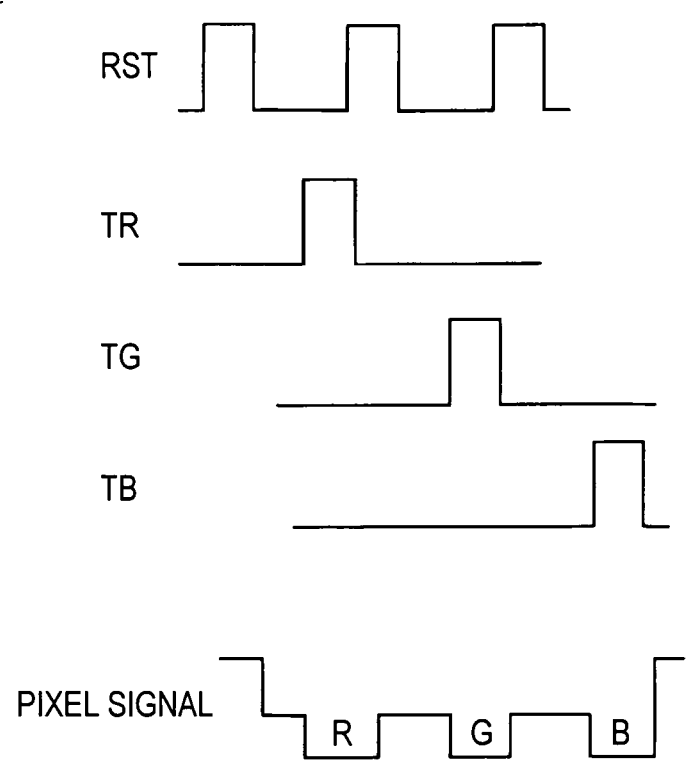

In this configuration example, the photoelectric conversion elements 732B, 732G, and 732R for the respective colors separated by the grating are connected to each pixel amplifier 705 through an amplification transistor 740, a reset transistor 736 and the corresponding transfer gates 734B, 734G, and 734R, respectively, to output pixel signals to a corresponding vertical signal line 753 according to the timing shown in FIG. 97B which shows a reset state and a signal read state. When the floating diffusion 738 is reset before each signal charge is read out, pixel signals R, G, and B can be independently read in that order (or another order.

In FIGS. 96 and 97A, signal charges are output from the photoelectric conversion elements 732B, 732G, and 732R to the pixel amplifier 705 through the corresponding transfer gates 734B, 734G, and 734R, respectively. However, the configuration is not limited to this, and the photoelectric conversion elements 732B, 732G, and 732R may be electrically connected directly to the pixel amplifier 705 without using the transfer gates. The circuit for output from the photoelectric conversion elements 732B, 732G, and 732R is not limited to this example, and signals output from the photoelectric conversion elements 732B, 732G, and 732R for the respective colors separated by the diffraction grating can be applied any circuit system.

FIGS. 98, 99, and 100 are drawings showing a third configuration example in which a photoelectric conversion element region of a CMOS solid-state image sensing device is also provided on the back side. FIGS. 98 and 99 show an example of a device structure in which a diffraction grating film is formed on the back side so that signals are transferred to the surface side. FIG. 100 shows an example in which signal transfer gates are formed on both the surface side and back side. As a circuit system for a pixel amplifier, the circuit example shown in FIG. 95 or 97 can be applied to the back side.

For example, in the third configuration example (1) shown in FIGS. 98 and 99, ions are implanted into a position corresponding to a sensor region 532 on the back side of a n-type semiconductor substrate 500 to form a back sensor region 533.

Then, an interlayer film 542 comprising a silicon oxide (SiO2) film is formed on the back of the n-type Si semiconductor substrate 500. When an interlayer film 544 is formed, a diffraction grating film such as a polysilicon (Poly Si) film or a silicon nitride (SiN) film is formed in the interlayer film 544. The diffraction grating film can be formed using a wiring metal film. Then, the diffraction grating film is patterned by lithography and dry etching to form a diffraction grating 584.

Signals are taken through connection holes 550 and a wiring metal film 560 of the interlayer films 540 and 542 which are formed on the surface side of the n-type Si semiconductor substrate 500.

In the third configuration example (2) shown in FIG. 100, an interlayer film 546 is formed on the interlayer film 544 formed in the third configuration example (1) shown in FIG. 99, and an electrical connection hole 554 and a wiring metal film 564 comprising meta wiring are also formed in the interlay films 544 and 546, respectively.

Since the photoelectric conversion element region is formed on the back side, the opening can be increased to improve the efficiency of light convergence.

In the third configuration example (1), the transfer gate and the wiring region are disposed on the surface side, and the diffraction grating is formed on the back side. In this structure, the light converging surface is provided only on the back side, and all electrical signals are obtained on the surface side. The third example (1) thus has the advantage that signals of the three colors can be independently output to the X surface. Although light convergence is inhibited by wiring or the like in comparison to a conventional case in which a diffraction grating is disposed on the surface side, the structure of this example is not adversely affected.

On the other hand, the third configuration example (2) is basically the same as the third configuration example (1), but light is further converged on the back side. Also, for blue light and green light, the electrons generated in a shallow region are converted into electric signals on the back side and then output. A signal of red light is converted to an electric signal on the surface side and then output. The depth direction is also utilized for design to permit design using both surfaces, thereby permitting design with a higher degree of freedom, as compared with the third configuration example (1) in which convergence of blue, green, and red light is designed on one of the surfaces.

Although, as described above, signals of blue light and green light can be independently output to the X surface, signals of red light can be output in a separated state in the depth Z direction. Therefore, an electrode or a signal output part must be formed only on the X surface, for outputting the signals of each color. However, at least two output terminals can be provided on the X surface, and an electrode can be provided in the depth Z direction, thereby decreasing the electrode area. As a result, the third configuration example (2) has the advantage that a wide photoelectric conversion element region can be secured, and a large number of electrons subjected to photoelectric conversion can be secured. Namely, the third configuration example (2) is advantageous to an increase in sensitivity.

FIGS. 101 and 102 are drawings showing a configuration example (configuration example 4) of a CCD solid-state image sensing device 101 for dispersing the visible light band into the three primary color components, the sensing device being manufactured by the above-described manufacturing process. FIG. 101 shows one pixel (one photodiode group 12) in this example, FIG. 102 shows a state in which pixels (photodiode groups 12) are arrayed, and FIG. 103 shows signal timing.

A diffraction grating for color separation is provided for each of photoelectric conversion elements 12B, 12G, 12R, and charges are transferred to vertical transfer CCDs 122 through each of read gates 124B, 124G, and 124R. The signal charges transferred from the vertical transfer CCDs 122 (122*a* and 122*b*) are transferred to a horizontal transfer CCD 126 and further transferred to an output amplifier 128 having a charge-voltage conversion part comprising a floating diffusion amplifier (FDA) and provided at the transfer end of the horizontal transfer CCD 126.

As seen from FIGS. 101 and 102, unlike in the structure shown in FIG. 24, the signal charges stored in the photoelectric conversion elements 12B and 12G among the photoelectric conversion elements 12B, 12G, and 12R for respective colors in each photodiode group 12 are read out to the vertical transfer CCD 122*a* on the same vertical column, and the signal charges stored in the photoelectric conversion element 12R are read out to the vertical transfer CCD 122*b* for the photoelectric conversion elements 12B and 12G in the adjacent photodiode group 12.

In this structure, exposure is started after completion of reset, read of red and blue components are then performed in that order. Finally, a green component is read so that charge transfer can be made according to each of the wavelength component signals. For example, as shown in a timing diagram of FIG. 103, full-surface reset RST is performed in the direction to the substrate, read pulses ROG_R and ROG_B are in turn supplied to read gates 124R and 124B, respectively, to output to signals of the color components R and B to the vertical transfer CCDs 122a and 122b, respectively. Finally, read pulse ROG_G is supplied to a read gate 124G to output a signal of green light component to the vertical transfer CCD 122a.

Herein, an interline transfer system CCD solid-state image sensing device (IT_CCD) is described as an example, the structure of example 4 can be also applied to a frame transfer system CCD solid-state image sensing device 201 (FT_CCD) and a frame interline transfer system CCD solid-state image sensing device (FIT_CCD).

FIGS. 104 to 106 are drawings showing a first configuration example of a CCD solid-state image sensing device 201 for dispersing into the two wavelength components including infrared light and visible light, the sensing device being manufactured by the above-described manufacturing process. FIG. 104 includes a plan view and section view (both are schematic views) of an example of the structure, and FIGS. 105 and 106 each include a circuit diagram A and a signal timing diagram B.

Although the detailed description of the structure shown in FIG. 104 is omitted, the basic structure is the same as the structure for dispersing the visible light band into the three wavelength components (color components) shown in FIG. 94 except that light is dispersed into the two wavelength components including infrared light and visible light.

In the circuit shown in each of FIGS. 105 and 106, a pixel amplifier 705 is the same as shown in FIG. 95A.

As a characteristic configuration of this example, a transfer gate contributes to read from all the photoelectric conversion elements 732W and 7321R. In the circuit shown in FIG. 105A, a reset transistor serving as a switch for read from the photoelectric conversion element 7321R on the basis of the reset pulse RIR is provided for the photoelectric conversion element 7321R.

Figure 105A:
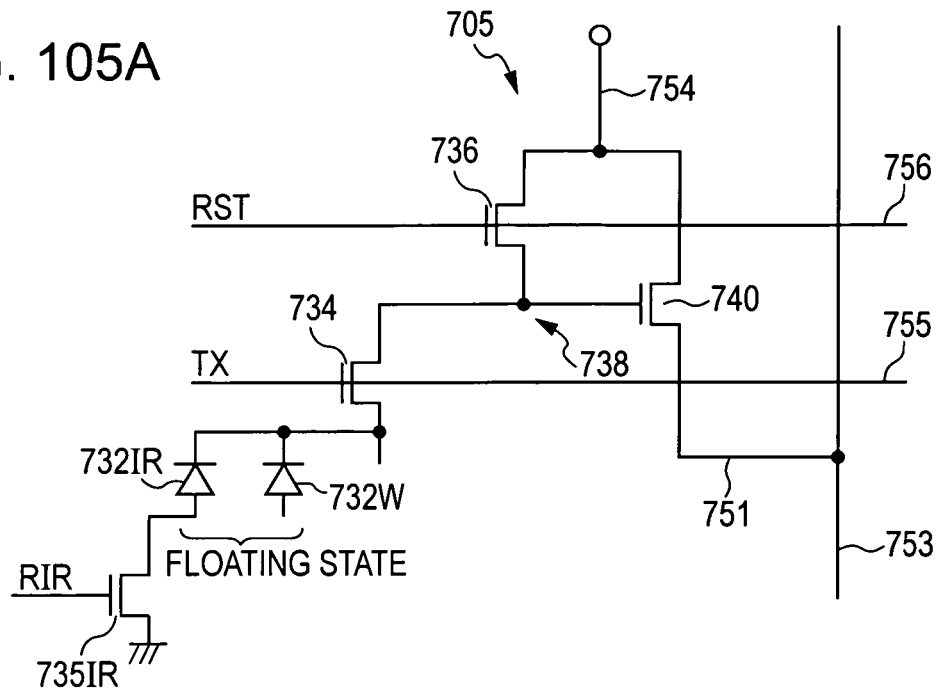
Figure 105B:
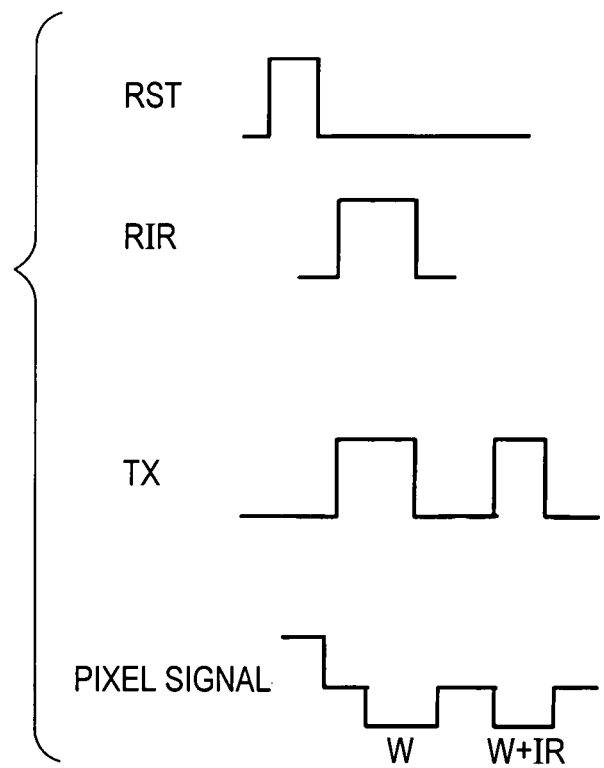

The photoelectric conversion elements 732W and 7321R for respective wavelengths separated by a grating are connected to each pixel amplifier 705 through the amplification transistor 740 and the reset transistor 736 to output a pixel signal according to the timing shown in FIG. 105B which shows a reset state and a signal read state.

In the circuit shown in FIG. 105A, in a state in which an infrared component IR is reset by a reset switch (rest transistor 7351R), a visible light component W is read. As a result, a pixel signal is read through the same transfer gate 734, but a potential corresponding to a signal charge can be read out from only the photoelectric conversion element 732W which has not been reset.

Then, the infrared light component IR and the visible light component W are combined and read out by nondestructive reading with the timing shown in FIG. 105(B) without supply of each rest pulse RST to the reset transistor 736. The infrared light component IR can be determined by subtracting the visible light component W from the synthesized component (W+IR) according to the calculation "IR=(W+IR)−W".

Figure 106A:
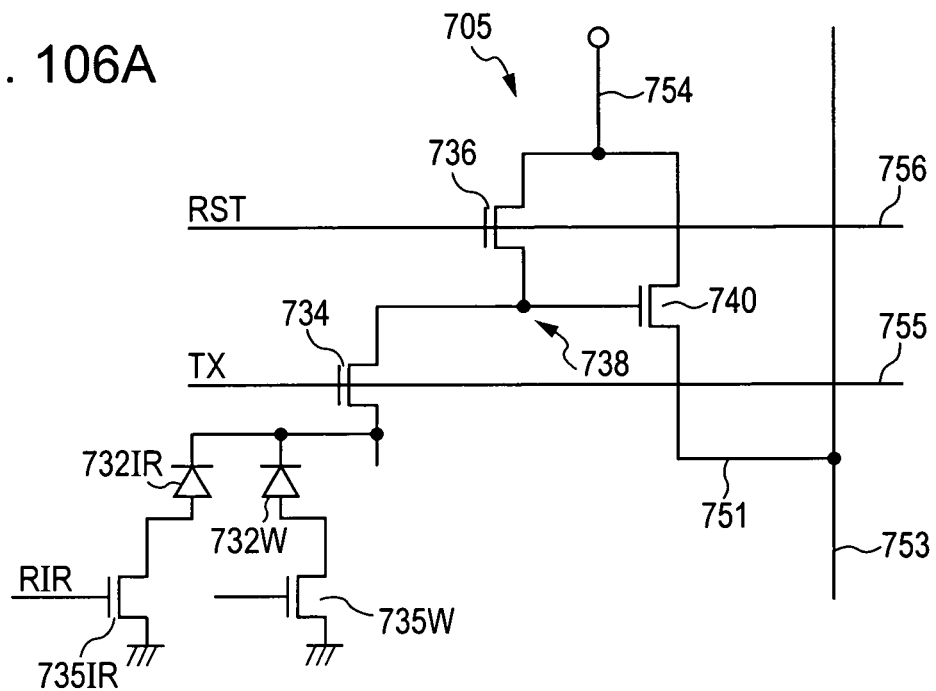

On the other hand, in the circuit shown in FIG. 106A, in addition to a reset transistor 7351R serving as a switch for read from the photoelectric conversion element 7321R on the basis of the reset pulse RIR, a reset transistor 735W serving as a switch for read from the photoelectric conversion element 732W on the basis of the reset pulse RIW is provided for the photoelectric conversion element 732W.

Figure 106B:
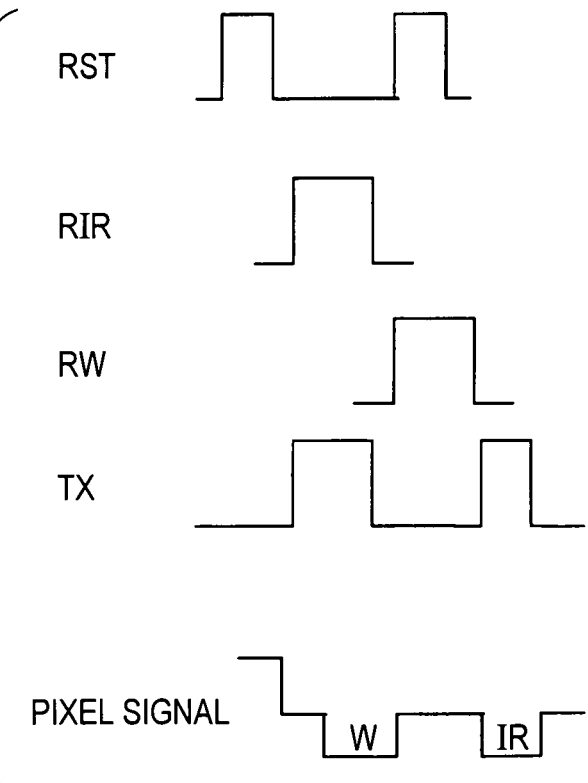

The photoelectric conversion elements 732W and 7321R for respective wavelengths separated by a grating are connected to each pixel amplifier 705 through the amplification transistor 740 and the reset transistor 736 to output a pixel signal according to the timing shown in FIG. 106B which shows a reset state and a signal read state.

In the circuit shown in FIG. 106A, in a state in which an infrared component IR is reset, a visible light component W is read. As a result, a pixel signal is read through the same transfer gate 734, but a potential corresponding to a signal charge can be read out from only the photoelectric conversion element 732W which has not been reset.

Then, in a state in which the visible light component W is reset, the reset transistor is reset, and the infrared light component IR is read with the timing shown in FIG. 106B. When the floating diffusion 738 is reset before the signal charge of each component is read out, the pixel signals of the visible light component W and the infrared light component IR can be independently read in that order.

FIGS. 107 and 108 are drawings showing a second configuration example of a CMOS solid-state image sensing device 201 for dispersing light into the two wavelength components including infrared light and visible light, the sensing device being manufactured by the above-described manufacturing process. FIG. 107 includes a plan view and sectional view (both are schematic views) of the structural example, and 108A and 108B are drawing showing a circuit and signal timing, respectively.

In comparison to the first configuration example shown in FIGS. 104 and 105, transfer gates 734W and 7341R for respective wavelengths are provided for the photoelectric conversion elements 732W and 7321R, respectively. The photoelectric conversion elements 732W and 7321R for the respective wavelengths separated by the grating are connected to each pixel amplifier 705 through an amplification transistor 740, a reset transistor 736 and the corresponding transfer gates 734W and 7341R, respectively, to output pixel signals according to the timing shown in FIG. 108B which shows a reset state and a signal read state. When the floating diffusion 738 is reset before each signal charge is read out, pixel signals can be independently read in the order of the infrared light component IR and the visible light component W (or the reverse order).

Although not shown in the drawings, as described above with reference to FIGS. 98 to 100, a photoelectric conversion element region of a CMOS solid-state image sensing device for infrared light can be also provided on the back side. As a circuit system for a pixel amplifier, the circuit example shown in FIG. 105 or 108 can be applied to the back side.

A plan view corresponding to FIG. 98 is the same as FIG. 104, and is thus the same as that for dispersion of the visible light band into the three primary colors. On the other hand, the sectional structure for dispersion of the visible light band into the three wavelength components (color components) shown in each of FIGS. 99 and 100 may be changed to a structure for dispersion of light into the two wavelength components including infrared light and visible light. The basic structure and the concept are the same as the structure shown in FIGS. 99 and 100.

FIGS. 109 and 110 are drawings showing a configuration example (configuration example 4) of a CCD solid-state image sensing device 101 for dispersing light into the two wavelength components including infrared light and visible light, the sensing device being manufactured by the above-described manufacturing process. FIG. 109 shows one pixel (one photodiode group 12) in this example, and FIG. 110 shows a state in which pixels (photodiode groups 12) are arrayed.

A diffraction grating is provided for each of photoelectric conversion elements 12W and 121R for wavelength separation, and charges are transferred to vertical transfer CCDs 112 through read gates 124W and 1241R.

In this structure, exposure is started after completion of reset, read of infrared light and visible light components are then performed in that order so that charge transfer can be made according to each of the wavelength component signals. For example, full-surface reset RST is performed in the direction to the substrate, exposure is started, and then read pulse ROG_IR is supplied to a read gate 1241R to output signals of the infrared component IR to vertical transfers CCD 122. Then, read pulse ROG_W is supplied to a read gate 124W to output a signal of the visible light component W to the vertical transfer CCDs 122.

Although the present invention is described above with reference to the embodiments, the technical field of the invention is limited to the range described in the embodiments, and various changes or modifications can be made in the scope of the gist of the present invention. The changed or modified embodiments are also included in the technical field of the present invention.

Also, the above-described embodiments define the invention described in the claims, and all combinations of the characteristics descried in the embodiments are not necessarily required for means for solving the problems in the present invention. The above-described embodiments include inventions in various steps, and various inventions can be extracted from proper combinations of a plurality of requirements disclosed in the invention. If some requirements are removed from the requirements described in the embodiments, an invention satisfying the remaining requirements can be achieved as long as an effect can be obtained.

For example, a device substrate may be either a n-type or a p-type, and in any of the device substrates, each of photoelectric conversion elements in each photodiode group may be formed in a HAD structure.

Figure 111A:
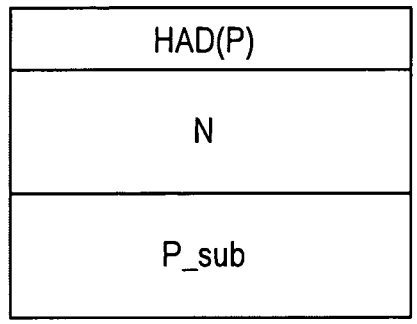

For example, FIGS. 111 and 112 show examples of a laminated device structure. As shown in FIG. 111A, even in the device structure shown in FIG. 36 in which photoelectric conversion elements are formed on a p-type substrate, a p-type region can be formed on the surface to form a HAD structure. The HAD structure can decrease noise.

Figure 111B:
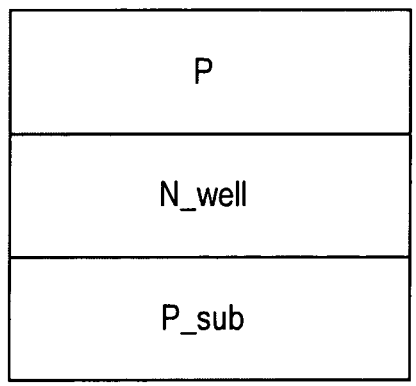
Figure 111C:
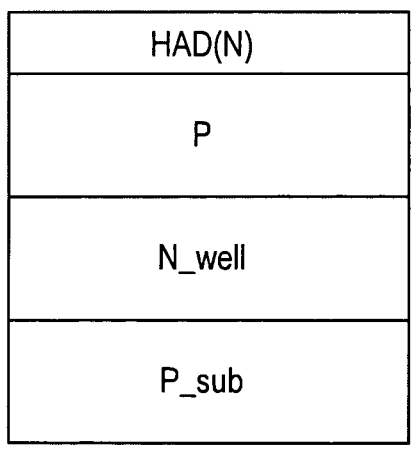

As shown in FIG. 111B, even when holes are used as carrier, a p-type substrate can be used. In this structure, a p-type region is formed on a N-type well. In this case, as shown in FIG. 111C, an N-type region can be formed on the surface to form a HAD structure.

Figure 112A:
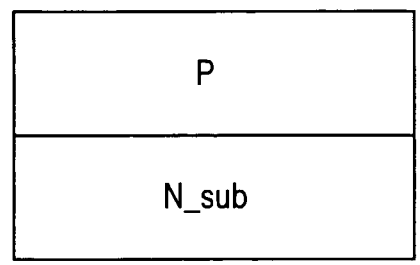
Figure 112B:
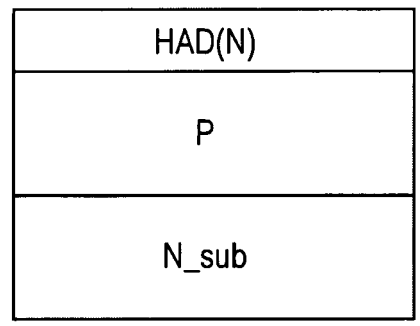

Although, in the structure described above in each of the embodiments, N-type carriers (electrons) are used for an N-type substrate. However, as shown in FIG. 112A, P-type carriers (holes) are used for an N-type substrate. In this case, as shown in FIG. 112B, an N-type region can be formed on the surface to form a HAD structure.

Figure 112C:
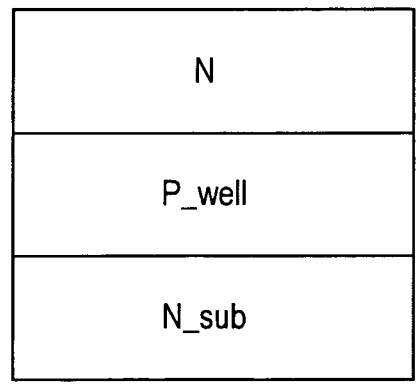
Figure 112D:
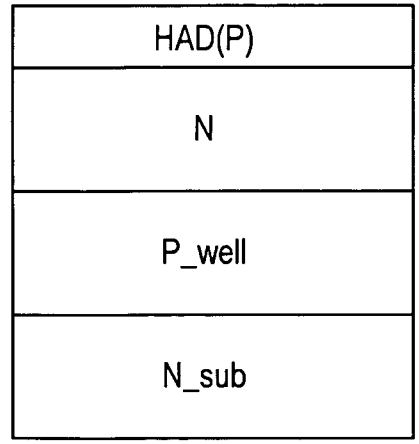

Furthermore, as shown in FIG. 112C, when P-type wells are formed on an N-type substrate (N_sub), a device in which electrons are used as carrier, i.e., the structure shown in FIG. 36 is formed on an N-type substrate (N_sub), can be formed. In this structure, excess charges can be overflowed to the substrate side. In this case, of course, as shown in FIG. 112D, a p-type region can be formed on the surface to form a HAD structure.

According to the present invention, an electromagnetic wave incident on the incidence surface is detected for each of the wavelength components produced by wavelength dispersion due to the diffraction effect. As a result, a signal of each wavelength component can be detected without using a separation filter. Also, the efficiency of conversion to an electric signal can be increased to achieve high sensitivity. For example, an image sensor with high resolution and excellent color reproducibility can be realized.

Furthermore, signals of respective wavelength components can be detected by one conventional pixel, and thus a higher density and higher resolution can be achieved.

Furthermore, signals of the respective wavelength components can be simultaneously detected, and thus a visible-light image and an infrared-light image can be simultaneously taken by, for example, a structure for separately detecting infrared or ultraviolet light and visible light. In this case, a visible-light image with a correct color and an infrared- or ultraviolet-light image can be simultaneously taken by a structure for separately detecting signals of the three primary colors of visible light.

What is claimed is:

1. A method comprising:
separating an electromagnetic wave into a plurality of wavelength components by a diffraction effect, the diffraction effect resulting from the electromagnetic wave passing through openings of a diffraction grating in a semiconductor device, the diffraction grating being parallel to an incidence surface of a substrate of the semiconductor device, the diffraction grating including (i) a plurality of first scatterers, (ii) a plurality of second scatterers between the first scatterers and the incidence surface, (iii) a plurality of third scatterers between the second scatterers and the incidence surface;
directing the plurality of wavelength components onto corresponding positions on the incidence surface; and
detecting the wavelength components directed out of the diffraction grating,
wherein,
the first, second and third scatterers in the diffraction grating are configured such as to separate the electromagnetic wave into the plurality of wavelength components and direct the wavelength components onto the corresponding positions on the incidence surface,
the semiconductor device further includes a plurality of photodiode groups on the incident surface side that are positioned such as to receive the wavelength components directed out of the diffraction grating, and
the photodiode groups are used in the detecting step, each of the photodiode groups including a plurality of photoelectric conversion elements that (i) each detect a respective wavelength component corresponding to one of primary colors of red, green, and blue, and (ii) output a respective signal charge for conversion into a signal corresponding to the detected wavelength component, photoelectric conversion elements of adjacent photodiode groups being arranged in a transverse direction of the substrate to detect the colors in the order of blue, green, red, green, blue, green, red, green, blue, . . . .

2. A semiconductor device comprising:
a substrate, the substrate having an incident surface upon which a wavelength component of an electromagnetic wave is incident;
a diffraction grating, the diffraction grating positioned parallel to the incidence surface, that includes (i) a plurality of first scatterers, (ii) a plurality of second scatterers between the first scatterers and the incidence surface, and (iii) a plurality of third scatterers between the second scatterers and the incidence surface; and
a plurality of photodiode groups on the incident surface side, wherein,
the first, second and third scatterers in the diffraction grating are configured such as to separate the electromagnetic wave into a plurality of wavelength components and direct the wavelength components onto corresponding positions on the incidence surface,
the plurality of photodiode groups on the incident surface side are positioned such as to receive the wavelength components directed out of the diffraction grating, and
each of the photodiode groups includes a plurality of photoelectric conversion elements that (i) each detect a respective wavelength component corresponding to one of primary colors of red, green, and blue, and (ii) output a respective signal charge for conversion into a signal corresponding to the detected wavelength component, photoelectric conversion elements of adjacent photodiode groups being arranged in a transverse direction of the substrate to detect the colors in the order of blue, green, red, green, blue, green, red, green, blue, . . . .

3. The semiconductor device according to claim 2, wherein the first scatterers each have an opening of a predetermined shape and a cut-off portion provided around the opening, the openings being periodically disposed.

4. The semiconductor device according to claim 3, wherein the predetermined shape is a long shape, a square shape, or a circular shape, and the openings are disposed in parallel with the incidence surface of the substrate.

5. The semiconductor device according to claim 3, wherein the second scatterers each have an opening of a predetermined shape and a cut-off portion provided around the opening, the openings of the second scatterers being disposed in parallel with the openings of the first scatters.

6. The semiconductor device according to claim 5, wherein the openings of the second scatters are disposed periodically, and a period of the openings of the second scatters is the same as a period of the openings of the first scatters.

7. The semiconductor device according to claim 5, wherein each of the openings of the second scatterers is substantially disposed on a center line passing through a center between the cut-off portions of adjacent first scatterers.

8. The semiconductor device according to claim 5, wherein:
the third scatterers each have an opening of a predetermined shape and a cut-off portion provided around the opening, the openings of the third scatterers being disposed in parallel with the openings of the second scatters,
the openings of the second scatters being disposed periodically,
the openings of the third scatters being disposed periodically,
and a period of the third openings being the same as a period of at least one of the openings of the first scatters and the openings of the second scatters.

9. The semiconductor device according to claim 2, wherein each of the photoelectric conversion elements comprises a pn junction, and the width of the pn junction in a signal read direction is set to be less than 1.0 µm.

10. The semiconductor device according to claim 2, wherein each of the photoelectric conversion elements comprises a pn junction, and the width of the pn junction in a signal read direction is set to be no greater than 0.3 µm.

11. The semiconductor device according to claim 2, wherein each photoelectric conversion element for detecting a blue wavelength component comprises a pn junction, and a maximum depth of the pn junction is set in the range of 0.2+−0.3 µm.

12. The semiconductor device according to claim 2, wherein each photoelectric conversion element for detecting a green wavelength component comprises a pn junction, and a maximum depth of the pn junction is set in the range of 0.8+−0.3 µm.

13. The semiconductor device according to claim 2, wherein each photoelectric conversion element for detecting a red wavelength component comprises a pn junction, and a maximum depth of the pn junction is set in the range of 1.4+−0.6 µm.

14. The semiconductor device according to claim 2, wherein the diffraction grating is formed to disperse a visible light band into the plurality of wavelength components.

* * * * *